(12) United States Patent
Yamazaki et al.

(10) Patent No.: US 10,741,414 B2
(45) Date of Patent: Aug. 11, 2020

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP);
Yasuharu Hosaka, Tochigi (JP);
Toshimitsu Obonai, Shimotsuke (JP);
Junichi Koezuka, Tochigi (JP);
Yukinori Shima, Tatebayashi (JP);
Masahiko Hayakawa, Tochigi (JP);
Takashi Hamochi, Tochigi (JP);
Suzunosuke Hiraishi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/584,223

(22) Filed: May 2, 2017

(65) Prior Publication Data

US 2017/0236723 A1    Aug. 17, 2017

Related U.S. Application Data

(63) Continuation of application No. 14/505,004, filed on Oct. 2, 2014, now Pat. No. 9,647,128.

(30) Foreign Application Priority Data

Oct. 10, 2013  (JP) .................................. 2013-213240
Oct. 17, 2013  (JP) .................................. 2013-216220
(Continued)

(51) Int. Cl.
*H01L 21/477*    (2006.01)
*H01L 21/02*     (2006.01)
(Continued)

(52) U.S. Cl.
CPC ...... *H01L 21/477* (2013.01); *H01L 21/02112* (2013.01); *H01L 21/02403* (2013.01);
(Continued)

(58) Field of Classification Search
CPC .................................................. H01L 29/7869
See application file for complete search history.

(56) References Cited

U.S. PATENT DOCUMENTS 5,528,032 A    6/1996  Uchiyama
5,731,856 A    3/1998  Kim et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
(Continued)

*Primary Examiner* — Eugene Lee
(74) *Attorney, Agent, or Firm* — Robinson Intellectual Property Law Office; Eric J. Robinson

(57) ABSTRACT

To suppress a change in electrical characteristics and to improve reliability in a semiconductor device using a transistor including an oxide semiconductor. The semiconductor device includes a gate electrode over an insulating surface, an oxide semiconductor film overlapping with the gate electrode, a gate insulating film which is between the gate electrode and the oxide semiconductor film and is in contact with a surface of the oxide semiconductor film, a protective film in contact with an opposite surface of the surface of the
(Continued)

oxide semiconductor film, and a pair of electrodes in contact with the oxide semiconductor film. In the gate insulating film or the protective film, the amount of gas having a mass-to-charge ratio m/z of 17 released by heat treatment is greater than the amount of nitrogen oxide released by heat treatment.

19 Claims, 80 Drawing Sheets

(30) Foreign Application Priority Data

Nov. 22, 2013 (JP) .................................. 2013-242253
Dec. 3, 2013 (JP) .................................. 2013-250040

(51) Int. Cl.
  *H01L 21/28* (2006.01)
  *H01L 29/786* (2006.01)
  *H01L 29/24* (2006.01)

(52) U.S. Cl.
  CPC .............. *H01L 21/28* (2013.01); *H01L 29/24* (2013.01); *H01L 29/7869* (2013.01); *H01L 29/78606* (2013.01)

(56) References Cited

U.S. PATENT DOCUMENTS

| | | | |
|---|---|---|---|
| 5,744,864 | A | 4/1998 | Cillessen et al. |
| 5,966,594 | A | 10/1999 | Adachi et al. |
| 6,146,928 | A * | 11/2000 | Ishiguro ............... H01L 29/458 257/632 |
| 6,294,274 | B1 | 9/2001 | Kawazoe et al. |
| 6,563,174 | B2 | 5/2003 | Kawasaki et al. |
| 6,576,926 | B1 | 6/2003 | Yamazaki et al. |
| 6,727,522 | B1 | 4/2004 | Kawasaki et al. |
| 6,858,898 | B1 | 2/2005 | Hayakawa et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,164,152 | B2 | 4/2012 | Lee et al. |
| 8,207,531 | B2 | 6/2012 | Takahashi et al. |
| 8,274,079 | B2 | 9/2012 | Yamazaki |
| 8,373,237 | B2 | 2/2013 | Park et al. |
| 8,384,080 | B2 | 2/2013 | Taniguchi et al. |
| 8,476,719 | B2 | 7/2013 | Endo et al. |
| 8,536,579 | B2 * | 9/2013 | Sele ........................ H01L 27/12 257/291 |
| 8,557,641 | B2 | 10/2013 | Sasaki et al. |
| 8,669,556 | B2 | 3/2014 | Yamazaki et al. |
| 8,692,252 | B2 | 4/2014 | Takata et al. |
| 8,790,960 | B2 | 7/2014 | Yamazaki |
| 8,846,460 | B2 | 9/2014 | Sasaki et al. |
| 8,884,294 | B2 | 11/2014 | Yamazaki et al. |
| 8,901,556 | B2 | 12/2014 | Okazaki et al. |
| 9,263,589 | B2 | 2/2016 | Endo et al. |
| 9,276,129 | B2 | 3/2016 | Yamazaki et al. |
| 9,318,317 | B2 | 4/2016 | Okazaki et al. |
| 9,368,633 | B2 | 6/2016 | Yamazaki et al. |
| 9,570,626 | B2 | 2/2017 | Okazaki et al. |
| 10,062,570 | B2 | 8/2018 | Sasaki et al. |
| 10,096,719 | B2 | 10/2018 | Okazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054057 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0206332 | A1 | 8/2009 | Son et al. |
| 2009/0278122 | A1 | 11/2009 | Hosono et al. |
| 2009/0280600 | A1 | 11/2009 | Hosono et al. |
| 2010/0051935 | A1 | 3/2010 | Lee et al. |
| 2010/0051941 | A1 | 3/2010 | Tanaka |
| 2010/0065844 | A1 | 3/2010 | Tokunaga |

(56) References Cited

U.S. PATENT DOCUMENTS

| | | | |
|---|---|---|---|
| 2010/0092800 | A1 | 4/2010 | Itagaki et al. |
| 2010/0109002 | A1 | 5/2010 | Itagaki et al. |
| 2010/0244029 | A1 | 9/2010 | Yamazaki et al. |
| 2011/0049509 | A1 | 3/2011 | Takahashi et al. |
| 2011/0121887 | A1 | 5/2011 | Kato et al. |
| 2011/0187410 | A1 | 8/2011 | Kato et al. |
| 2011/0204368 | A1 | 8/2011 | Tsubuku et al. |
| 2011/0269266 | A1 | 11/2011 | Yamazaki |
| 2011/0303913 | A1 | 12/2011 | Yamazaki et al. |
| 2012/0063204 | A1 | 3/2012 | Kamata |
| 2012/0064665 | A1 | 3/2012 | Yamazaki |
| 2012/0205651 | A1 | 8/2012 | Lee et al. |
| 2012/0211745 | A1 | 8/2012 | Ueda et al. |
| 2013/0264563 | A1 | 10/2013 | Okazaki et al. |
| 2013/0270549 | A1 | 10/2013 | Okazaki et al. |
| 2013/0270550 | A1 | 10/2013 | Okazaki et al. |
| 2014/0030845 | A1 | 1/2014 | Koezuka et al. |
| 2014/0308777 | A1 | 10/2014 | Yamazaki |
| 2014/0339542 | A1 | 11/2014 | Yamazaki et al. |
| 2015/0053971 | A1 | 2/2015 | Miyanaga et al. |
| 2015/0123090 | A1* | 5/2015 | Musiol ................... C23C 14/12 257/40 |
| 2016/0126241 | A1* | 5/2016 | Ellinger .............. H01L 27/0883 257/43 |
| 2016/0284861 | A1 | 9/2016 | Yamazaki et al. |
| 2017/0243759 | A1 | 8/2017 | Jintyou et al. |
| 2018/0366326 | A1 | 12/2018 | Sasaki et al. |
| 2019/0019894 | A1 | 1/2019 | Okazaki et al. |
| 2019/0348285 | A1 | 11/2019 | Sasaki et al. |

FOREIGN PATENT DOCUMENTS

| | | |
|---|---|---|
| EP | 3573108 A | 11/2019 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-009129 A | 1/1990 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073562 A | 3/2007 |
| JP | 2007-096055 A | 4/2007 |
| JP | 2007-123861 A | 5/2007 |
| JP | 2009-224479 A | 10/2009 |
| JP | 2010-062233 A | 3/2010 |
| JP | 2011-249788 A | 12/2011 |
| JP | 2012-009836 A | 1/2012 |
| JP | 2012-009838 A | 1/2012 |
| JP | 2012-019207 A | 1/2012 |
| JP | 2013-035740 A | 2/2013 |
| JP | 2013-080769 A | 5/2013 |
| TW | 201205684 | 2/2012 |
| WO | WO-2004/114391 | 12/2004 |
| WO | WO-2011/001879 | 1/2011 |
| WO | WO-2011/135987 | 11/2011 |
| WO | WO-2011/145467 | 11/2011 |
| WO | WO-2011/145632 | 11/2011 |
| WO | WO-2011/155502 | 12/2011 |
| WO | WO-2012/081591 | 6/2012 |
| WO | WO-2013/150927 | 10/2013 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops. Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivatin Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposiun Digest of Technical Papers, May 20, 2008, vol. 39, pp. 1277-1280.
Janotti.A et al., "Oxygen Vacancies in ZnO", Appl, Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Phys. Lett. (Applied Physics Letters) , Sep. 1, 2003, vol. 83, No. 9, pp. 1755-1757.

Internatonal Search Report (Application No. PCT/JP2014/077117) dated Jan. 6, 2015.

Written Opinion (Application No. PCT/JP2014/077117) dated Jan. 6, 2015.

Indian Office Action (Application No. 201617013940) dated Apr. 29, 2020.

\* cited by examiner

FIG. 12
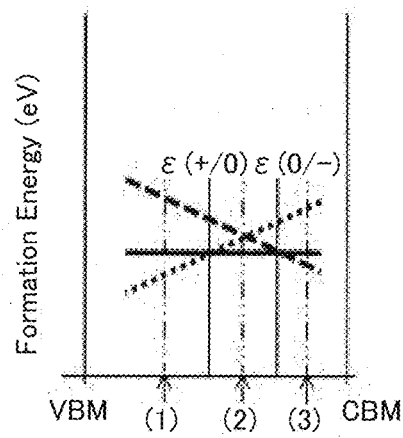
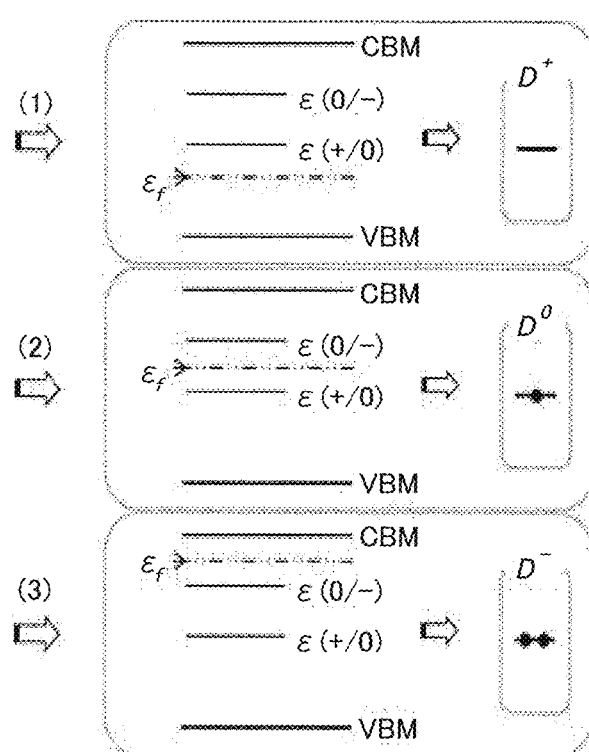

|  | charge : +1 | charge:neutral | charge : −1 |
|---|---|---|---|
| d(N-O) [Å] | 1.109(1.154) | 1.178(1.197) | 1.241(1.236) |
| ∠O-N-O [°] | 178.81(180) | 133.65(134) | 110.34(115) |

※ ( ) is the reference value of $NO_2$ molecule in a gaseous state.

|  | charge:+1 | charge:neutral | charge:-1 |
|---|---|---|---|
| d(N-N)[Å] | 1.191 | 1.105(1.126) | 1.163 |
| d(N-O)[Å] | 1.154 | 1.175(1.186) | 1.310 |
| ∠N-N-O[°] | 174.52 | 172.81(180) | 130.71 |

※ ( ) is the reference value of $N_2O$ molecule in a gaseous state.

$(CO)_O$ defect structure

FIG. 51A  Sample A1
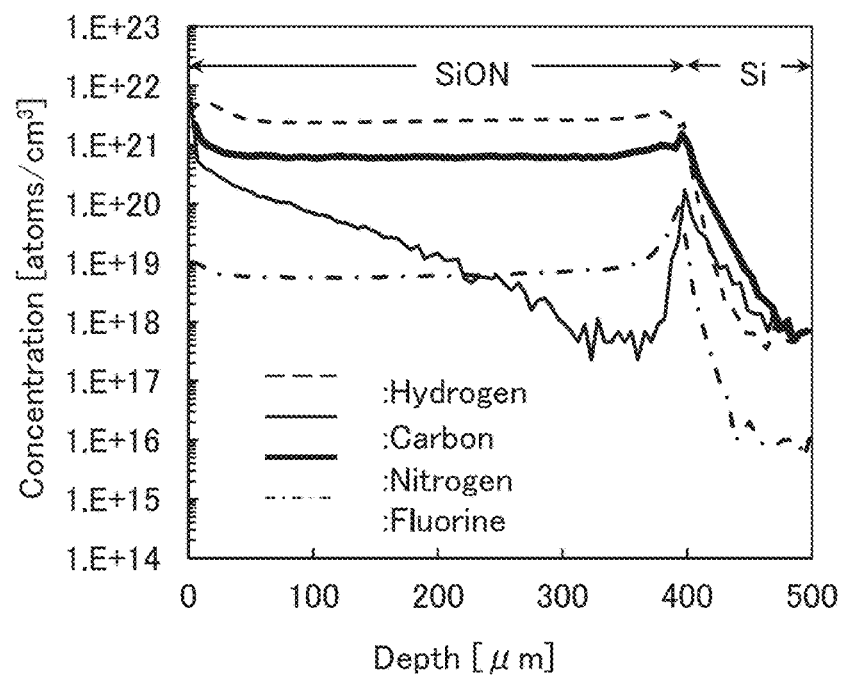
FIG. 51B  Sample A2
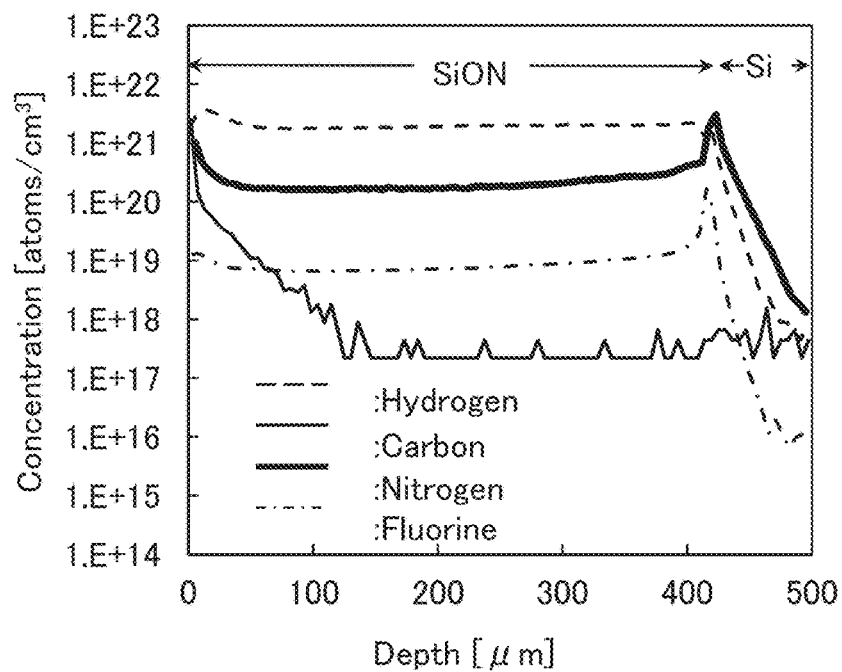

FIG. 54A    Sample A6
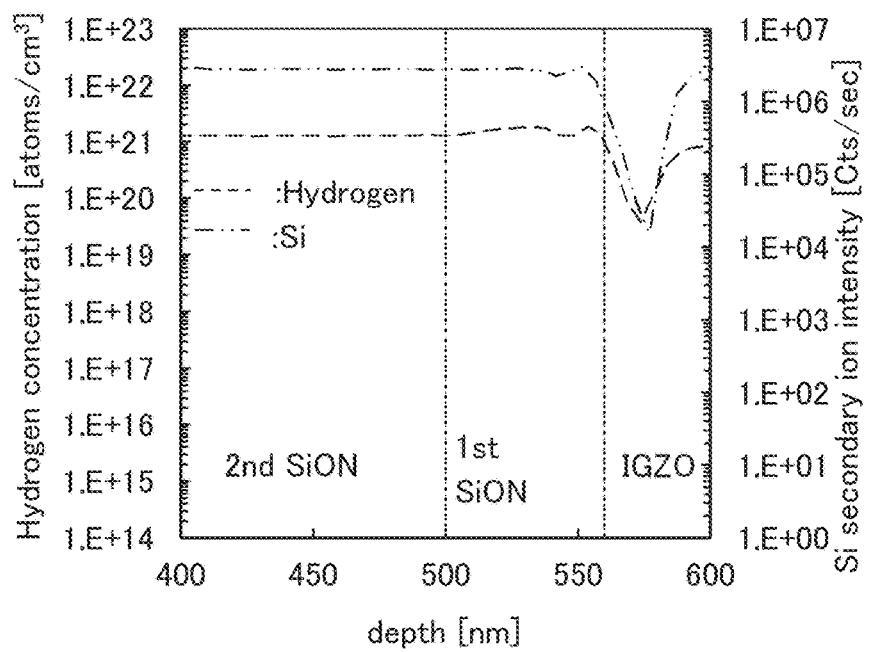
FIG. 54B    Sample A7
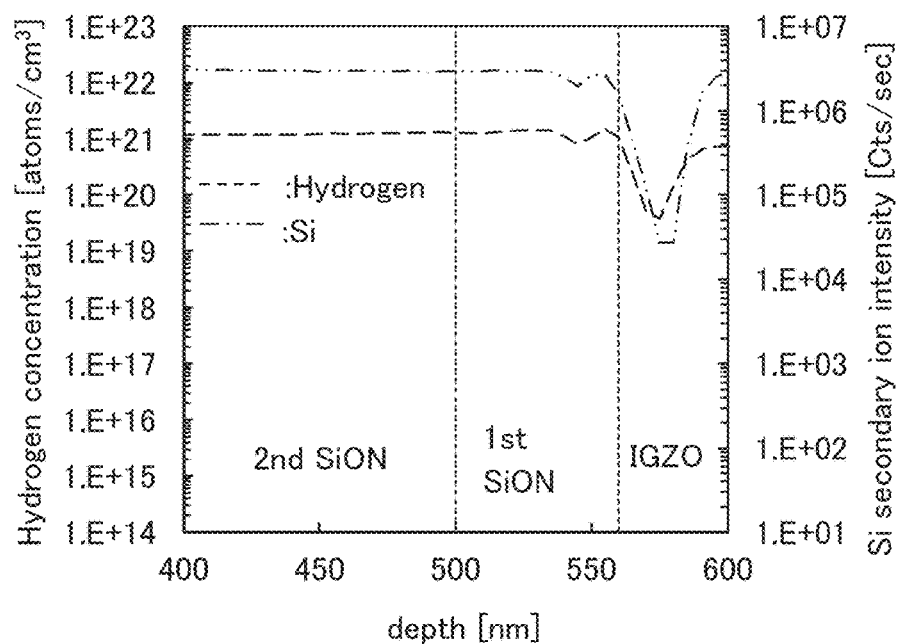

FIG. 55A    Sample A6
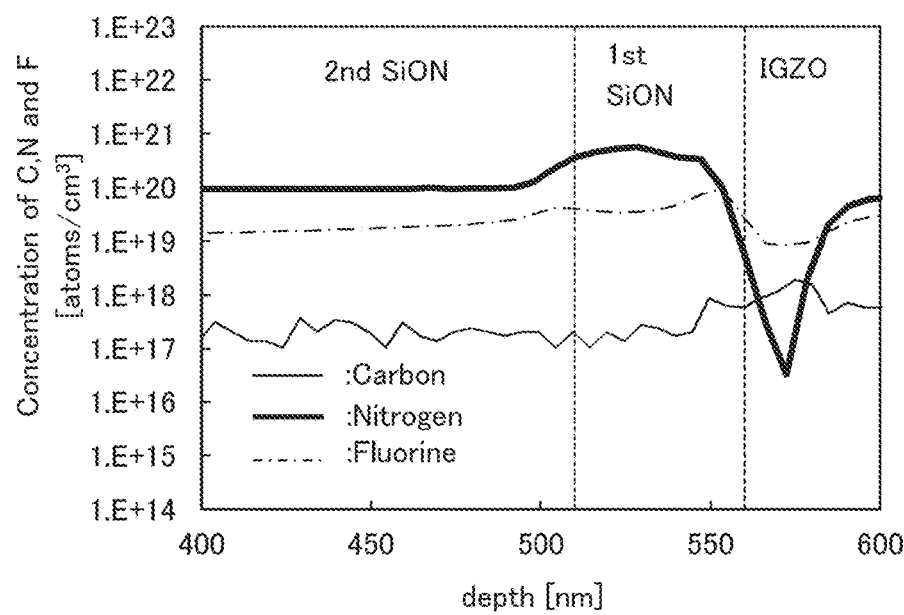
FIG. 55B    Sample A7
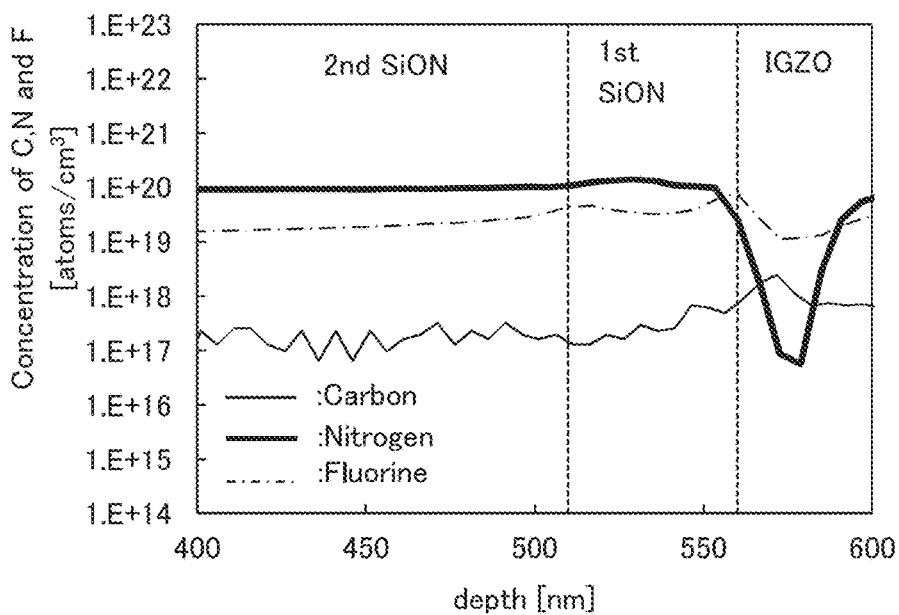

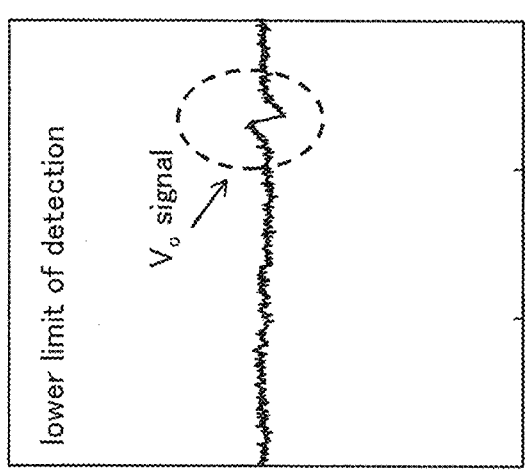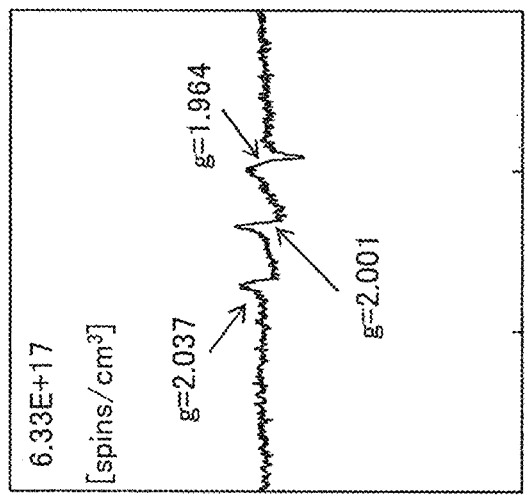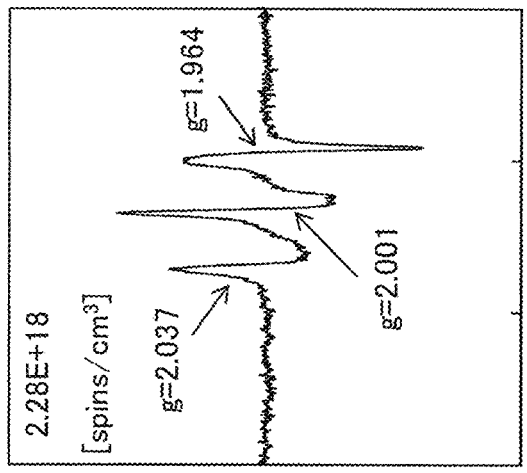

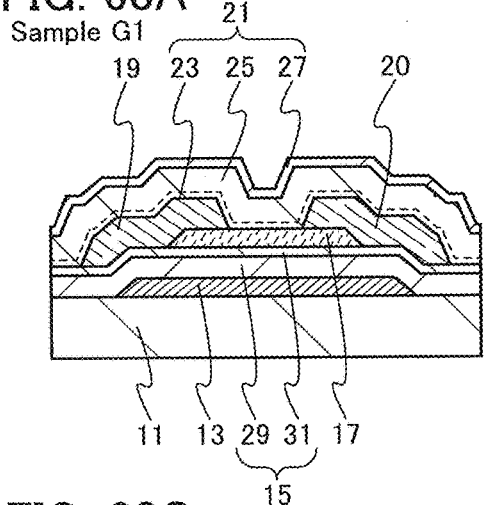
FIG. 63A Sample G1
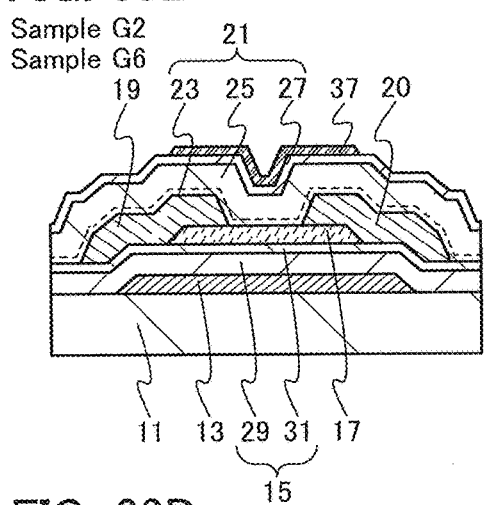
FIG. 63B Sample G2 Sample G6
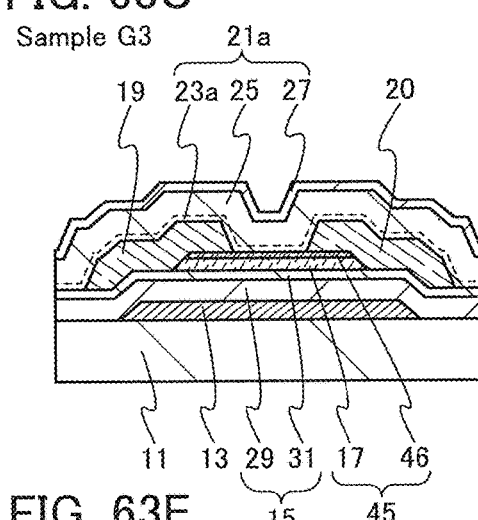
FIG. 63C Sample G3
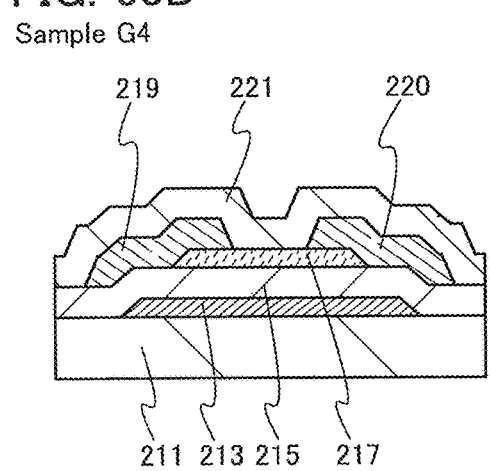
FIG. 63D Sample G4
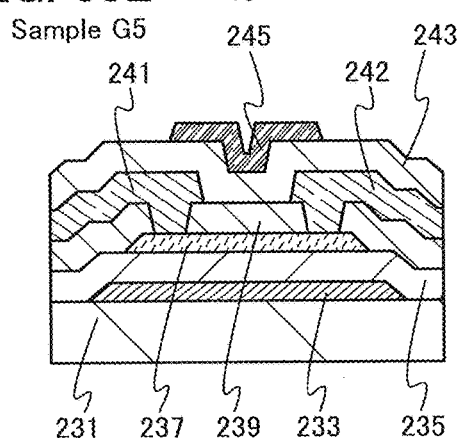
FIG. 63E Sample G5

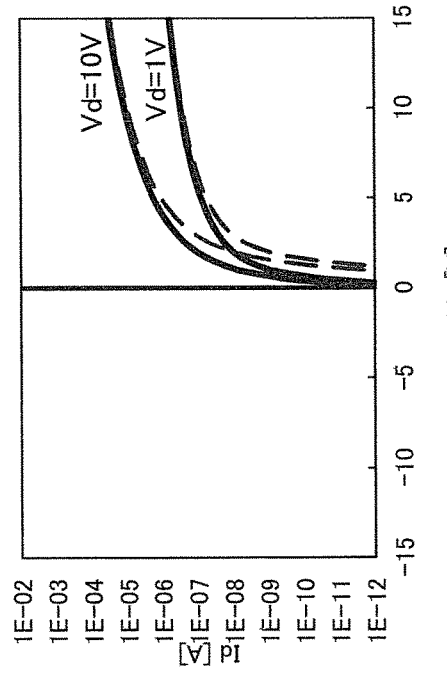
FIG. 64B  Sample G3
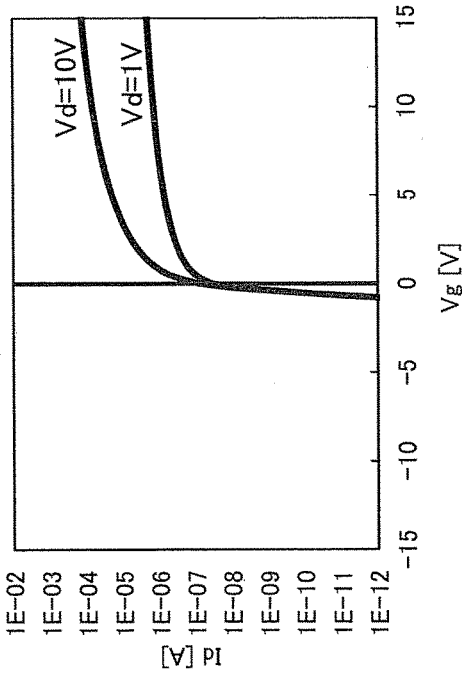
FIG. 64D  Sample G5
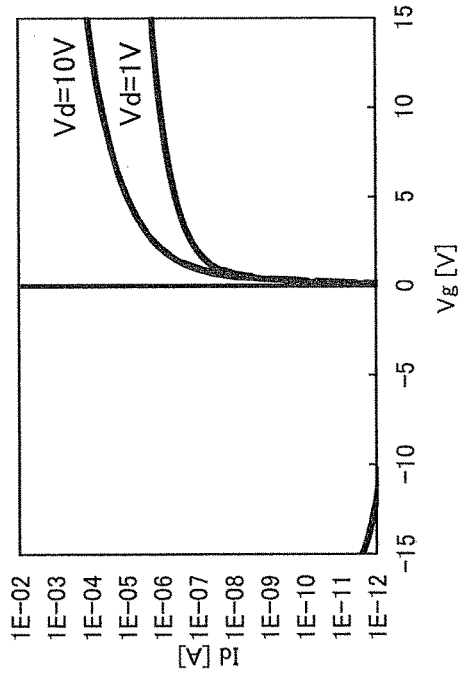
FIG. 64A  Sample G2
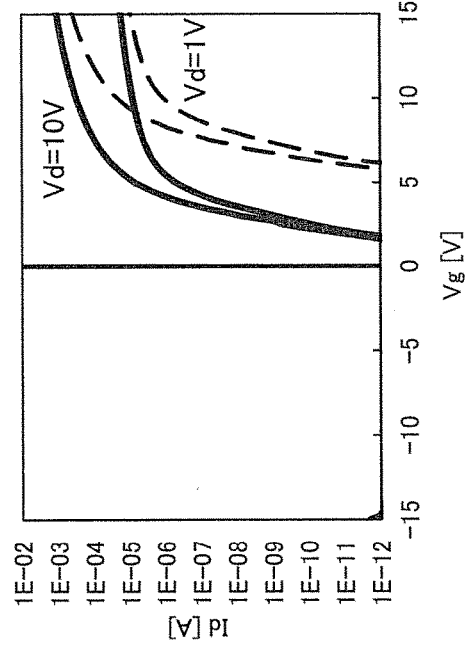
FIG. 64C  Sample G4

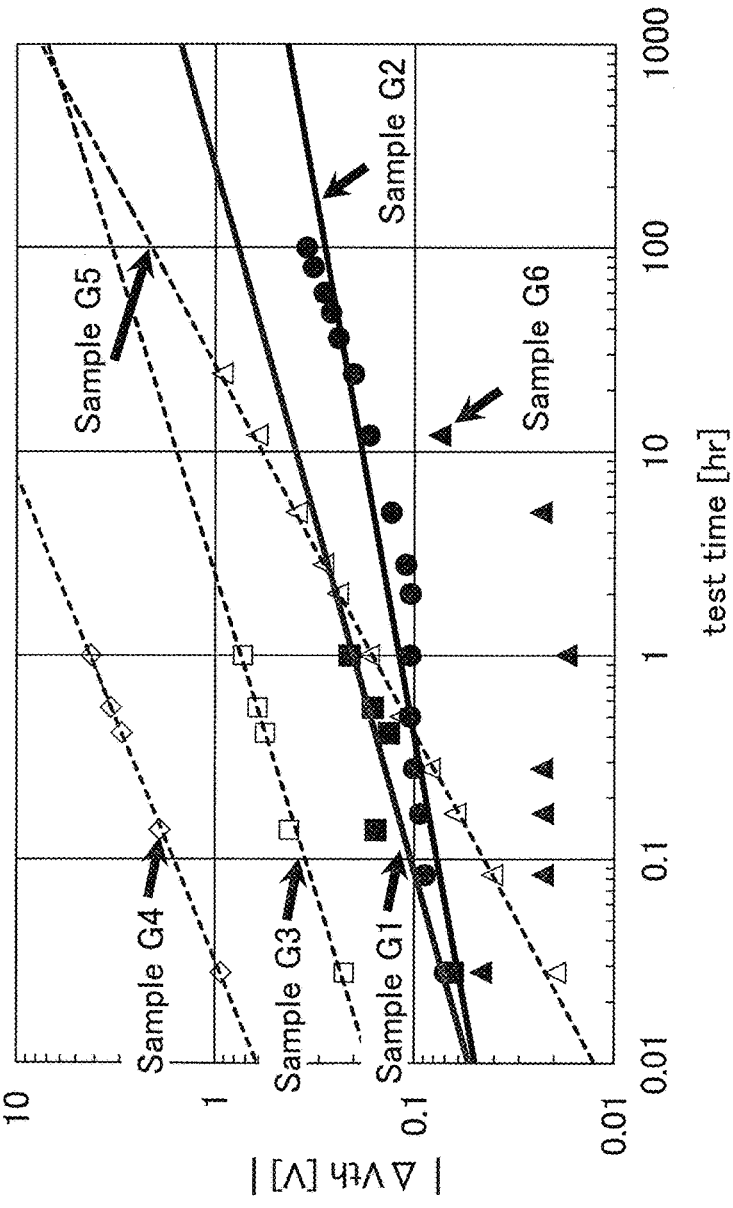

G2  single layer OS, dual GE, channel etch type FET
G4  conventional passivation,
    single layer OS, single GE, channel etch type FET
G5  coventional passivation,
    single layer OS, dual GE, channel stop type FET
G6  single layer OS, dual GE, channel etch type FET FIG. 67A  SiON quantification
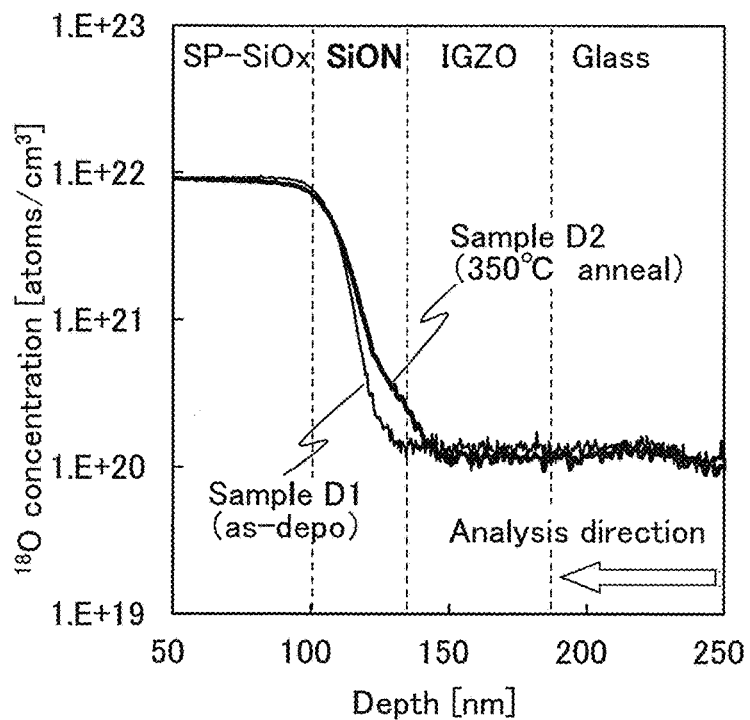
FIG. 67B  IGZO quantification
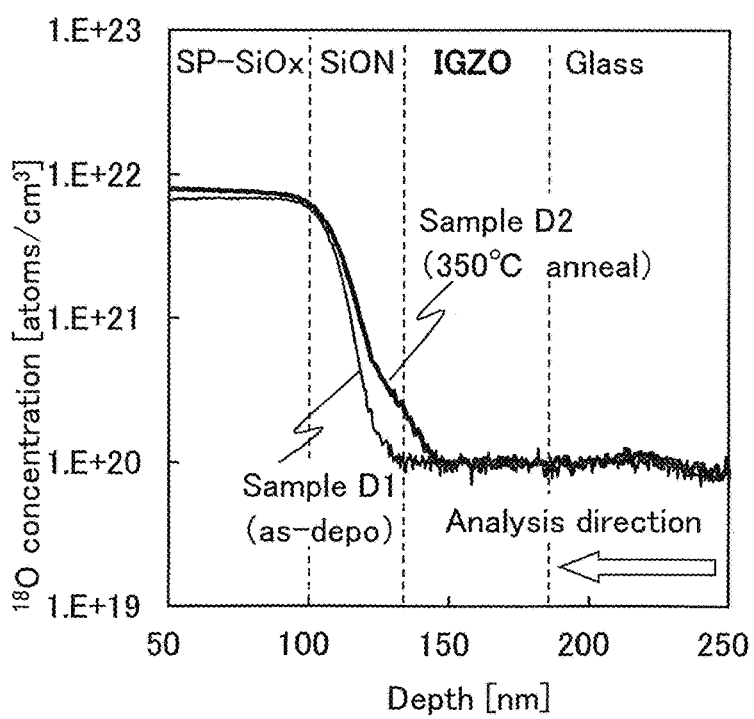

CAAC-OS nc-OS

□ Proportion of non-CAAC    ☰ Proportion of CAAC

As-sputtered

After heat treatment at 450 °C

FIG. 74A
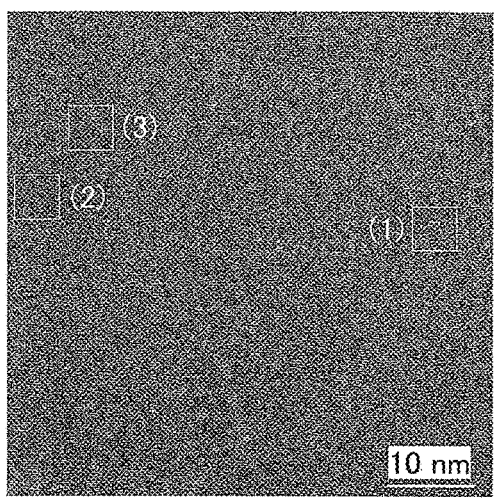
FIG. 74B  FIG. 74C  FIG. 74D
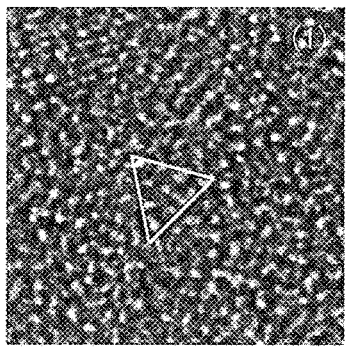 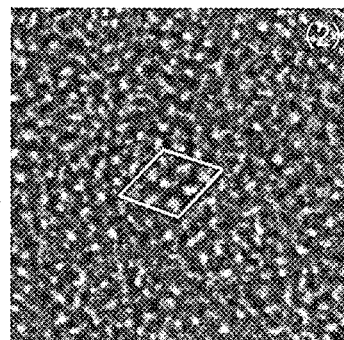 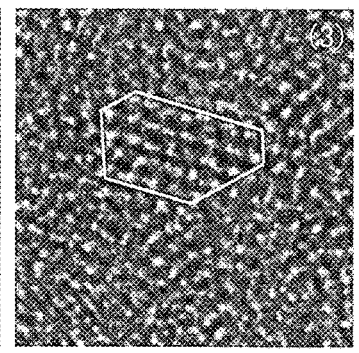

Sample irradiated with electron beam parallel to sample surface

Sample irradiated with electron beam perpendicular to sample surface

Cross-sectional view of pellet

Top view of pellet

SEMICONDUCTOR DEVICE

TECHNICAL FIELD

The present invention relates to an object, a method, or a manufacturing method. In addition, the present invention relates to a process, a machine, manufacture, or a composition of matter. In particular, the present invention relates to a semiconductor device, a display device, a light-emitting device, a power storage device, a storage device, a driving method thereof, or a manufacturing method thereof. Furthermore, in particular, the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

It has been pointed out that hydrogen is a supply source of carriers particularly in an oxide semiconductor. Therefore, some measures need to be taken to prevent hydrogen from entering the oxide semiconductor at the time of forming the oxide semiconductor. Further, variation in a threshold voltage is suppressed by reducing the amount of hydrogen contained in the oxide semiconductor film or a gate insulating film in contact with the oxide semiconductor (see Patent Document 3).

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2009-224479

DISCLOSURE OF INVENTION

However, similarly to hydrogen, nitrogen becomes a source for supplying carriers. Thus, when a large amount of nitrogen is contained in a film in contact with an oxide semiconductor film, the electrical characteristics, for a typical example, the threshold voltage, of a transistor including the oxide semiconductor film is changed. Further, there is a problem in that electrical characteristics vary among the transistors.

One object of one embodiment of the present invention is to suppress a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a gate electrode over an insulating surface, an oxide semiconductor film overlapping with the gate electrode, a gate insulating film which is between the gate electrode and the oxide semiconductor film and is in contact with a surface of the oxide semiconductor film, a protective film in contact with an opposite surface of the surface of the oxide semiconductor film, and a pair of electrodes in contact with the oxide semiconductor film. The gate insulating film or the protective film has a region where the amount of gas having a mass-to-charge ratio m/z of 17 released by heat treatment is greater than the amount of nitrogen oxide released by heat treatment.

One embodiment of the present invention is a semiconductor device including a transistor having a gate electrode over an insulating surface, an oxide semiconductor film overlapping with the gate electrode, a gate insulating film which is between the gate electrode and the oxide semiconductor film and is in contact with a surface of the oxide semiconductor film, a protective film in contact with an opposite surface of the surface of the oxide semiconductor film, and a pair of electrodes in contact with the oxide semiconductor film. In a log-log graph showing the amount of change in threshold voltage of the transistor with respect to stress time, a space of a logarithmic scale on a lateral axis is equal to that on a longitudinal axis, an angle between a power approximation line of the absolute values of the amount of change in threshold voltage and a straight line indicating that the absolute values of the amount of change in the threshold voltage is 0 V is greater than or equal to −3° and less than 20°, and the absolute value of the amount of change in the threshold voltage when the stress time is 0.1 hours is smaller than 0.3 V. Note that the stress time means a time during which a load such as voltage or temperature is applied to the transistor.

One embodiment of the present invention is a semiconductor device including a transistor having a gate electrode over an insulating surface, an oxide semiconductor film overlapping with the gate electrode, a gate insulating film which is between the gate electrode and the oxide semiconductor film and is in contact with a surface of the oxide semiconductor film, a protective film in contact with an opposite surface of the surface of the oxide semiconductor film, and a pair of electrodes in contact with the oxide semiconductor film. In a graph showing the amount of change in the threshold voltage of the transistor with respect to stress time, an index of a power approximation line of the amount of change in threshold voltage is greater than or equal to −0.1 and less than or equal to 0.3, and the amount of change in the threshold voltage when the stress time is 0.1 hours is smaller than 0.3 V.

The gate insulating film or the protective film may have a region or a portion whose spin density measured by electron spin resonance (ESR) spectroscopy is less than $1\times10^{18}$ spins/cm$^3$, preferably greater than or equal to $1\times10^{17}$ spins/cm$^3$ and less than $1\times10^{18}$ spins/cm$^3$.

The gate insulating film or the protective film has a region or a portion where, in an electron spin resonance spectrum, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by measurement using an X-band are each approximately 5 mT.

In the electron spin resonance spectrum of the gate insulating film or the protective film, a signal attributed to nitrogen oxide may be observed. The nitrogen oxide may contain nitrogen monoxide or nitrogen dioxide.

The protective film, the oxide semiconductor film, and the gate insulating film may be between the insulating surface and the gate electrode. Alternatively, the gate electrode and the gate insulating film may be between the insulating surface and the oxide semiconductor film.

The pair of electrodes may be between the oxide semiconductor film and the protective film. Alternatively, the pair of electrodes may be between the oxide semiconductor film and the gate insulating film.

One embodiment of the present invention can suppress a change in electrical characteristics of a transistor including an oxide semiconductor film and improve reliability. One embodiment of the present invention can provide a semiconductor device with less power consumption. One embodiment of the present invention can provide a novel semiconductor device or the like. Note that the descriptions of these effects do not disturb the existence of other effects. In one embodiment of the present invention, there is no need to obtain all the effects. Other effects will be apparent from and can be derived from the description of the specification, the drawings, the claims, and the like.

BRIEF DESCRIPTION OF DRAWINGS

FIG. 12 illustrates a change in the Fermi level and a change in the charge states of defects.

FIGS. 51A and 51B show SIMS analysis results.

FIGS. 54A and 54B show SIMS analysis results.

FIGS. 55A and 55B show SIMS analysis results.

FIGS. 57A to 57C show ESR measurement results.

FIGS. 63A to 63E are cross-sectional views each illustrating one embodiment of a transistor.

FIGS. 64A to 64D each shows $V_g$-$I_d$ characteristics of a transistor.

FIG. 65 shows the absolute values of the amounts of change in the threshold voltages of transistors after a BT stress test.

FIGS. 67A and 67B show results of SIMS analysis.

FIGS. 74A to 74D are Cs-corrected high-resolution TEM images of a plane of a CAAC-OS.

BEST MODE FOR CARRYING OUT THE INVENTION

Figure 1A:
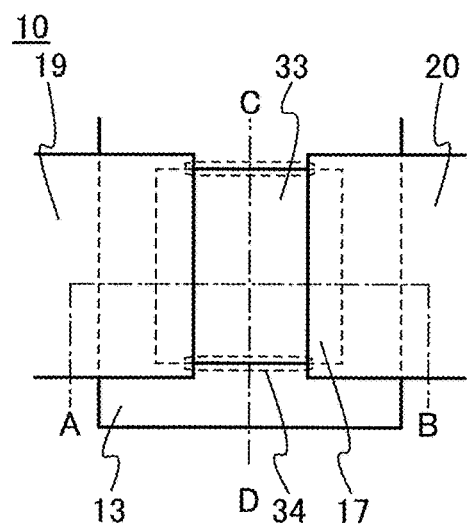
FIGS. 1A to 1C illustrate one embodiment of a transistor.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the channel length refers to, for example, a distance between a source (source region or source electrode) and a drain (drain region or drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where an oxide semiconductor film (or a portion where a current flows in an oxide semiconductor film when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of an oxide semiconductor film is known. Therefore, in the case where the shape of an oxide semiconductor film is not known accurately, it is difficult to measure an effective channel width accurately.

Therefore, in this specification, in a top view of a transistor, an apparent channel width that is a length of a portion where a source and a drain face each other in a region where an oxide semiconductor film and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

(Embodiment 1)

In this embodiment, a semiconductor device of one embodiment of the present invention and a method for manufacturing the semiconductor device are described with reference to drawings. A transistor 10 described in this embodiment has a bottom-gate structure.

<1. Structure of Transistor>

Figure 1C:
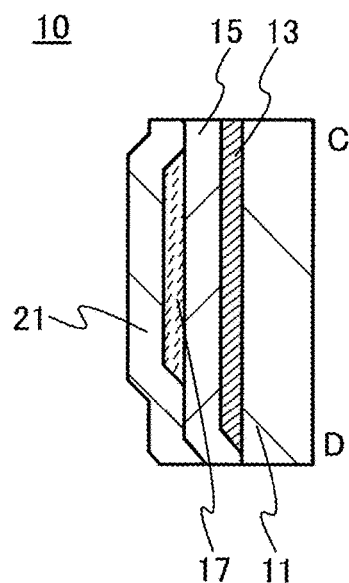
Figure 1B:
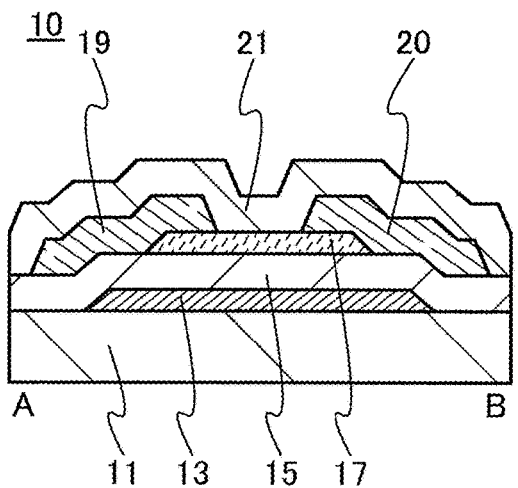

FIGS. 1A to 1C are a top view and cross-sectional views of the transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a gate insulating film 15, a protective film 21, and the like are omitted for simplicity.

The transistor 10 illustrated in FIGS. 1A to 1C includes a gate electrode 13 over the substrate 11, the gate insulating film 15 over the substrate 11 and the gate electrode 13, an oxide semiconductor film 17 overlapping with the gate electrode 13 with the gate insulating film 15 therebetween, and a pair of electrodes 19 and 20 in contact with the oxide semiconductor film 17. The protective film 21 is formed over the gate insulating film 15, the oxide semiconductor film 17, and the pair of electrodes 19 and 20.

The protective film 21 is in contact with a surface of the oxide semiconductor film 17 that is an opposite side of a surface in contact with the gate insulating film 15. Accordingly, the protective film 21 has a function of protecting a region (hereinafter referred to as a back channel region) of the oxide semiconductor film 17 that is on the opposite side of a region where a channel is formed.

In this embodiment, a film in contact with the oxide semiconductor film 17, typically, at least one of the gate insulating film 15 and the protective film 21 is an oxide insulating film containing nitrogen and having a small number of defects.

Typical examples of the oxide insulating film containing nitrogen and having a small number of defects include a silicon oxynitride film and an aluminum oxynitride film. Note that a "silicon oxynitride film" or an "aluminum oxynitride film" refers to a film that contains more oxygen than nitrogen, and a "silicon nitride oxide film" or an "aluminum nitride oxide film" refers to a film that contains more nitrogen than oxygen.

The oxide insulating film containing nitrogen and having a small number of defects has a region or a portion where the amount of gas having a mass-to-charge ratio m/z of 17 released by heat treatment is greater than the amount of nitrogen oxide ($NO_x$, where x is greater than or equal to 0 and less than or equal to 2, preferably greater than or equal to 1 and less than or equal to 2) released by heat treatment. Typical examples of nitrogen oxide include nitrogen monoxide and nitrogen dioxide. Alternatively, the oxide insulating film containing nitrogen and having a small number of defects has a region or a portion where the amount of gas having a mass-to-charge ratio m/z of 17 released by heat treatment is greater than the amount of gas having a mass-to-charge ratio m/z of 30 released by heat treatment. Alternatively, the oxide insulating film containing nitrogen and having a small number of defects has a region or a portion where the amount of gas having a mass-to-charge ratio m/z of 17 released by heat treatment is greater than the amount of gas having a mass-to-charge ratio m/z of 46 released by heat treatment. Alternatively, the oxide insulating film containing nitrogen and having a small number of defects has a region or a portion where the amount of gas having a mass-to-charge ratio m/z of 17 released by heat treatment is greater than the sum of the amount of gas having a mass-to-charge ratio m/z of 30 and the amount of gas having a mass-to-charge ratio m/z of 46 released by heat treatment. Note that in this specification, the amount of gas released by heat treatment is, for example, the amount of gas released by heat treatment with which the surface temperature of a film becomes higher than or equal to 50° C. and lower than or equal to 650° C., preferably higher than or equal to 50° C. and lower than or equal to 550° C.

Further alternatively, the oxide insulating film containing nitrogen and having a small number of defects has a region or a portion where the amount of gas having a mass-to-charge ratio m/z of 30 released by heat treatment is less than or equal to the detection limit and where the amount of gas having a mass-to-charge ratio m/z of 17 released by heat treatment is greater than or equal to $1\times10^{18}$ molecules/cm$^3$ and less than or equal to $5\times10^{19}$ molecules/cm$^3$. Alternatively, the oxide insulating film containing nitrogen and having a small number of defects has a region or a portion where the amount of gas having a mass-to-charge ratio m/z of 46 released by heat treatment is less than or equal to the detection limit and where the amount of gas having a mass-to-charge ratio m/z of 17 released by heat treatment is greater than or equal to $1\times10^{18}$ molecules/cm$^3$ and less than or equal to $5\times10^{19}$ molecules/cm$^3$. Alternatively, the oxide insulating film containing nitrogen and having a small number of defects has a region or a portion where the amount of gas having a mass-to-charge ratio m/z of 30 released by heat treatment is less than or equal to the detection limit, where the amount of gas having a mass-to-charge ratio m/z of 46 released by heat treatment is less than or equal to the detection limit, and where the amount of gas having a mass-to-charge ratio m/z of 17 released by heat treatment is greater than or equal to $1\times10^{18}$ molecules/cm$^3$ and less than or equal to $5\times10^{19}$ molecules/cm$^3$.

A typical example of the gas having a mass-to-charge ratio m/z of 30 includes nitrogen monoxide. A typical example of the gas having a mass-to-charge ratio m/z of 17 includes ammonia. A typical example of the gas having a mass-to-charge ratio m/z of 46 includes nitrogen dioxide. The amount of gas released by heat treatment is measured by thermal desorption spectroscopy (TDS), for example.

A method for measuring the amount of released gas by TDS analysis is described below. Here, the measurement method of the amount of molecules x released is described as an example.

The amount of a released gas in TDS analysis is proportional to the integral value of a spectrum obtained by the analysis. Therefore, the amount of a released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the amount of molecules x ($N_x$) released from an insulating film can be found according to Formula 1 with the TDS analysis results of a silicon wafer containing hydrogen at a predetermined density which is the standard sample and the TDS analysis results of the insulating film. Note that all spectra at mass-to-charge ratios which are obtained by the TDS analysis here are assumed to originate from the molecules x.

$$N_{O2}=N_{H2}/S_{H2}\times S_x\times \alpha_x \quad \text{[Formula 1]}$$

Note that $N_{H2}$ is the value obtained by conversion of the amount of hydrogen molecules released from the standard sample into density, and $S_{H2}$ is the integral value of a spectrum when the standard sample is subjected to TDS analysis. Here, the reference value of the standard sample is set to $N_{H2}/S_{H2}$. The value $S_x$ is the integral value of a spectrum when the insulating film is subjected to TDS analysis. Note that $\alpha_x$(x is a kind of molecule) is a coefficient affecting the intensity of the spectrum in the TDS analysis and depends on the kind of molecule. For details of Formula 1, refer to Japanese Published Patent Application No. H6-275697. The amount of molecules x released from the above insulating film is measured with a thermal desorption spectroscopy apparatus produced by ESCO Ltd., EMD$^-$WA1000S/W using a silicon wafer containing hydrogen atoms at $9.62\times10^{16}$ atoms/cm$^2$ as the standard sample.

Further, in Formula 1, an integral value of spectrum when the amount of released nitrogen monoxide, nitrogen dioxide, or ammonia is measured by the TDS analysis is substituted into $S_x$, whereby the amount of released nitrogen monoxide, nitrogen dioxide, or ammonia can be obtained.

Note that in the TDS analysis, the detection limit of the amount of released gas having a mass-to-charge ratio m/z of 30 (nitrogen monoxide) is $1\times10^{17}$ molecules/cm$^3$, $5\times10^{16}$ molecules/cm$^3$, $4\times10^{16}$ molecules/cm$^3$, or $1\times10^{16}$ molecules/cm$^3$.

In the TDS analysis, the detection limit of the amount of released gas having a mass-to-charge ratio m/z of 46 (nitrogen dioxide) is $1\times10^{17}$ molecules/cm$^3$, $5\times10^{16}$ molecules/cm$^3$, $4\times10^{16}$ molecules/cm$^3$, or $1\times10^{16}$ molecules/cm$^3$.

In the TDS analysis, the detection limit of the amount of released gas having a mass-to-charge ratio m/z of 17 (ammonia) is $5\times10^{17}$ molecules/cm$^3$ or $1\times10^{17}$ molecules/cm$^3$.

In the case where a sample contains water, the spectrum of the sample is divided into three fragments: mass-to-charge ratios of 18, 17, and 16. Note that fragmentation pattern coefficients can be obtained from the intensity ratio of the mass-to-charge ratios. The fragmentation pattern coefficients of mass-to-charge ratios of 18, 17, and 16 are 100, 23, and 1, respectively. This means that in the spectrum for a mass-to-charge ratio of 17, the intensity of the sum of the amounts of released ammonia and water is observed. Thus, the amount of ammonia released can be obtained by subtracting 0.23 times the amount of released gas having a mass-to-charge ratio m/z of 18 from the amount of released gas having a mass-to-charge ratio m/z of 17 in TDS analysis. Note that the amount of released gas having a mass-to-charge ratio m/z of 17 described in this specification means the amount of only ammonia released and does not include the amount of water released.

Note that when an oxide insulating film where the amount of ammonia released by heat treatment is greater than the amount of nitrogen oxide released by heat treatment (such an oxide insulating film is typified by an oxide insulating film where the amount of released gas having a mass-to-charge ratio m/z of 17 is greater than or equal to $1\times10^{18}$ molecules/cm$^3$ and less than or equal to $5\times10^{19}$ molecules/cm$^3$) is used as the protective film 21, Reaction Formulae (A-1) and (A-2) are satisfied and nitrogen oxide is released as a nitrogen gas by heat treatment in the manufacturing process. As a result, the nitrogen concentration and the content of nitrogen oxide in the protective film 21 can be reduced. Furthermore, carrier traps at the interface between the gate insulating film 15 or the protective film 21 and the oxide semiconductor film 17 can be reduced. In addition, a change in the threshold voltage of the transistor included in the semiconductor device can be reduced, which leads to a reduction in change in the electrical characteristics of the transistor.

$$NO + 4NH_3 + O_2 \rightarrow 4N_2 + 6H_2O \quad (A\text{-}1)$$

$$2NO_2 + 4NH_3 + O_2 \rightarrow 3N_2 + 6H_2O \quad (A\text{-}2)$$

In an ESR spectrum at 100 K or lower of the oxide insulating film containing nitrogen and having a small number of defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

At least one of the gate insulating film 15 and the protective film 21 preferably has a nitrogen concentration measured by secondary ion mass spectrometry (SIMS) of lower than or equal to $6 \times 10^{20}$ atoms/cm$^3$. In that case, nitrogen oxide is unlikely to be generated in at least one of the gate insulating film 15 and the protective film 21, so that the carrier trap at the interface between the oxide semiconductor film 17 and the gate insulating film 15 or the interface between the oxide semiconductor film 17 and the protective film 21 can be inhibited. Furthermore, a change in the threshold voltage of the transistor included in the semiconductor device can be reduced, which leads to a reduced change in the electrical characteristics of the transistor.

Figure 2:
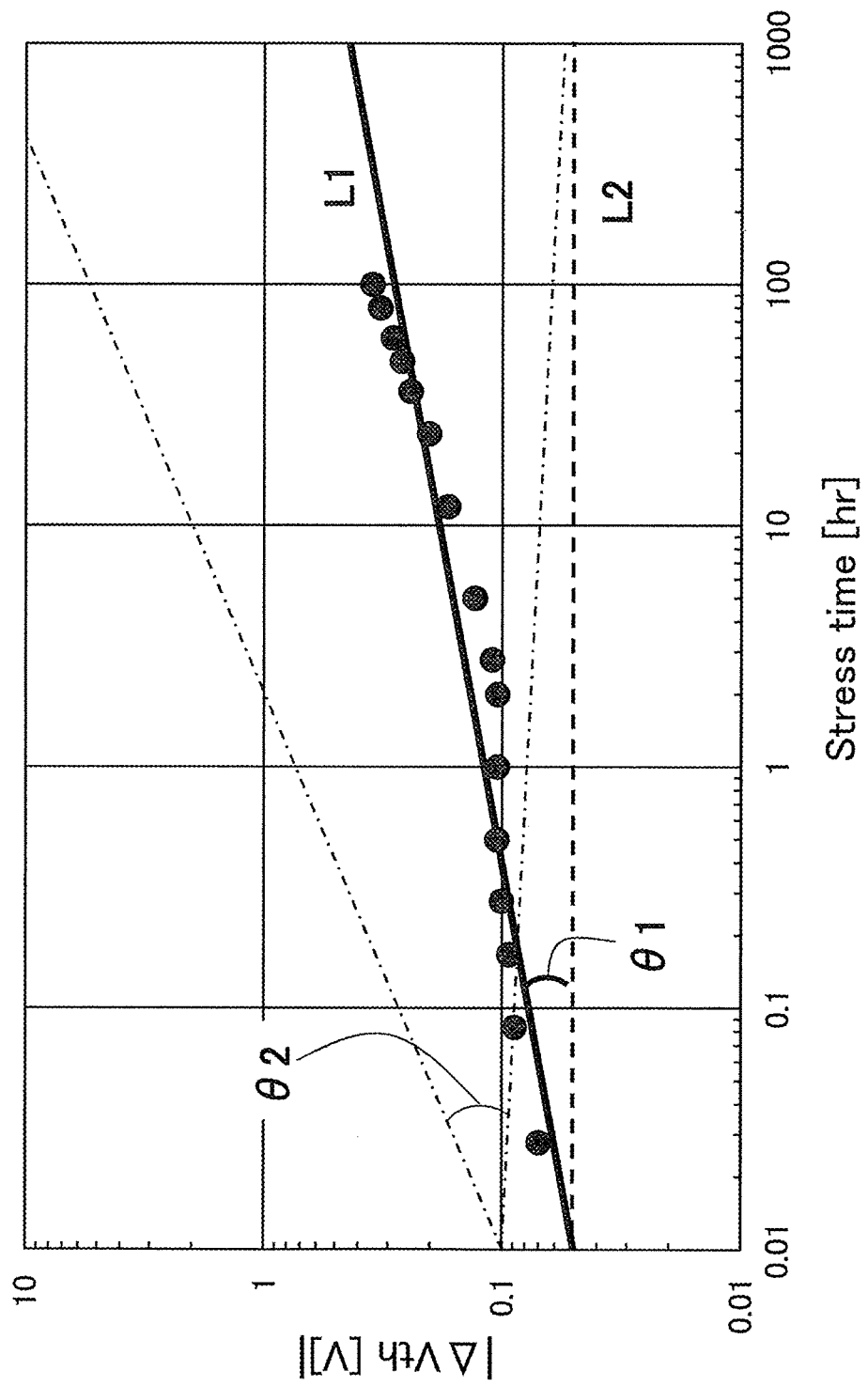
FIG. 2 is a graph showing the absolute values of the amount of change in the threshold voltage of a transistor after a BT stress test.

FIG. 2 shows a power approximation line L1 indicating the absolute values of the amount of change in the threshold voltage ($|\Delta V_{th}|$) of the transistor 10 with respect to test time (hereinafter, also referred to as stress time) between before and after a gate BT stress test in which positive voltage or negative voltage is applied to the gate of the transistor 10. In the transistor 10, the gate insulating film 15 or the protective film 21 includes an oxide insulating film containing nitrogen and having a small number of defects. When test time (stress time) and the amount of change in the threshold voltage are plotted on a graph, the plotted values can be approximated by a power approximation line. The power approximation line is a straight line in a log-log graph. Note that in a log-log graph, the index of a power approximation line corresponds to the slope of a straight line. FIG. 2 is a log-log graph. The lateral axis indicates a logarithm of stress time and the longitudinal axis indicates a logarithm of the absolute value of the amount of change in the threshold voltage. In the case of using a display device as a semiconductor device, for example, the following conditions can be used for the stress test: the maximum temperature is 60° C.; the maximum driving voltage is 30 V; and the stress is applied for a given period of time e.g., 100 hours).

A measurement method of the gate BT stress test is described. First, substrate temperature is kept constant at given temperature (hereinafter, referred to as stress temperature) to measure the initial $V_g$-$I_d$ characteristics of the transistor.

Next, while the substrate temperature is kept at stress temperature, the pair of electrodes serving as a source electrode and a drain electrode of the transistor is set at the same potential and the gate electrode is supplied with a potential different from that of the pair of electrodes for a certain period of time (hereinafter referred to as stress time). Then, the $V_g$-$I_d$ characteristics of the transistor are measured while the substrate temperature is kept at the stress temperature. As a result, a difference in threshold voltage and a difference in shift value between before and after the gate BT stress test can be obtained as the amount of change in the electrical characteristics.

Note that a stress test where negative voltage is applied to a gate electrode is called negative gate BT stress test (dark negative stress); whereas a stress test where positive voltage is applied is called positive gate BT stress test (dark positive stress). Note that a stress test where negative voltage is applied to a gate electrode while light emission is performed is called negative gate BT photostress test (negative photostress); whereas a stress test where positive voltage is applied while light emission is performed is called positive gate BT photostress test (positive photostress).

Since the power approximation line L1 is a straight line in the log-log graph of FIG. 2, when the space of the logarithmic scale on the lateral axis is equal to that on the longitudinal axis, an angle θ1 between the power approximation line L1 of the transistor 10 described in this embodiment and a straight line (a dashed line L2 in FIG. 2) having an index of power function of 0, indicating that threshold voltage is not changed with respect to stress time, is in a range of θ2. In addition, when stress time is 0.1 hours, $|\Delta V_{th}|$ is less than 0.3 V, preferably less than 0.1 V. Note that θ2 is an angle between dashed-dotted lines and is typified by an angle in a range from 3° in a negative direction to 20° in a positive direction from a straight line indicating $|\Delta V_{th}|$ of 0.1 V; in other words, the angle is greater than or equal to −3° and less than 20°, preferably greater than or equal to 0° and less than 15°. Note that the description that "the space of the logarithmic scale on the lateral axis is equal to that on the longitudinal axis" means that, for example, the interval between 0.01 hours to 0.1 hours on the lateral axis (stress time becomes 10 times) is the same as the interval between 0.01 V to 0.1 V on the longitudinal axis ($\Delta V_{th}$ becomes 10 times). Here, the positive direction for 2θ is a counterclockwise direction.

As in the transistor 10 described in this embodiment, as the angle θ1 between the power approximation line L1, which indicates the absolute values of the amount of change in threshold voltage ($|\Delta V_{th}|$) with respect to stress time, and the dashed line L2 is small, a transistor has a smaller amount of change in threshold voltage over time and higher reliability.

In FIG. 2, when the lateral axis is x and the longitudinal axis is y, the power approximation line L1 can be represented by Formula 2. Note that b and C are each a constant, and b corresponds to the index of the power approximation line L1.

$$y=Cx^b \quad \text{[Formula 2]}$$

In the transistor 10 described in this embodiment, the index b of the power approximation line L1 is greater than or equal to −0.1 and less than or equal to 0.3, preferably greater than or equal to 0 and less than or equal to 0.2, and $\Delta V_{th}$ when the stress time is 0.1 hours is less than 0.3 V, preferably less than 0.1 V.

As the index b of the power approximation line L1 is smaller, a transistor has a smaller amount of change in the threshold voltage over time and higher reliability. As $\Delta V_{th}$ when the stress time is 0.1 hours is smaller, a transistor has higher reliability at initial operation. As a result, a transistor in which the index b of the power approximation line L1 is greater than or equal to −0.1 and less than or equal to 0.3, preferably greater than or equal to 0 and less than or equal to 0.2, and $\Delta V_{th}$ when the stress time is 0.1 hours is smaller than 0.3 V, preferably smaller than 0.1 V has high reliability.

When at least one of the gate insulating film 15 and the protective film 21 in contact with the oxide semiconductor film 17 contains a small amount of nitrogen oxide as described above, the carrier trap at the interface between the oxide semiconductor film 17 and the gate insulating film 15 or the interface between the oxide semiconductor film 17 and the protective film 21 can be inhibited. As a result, a change in the threshold voltage of the transistor included in the semiconductor device can be reduced, which leads to a reduced change in the electrical characteristics of the transistor.

The details of other components of the transistor 10 are described below.

There is no particular limitation on the property of a material and the like of the substrate 11 as long as the material has heat resistance enough to withstand at least later heat treatment. A variety of substrates can be used as the substrate 11 to form a transistor, for example. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, soda lime glass substrate, or the like can be given. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic: polypropylene; polyester; polyvinyl fluoride, polyvinyl chloride; polyester; polyamide: polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate 11, and the transistor 10 may be provided directly on the flexible substrate. Further alternatively, a separation layer may be provided between the substrate 11 and the transistor 10. The separation layer can be used when part or the whole of a semiconductor device formed over the separation layer is separated from the substrate 11 and transferred onto another substrate. In such a case, the transistor 10 can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties or a transistor with low power consumption can be formed, a device with high durability and high heat resistance can be provided, or a reduction in weight or thickness can be achieved.

A base insulating film may be provided between the substrate 11 and the gate electrode 13. Examples of the base insulating film include a silicon oxide film, a silicon oxynitride film, a silicon nitride film, a silicon nitride oxide film a gallium oxide film, a hafnium oxide film an yttrium oxide film, an aluminum oxide film, and an aluminum oxynitride film. Note that when silicon nitride, gallium oxide, hafnium oxide, yttrium oxide, aluminum oxide, or the like is used for the base insulating film, it is possible to suppress diffusion of impurities such as alkali metal, water, and hydrogen from the substrate 11 into the oxide semiconductor film 17.

The gate electrode 13 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Further, one or more metal elements selected from manganese and zirconium may be used. The gate electrode 13 may have a single-layer structure or a layered structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

The gate electrode 13 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a layered structure formed using the above light-transmitting conductive material and the above metal element.

In the case where the protective film 21 is formed using an oxide insulating film containing nitrogen and having a small number of defects, the gate insulating film 15 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and the like. Note that an oxide insulating film is preferably used for at least a region of the gate insulating film 15, which is in contact with the oxide semiconductor film 17, in order to improve characteristics of the interface with the oxide semiconductor film 17.

Furthermore, it is possible to prevent outward diffusion of oxygen from the oxide semiconductor film 17 and entry of hydrogen, water, or the like into the oxide semiconductor film 17 from the outside by providing an insulating film having a blocking effect against oxygen, hydrogen, water, and the like as the gate insulating film 15. As the insulating film having a blocking effect against oxygen, hydrogen, water, and the like, an aluminum oxide film, an aluminum oxynitride film a gallium oxide film, a gallium oxynitride film, an yttrium oxide film an yttrium oxynitride film, a hafnium oxide film, and a hafnium oxynitride film can be given as examples.

The gate insulating film 15 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 15 is greater than or equal to 5 nm and less than or equal to 400 nm preferably greater than or equal to 10 nm and less than or equal to 300 nm, further preferably greater than or equal to 50 nm and less than or equal to 250 nm.

The oxide semiconductor film 17 is formed using a metal oxide film containing at least In or Zn; as a typical example, an In—Ga oxide film, an In—Zn oxide film, or an In-M-Zn oxide film (M is Al, Ga, Y, Zr, La. Ce, or Nd) can be given.

Note that in the case where the oxide semiconductor film 17 contains an In-M-Zn oxide, the proportions of In and M when summation of In and M is assumed to be 100 atomic % are preferably as follows: the proportion of In is greater than 25 atomic % and the proportion of M is less than 75 atomic %, or further preferably, the proportion of In is greater than 34 atomic % and the proportion of M is less than 66 atomic %.

The energy gap of the oxide semiconductor film 17 is 2 eV or more, preferably 2.5 eV or more, further preferably 3 eV or more. With the use of an oxide semiconductor having such a wide energy gap, the off-state current of the transistor 10 can be reduced.

The thickness of the oxide semiconductor film 17 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 17 contains an In-M-Zn oxide (M represents Al, Ga, Y, Zr, La, Ce, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 17 vary from the above atomic ratio of metal elements of the sputtering target within a range of ±40% as an error.

Hydrogen contained in the oxide semiconductor reacts with oxygen bonded to a metal atom to be water, and causes oxygen vacancies in a lattice (or a portion) from which oxygen is released. Due to entry of hydrogen into the oxygen vacancy, an electron serving as a carrier is generated. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor film 17. Specifically, in the oxide semiconductor film 17, the hydrogen concentration that is measured by secondary ion mass spectrometry (SIMS) is set to $2\times10^{20}$ atoms/cm$^3$ or lower, preferably $5\times10^{19}$ atoms/cm$^3$ or lower, further preferably $1\times10^{19}$ atoms/cm$^3$ or lower, further preferably $5\times10^{18}$ atoms/cm$^3$ or lower, further preferably $1\times10^{18}$ atoms/cm$^3$ or lower, further preferably $5\times10^{17}$ atoms/cm$^3$ or lower, further preferably $1\times10^{16}$ atoms/cm$^3$ or lower. As a result, the transistor 10 has positive threshold voltage (normally-off characteristics).

When silicon or carbon that is one of elements belonging to Group 14 is contained in the oxide semiconductor film 17, oxygen vacancies are increased in the oxide semiconductor film 17, and the oxide semiconductor film 17 becomes an n-type film. Thus, the concentration of silicon or carbon (the concentration is measured by SIMS) of the oxide semiconductor film 17 is lower than or equal to $2\times10^{18}$ atoms/cm$^3$, preferably lower than or equal to $2\times10^{17}$ atoms/cm$^3$. As a result, the transistor 10 has positive threshold voltage (normally-off characteristics).

Furthermore, the concentration of alkali metal or alkaline earth metal of the oxide semiconductor film 17, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film 17. As a result, the transistor 10 has positive threshold voltage (normally-off characteristics).

Furthermore, when containing nitrogen, the oxide semiconductor film 17 easily becomes an n-type film by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible: the concentration of nitrogen that is measured by SIMS is preferably set to, for example, lower than or equal to $5\times10^{18}$ atoms/cm$^3$.

When impurities in the oxide semiconductor film 17 are reduced, the carrier density of the oxide semiconductor film 17 can be lowered. The oxide semiconductor preferably has a carrier density of $1\times10^{17}/cm^3$ or less, further preferably $1\times10^{15}/cm^3$ or less, still further preferably $1\times10^{13}/cm^3$ or less, yet still further preferably $1\times10^{11}/cm^3$ or less.

Note that it is preferable to use, as the oxide semiconductor film 17, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A transistor formed using a highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A transistor including a highly purified intrinsic or substantially highly purified intrinsic oxide semiconductor film has a low density of defect states and accordingly has a low trap state in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film 17 may have a non-single-crystal structure, for example. The non-single crystal structure includes a c-axis aligned crystalline oxide semiconductor (CAAC-OS) that is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

Note that the oxide semiconductor film 17 may be a mixed film including two or more of the following: a region having an amorphous structure, a region having a microcrystalline structure, a region having a polycrystalline structure, a region of CAAC-OS described later, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

The pair of electrodes 19 and 20 is formed with a single-layer structure or a layered structure using any of metals such as aluminum, titanium, chromium, nickel, copper, yttrium, zirconium, molybdenum, iron, cobalt, silver, tantalum, and tungsten and an alloy containing any of these metals as a main component. For example, a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a copper film containing manganese, a copper film, and a copper film containing manganese are stacked in this order; and the like can be given. Note that a transparent conductive material containing indium oxide, tin oxide, or zinc oxide may be used.

Note that although the pair of electrodes 19 and 20 is provided between the oxide semiconductor film 17 and the protective film 21 in this embodiment, the pair of electrodes 19 and 20 may be provided between the gate insulating film 15 and the oxide semiconductor film 17.

When the gate insulating film 15 is formed of an oxide insulating film containing nitrogen and having a small number of defects, the protective film 21 can be formed using silicon oxide, silicon oxynitride, Ga—Zn-based metal oxide, or the like.

Further, it is possible to prevent outward diffusion of oxygen from the oxide semiconductor film 17 and entry of hydrogen, water, or the like into the oxide semiconductor film 17 from the outside by providing an insulating film having a blocking effect against oxygen, hydrogen, water, and the like as the protective film 21. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film, can be given as examples.

The protective film 21 includes a region with a thickness greater than or equal to 50 nm and less than or equal to 1000 nm, preferably greater than or equal to 150 nm and less than or equal to 400 nm.

<2. Method for Manufacturing Transistor>

Next, a method for manufacturing the transistor 10 in FIGS. 1A to 1C is described with reference to FIGS. 3A to 3D. A cross-section in the channel length direction along dot-dashed line A-B in FIG. 1A and a cross-section in the channel width direction along dot-dashed line C-D in FIG. 1A are used in FIGS. 3A to 3D to describe the method for manufacturing the transistor 10.

The films included in the transistor 10 (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute FET.

Figure 3A:
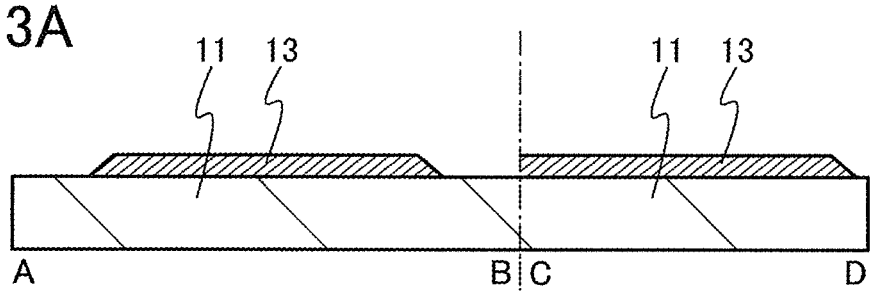
FIGS. 3A to 3D illustrate one embodiment of a method for forming a transistor.

As illustrated in FIG. 3A, the gate electrode 13 is formed over the substrate 11.

A formation method of the gate electrode 13 is described below. First, a conductive film is formed by a sputtering method, a vacuum evaporation method, a pulsed laser deposition (PLD) method, a thermal CVD method, or the like and then a mask is formed over the conductive film by a photolithography process. Next, the conductive film is partly etched using the mask to form the gate electrode 13. After that, the mask is removed.

Note that the gate electrode 13 may be formed by an electrolytic plating method, a printing method, an ink-jet method, or the like instead of the above formation method.

Alternatively, a tungsten film can be formed as the conductive film with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Here, a 100-nm-thick tungsten film is formed by a sputtering method. Next, a mask is formed by a photolithography process, and the tungsten film is subjected to dry etching with the use of the mask to form the gate electrode 13.

Then, the gate insulating film 15 is formed over the substrate 11 and the gate electrode 13, and the oxide semiconductor film 17 is formed in a region that is over the gate insulating film 15 and overlaps with the gate electrode 13.

The gate insulating film 15 is formed by a sputtering method, a CVD method, a vacuum evaporation method, a pulsed laser deposition (PLD) method, a thermal CVD method, or the like.

In the case of forming a silicon oxide film or a silicon oxynitride film as the gate insulating film 15, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a gallium oxide film is formed as the gate insulating film 15, an MOCVD method can be used.

In the case where a hafnium oxide film is formed as the gate insulating film 15 by a thermal CVD method such as an MOCVD method or an ALD method, two kinds of gases, i.e., ozone ($O_3$) as an oxidizer and a source material gas which is obtained by vaporizing liquid containing a solvent and a hafnium precursor compound (a hafnium alkoxide solution, which is typified by tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the gate insulating film 15 by a thermal CVD method such as an MOCVD method or an ALD method, two kinds of gases, i.e., $H_2O$ as an oxidizer and a source material gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the gate insulating film 15 by a thermal CVD method such as an MOCVD method or an ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Here, a silicon oxynitride film is formed as the gate insulating film 15 by a plasma CVD method.

Figure 3B:
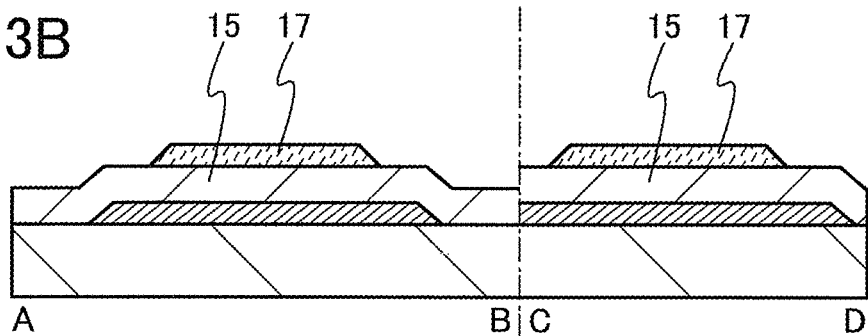

A formation method of the oxide semiconductor film 17 is described below. An oxide semiconductor film is formed over the gate insulating film 15 by a sputtering method, a coating method, a pulsed laser deposition method, a laser ablation method, a thermal CVD method, or the like. Then, after a mask is formed over the oxide semiconductor film by a photolithography process, the oxide semiconductor film is partly etched using the mask. Accordingly, the oxide semiconductor film 17 that is over the gate insulating film 15 and subjected to element isolation so as to partly overlap with the gate electrode 13 is formed as illustrated in FIG. 3B. After that, the mask is removed.

Alternatively, by using a printing method for forming the oxide semiconductor film 17, the oxide semiconductor film 17 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), an oxygen gas, or a mixed gas of a rare gas and an oxygen gas is used as appropriate. In the case of the mixed gas of a rare gas and an oxygen gas, the proportion of oxygen to a rare gas is preferably increased.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., the oxide semiconductor film can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn-based metal oxide target is described below.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration can be $5 \times 10^{19}$ atoms/cm$^3$ or lower, preferably $1 \times 10^{19}$ atoms/cm$^3$ or lower, further preferably $5 \times 10^{18}$ atoms/cm$^3$ or lower, still further preferably $1 \times 10^{18}$ atoms/cm$^3$ or lower, yet still further preferably $5 \times 10^{17}$ atoms/cm$^3$ or lower, yet still further preferably $1 \times 10^{16}$ atoms/cm$^3$ or lower.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced two or more times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, a Zn(CH$_3$)$_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen, whereby the oxide semiconductor film 17 is formed.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 70% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. This means that an oxide semiconductor film with a low impurity concentration and a low density of defect states can be formed.

Figure 3C:
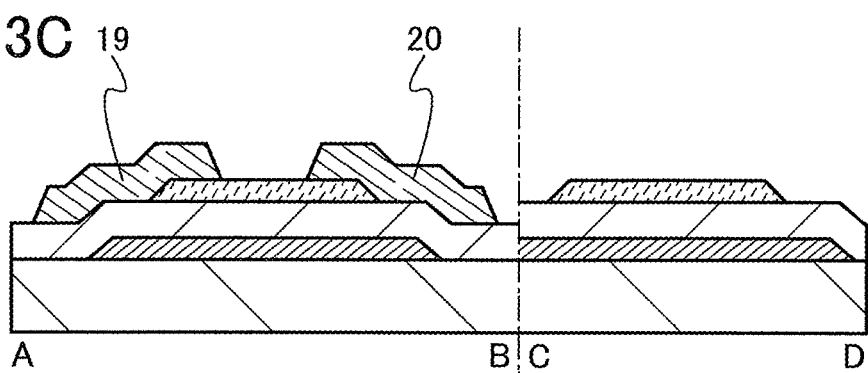
Figure 3D:
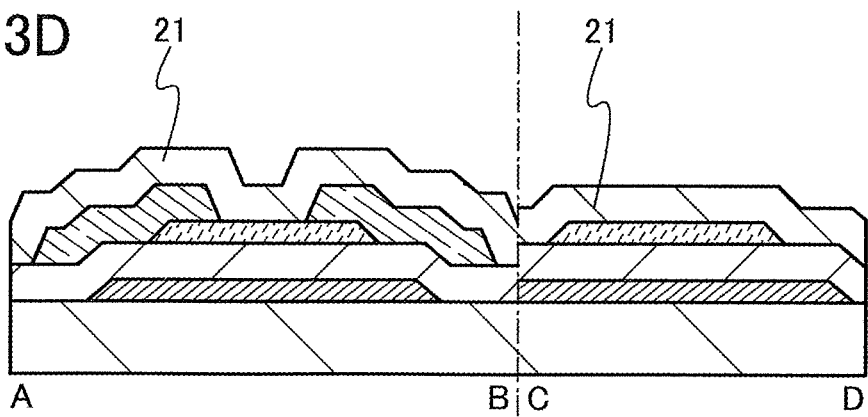

Next, as illustrated in FIG. 3C, the pair of electrodes 19 and 20 are formed.

A method for forming the pair of electrodes 19 and 20 is described below. First, a conductive film is formed by a sputtering method, a vacuum evaporation method, a pulsed laser deposition (PLD) method, a thermal CVD method, or the like. Then, a mask is formed over the conductive film by a photolithography process. After that, the conductive film is etched using the mask to form the pair of electrodes 19 and 20. After that, the mask is removed.

Here, a 50-nm-thick tungsten film, a 400-nm-thick aluminum film, and a 100-nm-thick titanium film are sequentially stacked by a sputtering method. Next, a mask is formed over the titanium film by a photolithography process and the tungsten film, the aluminum film, and the titanium film are dry-etched with use of the mask to form the pair of electrodes 19 and 20.

Note that heat treatment may be performed after the pair of electrodes 19 and 20 are formed. For example, this heat treatment can be performed in a manner similar to that of the heat treatment performed after the oxide semiconductor film 17 is formed.

After the pair of electrodes 19 and 20 are formed, cleaning treatment is preferably performed to remove an etching residue. A short circuit of the pair of electrodes 19 and 20 can be suppressed by this cleaning treatment. The cleaning treatment can be performed using an alkaline solution such as a tetramethylammonium hydroxide (TMAH) solution; an acidic solution such as a hydrofluoric acid, an oxalic acid solution, or a phosphoric acid solution; or water.

Next, the protective film 21 is formed over the oxide semiconductor film 17 and the pair of electrodes 19 and 20.

The protective film 21 can be formed by a sputtering method, a CVD method, an evaporation method, or the like.

In the case where an oxide insulating film containing nitrogen and having a small number of defects is formed as the protective film 21, a silicon oxynitride film can be formed by a CVD method as an example of the oxide insulating film. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

The oxide insulating film containing nitrogen and having a small number of defects can be formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

Here, a silicon oxynitride film is formed by a plasma CVD method under the conditions where the substrate 11 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

In the case where an oxide insulating film containing nitrogen and having a small number of defects is formed as the protective film 21, ammonia can be used as a source gas instead of a deposition gas containing silicon or an oxidation gas. In that case, a film including a region from which a large amount of gas having a mass-to-charge ratio m/z of 17 (ammonia as a typical example) is released can be formed.

A silicon oxynitride film is formed by, for example, a plasma CVD method under the conditions where the substrate 11 is held at a temperature of 220° C., silane at a flow rate of 30 sccm, dinitrogen monoxide at a flow rate of 4000 (sccm, and ammonia at a flow rate of 100 sccm are used as a source gas, the pressure in the treatment chamber is 40 Pa, and a high-frequency power of 150 W at 13.56 MHz ($2.4 \times 10^{-2}$ W/cm$^2$ as the power density) is supplied to parallel-plate electrodes.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, water, hydrogen, and the like contained in the protective film 21 can be released.

Here, heat treatment is performed at 350° C. in a mixed atmosphere containing nitrogen and oxygen for one hour.

Next, another heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C.

Through the above steps, a transistor in which a change in threshold voltage is reduced can be manufactured. Further, a transistor in which a change in electrical characteristics is reduced can be manufactured.
<Modification Example 1>

Modification examples of the transistor 10 described in this embodiment are described with reference to FIGS. 4A and 4B. In each of the transistors described in this modification example, a gate insulating film or a protective film has a stacked-layer structure.

In a transistor using an oxide semiconductor, oxygen vacancies in an oxide semiconductor film cause defects of electrical characteristics of the transistor. For example, the threshold voltage of a transistor including an oxide semiconductor film that contains oxygen vacancies in the film easily shifts in the negative direction, and such a transistor tends to have normally-on characteristics. This is because charge is generated owing to the oxygen vacancies in the oxide semiconductor film, resulting in reduction of the resistance of the oxide semiconductor film.

Further, when an oxide semiconductor film includes oxygen vacancies, there is a problem in that the amount of change in electrical characteristics, for a typical example, the amount of change in the threshold voltage of the transistor, is increased due to change over time or a bias-temperature stress test (hereinafter also referred to as a BT stress test).

Thus, by forming an oxide insulating film containing oxygen at a higher proportion than oxygen in the stoichiometric composition as a part of the protective film, a transistor in which a shift of the threshold voltage in the negative direction is suppressed and that has excellent electrical characteristics can be manufactured. In addition, a highly reliable transistor in which a variation in electrical characteristics with time or a variation in electrical characteristics due to a gate BT photostress test is small can be manufactured.

Figure 4A:
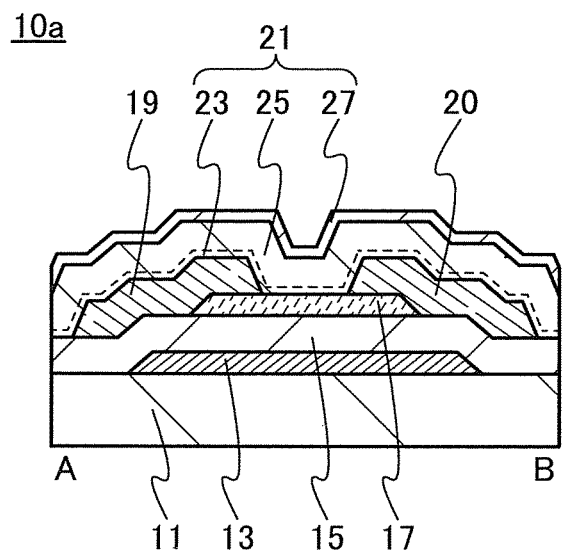
FIGS. 4A and 4B each illustrate one embodiment of a transistor.

In a transistor 10a illustrated in FIG. 4A, the protective film 21 has a multi-layer structure. Specifically, the protective film 21 includes an oxide insulating film 23, an oxide insulating film 25 containing oxygen at a higher proportion than oxygen in the stoichiometric composition, and a nitride insulating film 27. The oxide insulating film 23 in contact with the oxide semiconductor film 17 is an oxide insulating film containing nitrogen and having a small number of defects that can be used as at least one of the gate insulating film 15 and the protective film 21 of the transistor 10.

The oxide insulating film 25 is formed using an oxide insulating film that contains oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used for the oxide insulating film 25.

As the oxide insulating film 25, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As a source gas of the oxide insulating film 25, a deposition gas containing silicon and an oxidizing gas is preferably used. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the oxide insulating film 25, the high-frequency power having the above power density is supplied to a treatment chamber having the above pressure, whereby the degradation efficiency of the source gas in plasma is increased, oxygen radicals are increased, and oxidation of the source gas is promoted; thus, the oxygen content in the oxide insulating film 25 becomes higher than that in the stoichiometric composition. At the same time, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than oxygen in the stoichiometric composition and from which part of oxygen is released by heating. Further, the oxide insulating film 23 is provided over the oxide semiconductor film 17. Accordingly, in the step of forming the oxide insulating film 25, the oxide insulating film 23 serves as a protective film of the oxide semiconductor film 17. Consequently, the oxide insulating film 25 can be formed using the high-frequency power having a high power density while damage to the oxide semiconductor film 17 is reduced. By the later heat treatment step, part of oxygen contained in the oxide insulating film 25 can be moved to the oxide semiconductor film 17, so that the number of oxygen vacancies contained in the oxide semiconductor film 17 can be further reduced.

As the nitride insulating film 27, a film having an effect of blocking at least hydrogen and oxygen is used. Preferably, the nitride insulating film 27 has an effect of blocking oxygen, hydrogen, water, an alkali metal, an alkaline earth metal, or the like. It is possible to prevent outward diffusion of oxygen from the oxide semiconductor film 17 and entry of hydrogen, water, or the like into the oxide semiconductor film 17 from the outside by providing the nitride insulating film 27.

The nitride insulating film 27 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The nitride insulating film 27 can be formed by a sputtering method, a CVD method, or the like.

In the case where a silicon nitride film is formed by the plasma CVD method as the nitride insulating film 27, a deposition gas containing silicon, nitrogen, and ammonia is used as the source gas. As the source gas, ammonia whose amount is smaller than the amount of nitrogen is used, whereby ammonia is dissociated in the plasma and activated species are generated. The activated species break a bond between silicon and hydrogen that are contained in a deposition gas containing silicon and a triple bond between nitrogen molecules. As a result, a dense silicon nitride film having a small number of defects, in which bonds between silicon and nitrogen are promoted and bonds between silicon and hydrogen is few, can be formed. In contrast, when the amount of ammonia is larger than the amount of nitrogen in a source gas, dissociation of a deposition gas containing silicon and decomposition of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, further preferably greater than or equal to 10 and less than or equal to 50.

Figure 4B:
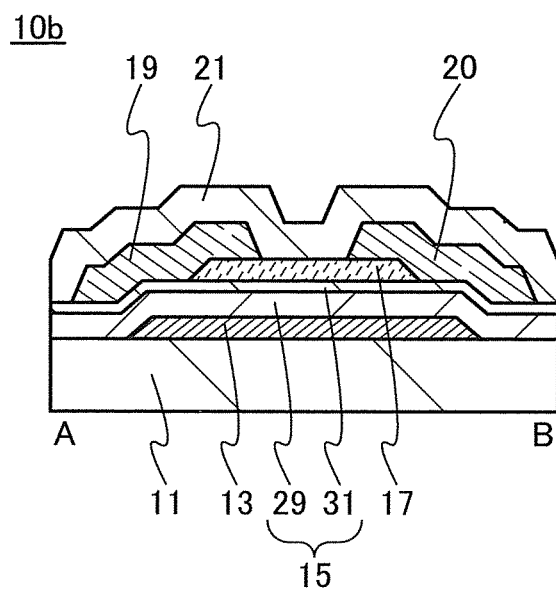

In a transistor 10b illustrated in FIG. 4B, the gate insulating film 15 has a stacked structure of a nitride insulating film 29 and an oxide insulating film 31 containing nitrogen, and the oxide insulating film 31 in contact with the oxide semiconductor film 17 is an oxide insulating film containing nitrogen and having a small number of defects.

As the nitride insulating film 29, a film having an effect of blocking water, hydrogen, or the like is preferably used. Alternatively, as the nitride insulating film 29, a film having a small number of defects is preferably used. Typical examples of the nitride insulating film 29 include films of silicon nitride, silicon nitride oxide, aluminum nitride, aluminum nitride oxide, and the like.

The use of a silicon nitride film as the nitride insulating film 29 has the following effect. In addition, a silicon nitride film has a higher dielectric constant than a silicon oxide film and needs a larger thickness for capacitance equivalent to that of the silicon oxide. Thus, the physical thickness of the gate insulating film 15 can be increased. This makes it possible to reduce a decrease in withstand voltage of the transistor 10b and furthermore increase the withstand voltage, thereby reducing electrostatic discharge damage to a semiconductor device.

In the transistor including the oxide semiconductor film, when trap states (also referred to as interface states) are included in the gate insulating film 15, the trap states can cause a change in electrical characteristics, for a typical example, a change in the threshold voltage, of the transistor. As a result, there is a problem in that electrical characteristics vary among transistors. Therefore, with the use of a silicon nitride film having a small number of defects as the nitride insulating film 29, the shift of the threshold voltage and the variation in the electrical characteristics among transistors can be reduced.

The nitride insulating film 29 may have a stacked-layer structure. For example, the nitride insulating film 29 has a stacked structure in which a first silicon nitride film is formed using a silicon nitride film having a small number of defects, and a second silicon nitride film using a silicon nitride film that releases a small number of hydrogen molecules and ammonia molecules is formed over the first silicon nitride film, whereby the gate insulating film 15 can be formed using a gate insulating film that has a small number of defects and releases a small number of hydrogen molecules and ammonia molecules. As a result, movement of hydrogen and nitrogen contained in the gate insulating film 15 to the oxide semiconductor film 17 can be suppressed.

The nitride insulating film 29 is preferably formed by stacking silicon nitride films by a two-step formation method. First, a first silicon nitride film having a small number of defects is formed by a plasma CVD method in which a mixed gas of silane, nitrogen, and ammonia is used as a source gas. Then, by using a source gas at a flow ratio that is similar to the above-described flow ratio of a source gas used for the nitride insulating film 27, a silicon nitride film that releases a small number of hydrogen molecules and ammonia molecules can be formed as the second silicon nitride film.

<Modification Example 2>

Modification examples of the transistor 10 described in this embodiment are described with reference to FIGS. 5A and 5B. The transistor 10 described in this embodiment is a channel-etched transistor; in contrast, a transistor 10c described in this modification example is a channel-protective transistor.

Figure 5A:
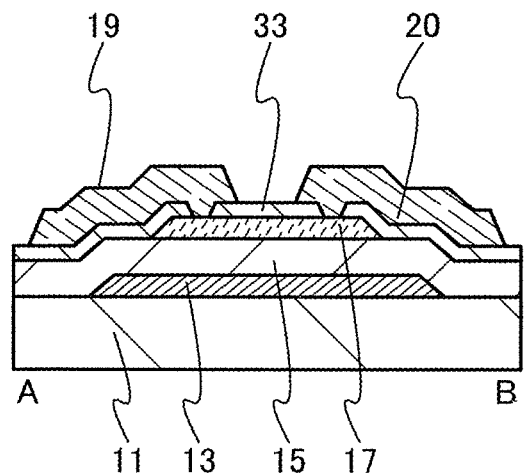
FIGS. 5A and 5B each illustrate one embodiment of a transistor.

The transistor 10c illustrated in FIG. 5A includes the gate electrode 13 over the substrate 11; the gate insulating film 15 over the substrate 11 and the gate electrode 13: the oxide semiconductor film 17 overlapping with the gate electrode 13 with the gate insulating film 15 therebetween; an insulating film 33 over the gate insulating film 15 and the oxide semiconductor film 17; and the pair of electrodes 19 and 20 in contact with the oxide semiconductor film 17 in openings of the insulating film 33.

Figure 5B:
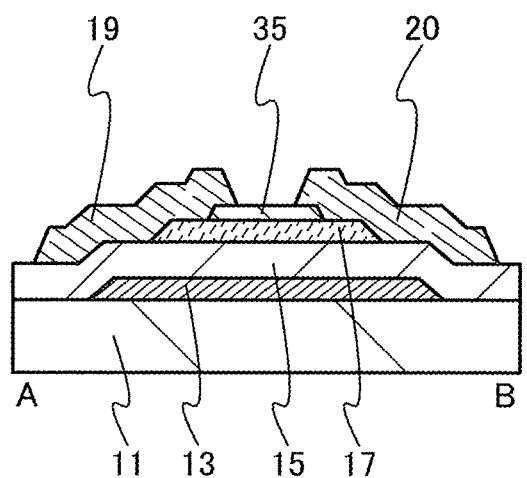

A transistor 10d illustrated in FIG. 5B includes an insulating film 35 over the oxide semiconductor film 17 and the pair of electrodes 19 and 20 in contact with the oxide semiconductor film 17. End portions of the pair of electrodes 19 and 20 are formed over the insulating film 35.

In the transistor 10c or 10d, part of the oxide semiconductor film 17 typified by a back channel region is covered with the insulating film 33 or 35 when the pair of electrodes 19 and 20 are formed; accordingly, the back channel region of the oxide semiconductor film 17 is not damaged by etching for forming the pair of electrodes 19 and 20. In addition, when the insulating film 33 or 35 is an oxide insulating film containing nitrogen and having a small number of defects, a change in electrical characteristics is suppressed, whereby the transistor can have improved reliability.

<Modification Example 3>

Modification examples of the transistor 10 described in this embodiment are described with reference to FIGS. 6A to 6C. The transistor 10 described in this embodiment includes one gate electrode; in contrast, a transistor 10e described in this modification example includes two gate electrodes with an oxide semiconductor film interposed between the gate electrodes.

Figure 6A:
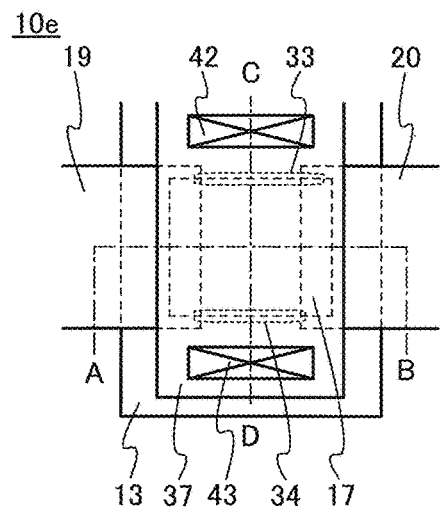
FIGS. 6A to 6C illustrate one embodiment of a transistor.
Figure 6C:
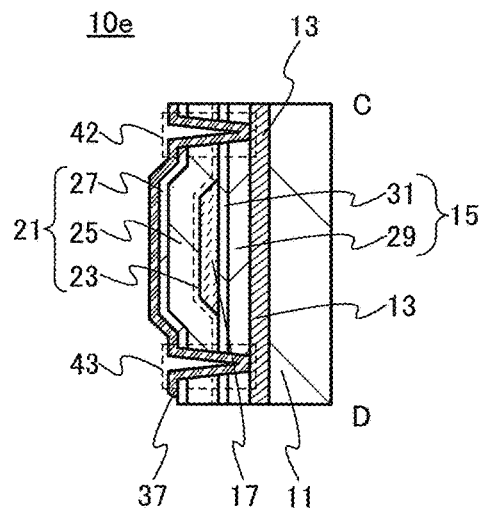
Figure 6B:
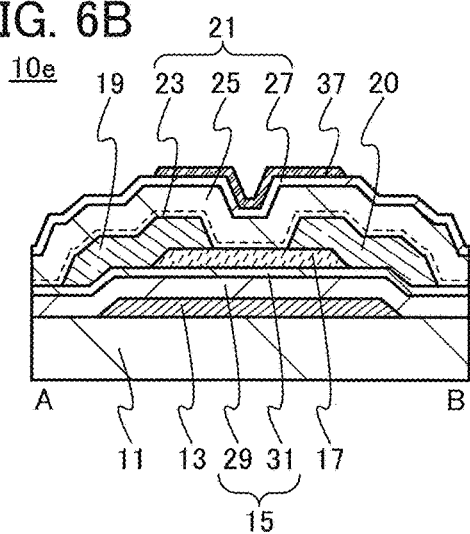

A top view and cross-sectional views of the transistor 10e included in a semiconductor device are illustrated in FIGS. 6A to 6C. FIG. 6A is a top view of the transistor 10e, FIG. 6B is a cross-sectional view taken along dashed-dotted line A-B in FIG. 6A, and FIG. 6C is a cross-sectional view taken along dashed-dotted line C-D in FIG. 6A. Note that in FIG. 6A, the substrate 11, the gate insulating film 15, the protective film 21, and the like are omitted for simplicity.

The transistor 10e illustrated in FIGS. 6B and 6C is a channel-etched transistor including the gate electrode 13 over the substrate 11; the gate insulating film 15 formed over the substrate 11 and the gate electrode 13; the oxide semiconductor film 17 overlapping with the gate electrode 13 with the gate insulating film 15 provided therebetween; and the pair of electrodes 19 and 20 in contact with the oxide semiconductor film 17. The transistor 10e further includes the protective film 21 including the oxide insulating film 23, the oxide insulating film 25, and the nitride insulating film 27 over the gate insulating film 15, the oxide semiconductor film 17, and the pair of electrodes 19 and 20; and a gate electrode 37 formed over the protective film 21. The gate electrode 37 is connected to the gate electrode 13 through openings 42 and 43 provided in the gate insulating film 15 and the protective film 21. Here, the gate insulating film 15 is a stack of the nitride insulating film 29 and oxide insulating film 31. The protective film 21 is a stack of the oxide insulating film 23, the oxide insulating film 25, and the nitride insulating film 27.

A plurality of openings are provided in the gate insulating film 15 and the protective film 21. As a typical example, the openings 42 and 43 are provided with the oxide semiconductor film 17 provided therebetween in the channel width direction as illustrated in FIG. 6C. In other words, the openings 42 and 43 are provided on outer sides of the side surfaces of the oxide semiconductor film 17. In addition, in the openings 42 and 43, the gate electrode 13 is connected to the gate electrode 37. This means that the gate electrode 13 and the gate electrode 37 surround the oxide semiconductor film 17 in the channel width direction with the gate insulating film 15 and the protective film 21 provided between the oxide semiconductor film 17 and each of the gate electrode 13 and the gate electrode 37. Furthermore, in the channel width direction, the gate electrode 37 in the openings 42 and 43 and each of the side surfaces of the oxide semiconductor film 17 are provided so that the protective film 21 is positioned therebetween.

As illustrated in FIG. 6C, a side surface of the oxide semiconductor film 17 faces the gate electrode 37 in the channel width direction, and the oxide semiconductor film 17 is surrounded by the gate electrode 13 and the gate electrode 37 with the gate insulating film 15 interposed between the oxide semiconductor film 17 and the gate electrode 13 and the protective film 21 interposed between the oxide semiconductor film 17 and the gate electrode 37 in the channel width direction. Thus, in the oxide semiconductor film 17, carriers flow not only at the interface between the gate insulating film 15 and the oxide semiconductor film 17 and the interface between the protective film 21 and the oxide semiconductor film 17, but also in the oxide semiconductor film 17, whereby the amount of transfer of carriers is increased in the transistor 10e. As a result, the on-state current and field-effect mobility of the transistor 10 are increased. The electric field of the gate electrode 37 affects the side surface or an end portion including the side surface and its vicinity of the oxide semiconductor film 17; thus, generation of a parasitic channel at the side surface or the end portion of the oxide semiconductor film 17 can be suppressed.

<Modification Example 4>

Modification examples of the transistor 10 described in this embodiment are described with reference to FIGS. 7A to 7F and FIGS. 8A to 8C. The transistor 10 described in this embodiment includes the single-layer oxide semiconductor film; in contrast, transistors 10f and 10g described in this modification example each includes a multi-layer film.

Figure 7A:
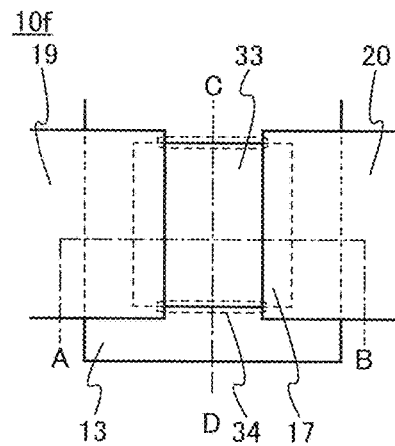
FIGS. 7A to 7F each illustrate one embodiment of a transistor.
Figure 7C:
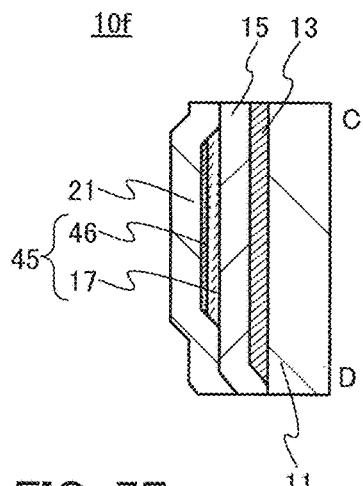
Figure 7B:
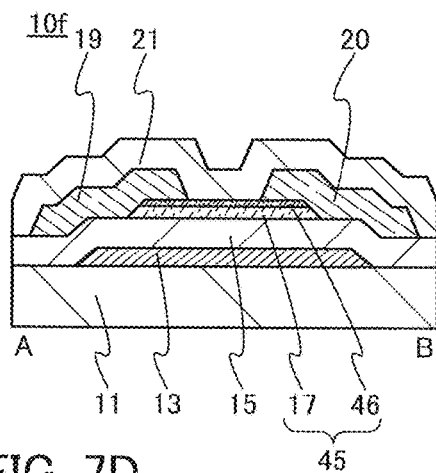

FIGS. 7A to 7C are a top view and cross-sectional views of the transistor 10f included in a semiconductor device. FIG. 7A is a top view of the transistor 10f, FIG. 7B is a cross-sectional view taken along dashed-dotted line A-B in FIG. 7A, and FIG. 7C is a cross-sectional view taken along dashed-dotted line C-D in FIG. 7A. Note that in FIG. 7A, the substrate 11, the gate insulating film 15, the protective film 21, and the like are omitted for simplicity.

The transistor 10f illustrated in FIG. 7A includes a multilayer film 45 overlapping with the gate electrode 13 with the gate insulating film 15 provided therebetween, and the pair of electrodes 19 and 20 in contact with the multilayer film 45. The protective film 21 is stacked over the gate insulating film 15, the multilayer film 45, and the pair of electrodes 19 and 20.

In the transistor 10f described in this embodiment, the multilayer film 45 includes the oxide semiconductor film 17 and an oxide semiconductor film 46. That is, the multilayer film 45 has a two-layer structure. Furthermore, part of the oxide semiconductor film 17 serves as a channel region. In addition, the protective film 21 is formed in contact with the multilayer film 45.

The oxide semiconductor film 46 contains one or more elements that form the oxide semiconductor film 17. Thus, interface scattering is unlikely to occur at the interface between the oxide semiconductor film 17 and the oxide semiconductor film 46. Thus, the transistor can have high field-effect mobility because the movement of carriers is not hindered at the interfaces.

The oxide semiconductor film 46 is formed using a metal oxide film containing at least In or Zn. Typical examples of the metal oxide film include an In—Ga oxide film, an In—Zn oxide film, and an In-M-Zn oxide film (M represents Al, Ga, Y, Zr, La, Ce, or Nd). The conduction band minimum of the oxide semiconductor film 46 is closer to a vacuum level than that of the oxide semiconductor film 17 is: as a typical example, the energy difference between the conduction band minimum of the oxide semiconductor film 46 and the conduction band minimum of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 46 and the electron affinity of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 46 preferably contains In because carrier mobility (electron mobility) can be increased.

When the oxide semiconductor film 46 contains a larger amount of Al, Ga, Y, Zr, La, Ce, or Nd than the amount of In in an atomic ratio, any of the following effects may be obtained: (1) the energy gap of the oxide semiconductor film 46 is widened; (2) the electron affinity of the oxide semiconductor film 46 decreases: (3) impurity diffusion from the outside is suppressed; (4) an insulating property of the oxide semiconductor film 46 increases as compared to that of the oxide semiconductor film 17; and (5) an oxygen vacancy is less likely to be generated because Al, Ga, Y, Zr, La, Ce, or Nd is a metal element that is strongly bonded to oxygen.

In the case where the oxide semiconductor film 46 is formed of an In-M-Zn oxide, the proportions of In and M when summation of In and M is assumed to be 100 atomic % are preferably as follows: the proportion of In is less than 50 atomic % and the proportion of M is greater than 50 atomic %, or further preferably, the proportion of In is less than 25 atomic % and the proportion of M is greater than 75 atomic %.

Furthermore, in the case where each of the oxide semiconductor films 17 and 46 contains an In-M-Zn oxide (M represents Al, Ga, Y, Zr, La, Ce, or Nd), the proportion of M atoms (M represents Al, Ga, Y. Zr, La, Ce, or Nd) in the oxide semiconductor film 46 is higher than that in the oxide semiconductor film 17. As a typical example, the proportion of M in the oxide semiconductor film 17 is 1.5 or more times, preferably twice or more, further preferably three or more times as high as that in the oxide semiconductor film 17.

Furthermore, in the case where each of the oxide semiconductor films 17 and 46 contains an In-M-Zn oxide (M represents Al, Ga, Y, Zr, La, Ce, or Nd), when $In:M:Zn=x_1:y_1:z_1$ [atomic ratio] is satisfied in the oxide semiconductor film 46 and $In:M:Zn=x_2:y_2:z_2$ [atomic ratio] is satisfied in the oxide semiconductor film 17, $y_1/x_1$ is higher than $yz_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 17 is an In-M-Zn oxide film (M is Al, Ga, Y, Zr, La, Ce, or Nd) and a target having the atomic ratio of metal elements of $In:M:Zn=x_1:y_1:z_1$ is used for forming the oxide semiconductor film 17, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 17 is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 46 is an In-M-Zn oxide film (M is Al, Ga, Y, Zr, La, Ce, or Nd) and a target having the atomic ratio of metal elements of $In:M:Zn=x_2:y_2:z_2$ is used for forming the oxide semiconductor film 46, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 46 is easily formed. Typical examples of the atomic ratio of the metal elements of the target are In:M:Zn=1:3:2. In:M:Zn=1:3:4. In:M:Zn=1:3:6, In:M:Zn=1:3:8, In:M:Zn=1:4:3. In:M:Zn=1:4:4, In:M:Zn=1:4:5, In:M:Zn=1:4:6, In:M:Zn=1:5:5, In:M:Zn=1:5:6, and the like.

Note that the proportion of each metal element in the atomic ratio of each of the oxide semiconductor films 17 and 46 varies within a range of ±40% of that in the above atomic ratio as an error.

The thickness of the oxide semiconductor film 46 is greater than or equal to 3 nm and less than or equal to 100) nm, preferably greater than or equal to 3 nm and less than or equal to 50 nm.

The oxide semiconductor film 46 may have a non-single-crystal structure, for example, like the oxide semiconductor film 17. The non-single crystal structure includes a c-axis aligned crystalline oxide semiconductor (CAAC-OS) that is described later, a polycrystalline structure, a microcrystalline structure described later, or an amorphous structure, for example.

The oxide semiconductor film 46 may have an amorphous structure, for example. An amorphous oxide semiconductor film has, for example, disordered atomic arrangement and no crystalline component. Alternatively, an amorphous oxide semiconductor film has, for example, an absolutely amorphous structure and no crystal part.

Note that the oxide semiconductor films 17 and 46 may each be a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

In this case, the oxide semiconductor film 46 is provided between the oxide semiconductor film 17 and the protective film 21. Thus, if carrier traps are formed between the oxide semiconductor film 46 and the protective film 21 by impurities and defects, electrons flowing in the oxide semiconductor film 17 are less likely to be trapped by the carrier traps because there is a distance between the region where the carrier traps are formed and the oxide semiconductor film 17. Accordingly, the amount of on-state current of the transistor can be increased, and the field-effect mobility can be increased. When the electrons are trapped by the carrier traps, the electrons become negative fixed charges. As a result, the threshold voltage of the transistor varies. However, by the distance between the region where the carrier traps are formed and the oxide semiconductor film 17, trap of the electrons by the carrier traps can be reduced, and accordingly fluctuations of the threshold voltage can be reduced.

The oxide semiconductor film 46 can block impurities from the outside, and accordingly, the amount of impurities that are transferred from the outside to the oxide semiconductor film 17 can be reduced. Furthermore, an oxygen vacancy is less likely to be formed in the oxide semiconductor film 46. Consequently, the impurity concentration and the number of oxygen vacancies in the oxide semiconductor film 17 can be reduced.

Note that the oxide semiconductor films 17 and 46 are not formed by simply stacking each film, but are formed to form a continuous junction (here, in particular, a structure in which the energy of the conduction band minimum is changed continuously between each film). In other words, a stacked-layer structure in which there exists no impurity that forms a defect level such as a trap center or a recombination center at each interface is provided. If an impurity exists between the oxide semiconductor films 17 and 46 that are stacked, a continuity of the energy band is damaged, and the carrier is trapped or recombined at the interface and then disappears.

To form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of gas, especially gas containing carbon or hydrogen from an exhaust system to the inside of the chamber.

Figure 7E:
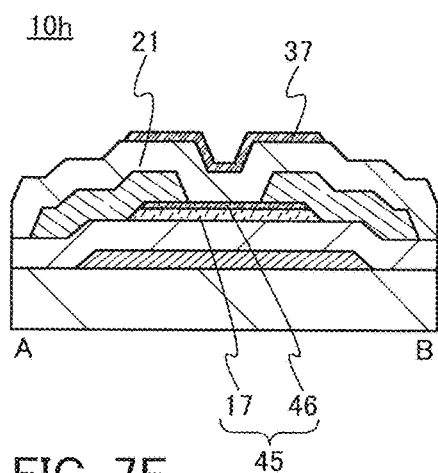
Figure 7D:
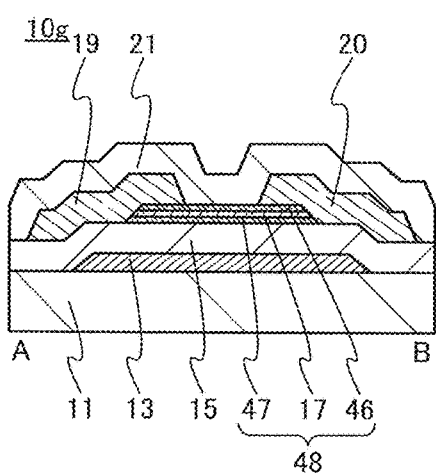
Figure 7F:
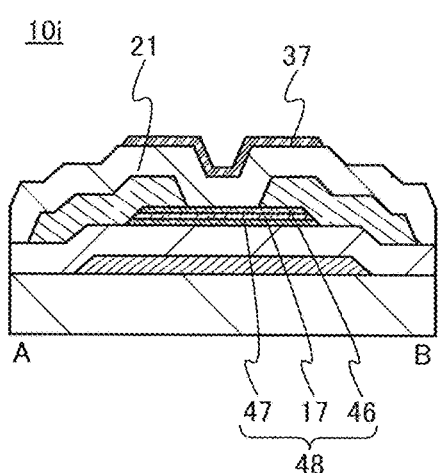

Note that a multilayer film 48 in the transistor 10g illustrated in FIG. 7D may be included instead of the multilayer film 45.

An oxide semiconductor film 47, the oxide semiconductor film 17, and the oxide semiconductor film 46 are stacked in this order in the multilayer film 48. That is, the multilayer film 48 has a three-layer structure. Furthermore, the oxide semiconductor film 17 serves as a channel region.

The gate insulating film 15 is in contact with the oxide semiconductor film 47. In other words, the oxide semiconductor film 47 is provided between the gate insulating film 15 and the oxide semiconductor film 17.

Furthermore, the oxide semiconductor film 46 is in contact with the protective film 21. That is, the oxide semiconductor film 46 is provided between the oxide semiconductor film 17 and the protective film 21.

The oxide semiconductor film 47 can be formed using a material and a formation method similar to those of the oxide semiconductor film 46.

It is preferable that the thickness of the oxide semiconductor film 47 be smaller than that of the oxide semiconductor film 17. When the thickness of the oxide semiconductor film 47 is greater than or equal to 1 nm and less than or equal to 5 nm, preferably greater than or equal to 1 nm and less than or equal to 3 nm, the amount of change in the threshold voltage of the transistor can be reduced.

In the transistors described in this embodiment, the oxide semiconductor film 46 is provided between the oxide semiconductor film 17 and the protective film 21. Thus, if carrier traps are formed between the oxide semiconductor film 46 and the protective film 21 by impurities and defects, electrons flowing in the oxide semiconductor film 17 are less likely to be trapped by the carrier traps because there is a distance between the region where the carrier traps are formed and the oxide semiconductor film 17. Accordingly, the amount of on-state current of the transistor can be increased, and the field-effect mobility can be increased. When the electrons are trapped by the carrier traps, the electrons behave as negative fixed charges. As a result, the threshold voltage of the transistor varies. However, by the distance between the region where the carrier traps are formed and the oxide semiconductor film 17, trap of electrons by the carrier traps can be reduced, and accordingly, fluctuations of the threshold voltage can be reduced.

The oxide semiconductor film 46 can block entry of impurities from the outside, and accordingly, the amount of impurities transferred to the oxide semiconductor film 17 from the outside can be reduced. Furthermore, an oxygen vacancy is less likely to be formed in the oxide semiconductor film 46. Consequently, the impurity concentration and the number of oxygen vacancies in the oxide semiconductor film 17 can be reduced.

The oxide semiconductor film 47 is provided between the gate insulating film 15 and the oxide semiconductor film 17, and the oxide semiconductor film 46 is provided between the oxide semiconductor film 17 and the protective film 21. Thus, it is possible to reduce the concentration of silicon or carbon in the vicinity of the interface between the oxide semiconductor film 47 and the oxide semiconductor film 17, in the oxide semiconductor film 17, or in the vicinity of the interface between the oxide semiconductor film 46 and the oxide semiconductor film 17.

The transistor 10g having such a structure includes very few defects in the multilayer film 48 including the oxide semiconductor film 17; thus, the electrical characteristics, typified by the on-state current and the field-effect mobility, of these transistors can be improved. Further, in a gate BT stress test and a gate BT photostress test that are examples of a stress test, the amount of change in threshold voltage is small, and thus, reliability is high.

The transistor 10f illustrated in FIG. 7B can be provided with the gate electrode 37 so that a transistor 10h can be manufactured (see FIG. 7E). The transistor 10g illustrated in FIG. 7D can be provide with the gate electrode 37 so that a transistor 10i can be manufactured (see FIG. 7F).

<Band Structure of Transistor>

Next, band structures of the multilayer film 45 included in the transistor 10f illustrated in FIG. 7A and the multilayer film 48 included in the transistor 10g illustrated in FIG. 7D are described with reference to FIGS. 8A to 8C.

Here, for example, an In—Ga—Zn oxide having an energy gap of 3.15 eV is used for the oxide semiconductor film 17, and an In—Ga—Zn oxide having an energy gap of 3.5 eV is used for the oxide semiconductor film 46. The energy gaps can be measured using a spectroscopic ellipsometer (UT-300 manufactured by HORIBA JOBIN YVON SAS.).

The energy difference between the vacuum level and the valence band maximum (also called ionization potential) of the oxide semiconductor film 17 and the energy difference between the vacuum level and the valence band maximum of the oxide semiconductor film 46 are 8 eV and 8.2 eV, respectively. Note that the energy difference between the vacuum level and the valence band maximum can be measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 17 and the energy difference between the vacuum level and the conduction band minimum of the oxide semiconductor film 46 are 4.85 eV and 4.7 eV, respectively.

Figure 8A:
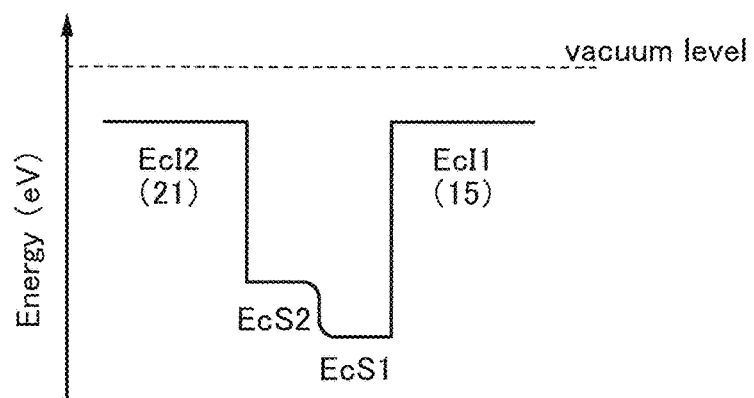
FIGS. 8A to 8C each show a band structure of a transistor.

FIG. 8A schematically illustrates a part of the band structure of the multilayer film 45 included in the transistor 10f. Here, the case where silicon oxide films are used for the gate insulating film 15 and the protective film 21 and the silicon oxide films are provided in contact with the multilayer film 45 is described. In FIG. 8A, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 46; and EcI2 denotes the energy of the conduction band minimum of the silicon oxide film. Furthermore, EcI1 and EcI2 correspond to the gate insulating film 15 and the protective film 21 in FIG. 7B, respectively.

As illustrated in FIG. 8A, there is no energy barrier between the oxide semiconductor films 17 and 46, and the energy of the conduction band minimum gradually changes therebetween. In other words, the energy of the conduction band minimum is continuously changed. This is because the multilayer film 45 contains an element contained in the oxide semiconductor film 17 and oxygen is transferred between the oxide semiconductor films 17 and 46, so that a mixed layer is formed.

As shown in FIG. 8A, the oxide semiconductor film 17 in the multilayer film 45 serves as a well and a channel region of the transistor including the multilayer film 45 is formed in the oxide semiconductor film 17. Note that since the energy of the conduction band minimum of the multilayer film 45 is continuously changed, it can be said that the oxide semiconductor films 17 and 46 are continuous.

Although trap levels due to impurities or defects might be generated in the vicinity of the interface between the oxide semiconductor film 46 and the protective film 21 as shown in FIG. 8A, the oxide semiconductor film 17 can be distanced from the region where the trap levels are generated owing to the existence of the oxide semiconductor film 46. However, when the energy difference between EcS1 and EcS2 is small, an electron in the oxide semiconductor film 17 might reach the trap level across the energy difference. When the electron is trapped by the trap level, a negative fixed charge is generated at the interface with the oxide insulating film, whereby the threshold voltage of the transistor shifts in the positive direction. Thus, it is preferable that the energy difference between EcS1 and EcS2 be 0.1 eV or more, further preferably 0.15 eV or more, because a change in the threshold voltage of the transistor is reduced and stable electrical characteristics are obtained.

Figure 8B:
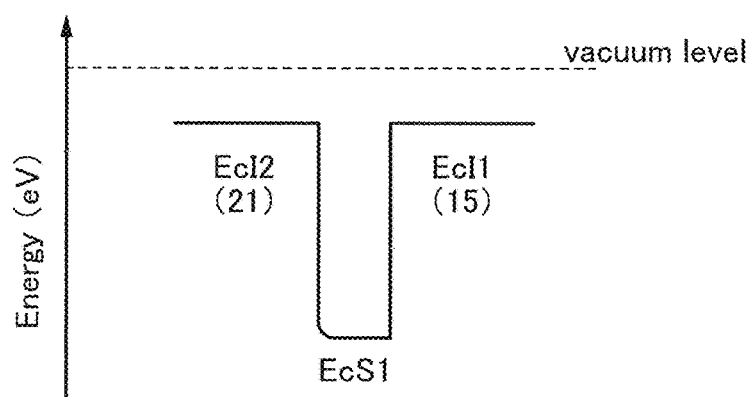

FIG. 8B schematically illustrates a part of the band structure of the multilayer film 45 of the transistor 10f, which is a variation of the band structure shown in FIG. 8A. Here, a structure where silicon oxide films are used for the gate insulating film 15 and the protective film 21 and the silicon oxide films are in contact with the multilayer film 45 is described. In FIG. 8B, EcI1 denotes the energy of the conduction band minimum of the silicon oxide film, EcS1 denotes the energy of the conduction band minimum of the oxide semiconductor film 17; and EcI2 denotes the energy of the conduction band minimum of the silicon oxide film. Further, EcI1 and EcI2 correspond to the gate insulating film 15 and the protective film 21 in FIG. 7B, respectively.

In the transistor illustrated in FIG. 7B, an upper portion of the multilayer film 45, that is, the oxide semiconductor film 46 might be etched in formation of the pair of electrodes 19 and 20. Furthermore, a mixed layer of the oxide semiconductor films 17 and 46 is likely to be formed on the top surface of the oxide semiconductor film 17 in formation of the oxide semiconductor film 46.

For example, Ga content in the oxide semiconductor film 46 is higher than that in the oxide semiconductor film 17 in the case where the oxide semiconductor film 17 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 46 is an oxide film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6. Thus, a $GaO_x$ layer or a mixed layer whose Ga content is higher than that in the oxide semiconductor film 17 can be formed on the top surface of the oxide semiconductor film 17.

For that reason, even in the case where the oxide semiconductor film 46 is etched, the energy of the conduction band minimum EcS1 on the EcI2 side is increased, and the band structure shown in FIG. 8B can be obtained in some cases.

As in the band structure shown in FIG. 8B, in observation of a cross section of a channel region, only the oxide semiconductor film 17 in the multilayer film 45 is apparently observed in some cases. However, a mixed layer that contains Ga more than the oxide semiconductor film 17 is formed over the oxide semiconductor film 17 in fact, and thus the mixed layer can be regarded as a 1.5-th layer. Note that the mixed layer can be confirmed by analyzing a composition in the upper portion of the oxide semiconductor film 17, when the elements contained in the multilayer film 45 are measured by an EDX analysis, for example. The mixed layer can be confirmed, for example, in such a manner that the Ga content in the composition in the upper portion of the oxide semiconductor film 17 is larger than the Ga content in the oxide semiconductor film 17.

Figure 8C:
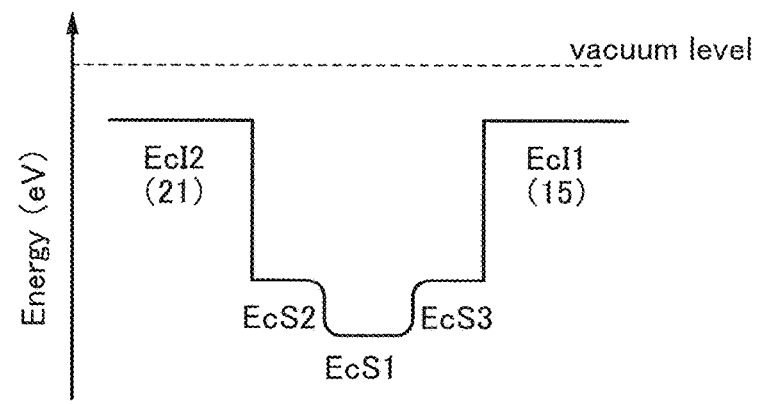

FIG. 8C schematically illustrates a part of the band structure of the multilayer film 48 of the transistor 10g. Here, the case where silicon oxide films are used for the gate insulating film 15 and the protective film 21 and the silicon oxide films are in contact with the multilayer film 48 is described. In FIG. 8C, EcI1 denotes the energy of the conduction band minimum of the silicon oxide film: EcS1 denotes the energy of the conduction band minimum of the oxide semiconductor film 17; EcS2 denotes the energy of the conduction band minimum of the oxide semiconductor film 46; EcS3 denotes the energy of the conduction band minimum of the oxide semiconductor film 47; and EcI2 denotes the energy of the conduction band minimum of the silicon oxide film. Furthermore, EcI1 and EcI2 correspond to the gate insulating film 15 and the protective film 21 in FIG. 7D, respectively.

As illustrated in FIG. 8C, there is no energy barrier between the oxide 15 semiconductor films 47, 17, and 46, and the conduction band minimums thereof smoothly vary. In other words, the conduction band minimums are continuous. This is because the multilayer film 48 contains an element contained in the oxide semiconductor film 17 and oxygen is transferred between the oxide semiconductor films 17 and 47 and between the oxide semiconductor films 17 and 46, so that a mixed layer is formed.

As shown in FIG. 8C, the oxide semiconductor film 17 in the multilayer film 48 serves as a well and a channel region of the transistor including the multilayer film 48 is formed in the oxide semiconductor film 17. Note that since the energy of the conduction band minimum of the multilayer film 48 is continuously changed, it can be said that the oxide semiconductor films 47, 17, and 46 are continuous.

Although trap levels due to impurities or defects might be generated in the vicinity of the interface between the oxide semiconductor film 17 and the protective film 21 and in the vicinity of the interface between the oxide semiconductor film 17 and the gate insulating film 15, as illustrated in FIG. 8C, the oxide semiconductor film 17 can be distanced from the region where the trap levels are generated owing to the existence of the oxide semiconductor films 46 and 47. However, when the energy difference between EcS1 and EcS2 and the energy difference between EcS1 and EcS3 are small, electrons in the oxide semiconductor film 17 might reach the trap level across the energy difference. When the electrons are trapped by the trap level, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because a change in the threshold voltage of the transistor is reduced and stable electrical characteristics are obtained.

Instead of the oxide semiconductor film 46, a metal oxide film formed of an In-M oxide (M is Al, Ga. Y. Zr, La, Ce, or Nd) can be used. Note that to prevent the metal oxide film from functioning as part of a channel region, a material having sufficiently low conductivity is used for the metal oxide film. Alternatively, a material which has a smaller electron affinity (an energy difference between a vacuum level and a conduction band minimum) than the oxide semiconductor film 17 and has a difference in conduction band minimum from the oxide semiconductor film 17 (band offset) is used for the metal oxide film. Furthermore, to inhibit generation of a difference between threshold voltages due to the value of the drain voltage, it is preferable to use a metal oxide film whose conduction band minimum is closer to the vacuum level than the conduction band minimum of the oxide semiconductor film 17 is by 0.2 eV or more, preferably 0.5 eV or more.

When an atomic ratio of M to In (M/In) is increased, the energy gap of the metal oxide film is increased and the electron affinity thereof can be small. In the case where a material containing an In-M oxide (M is Al. Ga, Y, Zr, La, Ce, or Nd) is used for the metal oxide film, for example, and where the atomic ratio of In to M in the metal oxide film is x:y, y/(x+y) is preferably greater than or equal to 0.75 and less than or equal to 1, further preferably greater than or equal to 0.78 and less than or equal to 1, still further preferably greater than or equal to 0.80 and less than or equal to 1 in order to form a conduction band offset between the metal oxide film and the oxide semiconductor film 17 and inhibit a channel from being formed in the metal oxide film. Note that an element other than indium, M, and oxygen that are main components may be mixed in the metal oxide film as an impurity. In that case, the impurity preferably accounts for less than or equal to 0.1% of the metal oxide film.

In the case where the metal oxide film is formed by a sputtering method, when the atomic ratio of the element M to In is increased, the number of particles in deposition can be reduced. To reduce the number of particles, when the atomic ratio is In:M=x:y, y/(x+y) may be greater than or equal to 0.90, e.g., 0.93. Note that in the case where the metal oxide film is formed by a sputtering method, when the atomic ratio of M to In is too high, the insulating property of a target becomes high, which makes it difficult to perform deposition using DC discharge; as a result, it is necessary to use RF discharge. Accordingly, when deposition is performed using DC discharge, which is applicable to the case of using a large-sized substrate, y/(x+y) is set less than or equal to 0.96, preferably less than or equal to 0.95, e.g., 0.93. The use of the deposition method applicable to the case of using a large-sized substrate can increase the productivity of the semiconductor device.

Note that it is preferable that the metal oxide film not have a spinel crystal structure. This is because if the metal oxide film has a spinel crystal structure, a constituent element of the pair of electrodes 19 and 20 might be diffused into the oxide semiconductor film 17 through the region between the spinel crystal structure and another region. For example, it is preferable that an In-M oxide be used as the metal oxide film and that a divalent metal element (e.g., zinc) not be contained as M, in which case the formed metal oxide film does not have a spinel crystal structure.

The thickness of the metal oxide film is greater than or equal to a thickness that is capable of inhibiting diffusion of the constituent element of the pair of electrodes 19 and 20 into the oxide semiconductor film 17, and less than a thickness which inhibits supply of oxygen from the protective film 21 to the oxide semiconductor film 17. For example, when the thickness of the metal oxide film is greater than or equal to 10 nm, the constituent element of the pair of electrodes 19 and 20 can be prevented from diffusing into the oxide semiconductor film 17. When the thickness of the metal oxide film is less than or equal to 100 nm, oxygen can be effectively supplied from the protective film 21 to the oxide semiconductor film 17.

<Modification Example 5>

Figure 10A:
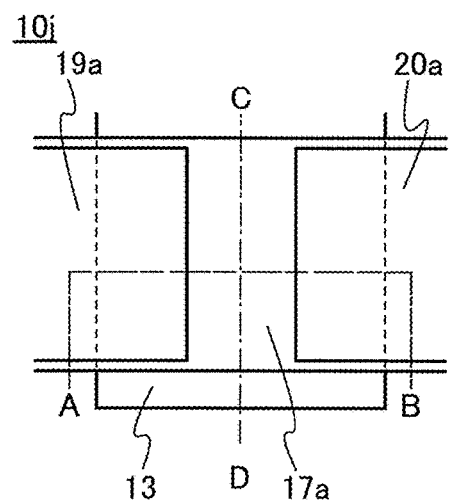
FIGS. 10A to 10C illustrate one embodiment of a transistor.
Figure 10C:
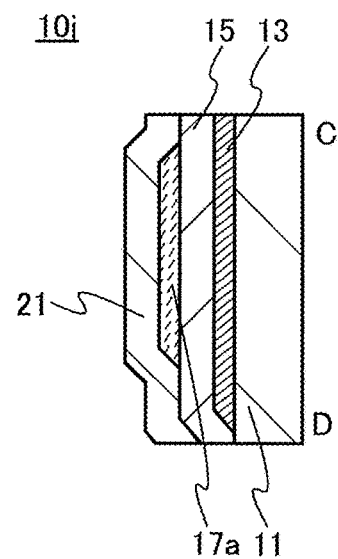
Figure 10B:
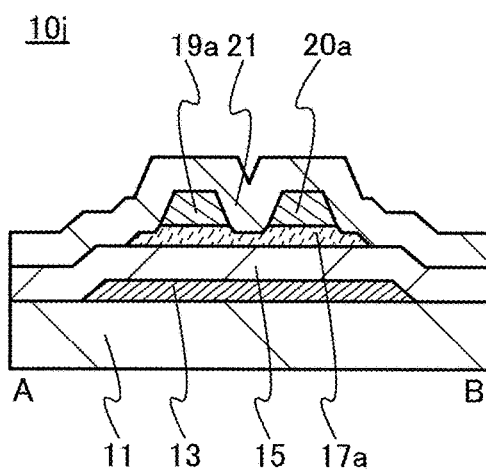

A modification example of the transistor described in this embodiment is described with reference to FIGS. 10A to 10C. A transistor 10j described in this modification example includes an oxide semiconductor film 17a and a pair of electrodes 19a and 20a that are formed using a multi-tone mask.

With the use of the multi-tone mask, a resist mask having plural thicknesses can be formed. After the oxide semiconductor film 17a is formed using the resist mask, the resist mask is exposed to oxygen plasma or the like; thus, the resist mask is partly removed to be a resist mask used for forming the pair of electrodes. As a result, the number of steps in photolithography in a process for forming the oxide semiconductor film 17a and the pair of electrodes 19a and 20a can be reduced.

With the use of a multi-tone mask, the oxide semiconductor film 17a is partly exposed to the outside of the pair of electrodes 19a and 20a when seen from the above.

Note that the structures, methods, and the like described in this embodiment can be used as appropriate in combination with any of the structures, methods, and the like described in the other embodiments and examples.

<Modification Example 6>

Figure 9:
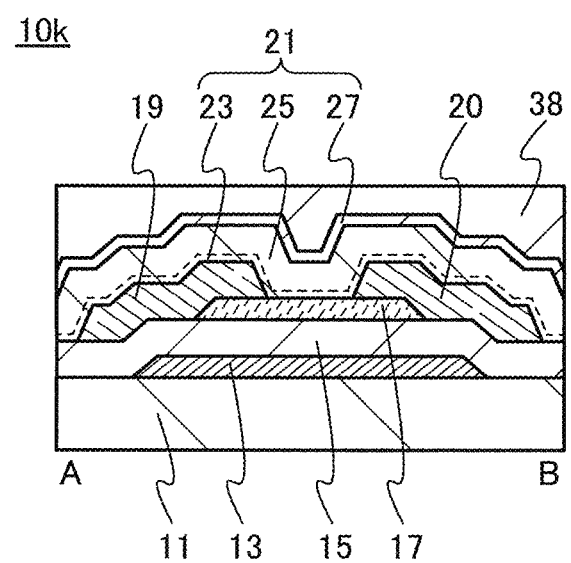
FIG. 9 illustrates one embodiment of a transistor.

Modification examples of the transistor described in this embodiment are described with reference to FIG. 9. A transistor 10k described in this modification example includes an organic insulating film 38 over the protective film 21.

As the organic insulating film 38, an organic resin film of polyimide, acrylic, polyamide, epoxy, or the like can be used, for example. The organic insulating film 38 preferably has a thickness greater than or equal to 500 nm and less than or equal to 10 μm.

The organic insulating film 38 may be provided to cover the whole protective film 21. Alternatively, the organic insulating film 38 may be provided for each transistor to overlap with the oxide semiconductor film 17 of each transistor. The organic insulating film 38 is preferably isolated from other organic insulating film 38 because water from the outside is not diffused into a semiconductor device through the organic insulating film 38.

Since the organic insulating film 38 is thick (greater than or equal to 500 nm), an electric field generated by application of negative voltage to the gate electrode 13 does not affect a surface of the organic insulating film 38; as a result, positive charges are less likely to be accumulated on the surface of the organic insulating film 38. In addition, even when positively charged particle in the air is adsorbed on the surface of the organic insulating film 38, the electric field of the positively charged particle adsorbed on the surface of the organic insulating film 38 is less likely to affect the interface between the oxide semiconductor film 17 and the protective film 21, because the organic insulating film 38 is thick (greater than or equal to 500 nm). As a result, practically no positive bias is applied to the interface between the oxide semiconductor film 17 and the protective film 21; thus, a change in the threshold voltage of the transistor is small.

Note that the structures, methods, and the like described in this embodiment can be used as appropriate in combination with any of the structures, methods, and the like described in the other embodiments and examples.

(Embodiment 2)

Note that the structures, methods, and the like described in this embodiment can be used as appropriate in combination with any of the structures, methods, and the like described in the other embodiments and examples.

<1. $NO_x$>

First, nitrogen oxide (hereinafter $NO_x$; x is greater than or equal to 0 and less than or equal to 2, preferably greater than or equal to 1 and less than or equal to 2) contained in the oxide insulating film in contact with the oxide semiconductor film is described.

<1-1. Transition Level of $NO_x$ in Oxide Insulating Film>

First, transition levels of point defects in a solid are described. A transition level shows the charge state of impurities or defects (hereinafter referred to as a defect D) forming a state in a gap, and is calculated from the formation energy of defects. In other words, a transition level is similar to a donor level or an acceptor level.

The relationship between formation energy and transition levels of the charge state of the defect D and is described. The formation energy of the defect D is different depending on the charge state and also depends on the Fermi energy. Note that $D^+$ represents a state in which a defect releases one electron, $D^-$ represents a state in which a defect traps one electron, and $D^O$ represents a state in which no electron is transferred.

Figure 11A:
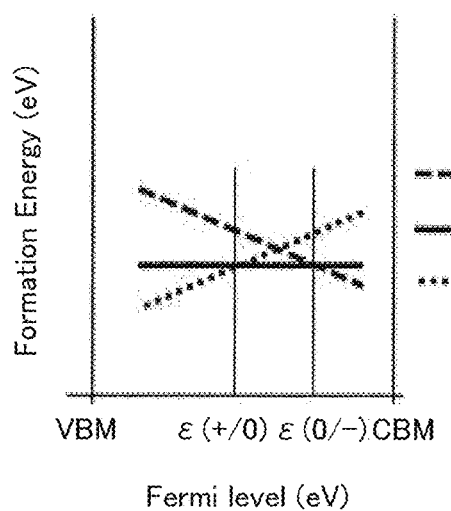
FIGS. 11A and 11B illustrate the relationship between formation energy and transition levels and electron configurations of defects.
Figure 11B:
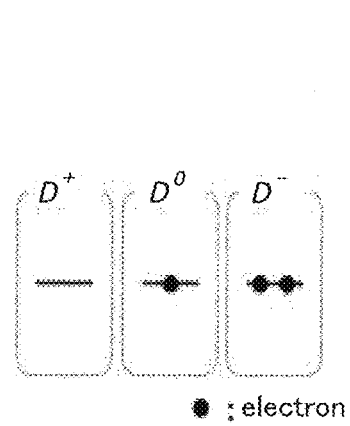

FIG. 11A illustrates the relationship between the formation energy and the transition level of each of the defects $D^+$, $D^0$, and $D^-$. FIG. 11B illustrates electron configurations of the defects $D^+$, $D^0$, and $D^-$ in the case where the defect D in a neutral state has an orbit occupied by one electron.

In FIG. 11A, the dotted line indicates the formation energy of the defect $D^+$, the solid line indicates the formation energy of the defect $D^O$, and the dashed line indicates the formation energy of the defect $D^-$. The transition level means the position of the Fermi level at which the formation energies of the defects D having different charge states become equal to each other. The position of the Fermi level at which the formation energy of the defect $D^+$ becomes equal to that of the defect $D^O$ (that is, a position at which the dotted line and the solid line intersect) is denoted by $\varepsilon(+/0)$, and the position of the Fermi level at which the formation energy of the defect $D^0$ becomes equal to that of the defect $D^-$ (that is, a position at which the solid line and the dashed line intersect) is denoted by $\varepsilon(0/-)$.

FIG. 12 illustrates a conceptual diagram of transition of charge states of a defect that are energetically stable when the Fermi level is changed. In FIG. 12, the dashed double-dotted line indicates the Fermi level. Right views of FIG. 12 are band diagrams of (1), (2), and (3) that indicate the Fermi level in a left view of FIG. 12.

By finding out the transition level of a solid, it is qualitatively known that which charge state allows a defect to be energetically stable at each of the Fermi levels when the Fermi level is used as a parameter.

As a typical example of the oxide insulating film in contact with the oxide semiconductor film, a silicon oxynitride (SiON) film was used, and the defect level in the silicon oxynitride film and an ESR signal attributed to the defect level were examined by calculation. Specifically, models in which $NO_2$, $N_2O$, NO, and an N atom were introduced into the respective silicon oxide ($SiO_2$) were formed, and the transition levels thereof were examined to verify whether $NO_2$, $N_2O$, NO, and an N atom introduced into silicon oxide serve as electron traps of the transistor.

Figure 13:
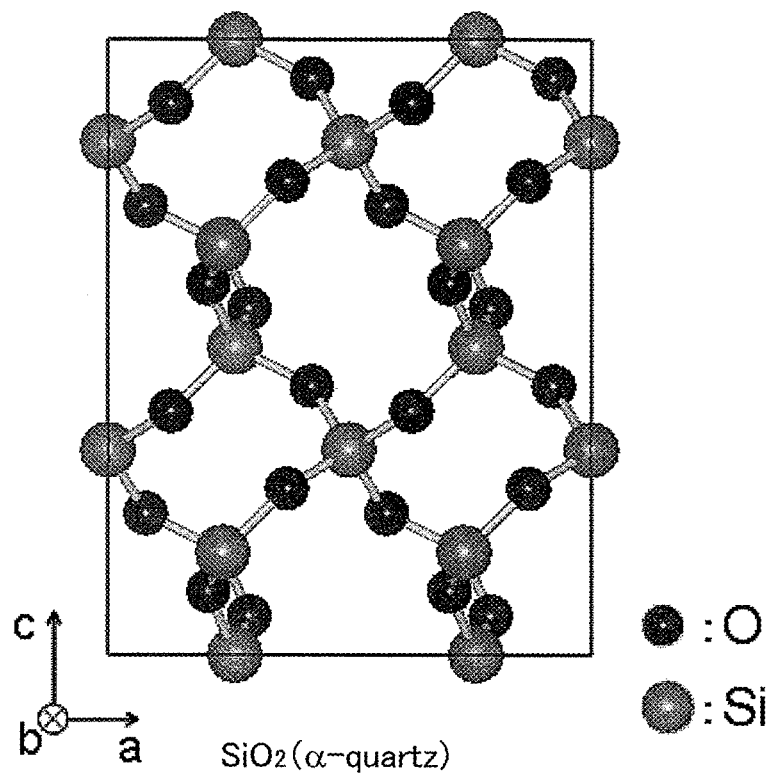
FIG. 13 shows a crystalline model of c-SiO$_2$.

In calculation. SiO$_2$ (c-SiO$_2$) with a low-temperature quartz (α-quartz) crystal structure was used as a model. A crystal model of c-SiO$_2$ without defects is shown in FIG. 13.

First, structure optimization calculation was performed on a model including 72 atoms, particularly on the lattice constants and the atomic coordinates. The model was obtained by doubling the unit cells in all axis direction of c-SiO$_2$. In the calculation, first principles calculation software VASP (the Vienna Ab initio Simulation Package) was used. The effect of inner-shell electron was calculated by a projector augmented wave (PAW) method, and as a functional, Hey d-Scuseria-Ernzerhof (HSE) DFT hybrid factor (HSE06) was used. The calculation conditions are shown below.

TABLE 1

| Software | VASP |
|---|---|
| Pseudopotential | PAW method |
| Functional | HSE06 |
| Mixing ratio of exchange term | 0.4 |
| Cut-off energy | 800 eV |
| k-point | 1 × 1 × 1 (optimization) |
| | 2 × 2 × 2 (total energy) |

The band gap of c-SiO$_2$ model after the structure optimization was 8.97 eV that is close to the experimental value, 9.0 eV.

Next, the structure optimization calculation was performed on the above c-SiO$_2$ models where NO$_2$, N$_2$O, NO, and an N atom were introduced into spaces (interstitial sites) in respective crystal structures. The structure optimization calculation was performed on each model with respect to the following three cases: a case where the whole model is positive monovalent (charge: +1); a case where the whole model is electrically neutral (zerovalent) (charge: neutral): and a case where the whole model is negative monovalent (charge: −1). Note that the charges imposed on the whole model, which were in the ground state of electrons, were localized in defects including NO$_2$, N$_2$O, NO, and an N atom.

Figure 14:
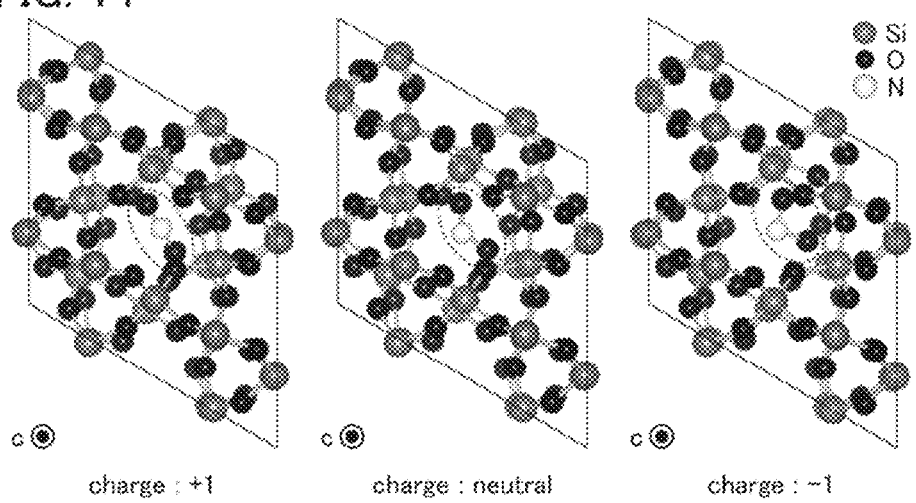
FIG. 14 shows a model in which NO$_2$ is introduced into an interstitial site of a c-SiO$_2$ model.

As for the model in which NO$_2$ was introduced into an interstitial site in the c-SiO$_2$ model, a structure after the structure optimization calculation was performed and structural parameters of an NO$_2$ are shown in FIG. 14. In FIG. 14, structural parameters of an NO$_2$ molecule in a gaseous state are also shown as a reference example.

Note that the molecule that is not electrically neutral is frequently called a molecular ion: however, unlike a gaseous state, it is difficult to quantitate the valence of molecule because the molecular discussed here is one introduced inside a crystal lattice. Thus, a molecule that is not electrically neutral is called molecular for convenience.

FIG. 14 shows that when an NO$_2$ molecule is introduced, the NO$_2$ molecule tends to be in a linear arrangement in the case where the charge of the model is +1. FIG. 14 also shows that the angle of the O—N—O bond of the model whose charge is −1 is smaller than that of the model whose charge is neutral, and the angle of the O—N—O bond of the model whose charge is neutral is smaller than that of the model whose charge is +1. This structure change in the NO$_2$ molecule is almost equal to a change in the bonding angle when the charge number of isolated molecules in a gas phase varies. Thus, it is suggested that almost the assumed charges are attributed to the NO$_2$ molecule, and the NO$_2$ molecule in SiO$_2$ probably exists in a state close to an isolated molecule.

Figure 15:
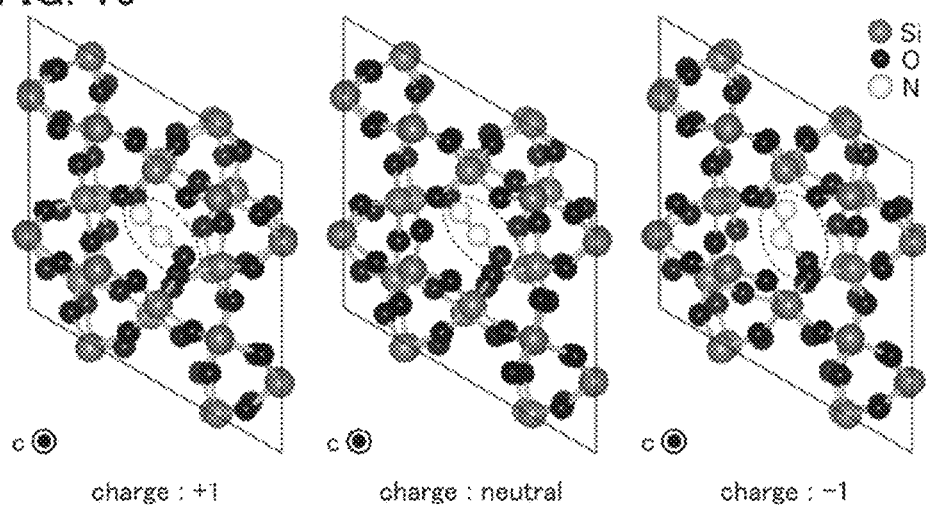
FIG. 15 shows a model in which N$_2$O is introduced into an interstitial site of a c-SiO$_2$ model.

Next, as for the model in which an N$_2$O molecule was introduced into an interstitial site in the c-SiO$_2$ model, a structure after the structure optimization calculation was performed and structural parameters of the N$_2$O molecule are shown in FIG. 15. In FIG. 15, structural parameters of the N$_2$O molecule in a gaseous state are also shown as a reference example.

According to FIG. 15, in the case where the charge of the model is +1 and the case where the charge is neutral, the structures of the N$_2$O molecules are both in a linear arrangement, which means the N$_2$O molecules of two cases have almost the same structure. In contrast, in the case where the charge of the model is −1, the N$_2$O molecule has a bent shape, and the distance between N and O is longer than that of the above two cases. This conceivable reason is that an electron enters the LUMO level that is π* orbital of the N$_2$O molecule.

Figure 16:
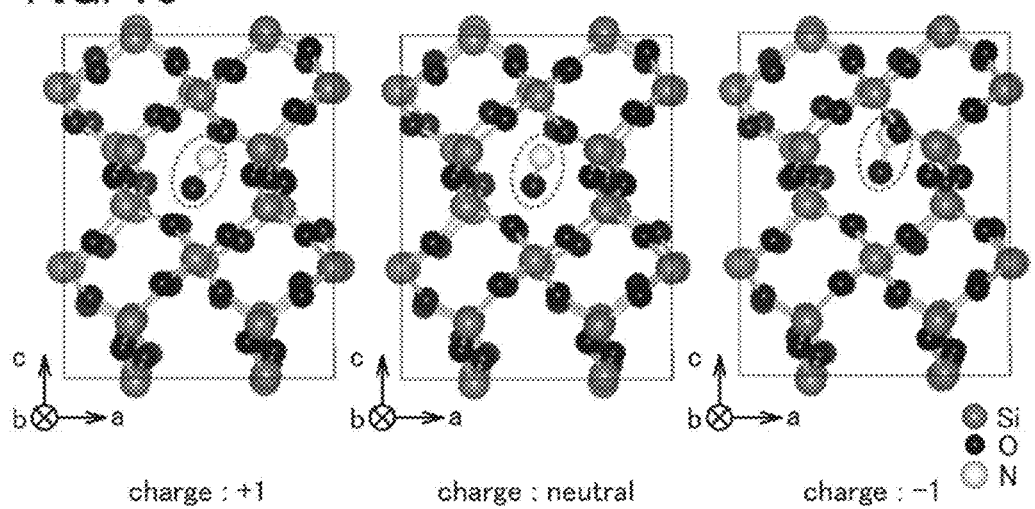
FIG. 16 shows a model in which NO is introduced into an interstitial site of a c-SiO$_2$ model.

Next, as for the model in which an NO molecule was introduced into an interstitial site in the c-SiO$_2$ model, a structure after the structure optimization calculation was performed and structural parameters of the NO molecule are shown in FIG. 16.

According to FIG. 16, the distance between N and O is short in the case where the charge of the model is +1, and the distance between a nitrogen atom and an oxygen atom is long in the case where the charge of the model is −1. This tendency is probably caused by the following reason. In the case where the charge of the NO molecule in a gaseous state is +1, the bond order of the N—O bond is 3.0; in the case where the charge of the NO molecule in a gaseous state is 0, the bond order is 2.5; and in the case where the charge of the NO molecule in a gaseous state is −1, the bond order is 2.0. Thus, the bond order becomes the largest when the charge is +1. Therefore, the NO molecule in SiO$_1$ is considered to exist stably in a state close to the isolated molecule.

Figure 17:
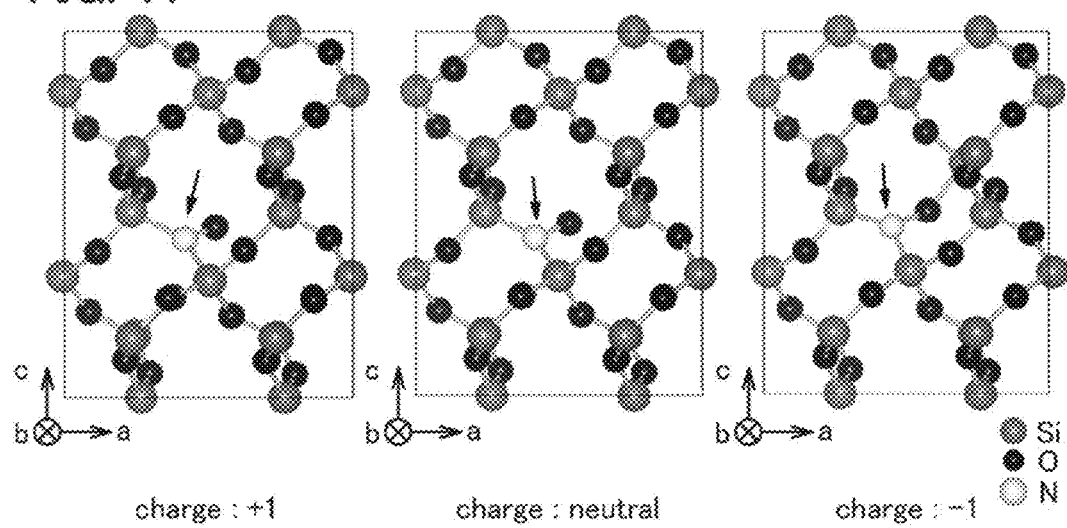
FIG. 17 shows a model in which an N atom is introduced into an interstitial site of a c-SiO$_2$ model.

Then, as for the model in which an N atom was introduced into an interstitial site in the c-SiO$_2$ model, a structure after the structure optimization calculation was performed is shown in FIG. 17.

According to FIG. 17, in either charge state, the N atom that is bonded to atoms in SiO$_2$ is more stable in terms of energy than the N atom exists as an isolated atom in an interstitial site.

Next, the calculation of a transition level was performed on each sample.

The transition level ε(q/q') for transition between the charge q state and the charge q' state in a model having defect D in its structure can be calculated with Formula 3.

$$\varepsilon(q/q') = \frac{\Delta E^q - \Delta E^{q'}}{q' - q} \quad \text{[Formula 3]}$$

$$\Delta E^q = E_{tot}(D^q) - E_{tot}(\text{bulk}) + \sum_i n_i \mu_i + q(\varepsilon_{VBM} + \Delta V_q + E_f)$$

In the above formula, $E_{tot}(D^q)$ represents the total energy in the model having defect D of the charge q, $E_{tot}(\text{bulk})$ represents the total energy in a model without defects, $n_i$ represents the number of atoms i contributing to defects, $\mu_i$ represents the chemical potential of atom i, $\varepsilon_{VBM}$ represents the energy of the valence band maximum in the model without defects, $\Delta V_q$ represents the correction term relating to the electrostatic potential, and $E_f$ represents the Fermi energy.

Figure 18:
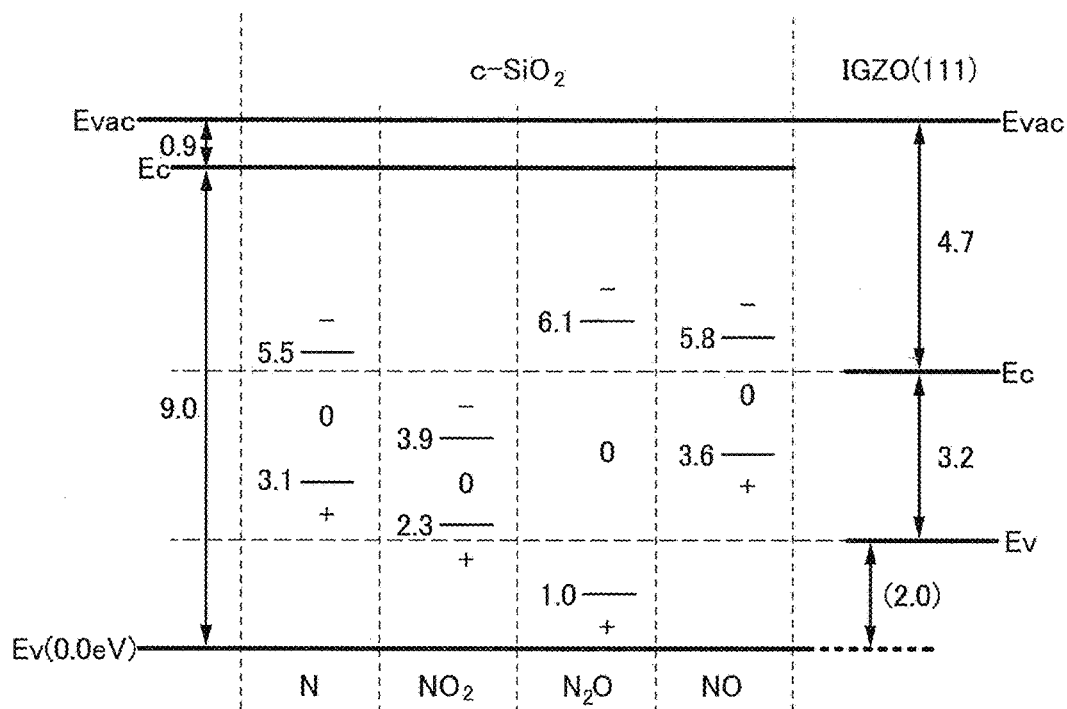
FIG. 18 is a band diagram.

FIG. 18 is a band diagram showing the transition levels obtained from the above formula. As the oxide semiconductor film, an oxide semiconductor film (hereinafter referred to as IGZO(111)) formed using metal oxide having an atomic ratio of In:Ga:Zn=1:1:1 is used. In FIG. 18, a band diagram of the IGZO(111) is shown in addition to the band diagrams of the above four models. The unit of the values in FIG. 18 is "eV".

In FIG. 18, the value of each transition level indicates a value obtained when the valence band maximum of $SiO_2$ is considered as a base (0.0 eV). Although a reference value was used as an electron affinity of $SiO_2$ here, the practical positional relation of the bands in the case where $SiO_2$ is bonded to the IGZO(111) is affected by the electron affinity of $SiO_2$ in some cases.

Hereinafter, the transition level that transits between a state where the charge of the model is +1 and a state where the charge of the model is 0 is referred to as (+/0), and the transition level that transits between a state where the charge of the model is 0 and a state where the charge of system is −1 is referred to as (0/−).

According to FIG. 18, in the model in which an $NO_2$ molecule was introduced into $SiO_2$, two transition levels of (+/0) and (0/−) exist at the positions within the band gap of the IGZO(111), which suggests that the $NO_2$ molecule may relate to trap and detrap of electrons. In both a model in which an NO molecule was introduced into $SiO_2$ and a model in which an N atom was introduced into $SiO_2$, the transition level of (+/0) exists at a position within the band gap of the IGZO(111). In contrast, the transition level of the model in which an $N_2O$ molecule was introduced into $SiO_2$ exists outside of the band gap of the IGZO(111), and the $N_2O$ molecules probably exist stably as neutral molecules regardless of the position on the Fermi level.

The above results strongly suggest that interstitial molecules containing nitrogen, which relate to trap and detrap of electrons caused by a shift of the threshold voltage of a transistor in the positive direction, have the transition level at a position on the conduction band side within the band gap of the IGZO(111). Here, a molecule having a transition level at a position close to the conduction band in the band gap of the IGZO(111) is probably an $NO_2$ molecule or an NO molecule, or both.

<1-2. Examination of ESR Signal>

Following the calculation results of the transition level, ESR signals of $NO_2$ molecules were calculated. In addition, a model in which an N atom substituted for an oxygen atom in $SiO_2$ was examined in a manner similar to that of the above case.

In this case, an N atom has seven electrons, and an O atom has eight electrons; in other words, an electron structure of the $NO_2$ molecule has an open shell. Thus, the neutral $NO_2$ molecule has a lone electron, and can be measured by ESR. In the case where an N atom substitutes for an O atom in $SiO_2$, only two Si atoms exist around an N atom and the N atom includes a dangling bond. Thus, the case can also be measured by ESR. Furthermore, $^{14}N$ has only one nuclear spin, and a peak of ESR signal relating to $^{14}N$ is split into three. At this time, the split width of ESR signal is a hyperfine coupling constant.

Figure 19A:
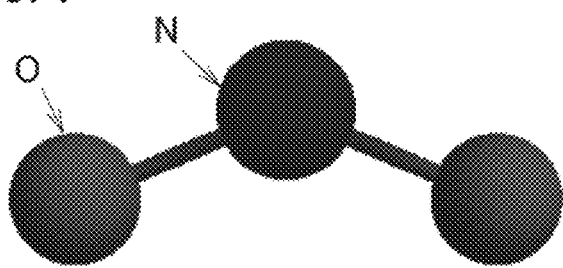
FIGS. 19A and 19B each show a model of a cluster structure.
Figure 19B:
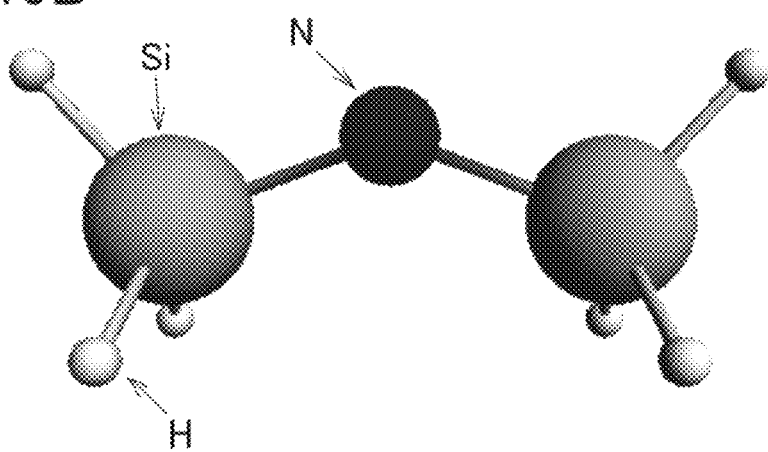

Thus, calculation was performed to examine whether split of an ESR signal of the oxide insulating film into three is caused by the $NO_2$ molecule or the N atom that replaces an O atom in $SiO_2$. When an $SiO_2$ crystal structure is used as a model, the amount of calculation is enormous. Thus, in this case, two kinds of models of cluster structures as shown in FIGS. 19A and 19B were used, the structure optimization was performed on these models, and then, g-factors and hyperfine coupling constants were calculated. FIG. 19A shows a model of an $NO_2$ molecule in a neutral state, and FIG. 19B shows a cluster model including an Si—N—Si bond. Note that the model shown in FIG. 19B is a cluster model in which a dangling bond of an Si atom is terminated with an H atom.

Amsterdam density functional (ADF) software was used for structure optimization of the models and calculation of the g-factors and hyperfine coupling constants of the models whose structures were optimized. In the structure optimization and the calculation of the models and the g-factors and hyperfine coupling constants of the models whose structures were optimized, "GGA:BP" was used as a functional, and "QZ4P" was used as a basic function, and "None" was used as Core Type. In addition, in the calculation of the g-factors and hyperfine coupling constants, "Spin-Orbit" was considered as a relativistic effect, and as a calculation method of ESR/EPR, "g & A-Tensor (full SO)" was employed. The calculation conditions are as follows.

TABLE 2

| | |
|---|---|
| Software | ADF |
| Basis function | QZ4P |
| Functional | GGA-BP |
| Core Type | None |
| Relativistic Effect | Spin-Orbit |
| Calculation method of ESR/EPR | g & A-Tensor (full SO) |

As a result of structure optimization, in the case of the $NO_2$ molecule shown in FIG. 19A, the bonding distance of the N—O bond was 0.1205 nm, and the angle of the O—N—O bond was 134.1°, which are close to experimental values of the $NO_2$ molecule (the bonding distance: 0.1197 nm, and the bonding angle 134.3°). In the case of the Si—N—Si cluster model shown in FIG. 19B, the bonding distance of Si—N was 0.172 nm and the angle of the Si—N—Si bond was 138.3°, which were almost the same as the bonding distance of Si—N(0.170 nm) and the angle of the Si—N—Si bond (139.0°) in the structure that had been subjected to structure optimization by first principles calculation in a state where an N atom substitutes for an O atom in the $SiO_2$ crystal.

The calculated g-factors and hyperfine coupling constants are shown below.

TABLE 3

| | g-factor | | | | Hyperfine coupling constant [mT] | | | |
|---|---|---|---|---|---|---|---|---|
| | g_x | g_y | g_z | g (average) | A_x | A_y | A_z | A (average) |
| $NO_2$ | 2.0066 | 1.9884 | 2.0014 | 1.9988 | 4.54 | 4.49 | 6.53 | 5.19 |
| Si—N—Si | 2.0021 | 2.0174 | 2.0056 | 2.0084 | 3.14 | −0.61 | −0.62 | 0.64 |

As described above, the hyperfine coupling constant A corresponds to the split width of a peak of the ESR signal.

Figure 20A:
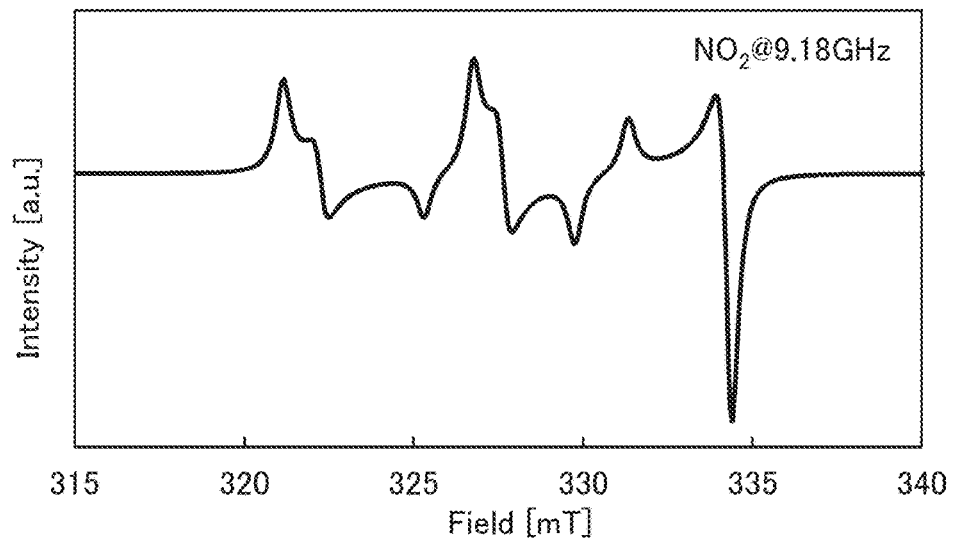
FIGS. 20A and 20B show ESR spectra of NO$_2$ and N—Si—N.
Figure 20B:
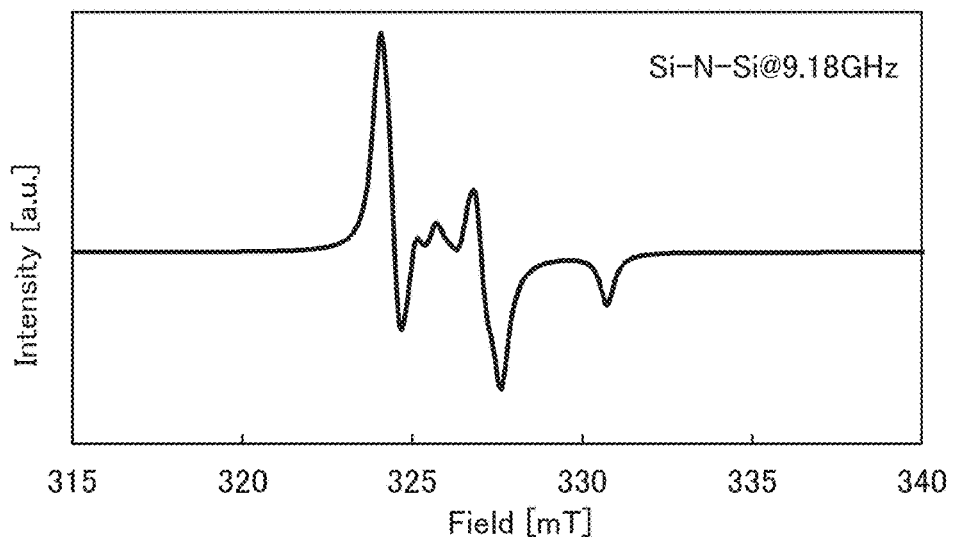

According to Table 3, the average value of the hyperfine coupling constant A of the $NO_2$ molecule is approximately 5 mT. In the case of the Si—N—Si cluster model, only A_x in the hyperfine coupling constants A is a positive value, which is approximately 3 mT FIG. 20A and FIG. 20B show the ESR spectra of $NO_2$ and Si—N—Si, respectively, which are calculated from the g-factor and the hyperfine coupling constant A.

According to this result, the ESR spectrum that has three signals, a hyperfine structure constant of approximately 5 mT, and a g-factor of approximately 2, which are obtained by ESR measurement using an X-band, is obtained probably because of an $NO_2$ molecule in an $SiO_2$ crystal. Among three signals, the g-factor of the medium signal is approximately 2.

<1-3. Consideration of Deterioration Mechanism of Transistor>

A mechanism of a phenomenon in which the threshold voltage of a transistor is shifted in the positive direction when a positive gate BT stress test (+GBT) is performed is considered below based on the above results.

Figure 21:
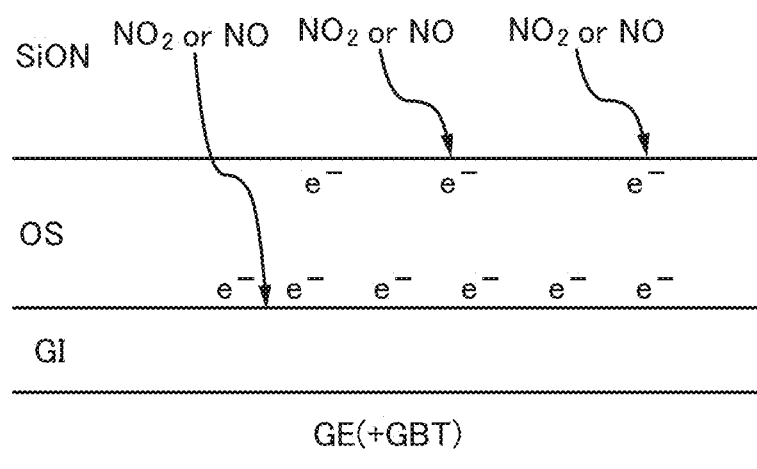
FIG. 21 illustrates a mechanism of a phenomenon in which the threshold voltage of a transistor is shifted in the positive direction.

The mechanism is considered with reference to FIG. 21. FIG. 21 illustrates a structure in which a gate (GE), a gate insulating film (GI), an oxide semiconductor film (OS), and a silicon oxynitride film (SiON) are stacked in this order. Here, a case where the silicon oxynitride film SiON that is positioned on the back channel side of the oxide semiconductor film (OS) contains nitrogen oxide is described.

First, when the positive gate BT stress test (+GBT) is performed on the transistor, the electron densities of the gate insulating film GI side and the silicon oxynitride film SiON side of the oxide semiconductor film OS become higher. In the oxide semiconductor film OS, the silicon oxynitride film SiON side has a lower electron density than the gate insulating film GI side. When an $NO_2$ molecule or an NO molecule contained in the silicon oxynitride film SiON is diffused into the interface between the gate insulating film GI and the oxide semiconductor film OS and the interface between the oxide semiconductor film OS and the silicon oxynitride film SiON, electrons on the gate insulating film GI side and the back channel side that are induced by the positive gate BT stress test (+GBT) are trapped. As a result, the trapped electrons remain in the vicinity of the interface between the gate insulating film GI and the oxide semiconductor film OS and the interface between the oxide semiconductor film OS and the silicon oxynitride film SiON; thus, the threshold voltage of the transistor is shifted in the positive direction.

That is, a lower concentration of nitrogen oxide contained in the silicon oxynitride film in contact with the oxide semiconductor film can suppress a change in the threshold voltage of the transistor. Here, as specific examples of the silicon oxynitride film in contact with the oxide semiconductor film, the protective film in contact with the back channel side, the gate insulating film, and the like can be given. By providing the silicon oxynitride film containing an extremely small amount of nitrogen oxide in contact with the oxide semiconductor film the transistor can have excellent reliability.

<2. $V_OH$>

Next, an H atom (hereinafter referred to as $V_OH$) positioned in an oxygen vacancy $V_{O-}$, which is one of defects contained in the oxide semiconductor film, is described.

<2-1. Energy and Stability between Existing Modes of H>

First, the energy difference and stability in a mode of H that exists in an oxide semiconductor film is described with calculated results. Here, $InGaZnO_4$ (hereinafter referred to as IGZO(111)) was used as the oxide semiconductor film.

The structure used for the calculation is based on an 84-atom bulk model in which twice the number of a hexagonal unit cell of the IGZO(111) is arranged along the a-axis and b-axis.

Figure 22A:
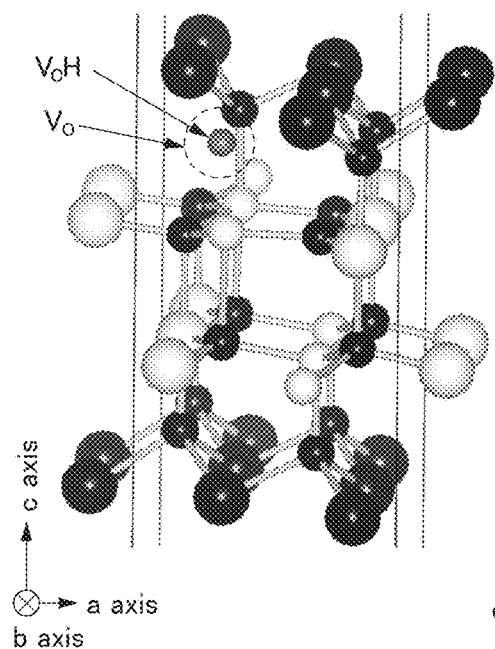
FIGS. 22A to 22D illustrate bulk models.
Figure 22B:
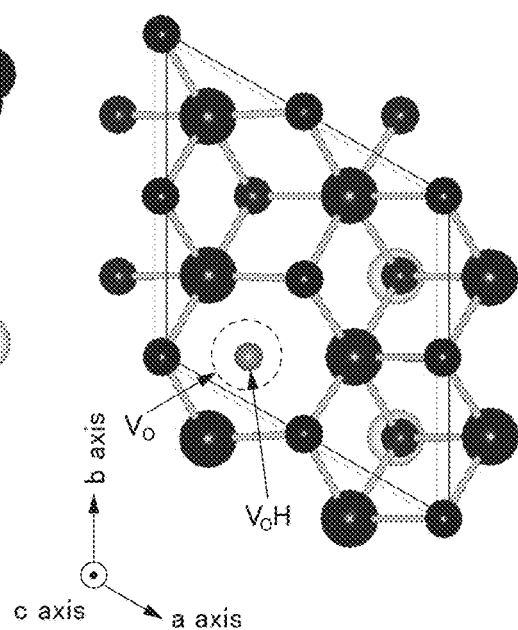

As the bulk model, a model in which one O atom bonded to three In atoms and one Zn atom is replaced with an H atom was prepared (see FIG. 22A). FIG. 22B shows a diagram in which the a-b plane of the InO layer in FIG. 22A is viewed from the c-axis direction. A region from which one O atom bonded to three In atoms and one Zn atom is removed is shown as an oxygen vacancy $V_O$, which is shown in a dashed line in FIGS. 22A and 22B. In addition, an H atom in the oxygen vacancy $V_O$ is expressed as $V_OH$.

Figure 22C:
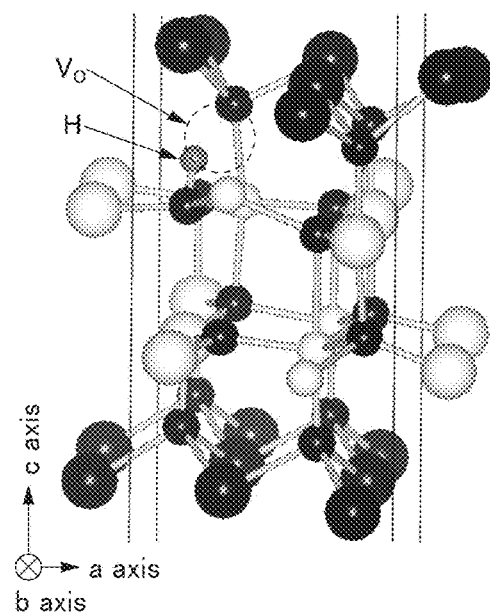
Figure 22D:
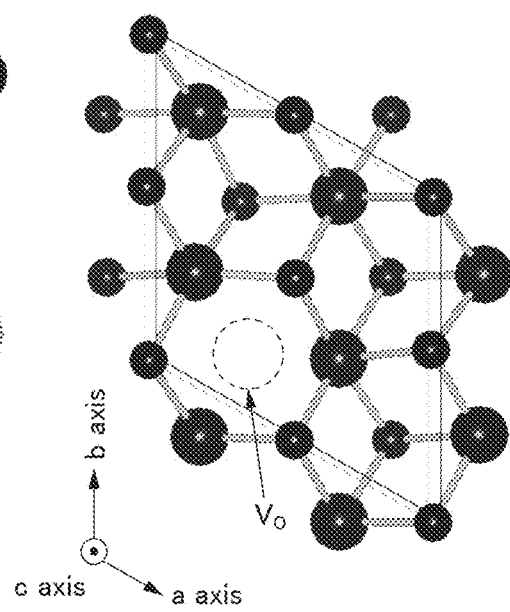

In the bulk model, one 0 atom bonded to three In atoms and one Zn atom is removed, whereby an oxygen vacancy ($V_O$) is formed. A model in which, in the vicinity of the oxygen vacancy $V_O$, an H atom is bonded to one O atom to which one Ga atom and two Zn atoms are bonded on the a-b plane was prepared (see FIG. 22C). FIG. 22D shows a diagram in which the a-b plane of the InO layer in FIG. 22C is viewed from the c-axis direction. In FIGS. 22C and 22D, an oxygen vacancy $V_O$ is shown in a dashed line. A model in which an oxygen vacancy $V_O$ is formed and, in the vicinity of the oxygen vacancy $V_O$, an H atom is bonded to one O atom to which one Ga atom and two Zn atoms are bonded on the a-b plane is expressed as $V_O+H$.

Optimization calculation was performed on the above two models with a fixed lattice constant to calculate the total energy. Note that as the value of the total energy is smaller, the structure becomes more stable.

In the calculation, first principles calculation software VASP (The Vienna Ab initio simulation Package) was used. The calculation conditions are shown in Table 4.

TABLE 4

| Software | VASP |
|---|---|
| Pseudopotential | PAW method |
| Functional | GGA/PBE |
| Cut-off energy | 500 eV |
| k-point | 4 × 4 × 1 |

As pseudopotential calculation of electronic states, a potential generated by a projector augmented wave (PAW) method was used, and as a functional, generalized-gradient-approximationPerdew-Burke-Ernzerhof (GGA/PBE) was used.

In addition, the total energy of the two models that were obtained by the calculations is shown in Table 5.

TABLE 5

| Model | Total energy |
|---|---|
| VoH | −456.084 eV |
| Vo + H | −455.304 eV |

According to Table 5, the total energy of $V_OH$ is lower than that of $V_O+H$ by 0.78 eV. Thus, $V_OH$ is more stable than $V_O+H$. This suggests that, when an H atom comes close to an oxygen vacancy ($V_O$), the H atom is easily trapped in the oxygen vacancy ($V_O$) than bonding with an O atom.

<2-2. Thermodynamic State of $V_OH$>

Next, the thermodynamic state of $V_OH$, which is an H atom trapped in an oxygen vacancy ($V_O$), is evaluated with electronic state calculation, and the results are described.

The formation energies of the defects $V_OH$ contained in the IGZO(111), $(V_OH)^+$, $(V_OH)^-$, and $(V_OH)^0$, were calculated. Note that $(V_OH)^+$ represents a state in which a defect releases one electron, $(V_OH)^-$ represents a state in which a defect traps one electron, and $(V_OH)^0$ represents a state in which no electron is transferred.

Figure 23:
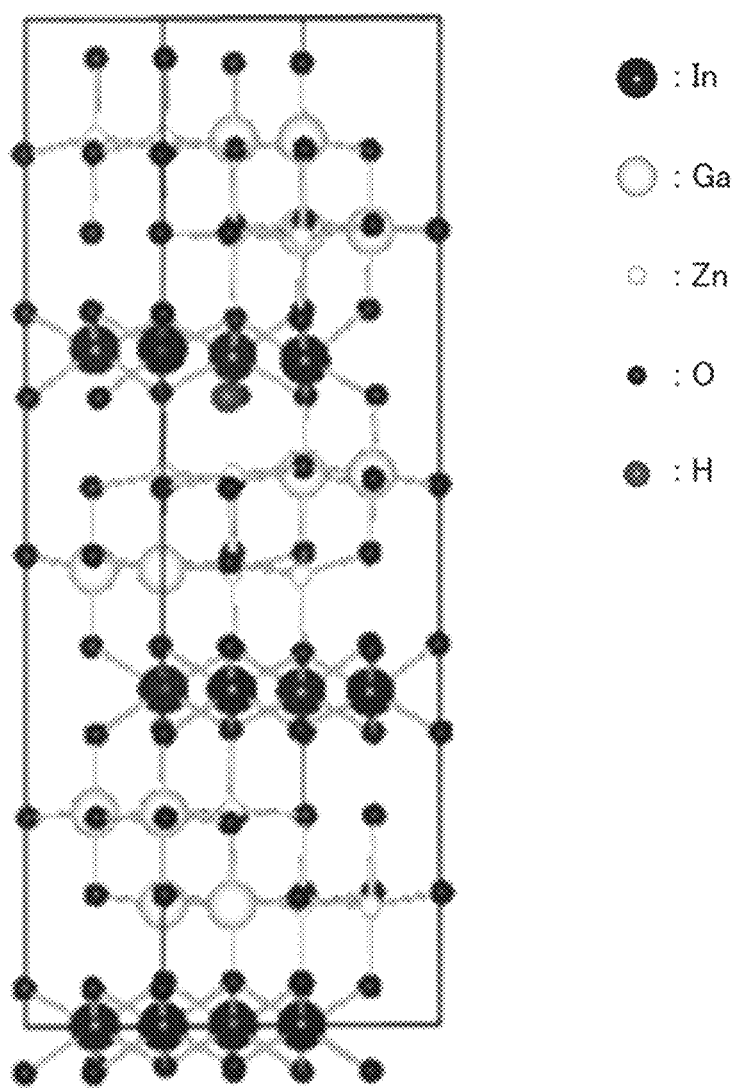
FIG. 23 illustrates a structure of a model.

In the calculation, the first principles calculation software VASP was used. The calculation conditions are shown in Table 6. FIG. 23 illustrates a model that was used for the calculation. The formation energy was calculated on the assumption of the reaction in Formula 4. As pseudopotential calculation of electronic states, a potential generated by a PAW method was used, and as a functional, Hey d-Scuseria-Ernzerhof (HSE) DFT hybrid factor (HSE06) was used. Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the valence band maximum of a complete crystal serving as the origin of energy.

TABLE 6

| Software | VASP |
|---|---|
| Pseudopotential | PAW method |
| Functional | HSE06 |
| Cut-off energy | 800 eV |
| The number of k-point samples | 2 × 2 × 1 (optimization) |
| | 4 × 4 × 1 (single) |
| Spin | Polarized |
| Shielding parameter | 0.2 |
| Exchange term mixing ratio | 0.25 |
| The number of atoms | 84 |

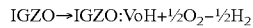

$E_{form}(IGZO:VoH)=E_{tot}(IGZO:VoH)-E_{tot}(IGZO)+$
$½E_{tot}(O_2)-½E_{tot}(H)$ [Formula 4]

Figure 24A:
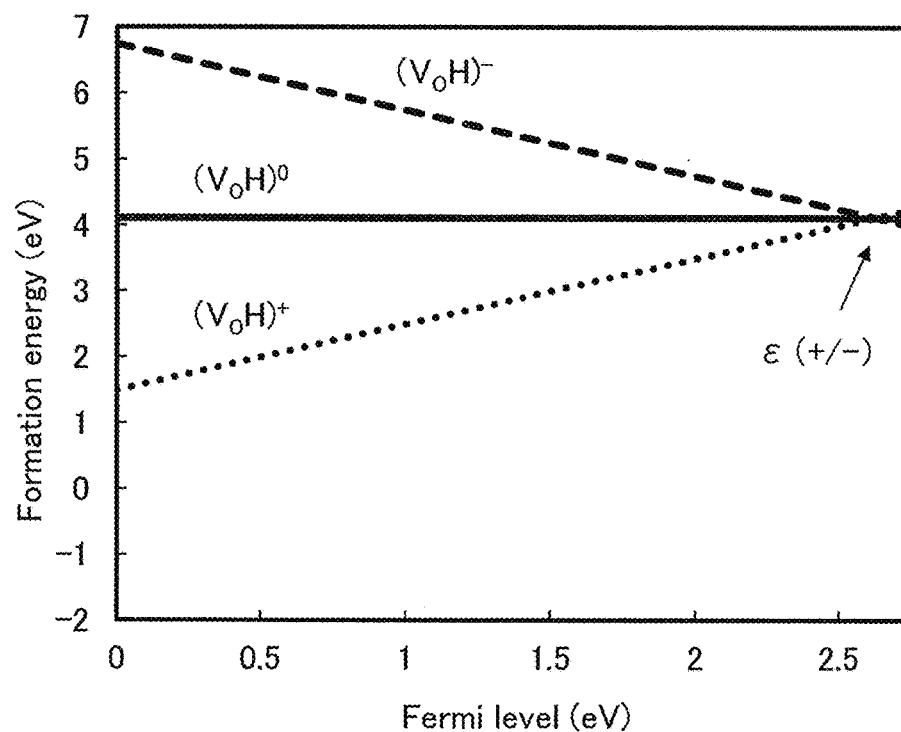
FIGS. 24A and 24B illustrate the relationship between the formation energy and transition levels of V$_O$H and the thermodynamic transition level of V$_O$H.

The formation energy obtained by the calculation is shown in FIG. 24A.

FIG. 24A shows the formation energies of $(V_OH)^+$, $(V_OH)^-$, and $(V_OH)^0$. The lateral axis represents the Fermi level, and the longitudinal axis represents the formation energy. The dotted line represents the formation energy of $(V_OH)^+$, the solid line represents the formation energy of $(V_OH)^0$, and the dashed line represents the formation energy of $(V_OH)^-$. In addition, the transition level of the $V_OH$ charge from $(V_OH)^+$ to $(V_OH)^-$ through $(V_OH)^0$ is represented by $\varepsilon$ (+/−).

Figure 24B:
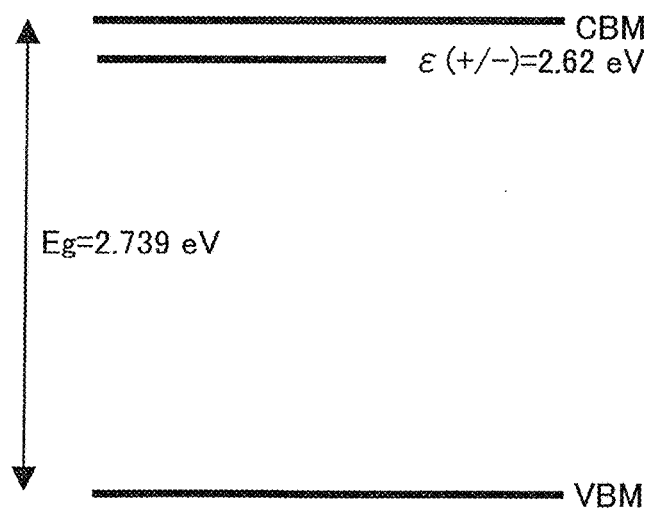

FIG. 24B shows a thermodynamic transition level of $V_OH$. From the calculation result, the energy gap of $InGaZnO_4$ was 2.739 eV. In addition, when the energy of the valence band is 0 eV, the transfer level ($\varepsilon$(+/−)) is 2.62 eV, which exists just under the conduction band. These suggest that in the case where the Fermi level exists in the energy gap, the charge state of $V_OH$ is always +1 and $V_OH$ serves as a donor. This shows that IGZO(111) becomes n-type by trapping an H atom in an oxygen vacancy ($V_O$).

Figure 25:
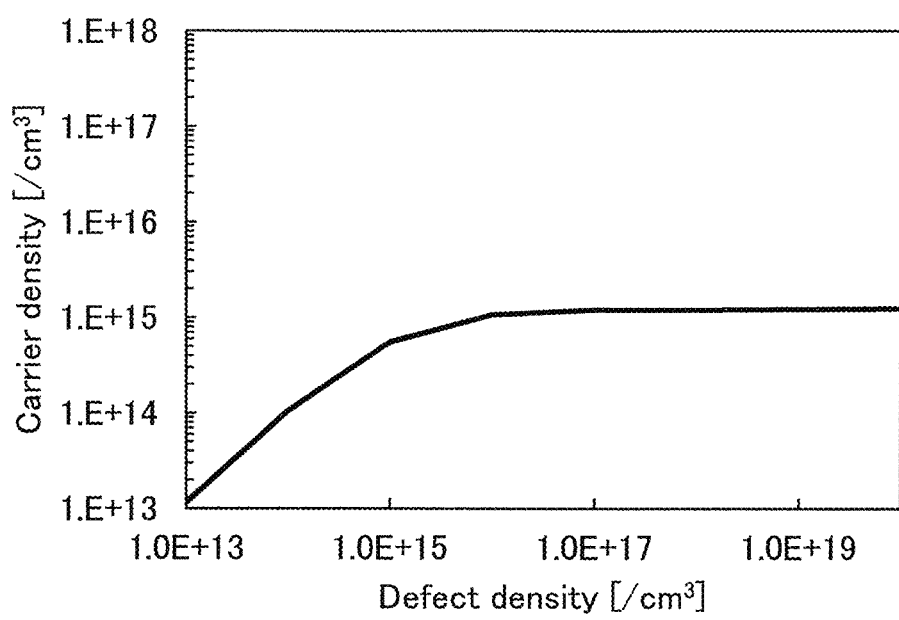
FIG. 25 shows the relationship between the carrier density and the defect density of V$_O$H.

Next, FIG. 25 shows the evaluation results of the relationship between the carrier (electron) density and the defect $(V_OH)$ density.

FIG. 25 shows that the carrier density increases as the defect $(V_OH)$ density increases.

Accordingly, it is found that $V_OH$ in the IGZO(111) serves as a donor. In addition, it is also found that when the density of $V_OH$ becomes high, the IGZO(111) becomes n-type.

<3. Model Explaining Relationship between DOS in Oxide Semiconductor Film and Element to be DOS>

When density of states (DOS) exists inside an oxide semiconductor film and in the vicinity of the interface between the oxide semiconductor film and the outside, DOS can cause deterioration of a transistor including the oxide semiconductor film. The DOS inside the oxide semiconductor film and in the vicinity of the interface with the oxide semiconductor film can be explained on the basis of the positions of and the bonding relation among oxygen (O), an oxygen vacancy ($V_O$), hydrogen (H), and nitrogen oxide ($NO_x$). A concept of a model is described below.

In order to fabricate a transistor with stable electrical characteristics, it is important to reduce the DOS inside the oxide semiconductor film and in the vicinity of the interface (to make a highly purified intrinsic state). In order to reduce the DOS, oxygen vacancies, hydrogen, and nitrogen oxide should be reduced. A relationship between DOS, which exists inside the oxide semiconductor film and in the vicinity of the interface with the oxide semiconductor film, and an oxygen vacancy, hydrogen, and nitrogen oxide will be described below with the use of a model.

Figure 26:
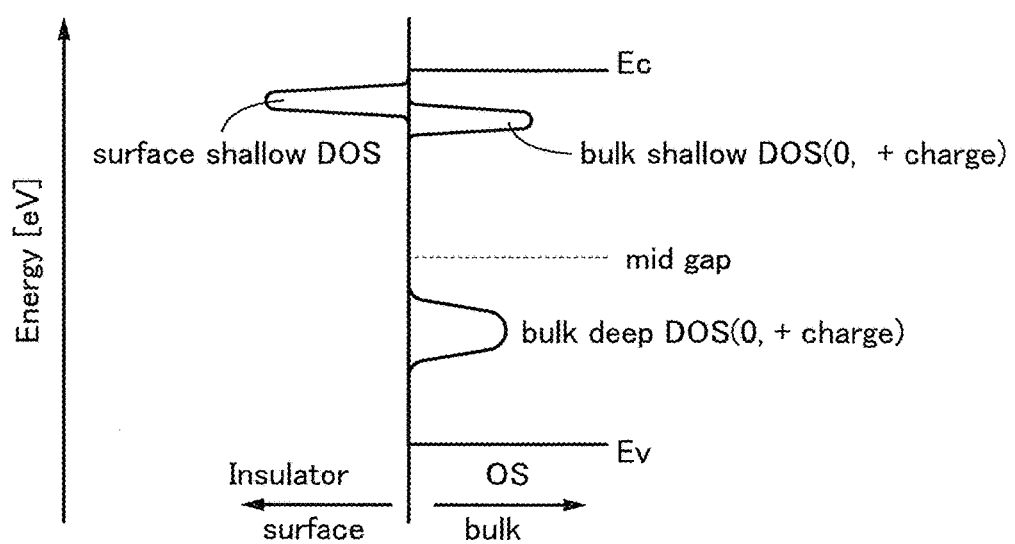
FIG. 26 illustrates a band structure of DOS inside an oxide semiconductor film and in the vicinity of the interface of the oxide semiconductor film.

FIG. 26 illustrates a band structure of DOS inside an oxide semiconductor film and in the vicinity of the interface of the oxide semiconductor film. The case where the oxide semiconductor film is the oxide semiconductor film (IGZO (111)) containing indium, gallium, and zinc is described below.

There are two types of DOS, DOS at a shallow level (shallow level DOS) and DOS at a deep level (deep level DOS). Note that in this specification, the shallow level DOS refers to DOS between energy at the conduction band minimum (Ec) and the mid gap. Thus, for example, the shallow level DOS is located closer to energy at the conduction band minimum. Note that in this specification, the deep level DOS refers to DOS between energy at the valence band maximum (Ev) and the mid gap. Thus, for example, the deep level DOS is located closer to the mid gap than to energy at the valence band maximum.

In the oxide semiconductor film, there are two types of shallow level DOS. One is DOS in the vicinity of a surface of an oxide semiconductor film (at the interface with an insulating film (insulator) or in the vicinity of the interface with the insulating film), that is, surface shallow DOS. The other is DOS inside the oxide semiconductor film, that is, bulk shallow DOS. Furthermore, as a type of the deep level DOS, there is DOS inside the oxide semiconductor film, that is, bulk deep DOS.

These types of DOS are likely to act as described below. The surface shallow DOS in the vicinity of the surface of an oxide semiconductor film is located at a shallow level from the conduction band minimum, and thus trap and loss of an electric charge are likely to occur easily in the surface shallow DOS. The bulk shallow DOS inside the oxide semiconductor film is located at a deep level from the conduction band minimum as compared to the surface shallow DOS in the vicinity of the surface of the oxide semiconductor film, and thus loss of an electric charge does not easily occur in the bulk shallow DOS.

An element causing DOS in an oxide semiconductor film is described below.

For example, when a silicon oxide film is formed over an oxide semiconductor film, indium contained in the oxide semiconductor film is taken into the silicon oxide film and replaced with silicon to form shallow level DOS.

For example, in the interface between the oxide semiconductor film and the silicon oxide film, a bond between oxygen and indium contained in the oxide semiconductor film is broken and a bond between the oxygen and silicon is generated. This is because the bonding energy between silicon and oxygen is higher than the bonding energy between indium and oxygen, and the valence of silicon (tetravalence) is larger than the valence of indium (trivalence). Oxygen contained in the oxide semiconductor film is trapped by silicon, so that a site of oxygen that has been bonded to indium becomes an oxygen vacancy. In addition, this phenomenon occurs similarly when silicon is contained inside the oxide semiconductor film, as well as in the surface. Such an oxygen vacancy forms deep level DOS.

Another cause as well as silicon can break the bond between indium and oxygen. For example, in an oxide semiconductor film containing indium, gallium, and zinc, the bond between indium and oxygen is weaker and cut more easily than the bond between oxygen and gallium or zinc. For this reason, the bond between indium and oxygen is broken by plasma damages or damages due to sputtered particles, so that an oxygen vacancy can be produced. The oxygen vacancy forms deep level DOS.

The deep level DOS can trap a hole and thus serve as a hole trap (hole trapping center). This means that the oxygen vacancy forms bulk deep DOS inside the oxide semiconductor film. Since such an oxygen vacancy forms bulk deep DOS, the oxygen vacancy is an instability factor to the oxide semiconductor film.

Such deep level DOS due to an oxygen vacancy is one of causes for forming bulk shallow DOS in the oxide semiconductor film, which is described below.

In addition, an oxygen vacancy in the oxide semiconductor film traps hydrogen to be metastable. That is, when an oxygen vacancy that is deep level DOS and is capable of trapping a hole traps hydrogen, the oxygen vacancy forms bulk shallow DOS and becomes metastable. As described in <Thermodynamic State of $V_OH$> of this embodiment, when an oxygen vacancy traps hydrogen, the oxygen vacancy is neutrally or positively charged. That is, $V_OH$, which is one bulk shallow DOS in the oxide semiconductor film, releases an electron, to be neutrally or positively charged, which adversely affects the characteristics of a transistor.

It is important to reduce the density of oxygen vacancies to prevent an adverse effect on the characteristics of the transistor. Thus, by supplying excess oxygen to the oxide semiconductor film, that is, by filling oxygen vacancies with excess oxygen, the density of oxygen vacancies in the oxide semiconductor film can be lowered. In other words, the oxygen vacancies become stable by receiving excess oxygen. For example, when excess oxygen is included in the oxide semiconductor film or an insulating film provided near the interface with the oxide semiconductor film, the excess oxygen can fill oxygen vacancies in the oxide semiconductor film, thereby effectively eliminating or reducing oxygen vacancies in the oxide semiconductor film.

As described above, the oxygen vacancy may become a metastable state or a stable state by hydrogen or oxygen.

As described in <Transition Level of $NO_x$ in Oxide Insulating Film> of this embodiment, NO or $NO_2$, which is $NO_x$, traps an electron included in the oxide semiconductor film. Because NO or $NO_2$, which is $NO_x$, is surface shallow DOS in the vicinity of the surface of the oxide semiconductor film, when $NO_x$ is included in the insulating film in the vicinity of the interface with the oxide semiconductor film, the characteristics of a transistor are adversely affected.

It is important to reduce the content of $NO_x$ in the insulating film in the vicinity of the interface with the oxide semiconductor film to prevent an adverse effect on the characteristics of the transistor.

<3-1. Model of Hysteresis Deterioration in Dark State of Transistor Including Oxide Semiconductor Film>

A mechanism in deterioration of a transistor including an oxide semiconductor film is described next. The transistor including an oxide semiconductor film deteriorates differently depending on whether or not the transistor is irradiated with light. When the transistor is irradiated with light, deterioration is likely to result from the bulk deep DOS at the deep level inside the oxide semiconductor film. When the transistor is not irradiated with light, deterioration is likely to result from the surface shallow DOS at the shallow level in the vicinity of the surface of the oxide semiconductor film (at the interface with an insulating film or in the vicinity thereof).

Thus, a state where the transistor including an oxide semiconductor film is not irradiated with light (dark state) is described. In the dark state, the deterioration mechanism of the transistor can be explained on the basis of trapping and releasing of a charge by the surface shallow DOS at the shallow level in the vicinity of the surface of the oxide semiconductor film (at the interface with an insulating film or in the vicinity of the interface). Note that here, a gate insulating film is described as an insulating film provided in the vicinity of the interface with the oxide semiconductor film.

Figure 27:
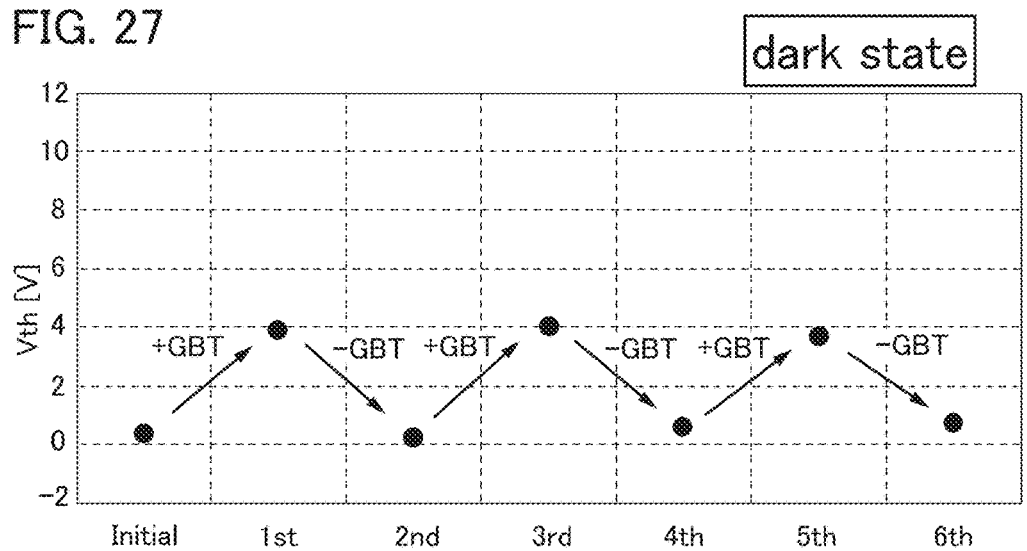
FIG. 27 is a graph showing deterioration of a transistor including an oxide semiconductor film in a dark state.

FIG. 27 shows variation in a threshold voltage ($V_{th}$) when the transistor including an oxide semiconductor film is subjected to a gate bias temperature (BT) stress test repeatedly in the dark state. As apparent from FIG. 27, the threshold voltage is shifted to a positive side by the positive gate BT (+GBT) stress test. Then, the transistor is subjected to a negative gate BT (−GBT) stress test, so that the threshold voltage is shifted to a negative side and is substantially equal to the initial value (initial). In this manner, by repeating the positive gate BT stress test and the negative gate BT stress test alternately, the threshold voltage is shifted positively and negatively (i.e., a hysteresis occurs). In other words, it is found that when the positive gate BT stress test and the negative gate BT stress test are repeated without light irradiation, the threshold voltage is shifted alternately to a positive side and then a negative side, but the shift fits in certain range as a whole.

Figure 28:
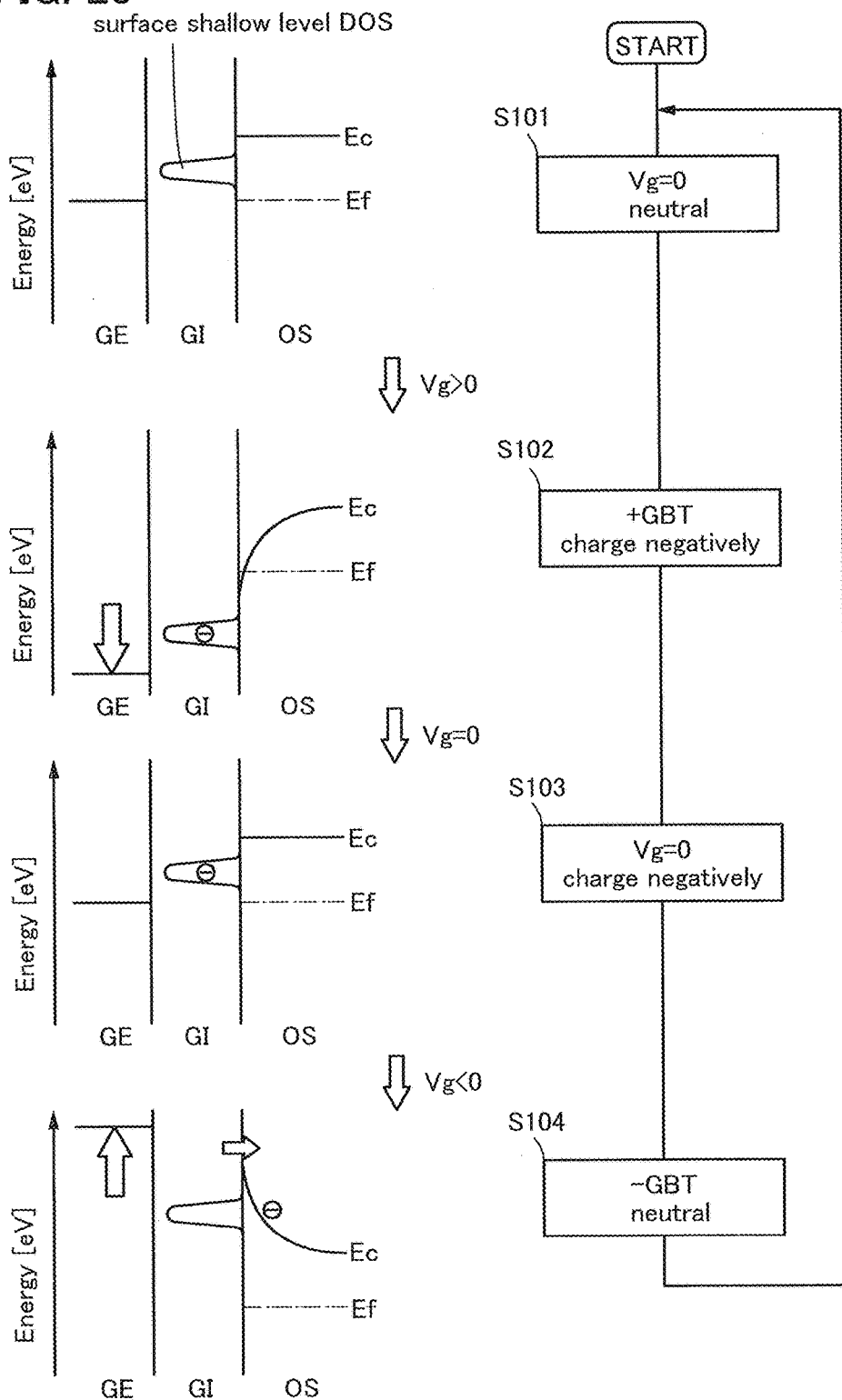
FIG. 28 illustrates deterioration of a transistor including an oxide semiconductor film in a dark state.

The variation in the threshold voltage of the transistor due to the gate BT stress test in the dark state can be explained with the surface shallow DOS in the vicinity of the surface of an oxide semiconductor film. FIG. 28 illustrates a band structure of an oxide semiconductor film and flow charts corresponding to the band structure.

Before application of the gate BT stress (at the gate voltage ($V_g$) of 0), the surface shallow DOS in the vicinity of the surface of an oxide semiconductor film has energy higher than the Fermi level ($E_f$) and is electrically neutral since an electron is not trapped (Step S101 in FIG. 28). In Step S101, the threshold voltage measured at this time is set as an initial value before the gate BT stress is applied.

Next, the positive gate BT stress test (dark state) is performed. When the positive gate voltage is applied, the conduction band is curved and the energy of the surface shallow DOS in the vicinity of the surface of the oxide semiconductor film becomes lower than the Fermi level. Thus, an electron is trapped in the surface shallow DOS in the vicinity of the surface of the oxide semiconductor film, so that the DOS is charged negatively (Step S102 in FIG. 28).

Next, the application of stress is stopped such that the gate voltage is 0. By the gate voltage at 0, the surface shallow DOS in the vicinity of the surface of an oxide semiconductor film has energy higher than the Fermi level. However, it takes a long time for the electron trapped in the surface shallow DOS in the vicinity of the surface of the oxide semiconductor film to be released. Thus, the surface shallow DOS in the vicinity of the surface of the oxide semiconductor film remains charged negatively (Step S103 in FIG. 28). At this time, a channel formation region of the transistor is being subjected to application of a negative voltage as well as the gate voltage. Accordingly, a gate voltage that is higher than the initial value should be applied so as to turn on the transistor, so that the threshold voltage is shifted to a positive side. In other words, the transistor tends to be normally off.

Next, a negative gate voltage is applied as the negative gate BT stress test (dark state). When the negative gate voltage is applied, the conduction band is curved and the energy of the surface shallow DOS in the vicinity of the surface of the oxide semiconductor film becomes much higher. Thus, the electron trapped in the surface shallow DOS in the vicinity of the surface of the oxide semiconductor film is released, so that the DOS becomes electrically neutral (Step S104 in FIG. 28).

Next, the application of stress is stopped such that the gate voltage is 0. The surface shallow DOS in the vicinity of the surface of an oxide semiconductor film at this time has released the electron and is electrically neutral (Step S101). Thus, the threshold voltage is shifted to a positive side, so that it returns to the initial value before the gate BT stress tests. The negative gate BT test and the positive gate BT stress test are repeated in the dark state, so that the threshold voltage is shifted repeatedly to the positive side and to the negative side. However, an electron trapped in the surface shallow DOS in the vicinity of the surface of an oxide semiconductor film at the time of the positive gate BT stress test is released at the time of the negative gate BT stress test; therefore, it is found that the threshold voltage is shifted within a certain range as a whole.

As described above, the shift in the threshold voltage of a transistor due to the gate BT stress test in the dark state can be explained on the basis of the understanding of the surface shallow DOS in the vicinity of the surface of the oxide semiconductor film.

<3-2. Model of Deterioration in Bright State of Transistor Including Oxide Semiconductor Film>

Then, a deterioration mechanism under light irradiation (bright state) is described here. The deterioration mechanism of the transistor in the bright state is explained on the basis of the trap and release of an electron in the bulk deep DOS at the deep level in the oxide semiconductor film.

Figure 29:
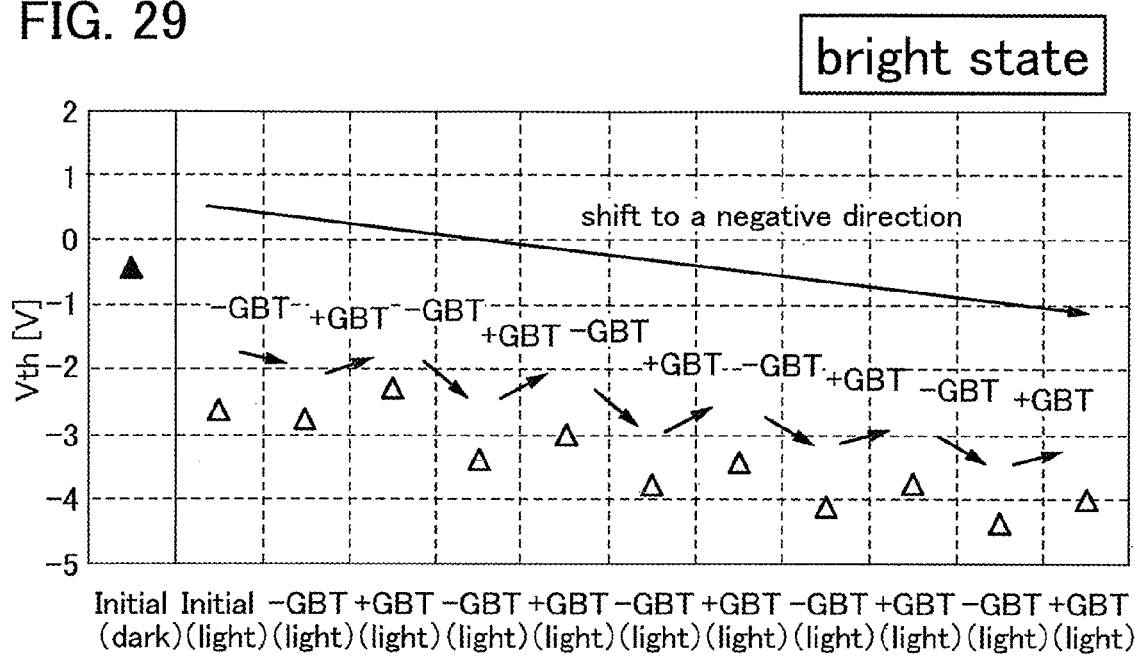
FIG. 29 is a graph showing deterioration of a transistor including an oxide semiconductor film under light irradiation.

FIG. 29 shows the shift in the threshold voltage ($V_{th}$) when the gate BT stress test is performed repeatedly on the transistor including an oxide semiconductor film in the bright state. As shown in FIG. 29, the threshold voltage ($V_{th}$) is shifted from the initial value (initial) in the negative direction.

In FIG. 29, a value measured in the dark state without application of the gate BT stress is plotted as the initial value of the threshold voltage. Then, the threshold voltage is measured in the bright state without application of the gate BT stress. As a result, the threshold voltage in the bright state is shifted to a negative side greatly from the threshold voltage in the dark state. One of the conceivable factors is that an electron and a hole are generated by light irradiation and the generated electron is excited to the conduction band. In other words, even when the gate BT stress is not applied, the threshold voltage of the transistor including an oxide semiconductor film is shifted to a negative side by light irradiation, so that the transistor is easily normally on. In this case, as the energy gap of the oxide semiconductor film is larger, or as fewer DOS exist in the gap, fewer electrons are excited. For that reason, the shift in the threshold voltage due to light irradiation is small in that case.

Then, when the negative gate BT stress is applied under light irradiation (−GBT), the threshold voltage is further shifted to a negative side.

After that, the positive gate BT (+GBT) stress test is performed under light irradiation, so that the threshold voltage is shifted to a positive side.

Further, when the negative gate BT stress test and the positive gate BT stress test are repeated under light irradiation, the threshold voltage is shifted to a positive side and a negative side repeatedly; as a result, it is found that the threshold voltage is shifted gradually to a negative side as a whole.

Figure 30:
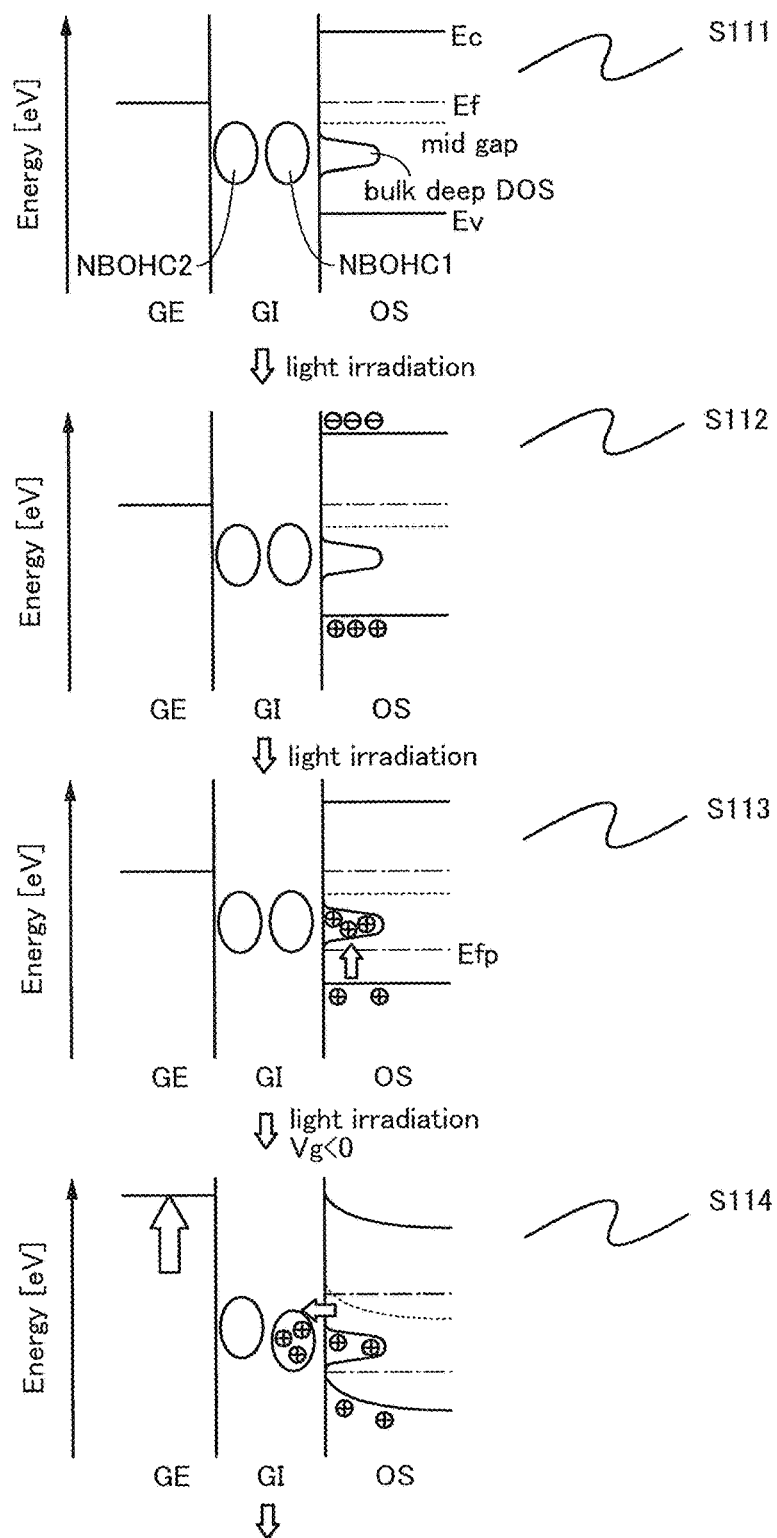
FIG. 30 illustrates showing deterioration of a transistor including an oxide semiconductor film under light irradiation.
Figure 31:
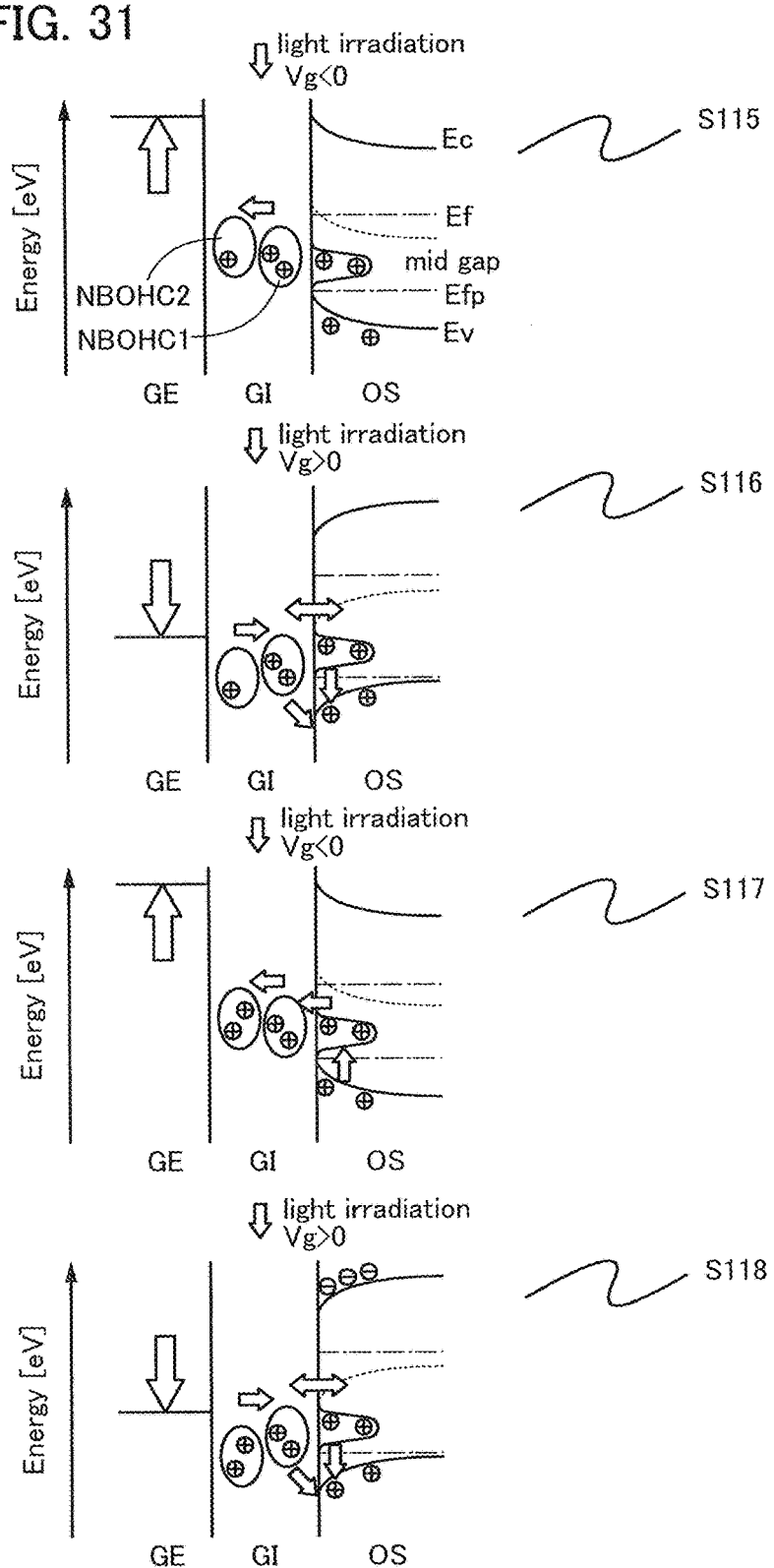
FIG. 31 is a graph showing deterioration of a transistor including an oxide semiconductor film under light irradiation.

In the gate BT stress tests (where the positive gate BT stress test and the negative gate BT stress test are repeated) in the bright state, a mechanism of the shift in the threshold voltage of the transistor is explained with reference to the band structures in FIG. 30 and FIG. 31. With reference to FIG. 30 and FIG. 31, the bulk deep DOS in the oxide semiconductor film and the non-bridging oxygen hole centers (NBOHC1 and NBOHC2) in the gate insulating film are described. Note that the non-bridging oxygen hole center (NBOHC1) is NBOHC that is located closer to the interface with the oxide semiconductor film (on the surface side) than the non-bridging oxygen hole center (NBOHC2) is.

Before the gate BT stress test and light irradiation (when the gate voltage ($V_g$) is 0), the bulk deep DOS in the oxide semiconductor film has energy lower than the Fermi level ($E_f$), and is electrically neutral since holes are not trapped (Step S111 in FIG. 30). At this time, the threshold voltage measured in the dark state is regarded as the initial value in the dark state.

Next, the oxide semiconductor film is irradiated with light without being subjected to the gate BT stress, so that electrons and holes are generated (Step S112 in FIG. 30). The generated electrons are excited to the conduction band, so that the threshold voltage is shifted to a negative side (electrons are not described in the subsequent steps). In addition, the generated holes lower the quasi-Fermi level ($E_{fp}$) of holes. Because the quasi-Fermi level ($E_{fp}$) of holes is lowered, holes are trapped in the bulk deep DOS inside the oxide semiconductor film (Step S113 in FIG. 30). Accordingly, under light irradiation without the gate BT stress test, the threshold voltage is shifted to the negative side, so that the transistor easily becomes normally on, unlike the transistor in the dark state.

Next, the negative gate BT stress test is performed under light irradiation, so that an electric field gradient is generated and holes trapped in the bulk deep DOS inside the oxide semiconductor film are injected to the non-bridging oxygen hole center (NBOHC1) in the gate insulating film (Step S114 in FIG. 30). In addition, some holes move into the non-bridging oxygen hole centers (NBOHC2) further inside the gate insulating film by the electric field (Step S115 in FIG. 31). The movement of holes from the non-bridging oxygen hole centers (NBOHC1) to the non-bridging oxygen hole centers (NBOHC2) in the gate insulating film progresses with time of the electric field application. The holes in the non-bridging oxygen hole centers (NBOHC1 and NBOHC2) in the gate insulating film act as positively-charged fixed charges, and shift the threshold voltage to the negative side, so that the transistor easily becomes normally on.

Light irradiation and the negative gate BT stress test are described as different steps for easy understanding, but the present invention is not construed as being limited to description in this embodiment. For example, Step S112 to Step S115 can occur in parallel.

Next, the positive gate BT stress test is performed under light irradiation, and holes trapped in the bulk deep DOS inside the oxide semiconductor film and holes in the non-bridging oxygen hole centers (NBOHC1) in the gate insulating film are released by the application of the positive gate voltage (Step S116 in FIG. 31). Thus, the threshold voltage is shifted to the positive side. Note that because the non-bridging oxygen hole center (NBOHC2) in the gate insulating film is at the deep level in the gate insulating film, almost no holes in the non-bridging oxygen hole centers (NBOHC2) are directly released even when the positive gate BT stress test is in the bright state. In order that the holes in the non-bridging oxygen hole center (NBOHC2) in the gate insulating film can be released, the holes should move to the non-bridging oxygen hole centers (NBOHC1) on the surface side. The movement of a hole from the non-bridging oxygen hole center (NBOHC2) to the non-bridging oxygen hole center (NBOHC1) in the gate insulating film progresses little by little with the time of electric field application. Therefore, the shift amount to the positive side of the threshold voltage is small, and the threshold voltage does not return completely to the initial value.

In addition, the movement of a hole occurs between the non-bridging oxygen hole center (NBOHC1) in the gate insulating film and the bulk deep DOS inside the oxide semiconductor film. However, because many holes have been trapped in the bulk deep DOS inside the oxide semiconductor film, the whole electric charge amount of the oxide semiconductor film and the gate insulating film can be hardly reduced.

Next, the negative gate BT stress test is performed again under light irradiation, so that an electric field gradient occurs and holes trapped in the bulk deep DOS inside the oxide semiconductor film are injected into the non-bridging oxygen hole center (NBOHC1) in the gate insulating film. In addition, some of the holes are injected into the non-bridging oxygen hole center (NBOHC2) that is deeper inside the gate insulating film by an electric field (Step S117 in FIG. 31). Note that the holes in the non-bridging oxygen hole centers (NBOHC2) in the gate insulating film, which have been injected thereinto in Step S115, are left without being released. Thus, holes are further injected, so that the number of holes serving as fixed charges is further increased. The threshold voltage is further shifted to the negative side, so that the transistor further easily becomes normally on.

Next, the positive gate BT stress test is performed under light irradiation, so that holes trapped in the bulk deep DOS in the oxide semiconductor film and holes in the non-bridging oxygen hole center (NBOHC1) in the gate insulating film are released by application of the positive gate voltage (Step S118 in FIG. 31). As a result, the threshold voltage is shifted to the positive side. However, the holes in the non-bridging oxygen hole center (NBOHC2) in the gate insulating film are hardly released. Accordingly, the shift amount to the positive side of the threshold voltage is small, and the threshold voltage does not return completely to the initial value.

It is presumed that by repeating the negative gate BT stress test and the positive gate BT stress test in the bright state as described above, the threshold voltage is gradually shifted to the negative side as a whole while the threshold voltage is shifted to the positive side and the negative side repeatedly.

The shift of the threshold voltage of the transistor in the gate BT stress test in the bright state can be explained on the basis of the bulk deep DOS inside the oxide semiconductor film and the non-bridging oxygen hole centers (NBOHC1 and NBOHC2) in the gate insulating film.

<3-3. Process Model of Dehydration, Dehydrogenation, and Oxygen Addition of Oxide Semiconductor Film>

In order to fabricate a transistor with stable electrical characteristics, it is important to reduce the DOS inside the oxide semiconductor film and in the vicinity of the interface of the oxide semiconductor film (to make a highly purified intrinsic state). A process model where the oxide semiconductor film is highly purified to be intrinsic is described below. Dehydration and dehydrogenation of the oxide semiconductor film are described first and then oxygen addition where an oxygen vacancy ($V_O$) is filled with oxygen is described.

Before a process model where the oxide semiconductor film is highly purified to be intrinsic is described, the position at which an oxygen vacancy is likely to be generated in the oxide semiconductor film is described. In the oxide semiconductor film containing indium, gallium, and zinc, the bond between indium and oxygen is broken most easily as compared to the bond between gallium and oxygen and the bond between zinc and oxygen. Thus, a model where the bond between indium and oxygen is broken to form an oxygen vacancy is described below.

When the bond between indium and oxygen is broken, oxygen is released and a site of the oxygen that has been bonded to indium serves as an oxygen vacancy. The oxygen vacancy forms the deep level DOS at the deep level of the oxide semiconductor film. Because the oxygen vacancy in the oxide semiconductor film is instable, it traps oxygen or hydrogen to be stable. For this reason, when hydrogen exists near an oxygen vacancy, the oxygen vacancy traps hydrogen to become $V_OH$. The $V_OH$ forms the shallow level DOS at the shallow level in the oxide semiconductor film.

Figure 32A:
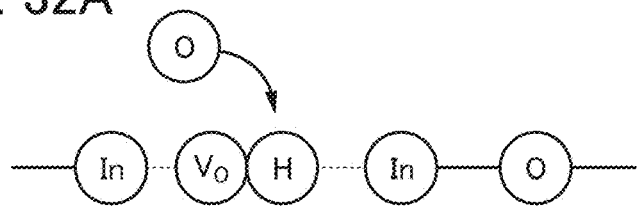
FIGS. 32A to 32F illustrate a model where an oxide semiconductor film is highly purified to be intrinsic.
Figure 32B:
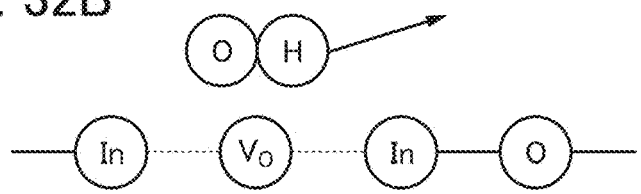

Next, when oxygen comes close to the $V_OH$ in the oxide semiconductor film oxygen extracts hydrogen from $V_OH$ to become a hydroxyl group (OH), so that hydrogen is released from the $V_OH$ (see FIGS. 32A and 32B). The oxygen can move in the oxide semiconductor film so as to come closer to hydrogen by heat treatment and the like.

Figure 32C:
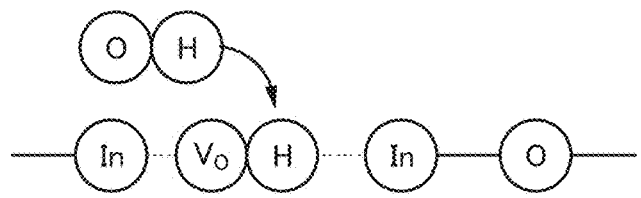
Figure 32D:
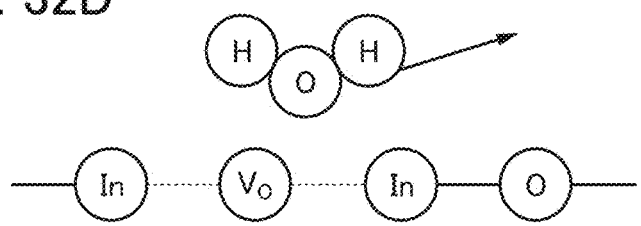

Further, when the hydroxyl group comes closer to another $V_OH$ in the oxide semiconductor film, the hydroxyl group extracts hydrogen from $V_OH$ to become a water molecule ($H_2O$), so that hydrogen is released from $V_OH$ (see FIGS. 32C and 32D). In this manner, one oxygen atom releases two hydrogen atoms from the oxide semiconductor film. This is referred to as dehydration or dehydrogenation of the oxide semiconductor film. By the dehydration or dehydrogenation, the shallow level DOS at the shallow level in the oxide semiconductor film is reduced, and the deep level DOS is formed.

Figure 32E:
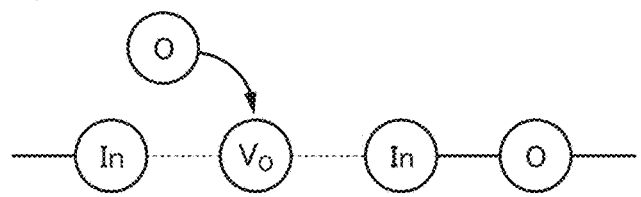
Figure 32F:
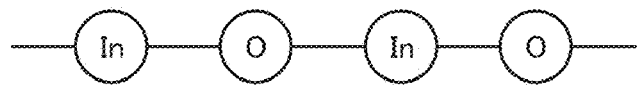

Next, when oxygen comes close to an oxygen vacancy in the oxide semiconductor film, oxygen is trapped by the oxygen vacancy, so that the oxygen vacancy disappears (see FIGS. 32E and 32F). This is referred to as oxygen addition in the oxide semiconductor film. By the oxygen addition, the deep level DOS at the deep level in the oxide semiconductor film is reduced.

As described above, when dehydration or dehydrogenation and oxygen addition of the oxide semiconductor film are performed, the shallow level DOS and the deep level DOS in the oxide semiconductor film can be reduced. This process is referred to as a highly purification process for making an intrinsic oxide semiconductor.

Note that the structures, methods, and the like described in this embodiment can be used as appropriate in combination with any of the structures, methods, and the like described in the other embodiments and examples.

(Embodiment 3)

In this embodiment, impurities included in an oxide semiconductor film in a transistor and deterioration of the transistor characteristics are described. In the description, the IGZO(111) is used for the oxide semiconductor film and carbon is used as one of the impurities.

<1. Effect of Carbon in IGZO>

An electronic state was calculated on a model where a C atom was introduced into the IGZO(111).

Figure 33A:
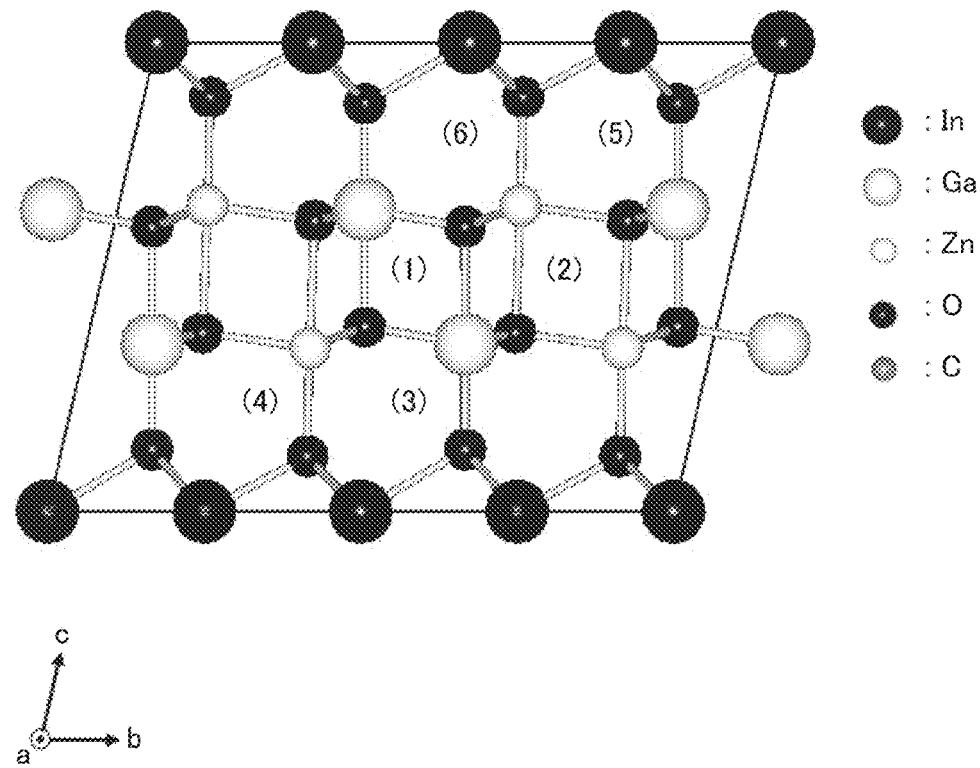
FIGS. 33A to 33C illustrate a crystalline model of InGaZnO$_4$ and a defect.

For the calculation, an IGZO(111) crystal model (the number of atoms: 112) shown in FIG. 33A was used.

Here, as the model where a C atom is included in the IGZO(111), as shown in FIG. 33A and Table 7, the following models were used: models in each of which a C atom was put in the respective interstitial sites (1) to (6), a model where one In atom was replaced with a C atom, a model where one Ga atom was replaced with a C atom, a model where one Zn atom was replaced with a C atom, and a model where one O atom was replaced with a C atom.

TABLE 7

| Arrangement | Position | Proximate metal atoms |
| --- | --- | --- |
| (1) | between (Ga,Zn)O and (Ga,Zn)O | Ga4, Zn2 |
| (2) | | Ga2, Zn4 |
| (3) | between (Ga,Zn)O and InO | In3, Ga2, Zn1 |
| (4) | | In3, Ga1, Zn2 |
| (5) | | In1, Ga2, Zn1 |
| (6) | | In1, Ga1, Zn2 |

<1-1. Model where C Atom was put in Interstitial Site>

A stable configuration was examined by comparing the energy after structure optimization of the models where C atoms were put in the respective interstitial sites (1) to (6). The calculation conditions are shown in Table 8. Note that GGA was used for exchange-correlation function, and thus the band gap tended to be underestimated.

TABLE 8

| Software | VASP |
| --- | --- |
| Model | InGaZnO4 crystal (112 atoms) |
| Calculation | Structure optimization (fixed lattice constant) |
| Functional | GGA-PBE |
| Pseudopotential | PAW method |
| Cut-off energy | 500 eV |
| k-point | 2 × 2 × 3 (optimization), 3 × 3 × 4 (state density) |

The results of the structure optimization calculation of the models where C atoms were put in the respective interstitial sites (1) to (6) are shown in Table 9.

TABLE 9

| | Initial arrangement | After optimization | Energy (relative value) |
| --- | --- | --- | --- |
| (1) | interstitial site (Ga4, Zn2) | (CO)o (M1 = Ga, M2 = Ga, M3 = Zn, M4 = Zn) | −618.511 eV (0.326 eV) |

TABLE 9-continued

| | Initial arrangement | After optimization | Energy (relative value) |
| --- | --- | --- | --- |
| (2) | interstitial site (Ga2, Zn4) | interstitial site (Ga2, Zn4) | −615.091 eV (3.746 eV) |
| (3) | interstitial site (In3, Ga2, Zn1) | (CO)o (M1 = In, M2 = Ga, M3 = In, M4 = In) | −618.640 eV (0.197 eV) |
| (4) | interstitial site (In3, Ga1, Zn2) | (CO)o (M1 = In, M2 = Zn, M3 = In, M4 = In) | −618.196 eV (0.641 eV) |
| (5) | interstitial site (In1, Ga2, Zn1) | bonded to In1, O3 | −618.140 eV (0.697 eV) |
| (6) | interstitial site (In1, Ga1, Zn2) | bonded to In1, O2 | −618.837 eV (0.000 eV) |

Figure 33B:
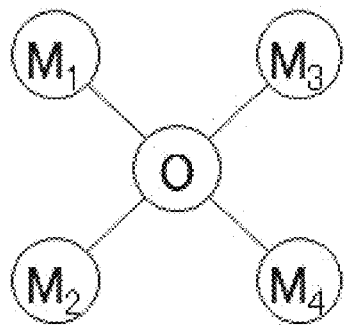
Figure 33C:
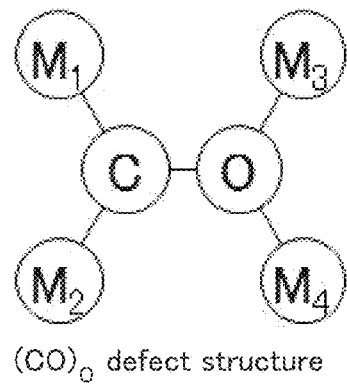

The interstitial sites were selected as the original position of a C atom. After the structure optimization was performed, a model where a C atom was put in the interstitial site (1), (3), or (4) had a $(CO)_O$ defect structure as illustrated in FIG. 33C. Note that $(CO)_O$ means that one O atom in the structure in FIG. 33B is replaced with CO, as illustrated in the structure in FIG. 33C. In the $(CO)_O$ defect structure, a C atom is bonded to an O atom. The C atom is bonded to an atom $M_1$ and an atom $M_2$. The O atom is bonded to an atom $M_3$ and an atom $M_4$. A model where a C atom was put in the interstitial site (5) or (6) has a structure in which a C atom was bonded to atoms in the IGZO(111). When the energy was compared, a C atom was more stable in the $(CO)_O$ defect structure and in a structure where a C atom was bonded to the atoms in the IGZO(111) than in the interstitial site.

Figure 34A:
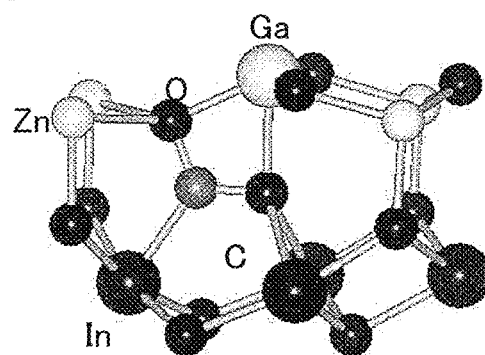
FIGS. 34A and 34B illustrate a structure of a model in which a C atom is put in an interstitial site (6) and its density of states.
Figure 34B:
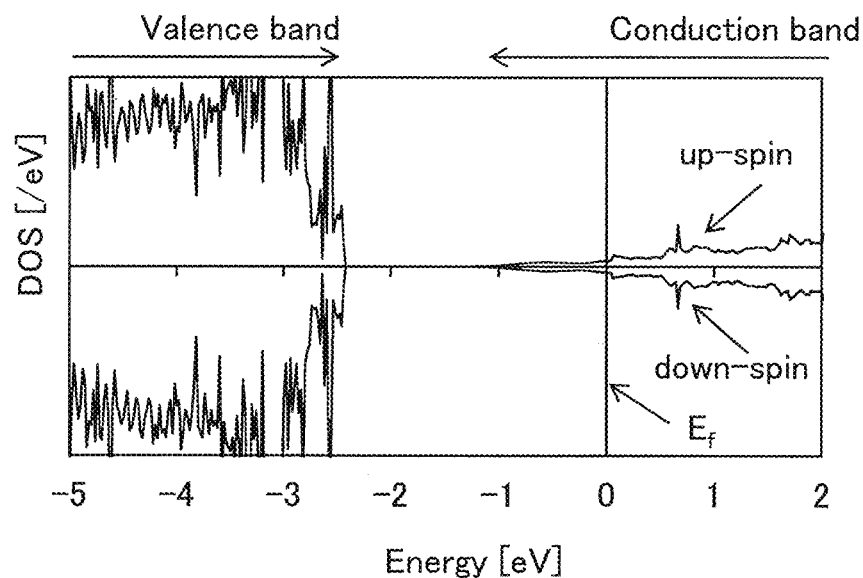

FIG. 34A shows a structure of the model that has the lowest energy and is the most stable (model where a C atom was put in the interstitial site (6)) in the calculation. FIG. 34B shows the density of states. In FIG. 34B, when the Fermi level $E_f$ is 0 eV in the lateral axis, the density of states of up-spin and down-spin are shown in the upper and lower sides of the Fermi level $E_f$, respectively.

In the structure shown in FIG. 34A, a C atom is bonded to one In atom and two O atoms. In a model where an Si atom belonging to the same group as a C atom was put in the interstitial site, the Si atom was bonded only to an O atom. The results indicate that the difference in bonding state between the Si atom and the C atom may be attributed to differences of their ionic radiuses and electronegativity. In FIG. 34B, when the density of states from the conduction band minimum to the Fermi level $E_f$ is integrated, the density of states corresponds to two electrons. The Fermi level $E_f$ is positioned on the side closer to the vacuum level than the conduction band minimum is by two electrons; thus, it is presumed that, when the C atom is put in the interstitial site, two electrons are released from the C atom, so that the IGZO(111) becomes n-type.

<1-2. Model where Metal Element was Replaced with C Atom>

Figure 35A:
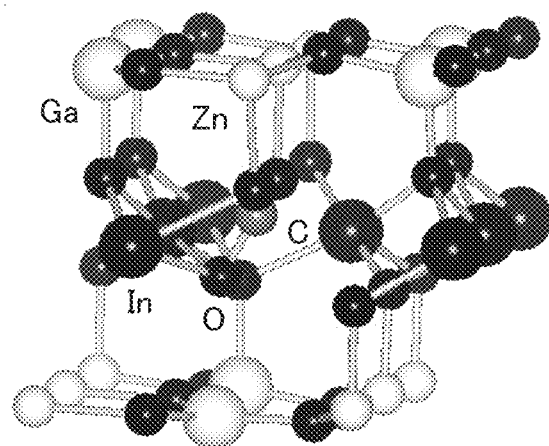
FIGS. 35A and 35B illustrate a structure of a model in which an In atom is replaced with a C atom and its density of states.
Figure 35B:
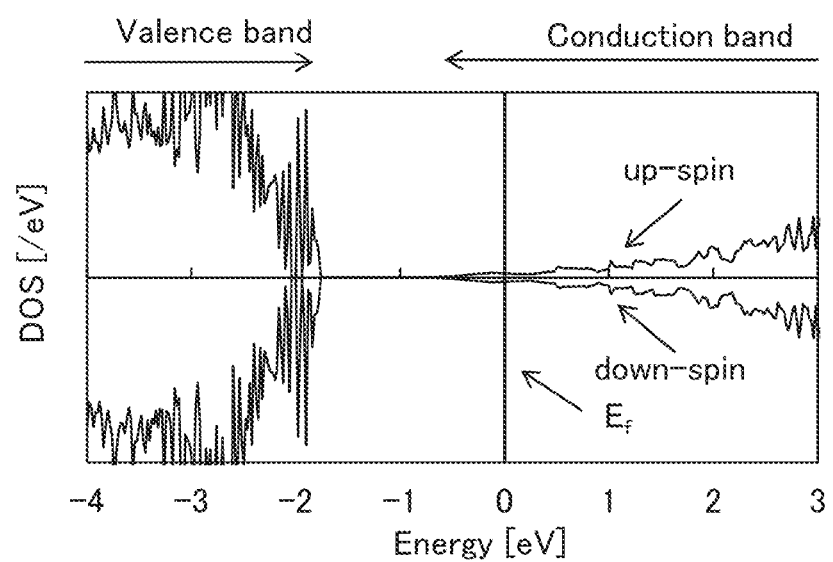

FIGS. 35A and 35B show the optimal structure and density of states in a model where one In atom was replaced with a C atom Note that in the lateral axis of FIG. 35B, the Fermi level $E_f$ is 0 eV.

In the structure of FIG. 35A, a C atom is bonded to three O atoms and positioned in a plane of a triangle having O atoms as the vertexes. Although the sketch of the density of states illustrated in FIG. 35B is almost the same as that of the density of states in the case of no defect, the Fermi level $E_f$ is positioned on the side closer to the vacuum level than the conduction band minimum is by one electron; thus, it is presumed that, when an In atom is replaced with a C atom, one electron is released from the C atom, so that the IGZO(111) became n-type. This is probably because a trivalent In atom was replaced with a tetravalent C atom.

Figure 36A:
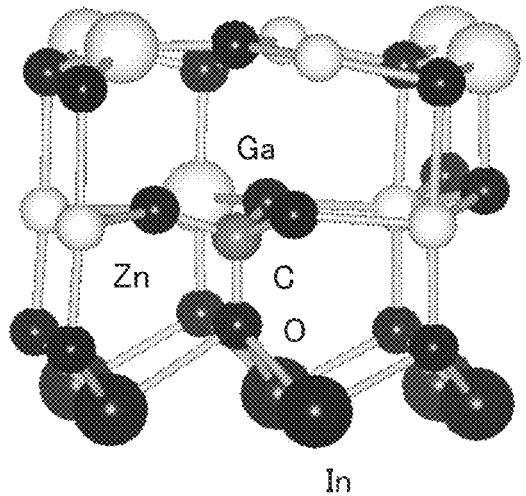
FIGS. 36A and 36B illustrate a structure of a model in which a Ga atom is replaced with a C atom and its density of states.
Figure 36B:
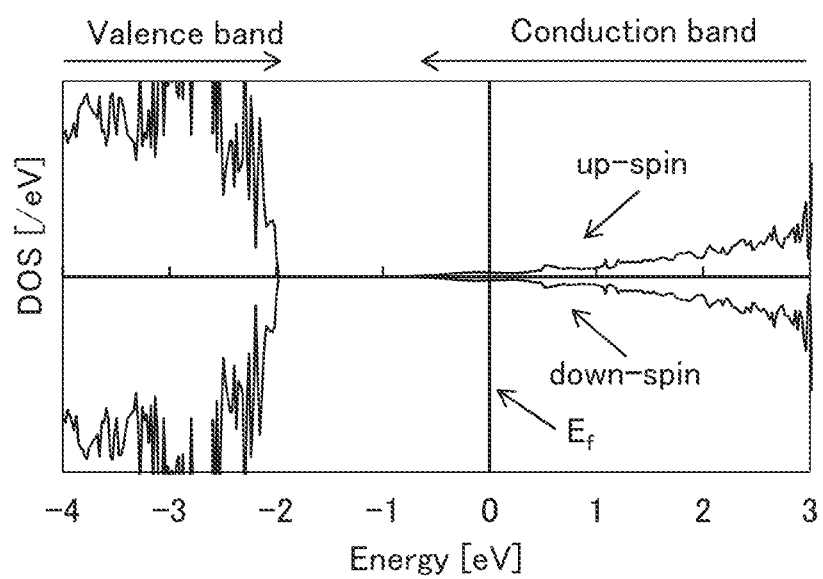

FIGS. 36A and 36B show the optimal structure and density of states in a model where one Ga atom was replaced with a C atom. Note that in the lateral axis of FIG. 36B, the Fermi level $E_f$ is 0 eV.

In the structure of FIG. 36A, a C atom is bonded to four O atoms and positioned in almost the center of a tetrahedron having O atoms as the vertexes. Although the sketch of the density of states illustrated in FIG. 36B is almost the same as that of the density of states in the case of no defect, the Fermi level $E_f$ is positioned on the side closer to the vacuum level than the conduction band minimum is by one electron: thus, it is presumed that, when a Ga atom is replaced with a C atom, one electron is released from the C atom, so that the IGZO(111) became n-type. This is probably because a trivalent Ga atom is replaced with a tetravalent C atom.

Figure 37A:
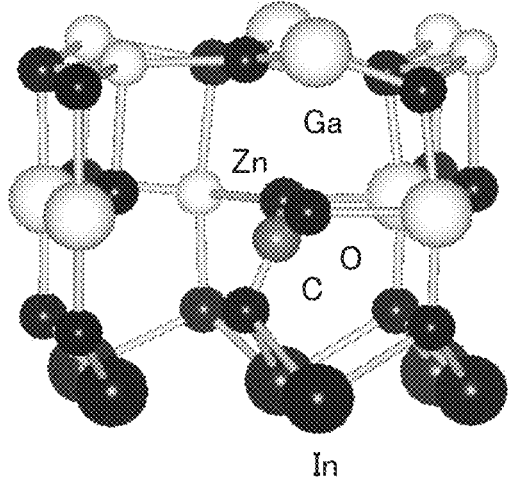
FIGS. 37A and 37B illustrate a structure of a model in which a Zn atom is replaced with a C atom and its density of states.
Figure 37B:
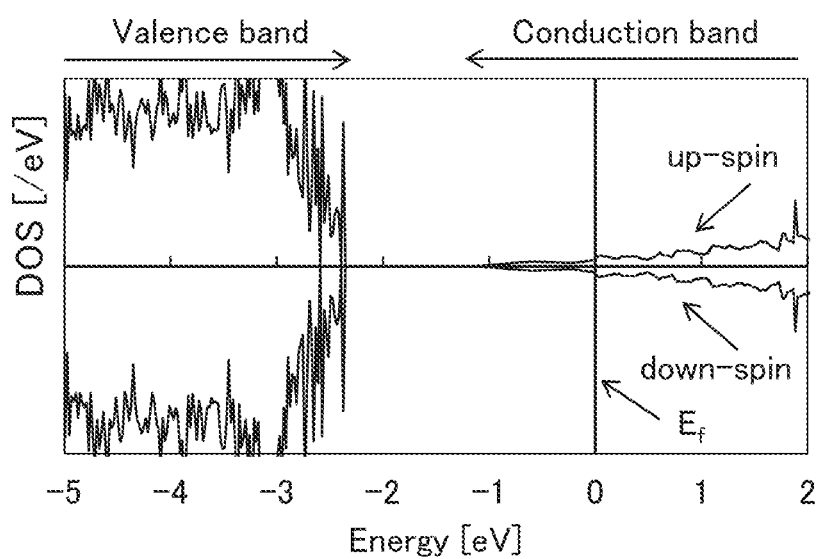

FIGS. 37A and 37B show the optimal structure and density of states in a model where one Zn atom was replaced with a C atom. Note that in the lateral axis of FIG. 37B, the Fermi level $F_4$ is 0 eV.

In the structure of FIG. 37A, a C atom is bonded to three O atoms and positioned in a plane of a triangle having O atoms as the vertexes. Although the sketch of the density of states illustrated in FIG. 37B is almost the same as that of the density of states in the case of no defect, the Fermi level $E_f$ is positioned on the side closer to the vacuum level than the conduction band minimum is by two electrons; thus, it is presumed that, when a Zn atom is replaced with a C atom, two electrons are released from the C atom, so that the IGZO(111) became n-type. This is probably because a divalent Zn atom was replaced with a tetravalent C atom.

<1-3. Model where O Atom was Replaced with C Atom>

Next, whether an O atom can be replaced with a C atom was examined. In the case where one O atom is replaced with a C atom, there are four O atom sites in consideration of a combination of metals that are bonding partners of an O atom, and substitution models for the sites were formed and structure optimization calculation was performed. As a result, a model where an O atom bonded to two Ga atoms and one Zn atom was replaced with a C atom was energetically stable.

The IGZO(111) formed in an oxygen atmosphere contains sufficient O atoms. Models (1) and (2) in Table 10 were examined to compare energies needed for a C atom to substitute for an O atom in the IGZO(111) containing much oxygen. The numbers of atoms of Model (1) and (2) were equalized; after that, the total energy of each model was calculated.

TABLE 10

| Model | Existing mode |
|---|---|
| (1) | [InGaZnO$_4$] + [CO$_2$] |
| (2) | [InGaZnO$_4$: C$_O$] + 3/2[O$_2$] |

In order to find out the stable configuration of a C atom, the IGZO(111) containing much oxygen was assumed, and the total energy of models where the numbers of atoms are the same as each other were calculated. Calculation results are shown in Table 11.

TABLE 11

| Model | Existing mode | Total energy (relative value) |
|---|---|---|
| (No defect) | [InGaZnO$_4$] + [CO$_2$] | −637.446 eV (0.000 eV) |
| C is put in interstitial site | [InGaZnO$_4$ + C] + [O$_2$] | −628.695 eV (8.751 eV) |
| In is replaced with C | [InGaZnO$_4$: C$_{In}$] + 1/2[In$_2$O$_3$] + 1/4[O$_2$] | −632.759 eV (4.687 eV) |
| Ga is replaced with C | [InGaZnO$_4$: C$_{Ga}$] + 1/2[Ga$_2$O$_3$] + 1/4[O$_2$] | −633.665 eV (3.781 eV) |
| Zn is replaced with C | [InGaZnO$_4$: C$_{Zn}$] + [ZnO] + 1/2[O$_2$] | −632.801 eV (4.645 eV) |
| O is replaced with C | [InGaZnO$_4$: C$_O$] + 3/2[O$_2$] | −626.620 eV (10.826 eV) |

In Model (1) shown in Table 10, a C atom was contained in the IGZO(111) as CO$_2$. In Model (2) shown in Table 10, an O atom was replaced with a C atom in the IGZO(111).

The energy of Model (1) was calculated to be lower than that of Model (2) by approximately 10.8 eV, and thus Model (1) is more stable than Model (2). This suggests that Model (1) is more likely to exist than Model (2). That is, that presumably shows that an O atom is unlikely to be replaced with a C atom and the state where an O atom is replaced with a C atom is unstable.

As shown in Table 11, it is presumed that, because the energy of a Ga atom is low, a C atom in the IGZO(111) is likely to substitute for a Ga atom and is unlikely to substitute for an O atom. Note that in Table 11. "IGZO:C$_{atom}$" means that the atom is replaced with a C atom in InGaZnO$_4$.

As a result, it is found that when a C atom is put in an interstitial site or a C atom substitutes for a metal atom (In, Ga, or Zn), the IGZO(111) becomes n-type. Furthermore, it is presumed that the configuration becomes stable when a C atom in the IGZO(111) substitutes particularly for a Ga atom.

Note that the structures, methods, and the like described in this embodiment can be used as appropriate in combination with any of the structures, methods, and the like described in the other embodiments and examples.

(Embodiment 4)

In this embodiment, a semiconductor device and a manufacturing method thereof, which are different from those in Embodiment 1, are described with reference to drawings. A transistor 50 of this embodiment is a top-gate transistor, which is different from the transistor 10 in Embodiment 1.

<1. Structure of Transistor>

Figure 38A:
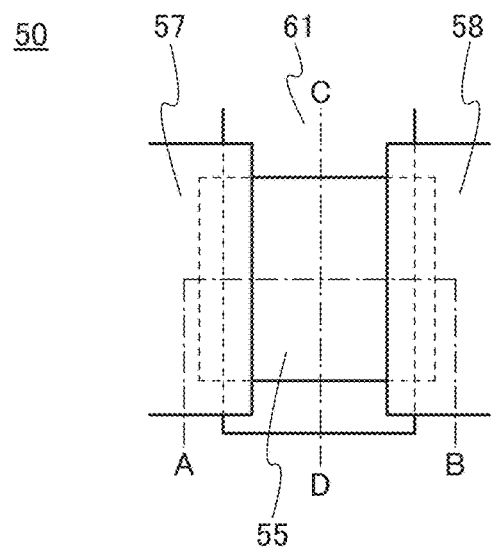
FIGS. 38A to 38C are a top view and cross-sectional views illustrating one embodiment of a transistor.
Figure 38C:
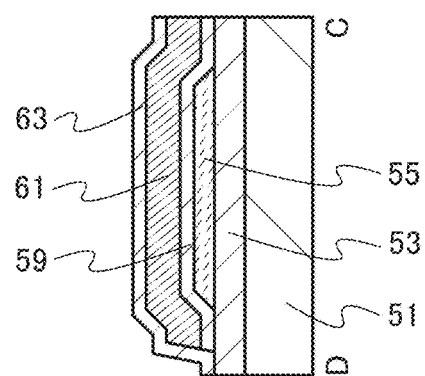
Figure 38B:
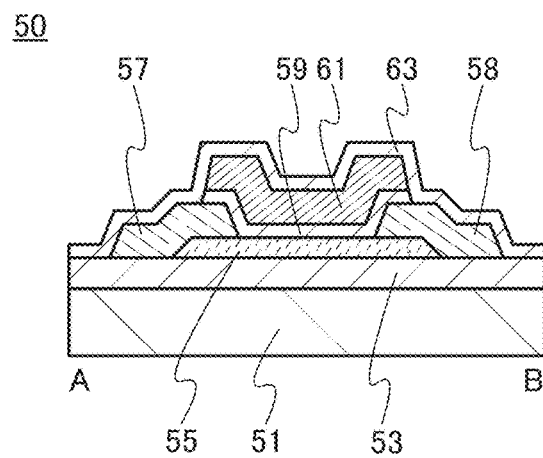

FIGS. 38A to 38C are a top view and cross-sectional views of the transistor 50. FIG. 38A is the top view of the transistor 50. FIG. 38B is a cross-sectional view taken along dashed-dotted line A-B in FIG. 38A. FIG. 38C is a cross-sectional view taken along dashed-dotted line C-D in FIG. 38A. Note that in FIG. 38A, for simplicity, a substrate 51, a protective film 53, a gate insulating film 59, an insulating film 63, and the like are omitted.

The transistor 50 illustrated in FIGS. 38A to 38C includes an oxide semiconductor film 55 over the protective film 53: a pair of electrodes 57 and 58 in contact with the oxide semiconductor film 55: the gate insulating film 59 in contact with the oxide semiconductor film 55 and the pair of electrodes 57 and 58; and a gate electrode 61 overlapping with the oxide semiconductor film 55 with the gate insulating film 59 therebetween. The insulating film 63 may be provided over the protective film 53, the pair of electrodes 57 and 58, the gate insulating film 59, and the gate electrode 61.

In this embodiment, a film in contact with the oxide semiconductor film 55, typically, at least one of the protective film 53 and the gate insulating film 59 is an oxide insulating film that contains nitrogen and has a small number of defects.

Typical examples of the oxide insulating film containing nitrogen and having a small number of defects include a silicon oxynitride film and an aluminum oxynitride film. Further, a "silicon oxynitride film" or an "aluminum oxynitride film" refers to a film that contains more oxygen than nitrogen, and a "silicon nitride oxide film" or an "aluminum nitride oxide film" refers to a film that contains more nitrogen than oxygen.

The oxide insulating film containing nitrogen and having a small number of defects has a region or a portion where the amount of gas having a mass-to-charge ratio m/z of 17 released by heat treatment is greater than the amount of nitrogen oxide ($NO_x$, where x is greater than or equal to 0 and less than or equal to 2, preferably greater than or equal to 1 and less than or equal to 2) released by heat treatment. Typical examples of nitrogen oxide include nitrogen monoxide and nitrogen dioxide. Alternatively, the oxide insulating film containing nitrogen and having a small number of defects has a region or a portion where the amount of gas having a mass-to-charge ratio m/z of 17 released by heat treatment is greater than the amount of gas having a mass-to-charge ratio m/z of 30 released by heat treatment. Alternatively, the oxide insulating film containing nitrogen and having a small number of defects has a region or a portion where the amount of gas having a mass-to-charge ratio m/z of 17 released by heat treatment is greater than the amount of gas having a mass-to-charge ratio m/z of 46 released by heat treatment. Alternatively, the oxide insulating film containing nitrogen and having a small number of defects has a region or a portion where the amount of gas having a mass-to-charge ratio m/z of 17 released by heat treatment is greater than the sum of the amount of gas having a mass-to-charge ratio m/z of 30 and the amount of gas having a mass-to-charge ratio m/z of 46 released by heat treatment.

Further alternatively, the oxide insulating film containing nitrogen and having a small number of defects has a region or a portion where the amount of gas having a mass-to-charge ratio m/i of 30 released by heat treatment is less than or equal to the detection limit and where the amount of gas having a mass-to-charge ratio m/z of 17 released by heat treatment is greater than or equal to $1\times10^{18}$ molecules/cm$^3$ and less than or equal to $5\times10^{19}$ molecules/cm$^3$. Alternatively, the oxide insulating film containing nitrogen and having a small number of defects has a region or a portion where the amount of gas having a mass-to-charge ratio m/i of 46 released by heat treatment is less than or equal to the detection limit and where the amount of gas having a mass-to-charge ratio m/z of 17 released by heat treatment is greater than or equal to $1\times10^{18}$ molecules/cm$^3$ and less than or equal to $5\times10^{19}$ molecules/cm$^3$. Alternatively, the oxide insulating film containing nitrogen and having a small number of defects has a region or a portion where the amount of gas having a mass-to-charge ratio m/z of 30 released by heat treatment is less than or equal to the detection limit, where the amount of gas having a mass-to-charge ratio m/z of 46 released by heat treatment is less than or equal to the detection limit, and where the amount of gas having a mass-to-charge ratio m/z of 17 released by heat treatment is greater than or equal to $1\times10^{18}$ molecules/cm$^3$ and less than or equal to $5\times10^{19}$ molecules/cm$^3$.

A typical example of the gas having a mass-to-charge ratio m/z of 30 includes nitrogen monoxide. A typical example of the gas having a mass-to-charge ratio m/z of 17 includes ammonia. A typical example of the gas having a mass-to-charge ratio m/z of 46 includes nitrogen dioxide.

In an ESR spectrum at 100 K or lower of the oxide insulating film containing nitrogen and having a small number of defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, preferably greater than or equal to 1 and less than or equal to 2). Typical examples of nitrogen oxide include nitrogen monoxide and nitrogen dioxide.

When at least one of the protective film 53 and the gate insulating film 59 in contact with the oxide semiconductor film 55 contains a small amount of nitrogen oxide as described above, the carrier trap at the interface between the oxide semiconductor film 55 and the gate insulating film 59 or the interface between the oxide semiconductor film 55 and the protective film 53 can be inhibited. As a result, a change in the threshold voltage of the transistor included in the semiconductor device can be reduced, which leads to a reduced change in the electrical characteristics of the transistor.

At least one of the protective film 53 and the gate insulating film 59 preferably has a nitrogen concentration measured by SIMS of lower than or equal to $6\times10^{20}$ atoms/cm$^3$. In that case, nitrogen oxide is unlikely to be generated in at least one of the protective film 53 and the gate insulating film 59, so that the carrier trap at the interface between the oxide semiconductor film 55 and the gate insulating film 59 or the interface between the oxide semiconductor film 55 and the protective film 53 can be inhibited. Furthermore, a change in the threshold voltage of the transistor included in the semiconductor device can be reduced, which leads to a reduced change in the electrical characteristics of the transistor.

The details of other components of the transistor 50 are described below.

As the substrate 51, a substrate given as an example of the substrate 11 of Embodiment 1 can be used as appropriate.

In the case where the gate insulating film 59 is formed of an oxide insulating film containing nitrogen and having a small number of defects, the protective film 53 can be formed using an oxide insulating film containing oxygen at a higher proportion than oxygen in the stoichiometric composition. The oxide insulating film containing oxygen at a higher proportion than oxygen in the stoichiometric composition can diffuse oxygen into an oxide semiconductor film by heat treatment. As typical examples of the protective film 53, a silicon oxide film, a silicon oxynitride film, a silicon nitride oxide film, a gallium oxide film, a hafnium oxide film, an yttrium oxide film, an aluminum oxide film an aluminum oxynitride film, and the like can be given.

The thickness of the protective film 53 is greater than or equal to 50 nm, preferably greater than or equal to 200 nm and less than or equal to 3000 nm, further preferably greater than or equal to 300 nm and less than or equal to 1000 nm. When the protective film 53 is formed thick, the number of oxygen molecules released from the protective film 53 can be increased, and the interface state at the interface between the base the protective film 53 and an oxide semiconductor film formed later can be reduced.

Here, "to release part of oxygen by heating" means that the amount of released oxygen by conversion into oxygen atoms is greater than or equal to $1\times10^{18}$ atoms/cm$^3$, preferably greater than or equal to $3\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

The oxide semiconductor film 55 can be formed in a manner similar to that of the oxide semiconductor film 17 in Embodiment 1.

The pair of electrodes 57 and 58 can be formed in a manner similar to that of the pair of electrodes 19 and 20 of Embodiment 1.

Note that although the pair of electrodes 57 and 58 are provided between the oxide semiconductor film 55 and the gate insulating film 59 in this embodiment, the pair of electrodes 57 and 58 may be provided between the protective film 53 and the oxide semiconductor film 55.

In the case where the protective film 53 is formed using an oxide insulating film containing nitrogen and having a small number of defects, the gate insulating film 59 can be formed to have a single-layer structure or a stacked-layer structure using, for example, any of silicon oxide, silicon oxynitride, silicon nitride oxide, silicon nitride, aluminum oxide, hafnium oxide, gallium oxide, Ga—Zn-based metal oxide, and the like. Note that an oxide insulating film is preferably used for at least a region of the gate insulating film 59, which is in contact with the oxide semiconductor film 55, in order to improve characteristics of the interface with the oxide semiconductor film 55.

Further, it is possible to prevent outward diffusion of oxygen from the oxide semiconductor film 55 and entry of hydrogen, water, or the like into the oxide semiconductor film 55 from the outside by providing an insulating film having a blocking effect against oxygen, hydrogen, water, and the like as the gate insulating film 59. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 59 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 59 is, for example, greater than or equal to 5 nm and less than or equal to 400 nm, preferably greater than or equal to 10 nm and less than or equal to 300 nm, further preferably greater than or equal to 15 nm and less than or equal to 100 nm.

The gate electrode 61 can be formed in a manner similar to that of the gate electrode 13 of Embodiment 1.

The insulating film 63 is formed with a single-layer structure or a stacked structure using one or more of silicon oxide, silicon oxynitride, silicon nitride oxide, silicon nitride, aluminum oxide, aluminum oxynitride, aluminum nitride oxide, aluminum nitride, and the like to a thickness greater than or equal to 30 nm and less than or equal to 500 nm, preferably greater than or equal to 100 nm and less than or equal to 400 nm.

Like the protective film 53, the insulating film 63 may have a stacked-layer structure including an oxynitride insulating film containing oxygen at a higher proportion than oxygen in the stoichiometric composition and an insulating film having a blocking effect against oxygen, hydrogen, water, and the like. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples. In the case where such insulating films are used, in heat treatment, oxygen is supplied to the oxide semiconductor film 55 through the gate insulating film 59 and/or the protective film 53, which enables a reduction in the interface state between the oxide semiconductor film 55 and the gate insulating film 59 and/or the interface state between the oxide semiconductor film 55 and the protective film 53. Furthermore, the number of oxygen vacancies in the oxide semiconductor film 55 can be reduced.

<2. Method for Manufacturing Transistor>

Next, a method for manufacturing the transistor illustrated in FIGS. 38A to 38C is described with reference to FIGS. 39A to 39D. In each of FIGS. 39A to 39D, a cross-sectional view in the channel length direction along dot-dashed line A-B in FIG. 38A and a cross-sectional view in the channel width direction along dot-dashed line C-D in FIG. 38A are used for describing a method for manufacturing the transistor 50.

Figure 39A:
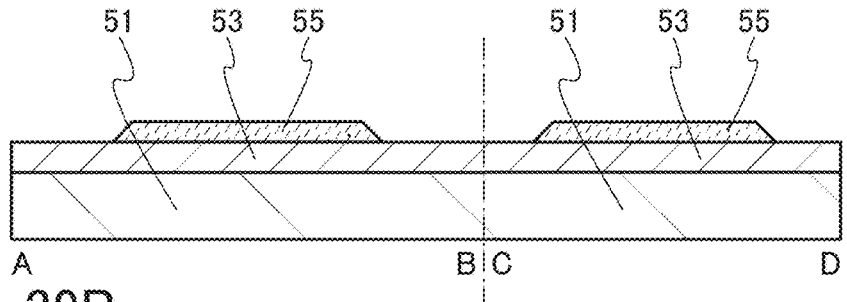
FIGS. 39A to 39D are cross-sectional views illustrating one embodiment of a method for manufacturing a transistor.

The protective film 53 is formed over the substrate 51 as illustrated in FIG. 39A. Then, the oxide semiconductor film 55 is formed over the protective film 53.

The protective film 53 is formed by a sputtering method, a CVD method, or the like.

In the case where an oxide insulating film containing nitrogen and having a small number of defects is formed as the protective film 53, a silicon oxynitride film can be formed by a CVD method as an example of the oxide insulating film containing nitrogen and having a small number of defects. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

In the case where an oxide insulating film from which part of oxygen is released by heating is formed as the protective film 53, the oxide insulating film is preferably formed by a sputtering method using the conditions where the amount of oxygen in a deposition gas is large. As the deposition gas, oxygen, a mixed gas of oxygen and a rare gas, or the like can be used. The concentration of oxygen in the deposition gas is preferably higher than or equal to 6% and lower than or equal to 100% as a typical example.

Furthermore in the case where an oxide insulating film from which part of oxygen is released by heating is formed as the protective film 53, an oxide insulating film is formed by a CVD method as the oxide insulating film from which part of oxygen is released by heating, and then oxygen is introduced into the oxide insulating film, so that the amount of oxygen released by heating can be increased. Oxygen can be added to the oxide insulating film by ion implantation, ion doping, plasma treatment, or the like. In this embodiment, the oxide semiconductor film is not provided below the protective film 53: accordingly, even when oxygen is introduced into the protective film 53, the oxide semiconductor film is not damaged. Thus, oxygen can be introduced into the protective film 53 in contact with the oxide semiconductor film without damage to the oxide semiconductor film.

In the case where an oxide insulating film is formed by a CVD method as the protective film 53, hydrogen or water derived from a source gas is sometimes mixed in the oxide insulating film. Thus, after the oxide insulating film is formed by a plasma CVD method, heat treatment is preferably performed for dehydrogenation or dehydration.

The oxide semiconductor film 55 can be formed as appropriate by a formation method similar to that of the oxide semiconductor film 17 described in Embodiment 1.

In order to improve the orientation of the crystal parts in the CAAC-OS film, planarity of the surface of the protective film 53 serving as a base insulating film of the oxide semiconductor film is preferably improved. The protective film 53 can be made to have an average surface roughness (Ra) of 1 nm or less, 0.3 nm or less, or 0.1 nm or less as a typical example.

As planarization treatment for improving planarity of the surface of the protective film 53, one or more can be selected from chemical mechanical polishing (CMP) treatment, dry etching treatment, plasma treatment (what is called reverse sputtering), and the like. The plasma treatment is the one in which minute unevenness of the surface is reduced by introducing an inert gas such as an argon gas into a vacuum chamber and applying an electric field so that a surface to be processed serves as a cathode.

Figure 39B:
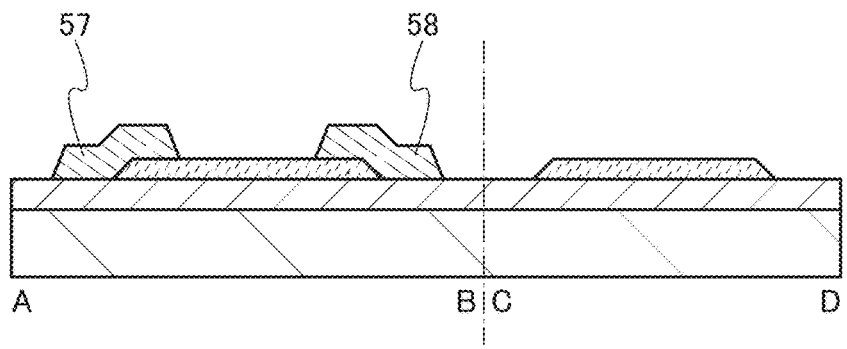

Next, as illustrated in FIG. 39B, the pair of electrodes 57 and 58 are formed. The pair of electrodes 57 and 58 can be formed as appropriate by a formation method similar to those of the pair of electrodes 19 and 20 described in Embodiment 1. Alternatively, the pair of electrodes 57 and 58 can be formed by a printing method or an inkjet method.

Figure 39C:
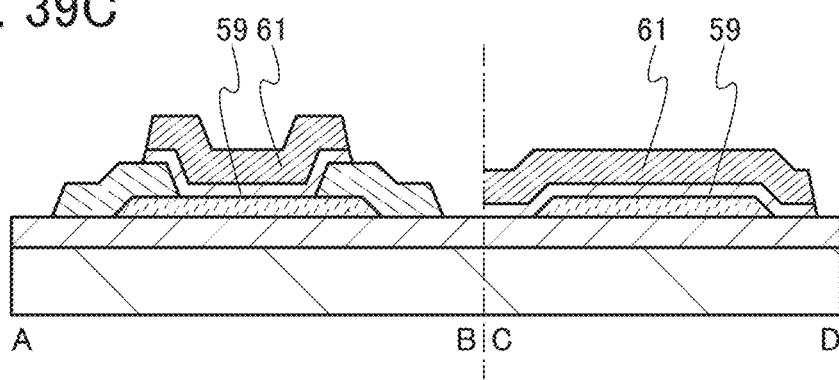

Next, as illustrated in FIG. 39C, the gate insulating film 59 and the gate electrode 61 are formed. An insulating film is formed by a sputtering method, a CVD method, an evaporation method, or the like, and a conductive film is formed over the insulating film by a sputtering method, a CVD method, an evaporation method, or the like. Then, a mask is formed over the conductive film by a photolithography process. After that, parts of insulating film and the conductive film are etched using the mask to form the gate insulating film 59 and the gate electrode 61. After that, the mask is removed.

A film to be the gate insulating film 59 is formed by a sputtering method, a CVD method, an evaporation method, or the like. A film to be the gate electrode 61 is formed by a sputtering method, a CVD method, an evaporation method, or the like.

In the case where an oxide insulating film containing nitrogen and having a small number of defects is formed as the film to be the gate insulating film 59, the film can be formed using conditions similar to those of the protective film 53 as appropriate.

Figure 39D:
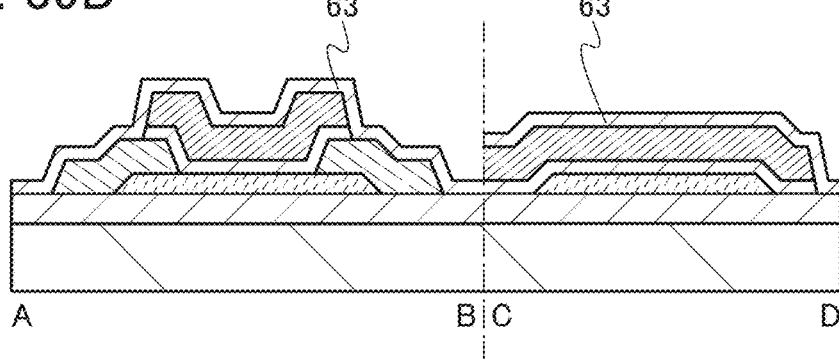

Next, as illustrated in FIG. 39D, the insulating film 63 is formed over the substrate 51, the pair of electrodes 57 and 58, the gate insulating film 59, and the gate electrode 61. The base insulating film 63 can be formed as appropriate by a sputtering method, a CVD method, a printing method, a coating method, or the like.

Next, in a manner similar to that in Embodiment 1, heat treatment may be performed. The heat treatment is performed typically at a temperature higher than or equal to 150° C. and lower than the strain point of the substrate, preferably higher than or equal to 250° C. and lower than or equal to 450° C., further preferably higher than or equal to 300° C. and lower than or equal to 450° C.

Through the above steps, a transistor in which a change in threshold voltage is reduced can be manufactured. Further, a transistor in which a change in electrical characteristics is reduced can be manufactured.

Note that the structures, methods, and the like described in this embodiment can be used as appropriate in combination with any of the structures, methods, and the like described in the other embodiments and examples.

<Modification Example 1>

Modification examples of the transistor 50 described in Embodiment 4 are described with reference to FIGS. 40A and 40B. In each of the transistors described in this modification example, a gate insulating film or a protective film has a stacked-layer structure.

Figure 40A:
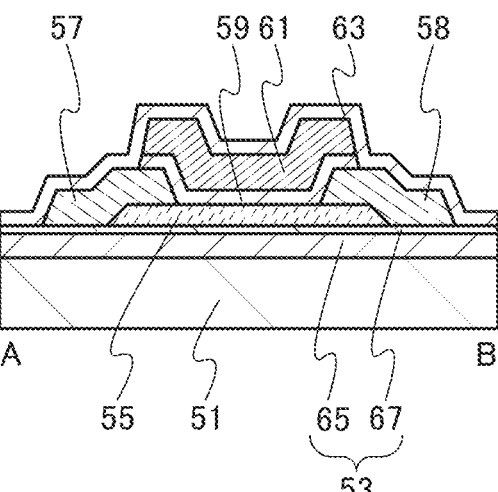
FIGS. 40A and 40B are each a cross-sectional view of one embodiment of a transistor.

In a transistor 50a illustrated in FIG. 40A, the protective film 53 have a multi-layer structure. Specifically, in the protective film 53, an oxide insulating film 65 and an oxide insulating film 67 are stacked. The oxide insulating film 65 contains oxygen at a higher proportion than oxygen in the stoichiometric composition. The oxide insulating film 67 in contact with the oxide semiconductor film 55 contains nitrogen, has a small number of defects, and can be used as at least one of the protective film 53 and the gate insulating film 59 of the transistor 50.

The oxide insulating film 65 containing oxygen at a higher proportion than oxygen in the stoichiometric composition has a thickness of greater than or equal to 50 nm, preferably greater than or equal to 200 nm and less than or equal to 3000 nm, further preferably greater than or equal to 300 nm and less than or equal to 1000 nm. When the oxide insulating film 65 containing oxygen at a higher proportion than oxygen in the stoichiometric composition is formed thick, the number of released oxygen molecules in the oxide insulating film 65 containing oxygen at a higher proportion than oxygen in the stoichiometric composition can be increased, and the interface state at the interface between the oxide insulating film 67 and the oxide semiconductor film 55 can be lowered.

For forming the oxide insulating film 65 containing oxygen at a higher proportion than oxygen in the stoichiometric composition, an oxide insulating film from which part of oxygen is released by heating and which can be used as the protective film 53 can be used as appropriate.

Furthermore, the oxide insulating film 67 can be formed in the formation manner of the oxide insulating film containing nitrogen and having a small number of defects which can be used as the protective film 53 and the gate insulating film 59 in the transistor 50.

The oxide insulating film 65 containing oxygen at a higher proportion than oxygen in the stoichiometric composition and the oxide insulating film 67 are formed, and the oxide semiconductor film 55 is formed over the oxide insulating film 67. After that, heat treatment may be performed. By the heat treatment, part of oxygen contained in the oxide insulating film 65 containing oxygen at a higher proportion than oxygen in the stoichiometric composition can be diffused in the vicinity of the interface between the oxide insulating film 67 and the oxide semiconductor film 55. As a result, the interface state in the vicinity of the interface between the oxide insulating film 67 and the oxide semiconductor film 55 can be lowered, so that a change in threshold voltage can be reduced.

The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

Figure 40B:
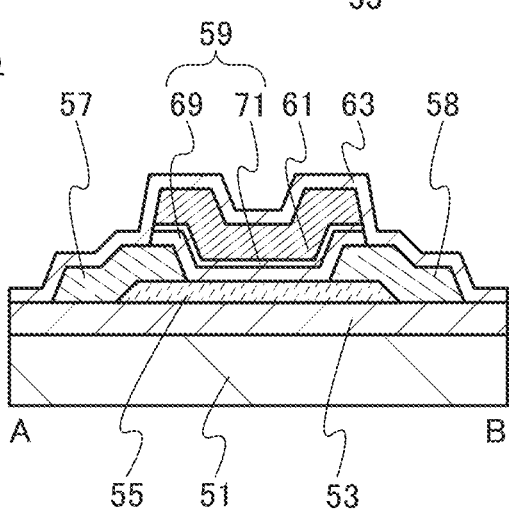

In a transistor 50b illustrated in FIG. 40B, the gate insulating film 59 has a stacked structure of an oxide insulating film 69 and a nitride insulating film 71 in this order, and the oxide insulating film 69 in contact with the oxide semiconductor film 55 is an oxide insulating film containing nitrogen and having a small number of defects.

As the nitride insulating film 71, a film similar to the nitride insulating film 29 described in Modification Example 1 in Embodiment 1 is preferably used. Thus, the physical thickness of the gate insulating film 59 can be increased. This makes it possible to reduce a decrease in withstand voltage of the transistor 50b and furthermore increase the withstand voltage, thereby reducing electrostatic discharge damage to a semiconductor device.

<Modification Example 2>

A modification example of the transistor 50 described in Embodiment 4 is described with reference to FIGS. 41A to 41C. In this modification example, a transistor in which an oxide semiconductor film is provided between a gate insulating film and a pair of electrodes is described.

Figure 41A:
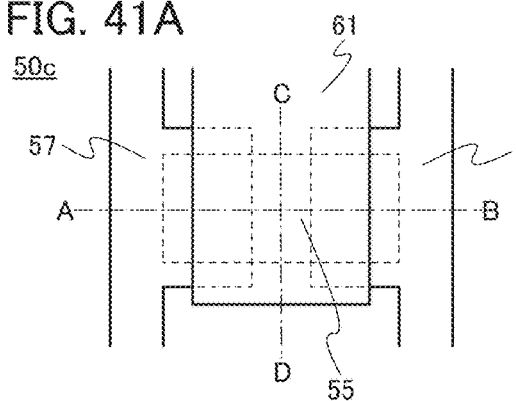
FIGS. 41A to 41C are a top view and cross-sectional views illustrating one embodiment of a transistor.
Figure 41C:
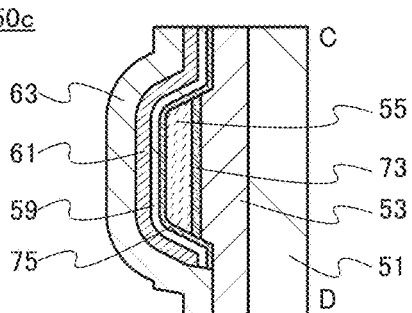
Figure 41B:
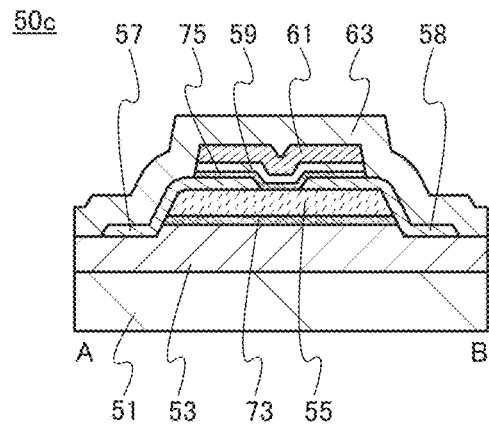

FIGS. 41A to 41C are a top view and cross-sectional views of a transistor 50c included in a semiconductor device of one embodiment of the present invention. FIG. 41A is a top view, FIG. 41B is a schematic cross-sectional view taken along dot-dashed line A-B in FIG. 41A, and FIG. 41C is a schematic cross-sectional view taken along dot-dashed line C-D in FIG. 41A.

The transistor 50c illustrated in FIGS. 41B and 41C includes an oxide semiconductor film 73 over the protective film 53; the oxide semiconductor film 55 over the oxide semiconductor film 73; the pair of electrodes 57 and 58 in contact with the oxide semiconductor film 55 and the oxide semiconductor film 73; an oxide semiconductor film 75 in contact with the oxide semiconductor film 55 and the pair of electrodes 57 and 58; the gate insulating film 59 over the oxide semiconductor film 75; and the gate electrode 61 overlapping with the oxide semiconductor film 55 with the gate insulating film 59 therebetween. The insulating film 63 may be provided over the protective film 53, the pair of electrodes 57 and 58, the oxide semiconductor film 75, the gate insulating film 59, and the gate electrode 61.

In the transistor 50c, the protective film 53 has a projecting portion, and the stacked oxide semiconductor films 73 and 55 are provided over the projecting portion of the protective film 53.

As illustrated in FIG. 41B, the oxide semiconductor film 75 is in contact with the top surface of the oxide semiconductor film 55 and the top and side surfaces of the pair of electrodes 57 and 58. As illustrated in FIG. 41C, the oxide semiconductor film 75 is in contact with a side surface of the projecting portion of the protective film 53, a side surface of the oxide semiconductor film 73, and the top and side surfaces of the oxide semiconductor film 55.

As illustrated in FIG. 41C, in the channel width direction of the transistor 50c, the gate electrode 61 faces the top and side surfaces of the oxide semiconductor film 55 with the oxide semiconductor film 75 and the gate insulating film 59 therebetween.

The gate electrode 61 electrically surrounds the oxide semiconductor film 55. With this structure, on-state current of the transistor 50c can be increased. Such a transistor structure is referred to as a surrounded channel (s-channel) structure. Note that in the s-channel structure, current flows in the whole (bulk) of the oxide semiconductor film 55. Since current flows in an inner part of the oxide semiconductor film 55, the current is hardly affected by interface scattering, and high on-state current can be obtained. In addition, by making the oxide semiconductor film 55 thick, on-state current can be increased.

In fabricating a transistor with a small channel length and a small channel width, when a pair of electrodes, an oxide semiconductor film, or the like is processed while a resist mask is reduced in size, the pair of electrodes, the oxide semiconductor film, or the like has a round end portion (curved surface) in some cases. With this structure, the coverage with the oxide semiconductor film 75 and the gate insulating film 59, which are to be formed over the oxide semiconductor film 55, can be improved. In addition, electric field concentration which might occur at the edges of the pair of electrodes 57 and 58 can be relaxed, which can suppress deterioration of the transistor.

In addition, by miniaturizing the transistor, higher integration and higher density can be achieved. For example, the channel length of the transistor is set to 100 nm or less, preferably 40 nm or less, further preferably 30 nm or less, still further preferably 20 nm or less, and the channel width of the transistor is set to 100 nm or less, preferably 40 nm or less, further preferably 30 nm or less, still further preferably 20 nm or less. The transistor of one embodiment of the present invention with the s-channel structure can increase on-state current even in the case where the channel width thereof is shortened as described above.

For the oxide semiconductor film 73, the material of the oxide semiconductor film 46 described in Modification Example 4 in Embodiment 1 can be used as appropriate. Before a film to be the oxide semiconductor film 55 is formed in FIG. 39A, a film to be the oxide semiconductor film 73 is formed. Then, a film to be the oxide semiconductor film 73 and a film to be the oxide semiconductor film 55 are processed, whereby the oxide semiconductor film 73 and the oxide semiconductor film 55 can be obtained.

For the oxide semiconductor film 75, the material of the oxide semiconductor film 47 described in Modification Example 4 in Embodiment 1 can be used as appropriate. Before a film to be the gate insulating film 59 is formed in FIG. 39C, a film to be the oxide semiconductor film 75 is formed. Then, a film to be the gate insulating film 59 and a film to be the gate electrode 61 are formed. After that, the films are processed at the same time, whereby the oxide semiconductor film 75, the gate insulating film 59, and the gate electrode 61 can be obtained.

The thickness of the oxide semiconductor film 73 may be set as appropriate as long as formation of an interface state at the interface with the oxide semiconductor film 55 is inhibited. For example, the oxide semiconductor film 55 includes a region whose thickness is larger than that of the oxide semiconductor film 73, preferably 2 times or more, further preferably 4 times or more, still further preferably 6 times or more as large as that of the oxide semiconductor film 73. Note that the above does not apply in the case where the on-state current of the transistor need not be increased, and the oxide semiconductor film 73 may include a region whose thickness is equal to or greater than that of the oxide semiconductor film 55.

The oxide semiconductor film 75 includes a region whose thickness is set as appropriate, in a manner similar to that of the oxide semiconductor film 73, as long as formation of an interface state at the interface with the oxide semiconductor film 55 is inhibited. For example, the oxide semiconductor film 75 includes a region whose thickness is smaller than or equal to that of the oxide semiconductor film 73. If the oxide semiconductor film 75 is thick, it may become difficult for the electric field from the gate electrode 61 to reach the oxide semiconductor film 55; thus, it is preferable that the oxide semiconductor film 75 be thin. For example, the oxide semiconductor film 75 includes a region thinner than the oxide semiconductor film 55. Note that the thickness of the oxide semiconductor film 75 is not limited to the above, and may be set as appropriate depending on a driving voltage of the transistor in consideration of the withstand voltage of the gate insulating film 59.

High integration of a semiconductor device requires miniaturization of a transistor. However, it is known that miniaturization of a transistor causes deterioration in electrical characteristics of the transistor. A decrease in channel width causes a reduction in on-state current.

However, in the transistor of one embodiment of the present invention, as described above, the oxide semiconductor film 75 is formed to cover the channel formation region of the oxide semiconductor film 55, and the channel formation region and the gate insulating film 59 are not in contact with each other. Therefore, scattering of carries formed at the interface between the oxide semiconductor film 55 and the gate insulating film 59 can be suppressed, whereby on-state current of the transistor can be increased.

In the case where an oxide semiconductor film is made intrinsic or substantially intrinsic, decrease in the number of carriers contained in the oxide semiconductor film may reduce the field-effect mobility. However, in the transistor of one embodiment of the present invention, a gate electric field is applied to the oxide semiconductor film 55 not only in the vertical direction but also from the side surfaces. That is, the gate electric field is applied to the whole of the oxide semiconductor film 55, whereby current flows in the bulk of the oxide semiconductor films. It is thus possible to improve the field-effect mobility of the transistor while a change in electrical characteristics is reduced by highly purified intrinsic properties.

In the transistor of one embodiment of the present invention, the oxide semiconductor film 55 is formed over the oxide semiconductor film 73, so that an interface state is less likely to be formed. In addition, impurities do not enter the oxide semiconductor film 55 from above and below because the oxide semiconductor film 55 are provided between the oxide semiconductor films 73 and 75. Thus, the oxide semiconductor film 55 is surrounded by the oxide semiconductor film 73 and the oxide semiconductor film 75 (also electrically surrounded by the gate electrode 61), so that stabilization of the threshold voltage in addition to the above-described improvement of on-state current of the transistor is possible. As a result, current flowing between the source and the drain when the voltage of the gate electrode is 0 V can be reduced, which leads to lower power consumption. Further, the threshold voltage of the transistor becomes stable; thus, long-term reliability of the semiconductor device can be improved.

Note that the structures, methods, and the like described in this embodiment can be used as appropriate in combination with any of the structures, methods, and the like described in the other embodiments and examples.

(Embodiment 5)

In this embodiment, one embodiment that can be applied to the oxide semiconductor film in any of the transistors included in the semiconductor device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed using a CAAC-OS film. Furthermore, the oxide semiconductor film may include an amorphous oxide semiconductor and an oxide semiconductor having a crystal grain. Described below are the CAAC-OS and the microcrystalline oxide semiconductor.

An oxide semiconductor is classified into, for example, a non-single-crystal oxide semiconductor and a single crystal oxide semiconductor. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

Described below are the CAAC-OS, the microcrystalline oxide semiconductor, and the amorphous oxide semiconductor.

First, a CAAC-OS is described.

A CAAC-OS is one of oxide semiconductors having a plurality of c-axis aligned crystal parts (also referred to as pellets).

In a transmission electron microscope (TEM) image of the CAAC-OS, a boundary between crystal parts, that is, a clear grain boundary is not observed. Thus, in the CAAC-OS, a reduction in electron mobility due to the grain boundary is less likely to occur.

Figure 73A:
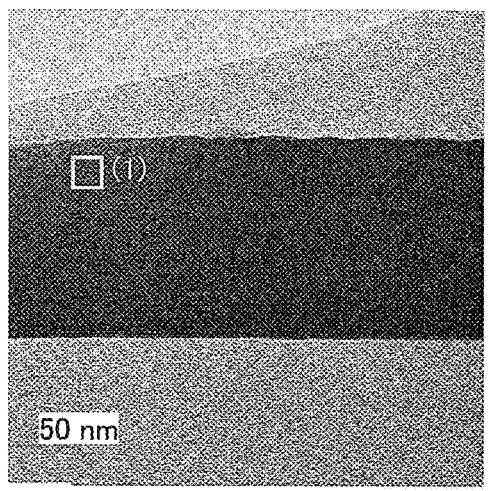
FIGS. 73A to 73D are Cs-corrected high-resolution TEM images of a cross section of a CAAC-OS and a cross-sectional schematic view of a CAAC-OS.

FIG. 73A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 73B:
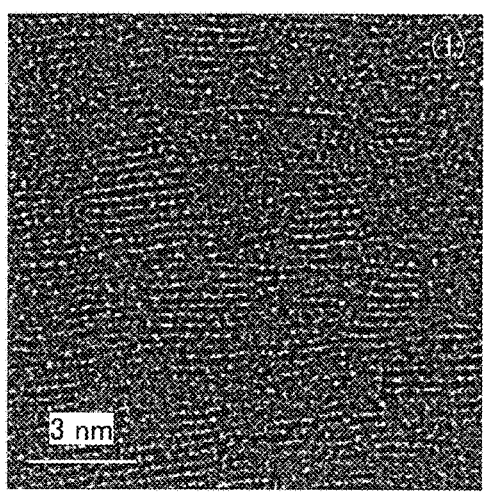

FIG. 73B is an enlarged Cs-corrected high-resolution TEM image of a region (1) in FIG. 73A. FIG. 73B shows that metal atoms are arranged in a layered manner in a crystal part. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 73C:
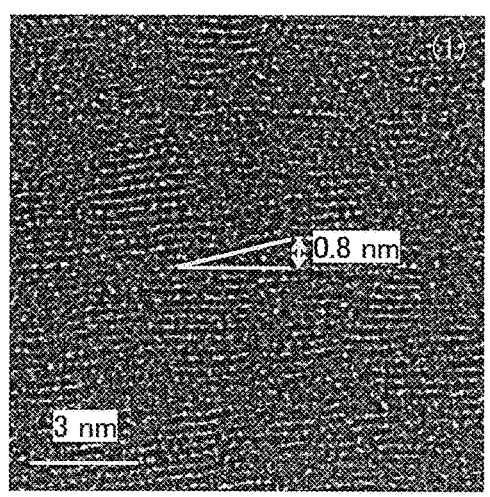

As shown in FIG. 73B, the CAAC-OS has a characteristic atomic arrangement. The characteristic atomic arrangement is denoted by an auxiliary line in FIG. 73C. FIGS. 73B and 73C prove that the size of a pellet is approximately 1 nm to 3 nm, and the size of a space caused by tilt of the pellets is approximately 0.8 nm. Therefore, the pellet can also be referred to as a nanocrystal (nc).

Figure 73D:
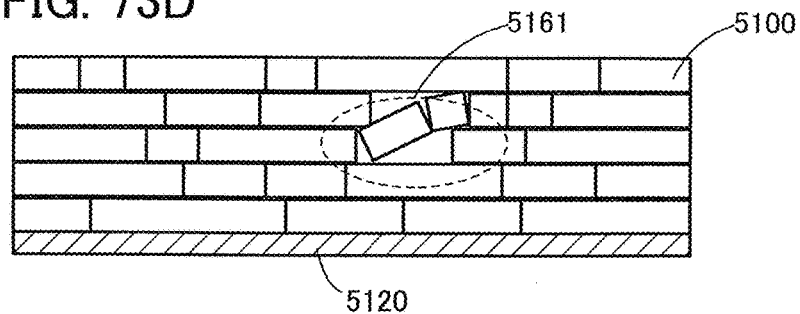

Here, according to the Cs-corrected high-resolution TEM images, the schematic arrangement of pellets 5100 of a CAAC-OS over a substrate 5120 is illustrated by such a structure in which bricks or blocks are stacked (see FIG. 73D). The part in which the pellets are tilted as observed in FIG. 73C corresponds to a region 5161 shown in FIG. 73D.

For example, as shown in FIG. 74A, a Cs-corrected high-resolution TEM image of a plane of the CAAC-OS obtained from a direction substantially perpendicular to the sample surface is observed. FIGS. 74B, 74C, and 74D are enlarged Cs-corrected high-resolution TEM images of regions (1), (2), and (3) in FIG. 74A, respectively. FIGS. 74B, 74C, and 74D indicate that metal atoms are arranged in a triangular, quadrangular, or hexagonal configuration in a crystal part. However, there is no regularity of arrangement of metal atoms between different crystal parts.

Figure 70A:
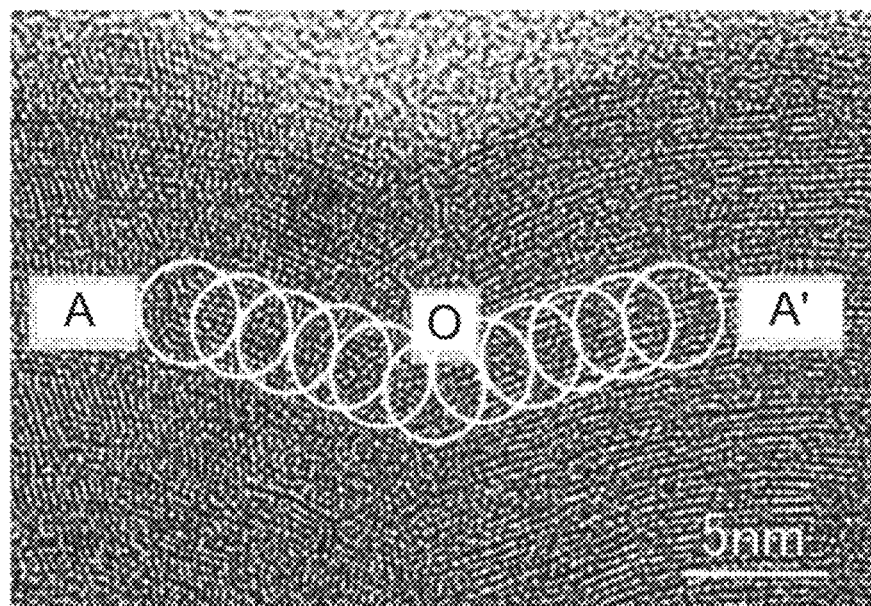
FIGS. 70A to 70C are cross-sectional TEM images and a local Fourier transform image of an oxide semiconductor.
Figure 70B:
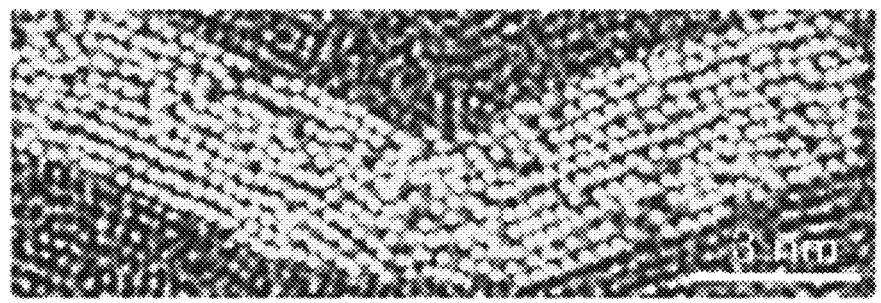

FIG. 70A is a high-resolution cross-sectional TEM image of a CAAC-OS. FIG. 70B is a high-resolution cross-sectional TEM image obtained by enlarging the image of FIG. 70A. In FIG. 70B, atomic arrangement is highlighted for easy understanding.

Figure 70C:
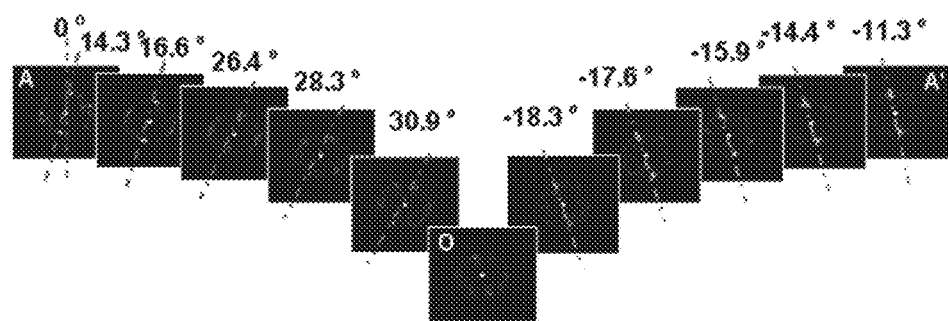

FIG. 70C is local Fourier transform images of regions each surrounded by a circle (the diameter is about 4 nm) between A and O and between O and A' in FIG. 70A. C-axis alignment can be observed in each region in FIG. 70C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS, spots (luminescent spots) indicating alignment are observed. For example, when electron diffraction with an electron beam having a diameter of 1 nm or more and 30 nm or less (such electron diffraction is also referred to as nanobeam electron diffraction) is performed on the top surface of the CAAC-OS, spots are observed (see FIG. 71A).

The results of the high-resolution cross-sectional TEM image and the high-resolution plan TEM image show that the crystal parts in the CAAC-OS have alignment.

Most of the crystal parts included in the CAAC-OS each fit inside a cube whose one side is less than 100 nm. Thus, there is a case where a crystal part included in the CAAC-OS fits inside a cube whose one side is less than 10 nm, less than 5 nm, or less than 3 nm. Note that when a plurality of crystal parts included in the CAAC-OS are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan TEM image.

Figure 75A:
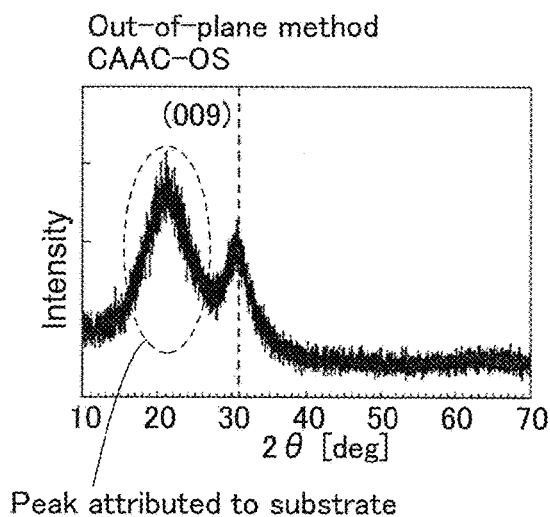
FIGS. 75A to 75C show structural analysis of a CAAC-OS and a single crystal oxide semiconductor by XRD.

For example, when the structure of a CAAC-OS including an InGaZnO$_4$ crystal is analyzed by an out-of-plane method using an X-ray diffraction (XRD) apparatus, a peak appears at a diffraction angle (2θ) of around 31° as shown in FIG. 75A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS including an InGaZnO$_4$ crystal by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS, a peak appear when 2θ is around 31° and that a peak not appear when 2θ is around 36°.

Figure 75B:
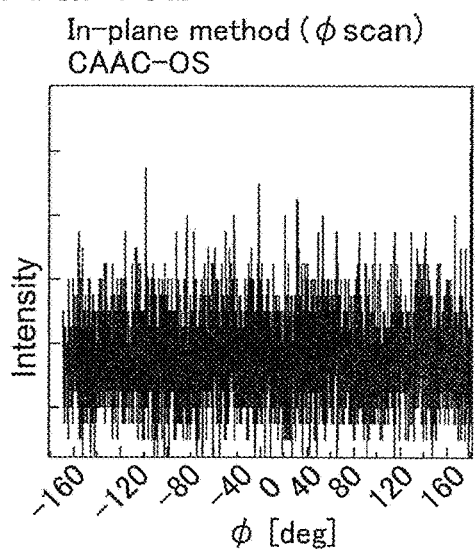
Figure 75C:
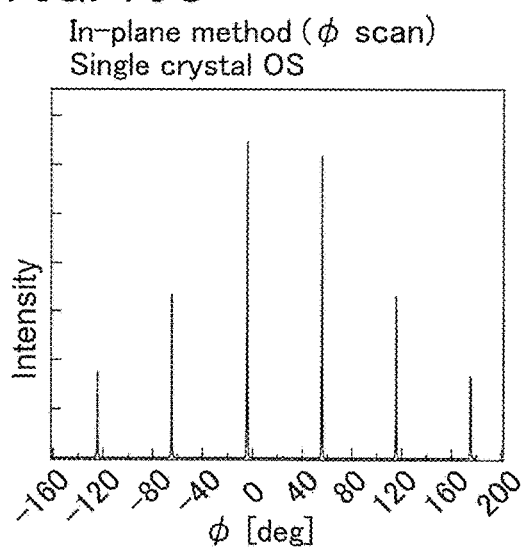

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 75B, a peak is not clearly observed. In contrast, in the case of a single crystal oxide semiconductor of InGaZnO$_4$, when φ scan is performed with 2θ fixed at around 56θ, as shown in FIG. 75C, six peaks which are derived from crystal planes equivalent to the (110) plane are observed. Accordingly, the structural analysis using XRD shows that the directions of a-axes and b-axes are different in the CAAC-OS.

Figure 76A:
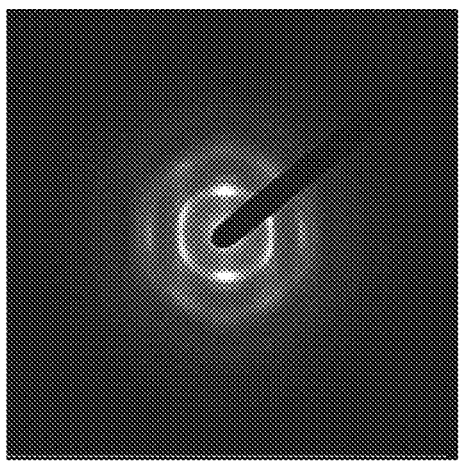
FIGS. 76A and 76B show electron diffraction patterns of a CAAC-OS.
Figure 76B:
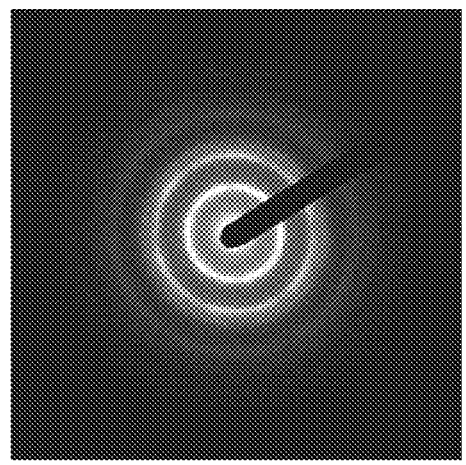

Next, FIG. 76A shows a diffraction pattern (also referred to as a selected-area transmission electron diffraction pattern) obtained in such a manner that an electron beam with a probe diameter of 300 nm is incident on an In—Ga—Zn oxide that is a CAAC-OS in a direction parallel to the sample surface. As shown in FIG. 76A, for example, spots derived from the (009) plane of an InGaZnO$_4$ crystal are observed. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 76B shows a diffraction pattern obtained in such a manner that an electron beam with a probe diameter of 300 nm is incident on the same sample in a direction perpendicular to the sample surface. As shown in FIG. 76B, a ring-like diffraction pattern is observed. Thus, the electron diffraction also indicates that the a-axes and b-axes of the pellets included in the CAAC-OS do not have regular alignment. The first ring in FIG. 76B is considered to be derived from the (010) plane, the (100) plane, and the like of the InGaZnO$_4$ crystal. The second ring in FIG. 76B is considered to be derived from the (110) plane and the like.

Since the c-axes of the pellets (nanocrystals) are aligned in a direction substantially perpendicular to the formation surface or the top surface in the above manner, the CAAC-OS can also be referred to as an oxide semiconductor including c-axis aligned nanocrystals (CANC).

According to the above results, in the CAAC-OS having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface of the CAAC-OS. Thus, for example, in the case where a shape of the CAAC-OS is changed by etching or the like, the c-axis might not be necessarily parallel to a normal vector of a formation surface or a normal vector of a top surface of the CAAC-OS.

Distribution of c-axis aligned crystal parts in the CAAC-OS is not necessarily uniform. For example, in the case where crystal growth leading to the crystal parts of the CAAC-OS occurs from the vicinity of the top surface of the CAAC-OS, the proportion of the c-axis aligned crystal parts in the vicinity of the top surface is higher than that in the vicinity of the formation surface in some cases. Furthermore, when an impurity is added to the CAAC-OS, a region to which the impurity is added is altered, and the proportion of the c-axis aligned crystal parts in the CAAC-OS varies depending on regions, in some cases.

The CAAC-OS is an oxide semiconductor with a low impurity concentration. The impurity means an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. Additionally, the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

In a transistor using the CAAC-OS, change in electrical characteristics due to irradiation with visible light or ultraviolet light is small.

A semiconductor device including the transistor having the CAAC-OS is less likely to be broken even when folded. For this reason, a flexible semiconductor device preferably includes the transistor having the CAAC-OS.

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS when an electron beam having a probe diameter close to or smaller than the size of a crystal part is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases (see FIG. 71B).

Since there is no regularity of crystal orientation between the pellets (nanocrystals) as mentioned above, the nc-OS can also be referred to as an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different crystal parts in the nc-OS. Therefore, the nc-OS has a higher density of defect states than the CAAC-OS.

Note that an oxide semiconductor may be a stacked film including two or more of an amorphous oxide semiconductor, a microcrystalline oxide semiconductor, and a CAAC-OS, for example.

In the case where an oxide semiconductor film has a plurality of structures, the structures can be analyzed using nanobeam electron diffraction in some cases.

Figure 71A:
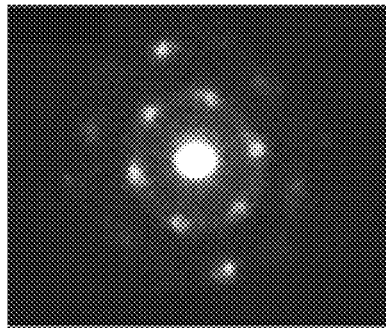
FIGS. 71A and 71B show nanobeam electron diffraction patterns of oxide semiconductor films and FIGS. 71C and 71D illustrate an example of a transmission electron diffraction measurement apparatus.
Figure 71B:
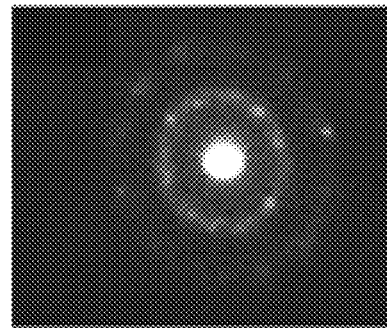
Figure 71C:
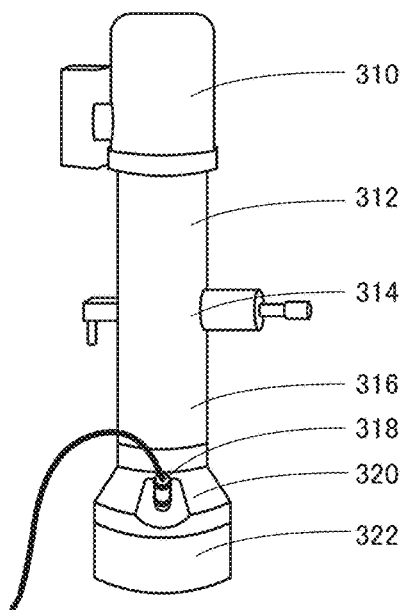

FIG. 71C illustrates a transmission electron diffraction measurement apparatus which includes an electron gun chamber 310, an optical system 312 below the electron gun chamber 310, a sample chamber 314 below the optical system 312, an optical system 316 below the sample chamber 314, an observation chamber 320 below the optical system 316, a camera 318 installed in the observation chamber 320, and a film chamber 322 below the observation chamber 320. The camera 318 is provided to face toward the inside of the observation chamber 320. Note that the film chamber 322 is not necessarily provided.

Figure 71D:
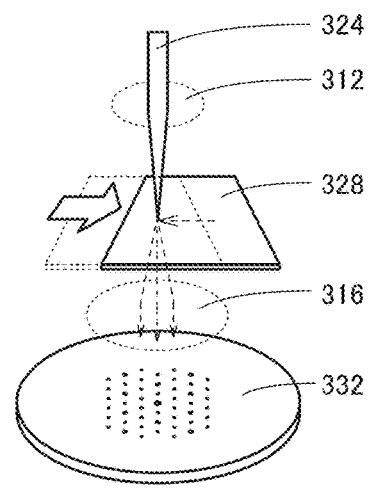

FIG. 71D illustrates an internal structure of the transmission electron diffraction measurement apparatus illustrated in FIG. 71C. In the transmission electron diffraction measurement apparatus, a substance 328 which is positioned in the sample chamber 314 is irradiated with electrons emitted from an electron gun installed in the electron gun chamber 310 through the optical system 312. Electrons passing through the substance 328 enter a fluorescent plate 332 provided in the observation chamber 320 through the optical system 316. On the fluorescent plate 332, a pattern corresponding to the intensity of the incident electron appears, which allows measurement of a transmission electron diffraction pattern.

The camera 318 is installed so as to face the fluorescent plate 332 and can take a picture of a pattern appearing in the fluorescent plate 332. An angle formed by a straight line which passes through the center of a lens of the camera 318 and the center of the fluorescent plate 332 and an upper surface of the fluorescent plate 332 is, for example, 15° or more and 80° or less, 30° or more and 75° or less, or 45° or more and 70° or less. As the angle is reduced, distortion of the transmission electron diffraction pattern taken by the camera 318 becomes larger. Note that if the angle is obtained in advance, the distortion of an obtained transmission electron diffraction pattern can be corrected. Note that the film chamber 322 may be provided with the camera 318. For example, the camera 318 may be set in the film chamber 322 so as to be opposite to the incident direction of electrons 324. In this case, a transmission electron diffraction pattern with less distortion can be taken from the rear surface of the fluorescent plate 332.

A holder for fixing the substance 328 that is a sample is provided in the sample chamber 314. The holder transmits electrons passing through the substance 328. The holder may have, for example, a function of moving the substance 328 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 328.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 324 that are a nanobeam in the substance, as illustrated in FIG. 71D. At this time, when the substance 328 is a CAAC-OS film, a diffraction pattern shown in FIG. 71A is observed. When the substance 328 is an nc-OS film, a diffraction pattern shown in FIG. 71B is observed.

Even when the substance 328 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 72A:
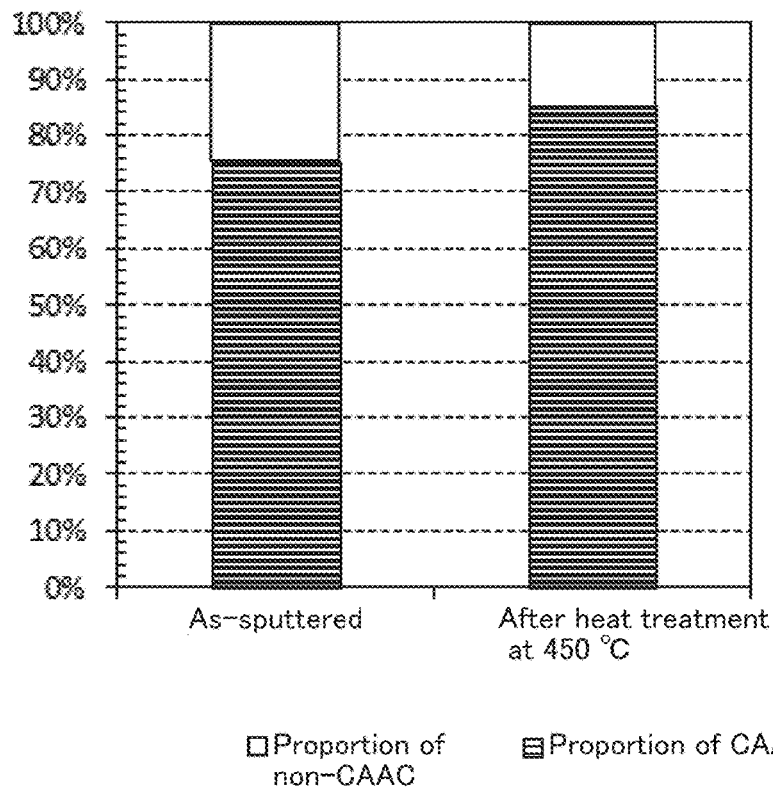
FIG. 72A shows an example of structural analysis by transmission electron diffraction measurement and FIGS. 72B and 72C show plan-view TEM images.

FIG. 72A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at high temperatures (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 72B:
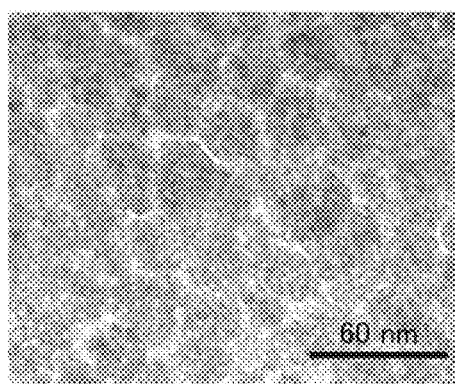
Figure 72C:
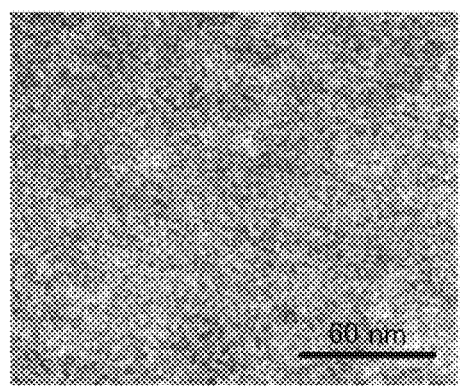

FIGS. 72B and 72C are high-resolution planar TEM images of the CAAC-OS film obtained just after the deposition and the CAAC-OS film subjected to the heat treatment at 450° C., respectively. Comparison between FIGS. 72B and 72C shows that the CAAC-OS film subjected to the heat treatment at 450° C. has more uniform film quality. That is, the heat treatment at high temperatures improves the film quality of the CAAC-OS film.

With such a measurement method, the structure of an oxide semiconductor film having a plurality of structures can be analyzed in some cases.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS, an nc-OS, and a CAAC-OS are prepared. Each of the samples is an In—Ga—Zn oxide.

First, a high-resolution cross-sectional TEM image of each sample is obtained. The high-resolution cross-sectional TEM images show that all the samples have crystal parts.

Figure 77:
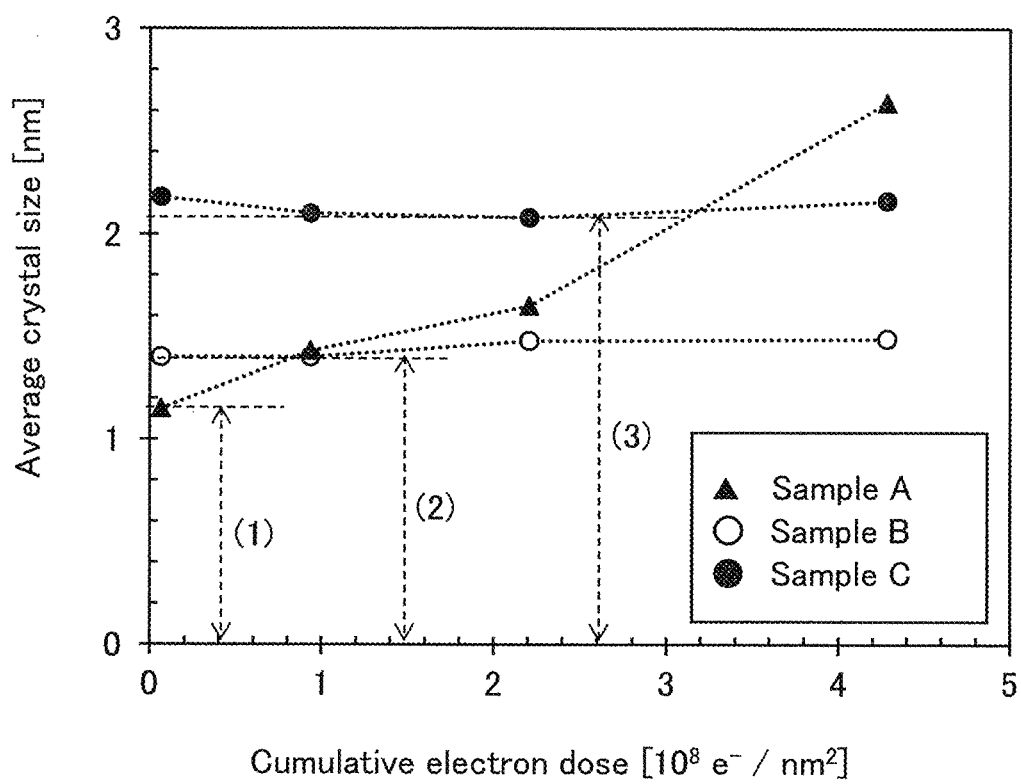
FIG. 77 shows a change in crystal part of an In—Ga—Zn oxide induced by electron irradiation.

Then, the size of the crystal part of each sample is measured. FIG. 77 shows the change in the average size of crystal parts (at 22 points to 45 points) in each sample. Sample A has the a-like OS, Sample B has the nc-OS, and Sample C has the CAAC-OS. FIG. 77 indicates that the crystal part size in the a-like OS increases with an increase in the cumulative electron dose. Specifically, as shown by (1) in FIG. 77, a crystal part of approximately 1.2 nm at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$ regardless of the cumulative electron dose. Specifically, as shown by (2) in FIG. 77, the average crystal size is approximately 1.4 nm regardless of the observation time by TEM. Furthermore, as shown by (3) in FIG. 77, the average crystal size is approximately 2.1 nm regardless of the observation time by TEM.

In this manner, growth of the crystal part occurs due to the crystallization of the a-like OS, which is induced by a slight amount of electron beam employed in the TEM observation. In contrast, in the nc-OS and the CAAC-OS that have good quality, crystallization hardly occurs by a slight amount of electron beam used for TEM observation.

Note that the crystal part size in the a-like OS and the nc-OS can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS is higher than or equal to 78.6% and lower than 92.3% of the density of the single crystal oxide semiconductor having the same composition. For example, the density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor, an a-like OS, a microcystalline oxide semiconductor, and a CAAC-OS, for example.

An oxide semiconductor having a low impurity concentration and a low density of defect states (a small number of oxygen vacancies) can have low carrier density. Therefore, such an oxide semiconductor is referred to as a highly purified intrinsic or substantially highly purified intrinsic oxide semiconductor. A CAAC-OS and an nc-OS have a low impurity concentration and a low density of defect states as compared to an a-like OS and an amorphous oxide semiconductor. That is, a CAAC-OS and an nc-OS are likely to be highly purified intrinsic or substantially highly purified intrinsic oxide semiconductors. Thus, a transistor including a CAAC-OS or an nc-OS rarely has negative threshold voltage (is rarely normally on). The highly purified intrinsic or substantially highly purified intrinsic oxide semiconductor has few carrier traps. Therefore, a transistor including a CAAC-OS or an nc-OS has small variation in electrical characteristics and high reliability. An electric charge trapped by the carrier traps in the oxide semiconductor takes a long time to be released. The trapped electric charge may behave like a fixed electric charge. Thus, the transistor including the oxide semiconductor, which has a high impurity concentration and a high density of defect states, might have unstable electrical characteristics.

<Deposition Model>

Examples of deposition models of a CAAC-OS and an nc-OS are described below.

Figure 78A:
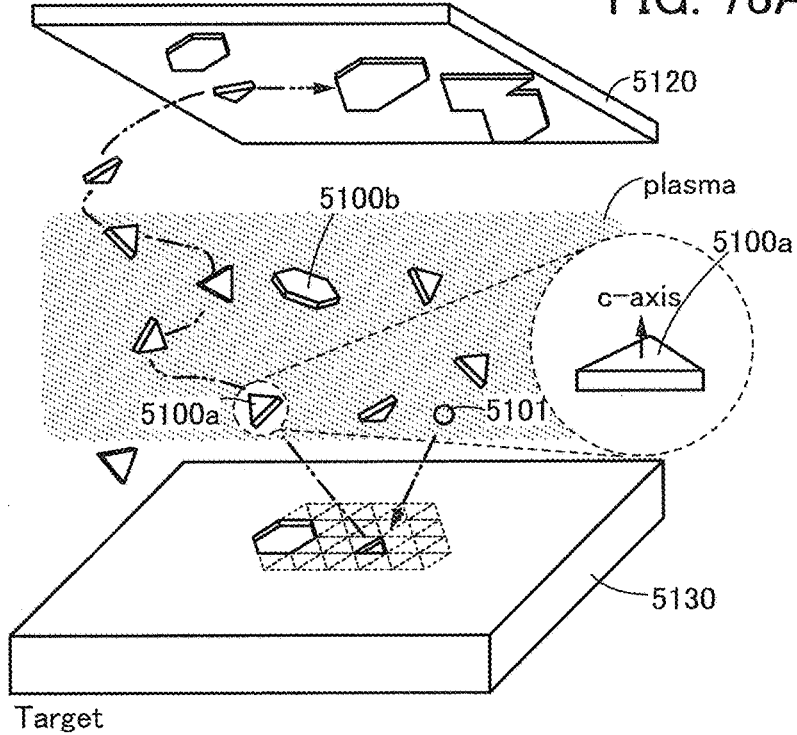
FIGS. 78A and 78B are schematic views showing deposition models of a CAAC-OS and an nc-OS.

FIG. 78A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. The above description on the deposition chamber is referred to for the layout and structure of magnets. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 79A:
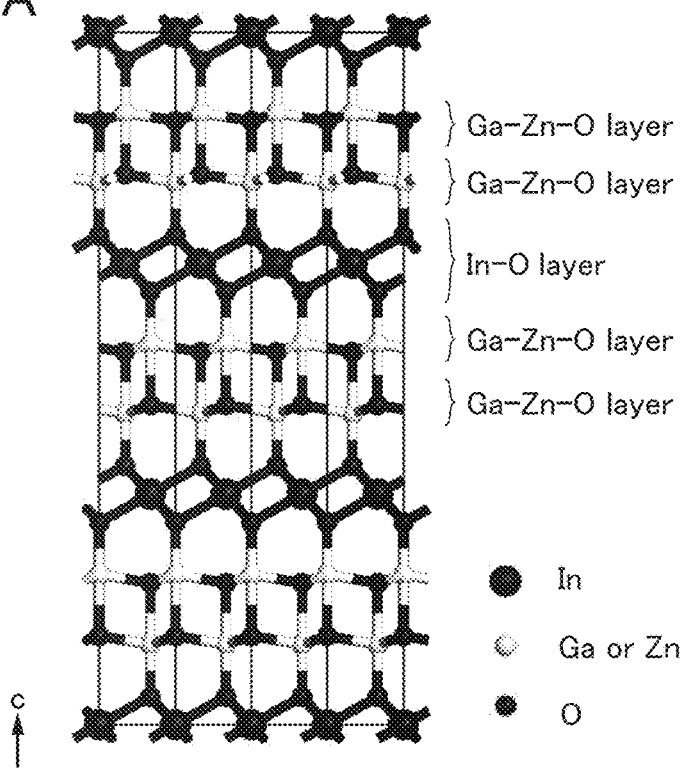
FIGS. 79A to 79C show an InGaZnO$_4$ crystal and a pellet.

A cleavage plane of the target 5130 including an In—Ga—Zn oxide is described as an example. FIG. 79A shows a structure of an InGaZnO$_4$ crystal included in the target 5130. Note that FIG. 79A shows a structure of the case where the InGaZnO$_4$ crystal is observed from a direction parallel to the b-axis when the c-axis is in an upward direction.

FIG. 79A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

The ion 5101 is accelerated toward the target 5130 side by an electric field, and then the ion 5101 collides with the target 5130. At this time, a pellet 5100a and a pellet 5100b, which are flat-plate-like (pellet-like) sputtered particles, are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100 (see FIG. 73D). The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 79B:
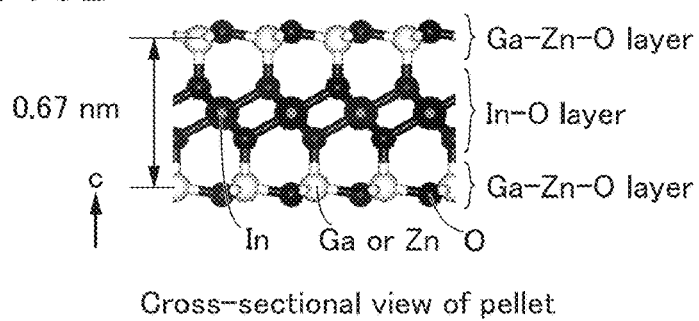
Figure 79C:
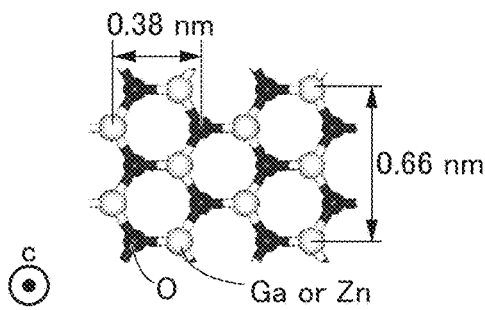

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 77. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 79B is ejected. Note that FIG. 79C shows the structure of the pellet 5100 observed from a direction parallel to the c-axis. Therefore, the pellet 5100 has a nanometer-sized sandwich structure including two Ga—Zn—O layers and an In—O layer.

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom or a zinc atom is negatively charged. In addition, the pellet 5100 may grow by being bonded with an indium atom, a gallium atom, a zinc atom, an oxygen atom, or the like when passing through plasma. This is a cause of a difference in size between (2) and (1) in FIG. 77. Here, in the case where the temperature of the substrate 5120 is at around room temperature, the pellet 5100 does not grow anymore; thus, an nc-OS is formed (see FIG. 78B). An nc-OS can be deposited when the substrate 5120 has a large size because a temperature at which the deposition of an nc-OS is carried out is approximately room temperature. Note that in order that the pellet 5100 grows in plasma, it is effective to increase deposition power in sputtering. High deposition power can stabilize the structure of the pellet 5100.

Figure 78B:
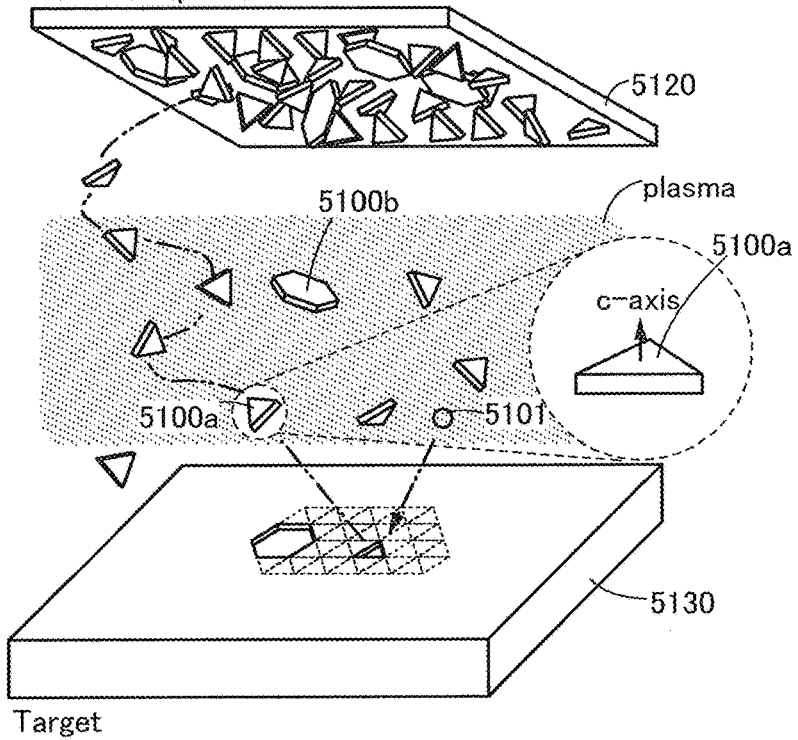

As shown in FIGS. 78A and 78B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and/or the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 78A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 80A to 80D are cross-sectional schematic views.

Figure 80A:
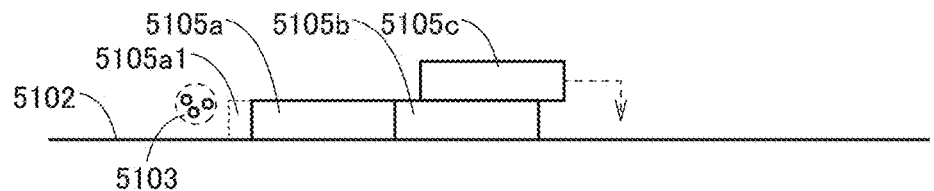
FIGS. 80A to 80D are schematic views showing a deposition model of a CAAC-OS.

As illustrated in FIG. 80A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 ejected from the target together with the zinc oxide is crystallized by heating of the substrate 5120 to form a region 5105a1 on another side surface of the pellet 5105a. Note that the plurality of particles 5103 may contain oxygen, zinc, indium, gallium, or the like.

Figure 80B:
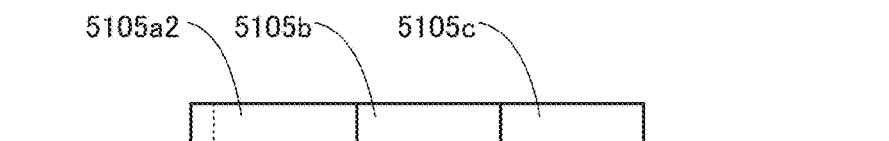

Then, as illustrated in FIG. 80B, the region 5105a1 grows to part of the pellet 5105a to form a pellet 5105a2. In addition, a side surface of the pellet 5105c is in contact with another side surface of the pellet 5105b.

Figure 80C:
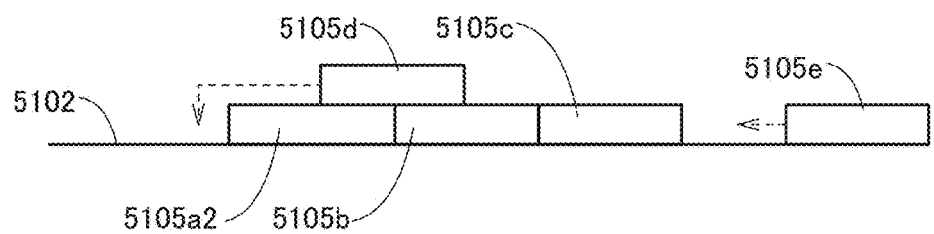

Next, as illustrated in FIG. 80C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 80D:
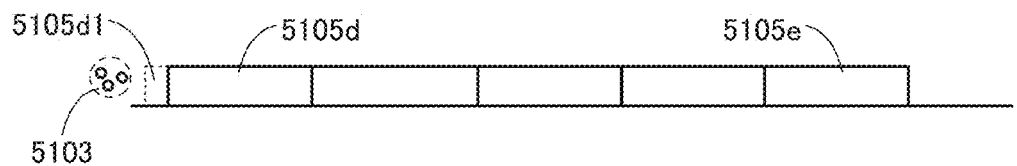

Then, as illustrated in FIG. 80D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 ejected from the target together with the zinc oxide is crystallized by heating of the substrate 5120 to form a region 5105d1 on another side surface of the pellet 5105d.

As described above, deposited pellets are placed to be in contact with each other and then crystal growth is caused at side surfaces of the pellets, whereby a CAAC-OS is formed over the substrate 5120. Therefore, each pellet of the CAAC-OS is larger than that of the nc-OS. This corresponds to a difference in size between (3) and (2) in FIG. 77.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness.

For example, in the case where the top surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be obtained.

As a result, laser crystallization is not needed for formation of a CAAC-OS, and a uniform film can be formed even over a large-sized glass substrate or the like.

Since a CAAC-OS is deposited in accordance with such a model, the sputtered particle preferably has a pellet shape with a small thickness. Note that when the sputtered particles have a dice shape with a large thickness, planes facing the substrate 5120 vary, thus, the thicknesses and orientations of the crystals cannot be uniform in some cases.

According to the deposition model described above, a CAAC-OS with high crystallinity can be formed even on a formation surface with an amorphous structure.

Note that the structures, methods, and the like described in this embodiment can be used as appropriate in combination with any of the structures, methods, and the like described in the other embodiments and examples.

(Embodiment 6)

In this embodiment, a structural example of a display panel of one embodiment of the present invention is described.

<Structural Example>

Figure 42A:
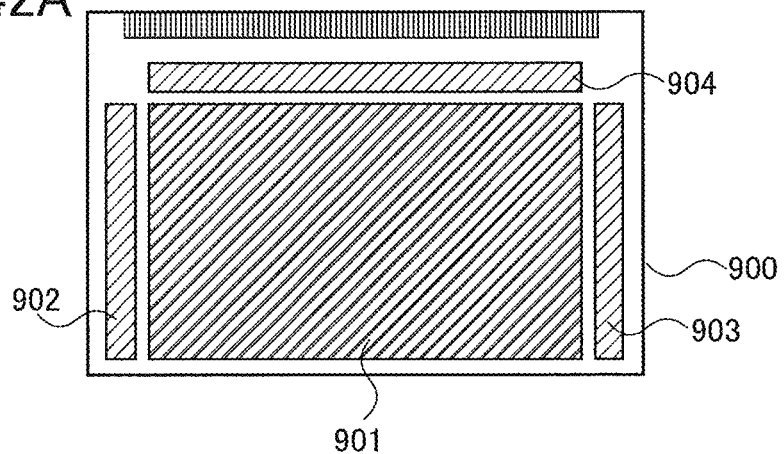
FIGS. 42A to 42C illustrate a structure of a display panel of one embodiment.
Figure 42B:
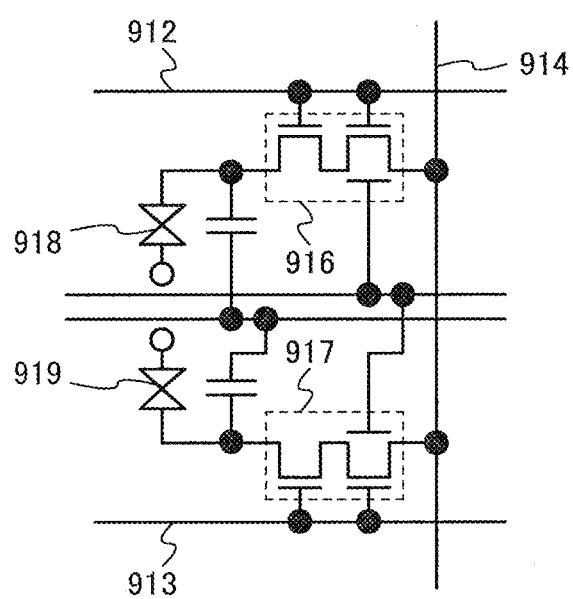
Figure 42C:
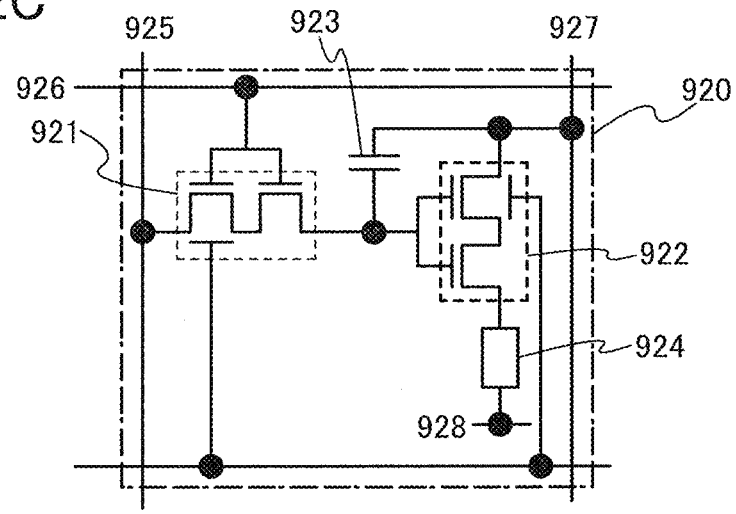

FIG. 42A is a top view of the display panel of one embodiment of the present invention. FIG. 42B is a circuit diagram illustrating a pixel circuit that can be used in the case where a liquid crystal element is used in a pixel in the display panel of one embodiment of the present invention. FIG. 42C is a circuit diagram illustrating a pixel circuit that can be used in the case where an organic EL element is used in a pixel in the display panel of one embodiment of the present invention.

The transistor in the pixel portion can be formed in accordance with the above embodiments. Further, the transistor can easily be an n-channel transistor, and thus, part of a driver circuit that can be formed using an n-channel transistor in the driver circuit is formed over the same substrate as the transistor of the pixel portion. With the use of any of the transistors described in the above embodiments for the pixel portion or the driver circuit in this manner, a highly reliable display device can be provided.

FIG. 42A illustrates an example of a block diagram of an active matrix display device. A pixel portion 901, a first scan line driver circuit 902, a second scan line driver circuit 903, and a signal line driver circuit 904 are provided over a substrate 900 in the display device. In the pixel portion 901, a plurality of signal lines extended from the signal line driver circuit 904 are arranged, and a plurality of scan lines extended from the first scan line driver circuit 902 and the second scan line driver circuit 903 are arranged. Pixels each including a display element are provided in matrix in respective regions in each of which the scan line and the signal line intersect with each other. The substrate 900 of the display device is connected to a timing control circuit (also referred to as controller or control IC) through a connection portion such as a flexible printed circuit (FPC).

In FIG. 42A, the first scan line driver circuit 902, the second scan line driver circuit 903, and the signal line driver circuit 904 are formed over the same substrate 900 as the pixel portion 901. Accordingly, the number of components provided outside, such as a driver circuit, is reduced, so that a reduction in cost can be achieved. Further, if the driver circuit is provided outside the substrate 900, wirings would need to be extended and the number of wiring connections would increase. However, by providing the driver circuit over the substrate 900, the number of wiring connections can be reduced and the reliability or yield can be improved.

<Liquid Crystal Panel>

FIG. 42B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 912 of a transistor 916 and a gate wiring 913 of a transistor 917 are separated so that different gate signals can be given thereto. In contrast, a source or drain electrode 914 serving as a data line is used in common for the transistors 916 and 917. Any of the transistors described in the above embodiments can be used as appropriate as each of the transistors 916 and 917. In this way, a highly reliable liquid crystal display panel can be provided.

The shapes of a first pixel electrode electrically connected to the transistor 916 and a second pixel electrode electrically connected to the transistor 917 are described. The first pixel electrode and the second pixel electrode are separated by a slit. The first pixel electrode has a V-shape and the second pixel electrode is provided so as to surround the first pixel electrode.

A gate electrode of the transistor 916 is connected to the gate wiring 912, and a gate electrode of the transistor 917 is connected to the gate wiring 913. When different gate signals are supplied to the gate wiring 912 and the gate wiring 913, operation timings of the transistor 916 and the transistor 917 can be varied. As a result, alignment of liquid crystals can be controlled.

Further, a storage capacitor may be formed using a capacitor wiring 910, a gate insulating film serving as a dielectric, and a capacitor electrode electrically connected to the first pixel electrode or the second pixel electrode.

The multi-domain pixel includes a first liquid crystal element 918 and a second liquid crystal element 919. The first liquid crystal element 918 includes the first pixel electrode, a counter electrode, and a liquid crystal layer therebetween. The second liquid crystal element 919 includes the second pixel electrode, a counter electrode, and a liquid crystal layer therebetween.

Note that a pixel circuit of the present invention is not limited to that shown in FIG. 42B. For example, a switch, a resistor, a capacitor, a transistor, a sensor, a logic circuit, or the like may be added to the pixel illustrated in FIG. 42B.

<Organic EL Panel>

FIG. 42C illustrates another example of a circuit configuration of the pixel. Here, a pixel structure of a display panel using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 42C illustrates an example of a pixel circuit that can be used. Here, an example in which an n-channel transistor is used in the pixel is shown. Further, digital time grayscale driving can be employed for the pixel circuit.

The configuration of the pixel circuit that can be used and operation of a pixel employing digital time grayscale driving are described.

A pixel 920 includes a switching transistor 921, a driving transistor 922, a light-emitting element 924, and a capacitor 923. A gate electrode of the switching transistor 921 is connected to a scan line 926. A first electrode (one of a source electrode and a drain electrode) of the switching transistor 921 is connected to a signal line 925. A second electrode (the other of the source electrode and the drain electrode) of the switching transistor 921 is connected to a gate electrode of the driving transistor 922. The gate electrode of the driving transistor 922 is connected to a power supply line 927 through the capacitor 923, a first electrode of the driving transistor 922 is connected to the power supply line 927, and a second electrode of the driving transistor 922 is connected to a first electrode (pixel electrode) of the light-emitting element 924. A second electrode of the light-emitting element 924 corresponds to a common electrode 928. The common electrode 928 is electrically connected to a common potential line formed over the same substrate as the common electrode 928.

As the switching transistor 921 and the driving transistor 922, any of the transistors described in the above embodiments can be used as appropriate. In this way, a highly reliable organic EL display panel can be provided.

The potential of the second electrode (the common electrode 928) of the light-emitting element 924 is set to be a low power supply potential. Note that the low power supply potential is lower than a high power supply potential supplied to the power supply line 927. For example, the low power supply potential can be GND, 0 V, or the like. The high power supply potential and the low power supply potential are set to be higher than or equal to the forward threshold voltage of the light-emitting element 924, and the difference between the potentials is applied to the light-emitting element 924, whereby current is supplied to the light-emitting element 924, leading to light emission. The forward voltage of the light-emitting element 924 refers to a voltage at which a desired luminance is obtained, and at least includes a forward threshold voltage.

Note that gate capacitance of the driving transistor 922 may be used as a substitute for the capacitor 923, so that the capacitor 923 can be omitted. The gate capacitance of the driving transistor 922 may be formed between the semiconductor film and the gate electrode.

Next, a signal input to the driving transistor 922 is described. For a voltage-input voltage driving method, a video signal for turning on or off the driving transistor 922 without fail is input to the driving transistor 922. In order for the driving transistor 922 to operate in a subthreshold region, voltage higher than the voltage of the power supply line 927 is applied to the gate electrode of the driving transistor 922. Voltage higher than or equal to voltage that is the sum of power supply line voltage and the threshold voltage $V_{th}$ of the driving transistor 922 is applied to the signal line 925.

In the case where analog grayscale driving is performed, voltage higher than or equal to voltage that is the sum of the forward voltage of the light-emitting element 924 and the threshold voltage $V_{th}$ of the driving transistor 922 is applied to the gate electrode of the driving transistor 922. A video signal by which the driving transistor 922 is operated in a saturation region is input, so that current is supplied to the light-emitting element 924. In order for the driving transistor 922 to operate in a saturation region, the potential of the power supply line 927 is set higher than the gate potential of the driving transistor 922. When an analog video signal is used, current corresponding to the video signal can be supplied to the light-emitting element 924 and analog grayscale driving can be performed.

Note that the configuration of the pixel circuit is not limited to that shown in FIG. 42C. For example, a switch, a resistor, a capacitor, a sensor, a transistor, a logic circuit, or the like may be added to the pixel circuit illustrated in FIG. 42C.

In the case where the transistor described in the above embodiments is used for the circuit shown in FIGS. 42A to 42C, the source electrode (the first electrode) is electrically connected to the low potential side and the drain electrode (the second electrode) is electrically connected to the high potential side. Further, the potential of the first gate electrode (and the third gate electrode) may be controlled by a control circuit or the like, and a potential lower than the potential applied to the source electrode may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a carbon nanotube. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or electrophoretic elements include electronic paper.

Figure 43:
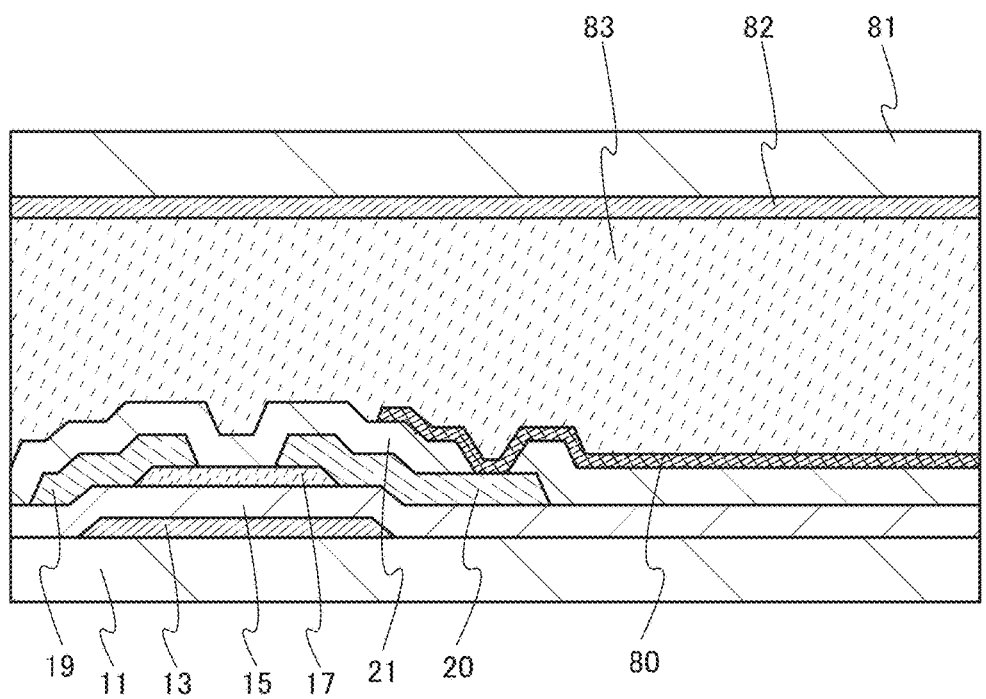
FIG. 43 illustrates one embodiment of a display device.
Figure 44:
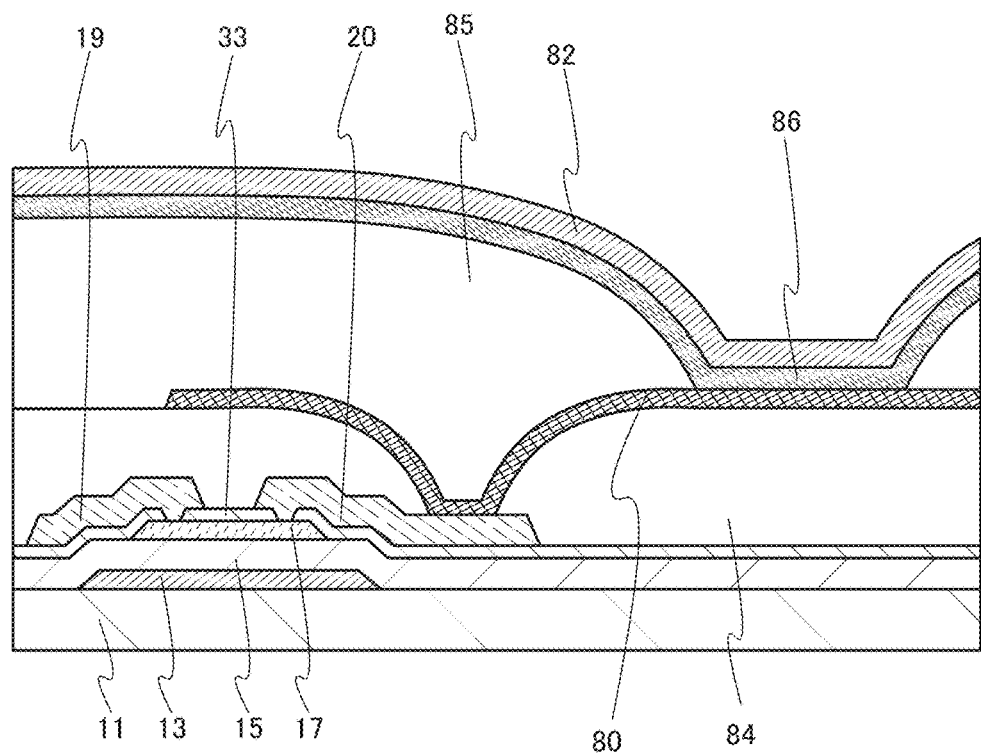
FIG. 44 illustrates one embodiment of a display device.

FIG. 43 illustrates an example in which the transistor illustrated in FIG. 1B is provided with a liquid crystal element. The liquid crystal element includes a pixel electrode 80, a liquid crystal layer 83, and a common electrode 82. The common electrode 82 is provided on a substrate 81. For another example, FIG. 44 illustrates an example in which the transistor illustrated in FIG. 5A is provided with a light-emitting element. An insulating film 84 is provided over the electrodes 19 and 20. The pixel electrode 80 is provided over the insulating film 84, and an insulating film 85 is provided over the pixel electrode 80. The light-emitting element includes the pixel electrode 80, a light-emitting layer 86, and the common electrode 82. A variety of display devices can be formed by combining a variety of display elements and transistors with a variety of structures as described above.

This embodiment can be combined with any of the other embodiments disclosed in this specification as appropriate.

(Embodiment 7)

In this embodiment, a display module and electronic devices that can be formed using a semiconductor device of one embodiment of the present invention are described.

Figure 45:
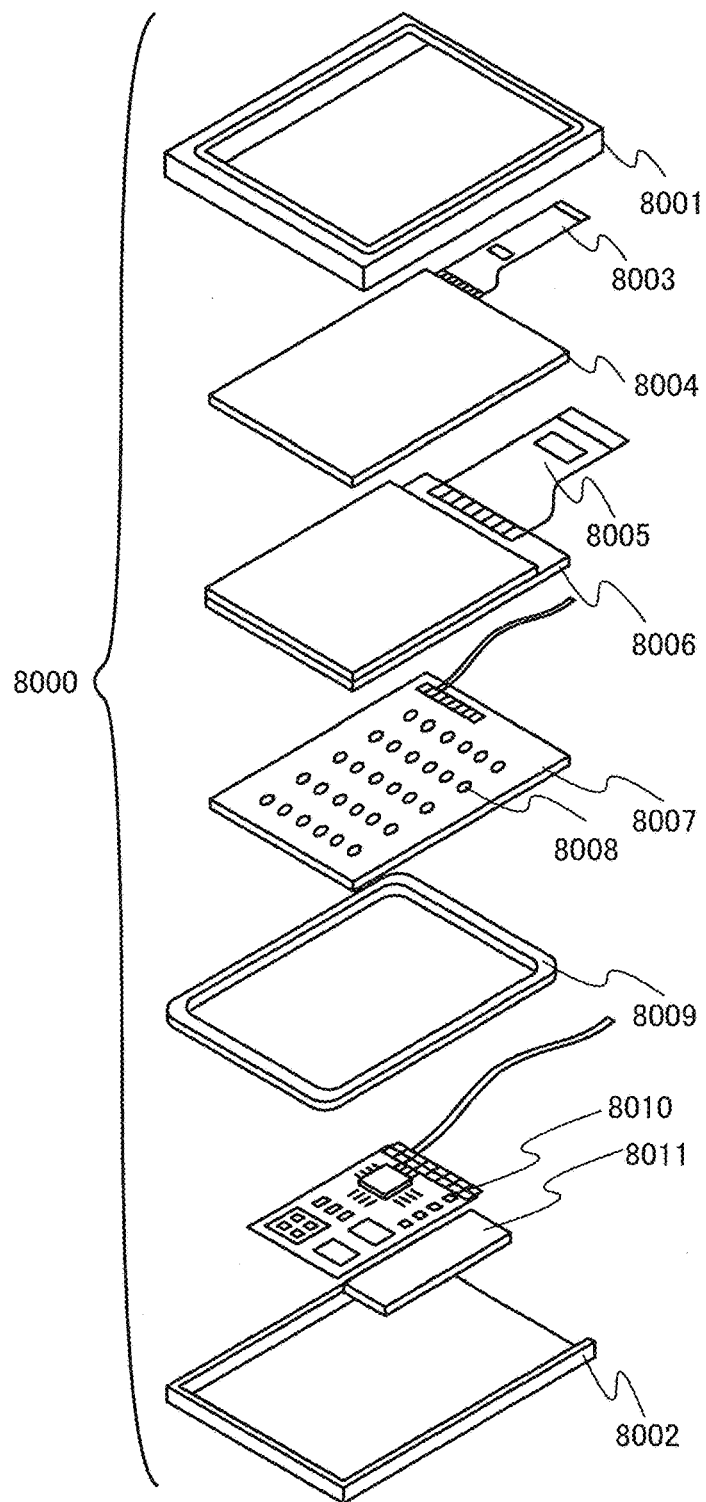
FIG. 45 illustrates a display module.

In a display module 8000 illustrated in FIG. 45, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 46A to 46D are external views of electronic devices each including the semiconductor device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 46A:
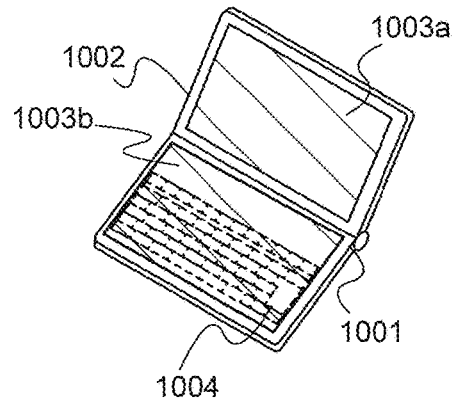
FIGS. 46A to 46D each illustrate an electronic device of one embodiment.

FIG. 46A illustrates a portable information terminal including a main body 1001, a housing 1002, display portions 1003*a* and 1003*b*, and the like. The display portion 1003*b* is a touch panel. By touching a keyboard button 1004 displayed on the display portion 1003*b*, a screen can be operated, and text can be input. It is needless to say that the display portion 1003*a* may be a touch panel. A liquid crystal panel or an organic light-emitting panel is manufactured by using any of the transistors described in the above embodiments as a switching element and used in the display portion 1003*a* or 1003*b*, whereby a highly reliable portable information terminal can be provided.

The portable information terminal illustrated in FIG. 46A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 46A may transmit and receive data wirelessly. Through wireless communication, desired book data or the like can be purchased and downloaded from an e-book server.

Figure 46B:
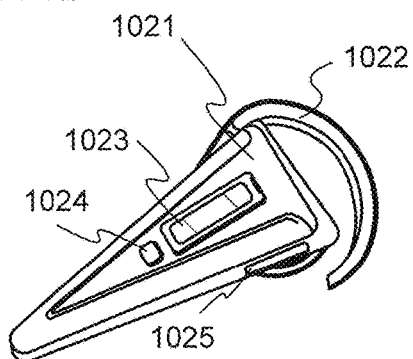

FIG. 46B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element, and used in the display portion 1023, whereby a highly reliable portable music player can be provided.

Furthermore, when the portable music player illustrated in FIG. 46B has an antenna, a microphone function, or a wireless communication function and is used with a mobile phone, a user can talk on the phone wirelessly in a hands-free way while driving a car or the like.

Figure 46C:
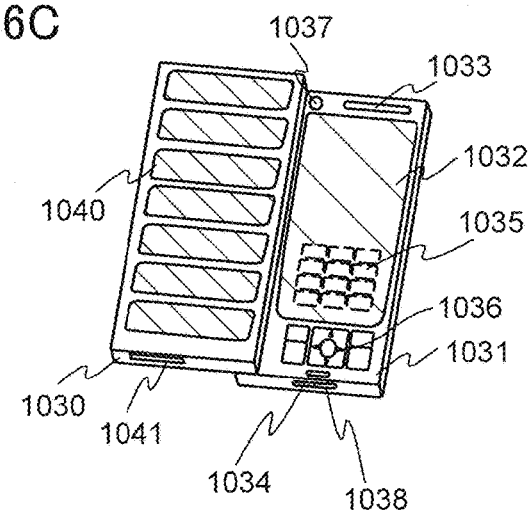

FIG. 46C illustrates a mobile phone that includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Further, the display panel 1032 includes a touch panel. A plurality of operation keys 1035 that are displayed as images are indicated by dotted lines in FIG. 46C. Note that a boosting circuit by which a voltage output from the solar cell 1040 is increased to be sufficiently high for each circuit is also included.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are opened as illustrated in FIG. 46C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 46D:
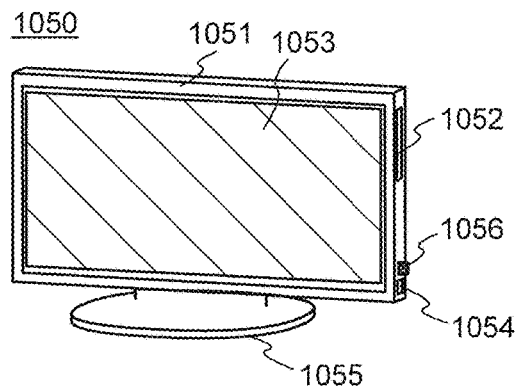

FIG. 46D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

EXAMPLE 1

In this example, evaluation results of an oxide insulating film that can be used for the transistor included in the semiconductor device of one embodiment of the present invention are described. Specifically, results of evaluating, by TDS analysis, the amounts of nitrogen monoxide, dinitrogen monoxide, nitrogen dioxide, ammonia, water, and nitrogen released by heating are described.

<Fabrication Methods of Samples>

In this example, Sample A1, which is an oxide insulating film that can be used for the transistor of one embodiment of the present invention, and Samples A2 and A3 for comparison were fabricated.

<Sample A1>

Sample A1 was fabricated by forming an oxide insulating film over a silicon wafer by a plasma CVD method under formation conditions that can be used for at least one of the gate insulating film 15 and the protective film 21 described in Embodiment 1 (see FIGS. 1A to 1C).

Here, as the oxide insulating film, a 400-nm-thick silicon oxynitride film was formed by a plasma CVD method under the conditions where the silicon wafer was held at a temperature of 220° C., silane at a flow rate of 50 sccm and dinitrogen monoxide at a flow rate of 2000 sccm were used as a source gas, the pressure in the treatment chamber was 20 Pa, and a high-frequency power of 100 W at 13.56 MHz ($1.6 \times 10^{-2}$ W/cm$^2$ as the power density) was supplied to parallel-plate electrodes. Note that the flow ratio of dinitrogen monoxide to silane was 40.

<Sample A2>

For Sample A2, instead of the oxide insulating film of Sample A1, an oxide insulating film was formed under the following conditions.

In Sample A2, as the oxide insulating film, a 400-nm-thick silicon oxynitride film was formed by a plasma CVD method under the conditions where the silicon wafer was held at a temperature of 220° C., silane at a flow rate of 30 seem and dinitrogen monoxide at a flow rate of 4000 sccm were used as a source gas, the pressure in the treatment chamber was 40 Pa, and a high-frequency power of 150 W at 13.56 MHz ($8.0 \times 10^{-2}$ W/cm$^2$ as the power density) was supplied to parallel-plate electrodes. Note that the flow ratio of dinitrogen monoxide to silane was 133.

<Sample A3>

For Sample A3, instead of the oxide insulating film of Sample A1, an oxide insulating film was formed under the following conditions.

In Sample A3, as the oxide insulating film, a 100-nm-thick silicon oxide film was formed by a sputtering method under the conditions where the silicon wafer was held at a temperature of 100) ° C., a silicon target was used, oxygen at a flow rate of 50 sccm was used as a sputtering gas, the pressure in the treatment chamber was 0.5 Pa, and a high-frequency power of 6 kW was supplied to parallel-plate electrodes.

<TDS Analysis>

Figure 47A:
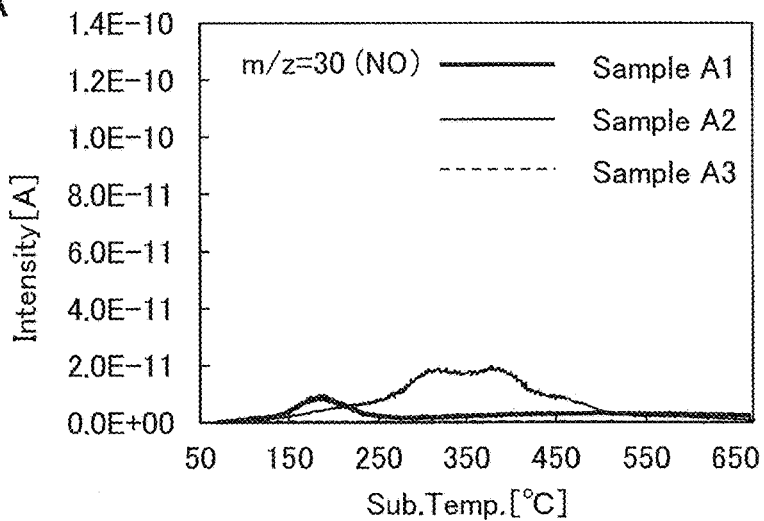
FIGS. 47A to 47C show TDS analysis results.
Figure 47B:
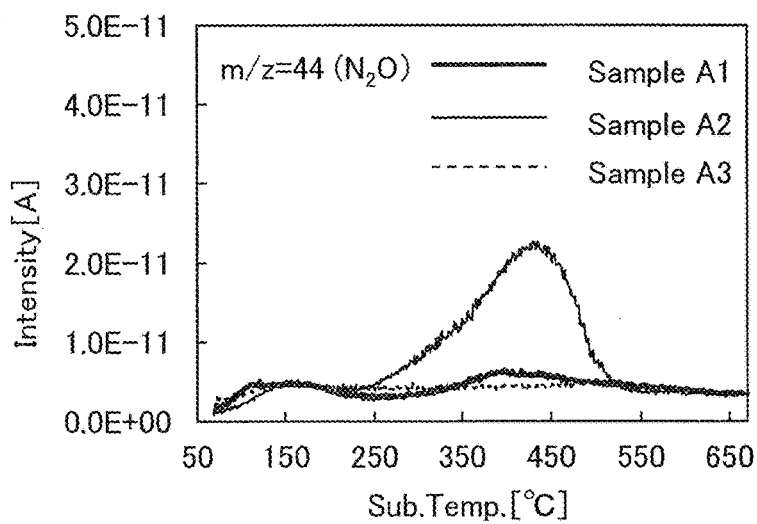
Figure 47C:
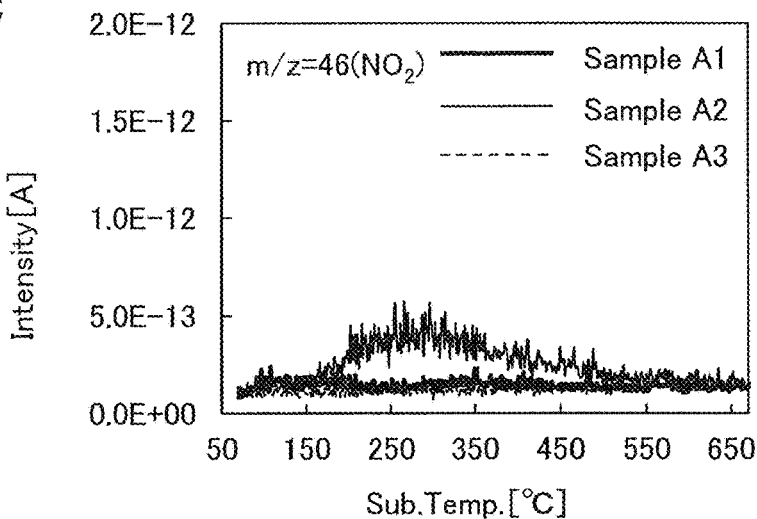
Figure 48A:
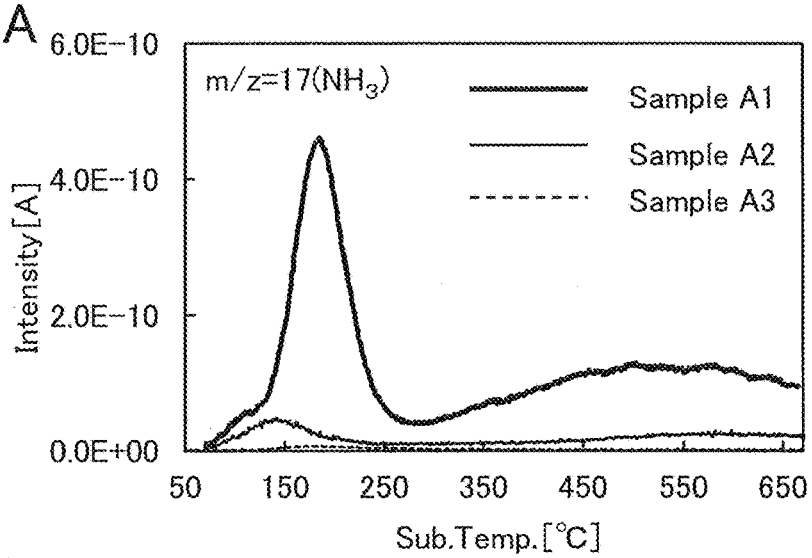
FIGS. 48A to 48C show TDS analysis results.
Figure 48B:
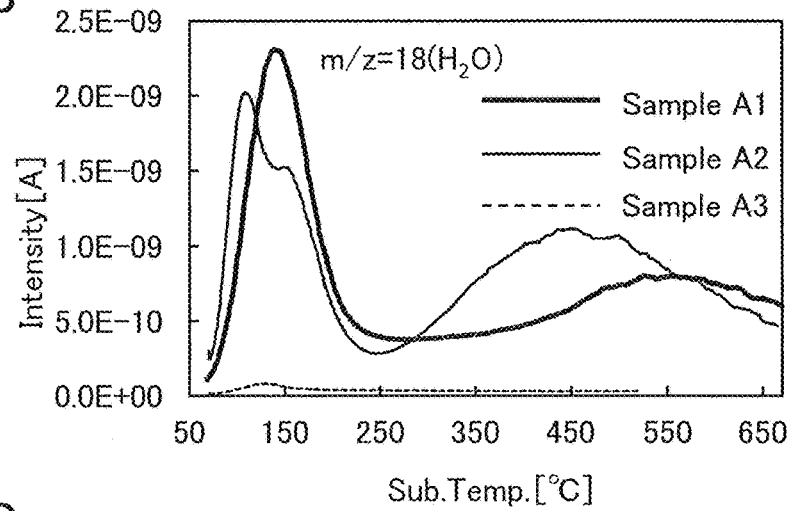
Figure 48C:
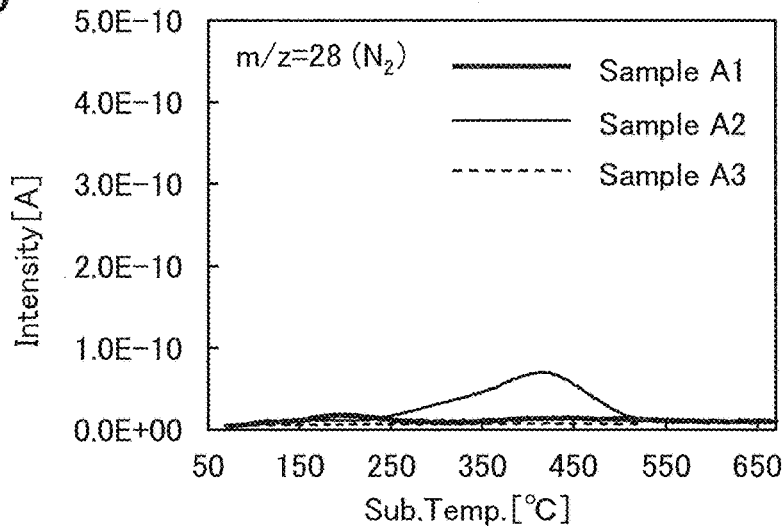

TDS analyses were performed on Samples A1 to A3. In each sample, a stage on which the sample is mounted was heated at higher than or equal to 55° C. and lower than or equal to 997° C. The amounts of gas having a mass-to-charge ratio m/z of 30 (nitrogen monoxide), gas having a mass-to-charge ratio m/z of 44 (dinitrogen monoxide), and gas having a mass-to-charge ratio m/z of 46 (nitrogen dioxide) released from Samples A1 to A3 are shown in FIGS. 47A, 47B, and 47C, respectively. In addition, the amounts of gas having a mass-to-charge ratio m/z of 17 (ammonia), gas having a mass-to-charge ratio m/z of 18 (water), and gas having a mass-to-charge ratio m/z of 28 (nitrogen molecule) released from Samples A1 to A3 are shown in FIGS. 48A, 48B, and 48C, respectively.

In FIGS. 47A to 47C and FIGS. 48A to 48C, the lateral axis indicates the temperature of the samples; here, the temperature range is from 50° C. to 650° C. inclusive. The upper limit temperature of an analysis apparatus used in this example is approximately 650° C. The longitudinal axis indicates intensity proportional to the amount of each of the released gases. The total number of the molecules released to the outside corresponds to the integral value of the peak. Thus, with the degree of the peak intensity, the total number of the molecules contained in the oxide insulating film can be evaluated.

In FIGS. 47A to 47C and FIGS. 48A to 48C, the bold solid line, the thin solid line, and the dashed line indicate the measurement results of Samples A1, A2, and A3, respectively.

FIGS. 47A to 47C show that Sample A1 has peaks showing a mass-to-charge ratio m/z of 30 and a mass-to-charge ratio m/z of 44. However, in Sample A1, the peak observed at a temperature range of 150° C. to 200° C. in FIG. 47A is probably due to release of gas other than nitrogen monoxide, and the peak in FIG. 47B is probably due to release of gas other than dinitrogen monoxide. This indicates that release of nitrogen monoxide, dinitrogen monoxide, and nitrogen dioxide are not observed in Sample A1. Sample A2 has peaks showing a mass-to-charge ratio m/z of 30, a mass-to-charge ratio m/z of 44, and a mass-to-charge ratio m/z of 46, which shows release of nitrogen monoxide, dinitrogen monoxide, and nitrogen dioxide in Sample A2. Sample A3 does not have peaks showing a mass-to-charge ratio m/z of 30, a mass-to-charge ratio m/z of 44, and a mass-to-charge ratio m/z of 46. This means that release of nitrogen monoxide, dinitrogen monoxide, and nitrogen dioxide is not observed in Sample A3.

FIG. 48A shows that Sample A1 has a peak showing a mass-to-charge ratio m/z of 17, Sample A2 has lower peak intensity than Sample A1, and Sample A3 has no peak. This indicates that the oxide insulating film included in Sample A1 contains much ammonia. FIG. 48B shows that Samples A1 and A2 have a peak showing a mass-to-charge ratio m/z of 18. This indicates that the oxide insulating films included in Samples A1 and A2 contain water. FIG. 48C shows that Sample A2 has a peak showing a mass-to-charge ratio m/i of 28. This indicates that the oxide insulating film included in Sample A2 contains nitrogen molecules.

Figure 49A:
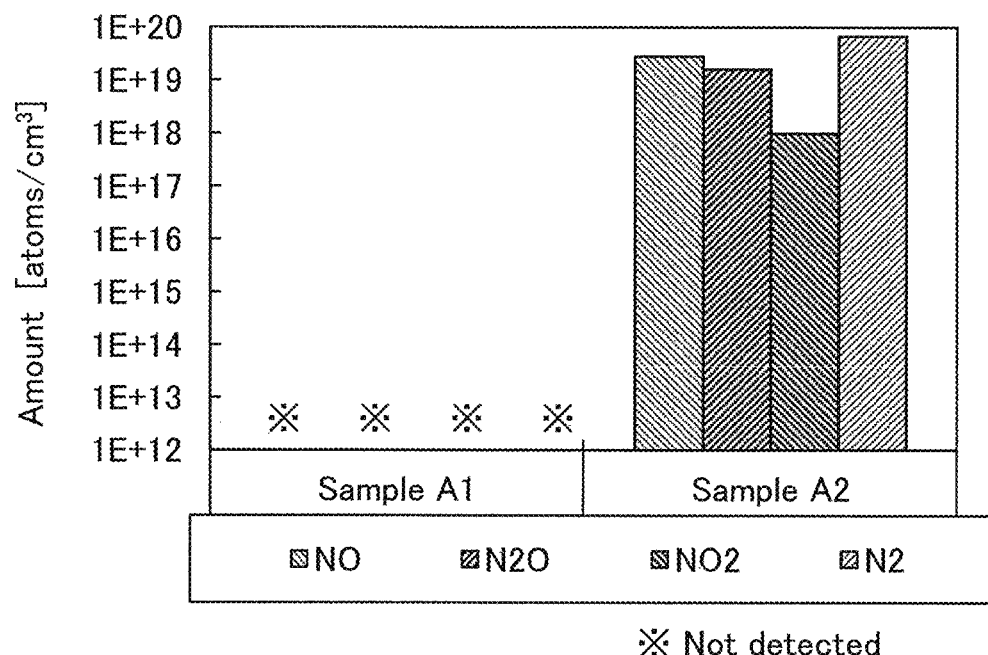
FIGS. 49A and 49B show TDS analysis results.
Figure 49B:
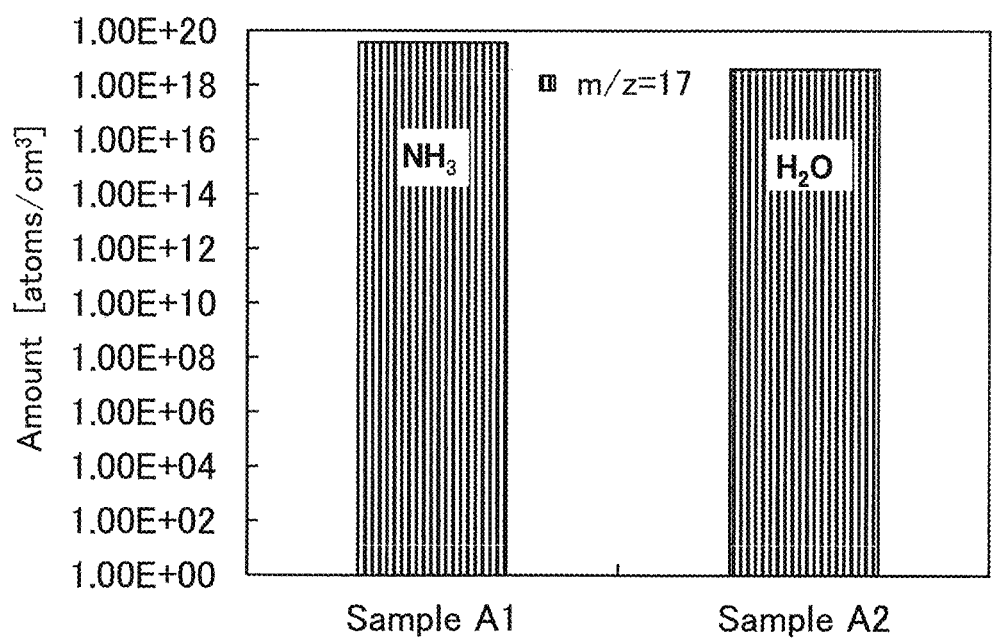

FIG. 49A shows the amounts of gas having a mass-to-charge ratio m/z of 30 (nitrogen monoxide), gas having a mass-to-charge ratio m/z of 44 (dinitrogen monoxide), gas having a mass-to-charge ratio m/z of 46 (nitrogen dioxide), and gas having a mass-to-charge ratio m/z of 28 (nitrogen), which were released from Samples A1 and A2, and FIG. 49B shows the amount of gas having a mass-to-charge ratio m/z of 17 released from Samples A1 and A2. The amounts of gas were calculated from integrated values of the peaks of the curves in FIGS. 47A to 47C and FIGS. 48A to 48C. Note that since the amount of gas having a mass-to-charge ratio m/z of 17 released from Sample A2 shows the amount of water adsorbed on a surface of the sample, release of ammonia is not observed.

As shown in FIG. 49A, the amounts of nitrogen monoxide, dinitrogen monoxide, nitrogen dioxide, and nitrogen released from Sample A1 are smaller than those from Sample A2 and are each lower than or equal to the detection limit; that is, the release of each gas is not detected. Note that here, the detection limits of nitrogen monoxide, dinitrogen monoxide, nitrogen dioxide, and nitrogen are $4\times10^{16}$ molecules/cm$^3$, $4\times10^{17}$ molecules/cm$^3$, $4\times10^{16}$ molecules/cm$^3$, and $9\times10^{17}$ molecules/cm$^3$, respectively. As shown in FIG. 49B, the amount of ammonia released from Sample A2 is larger than that from Sample A1.

Figure 50:
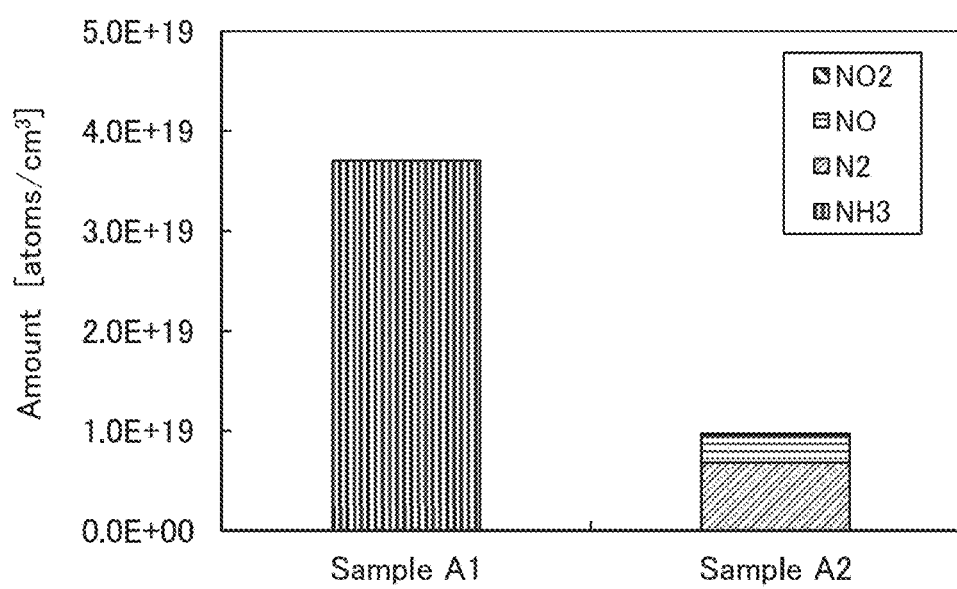
FIG. 50 shows TDS analysis results.

FIG. 50 shows the total amounts of nitrogen monoxide, nitrogen dioxide, nitrogen, and ammonia released from Samples A1 and A2.

Table 12 shows the amounts of ammonia, nitrogen, nitrogen monoxide, oxygen, and nitrogen dioxide released from Samples A1 and A2.

TABLE 12

| Released amount [atoms/cm$^3$] | Sample A1<br>SiH$_4$ = 50 sccm<br>N$_2$O = 2000 sccm<br>20 Pa, 100 W, 220° C. | Sample A2<br>SiH$_4$ = 30 sccm<br>N$_2$O = 4000 sccm<br>40 Pa, 150 W, 220° C. |
|---|---|---|
| m/z = 17 (NH$_3$ or H$_2$O) | 3.7E19 (NH$_3$) | 3.88E+18 (H$_2$O) |
| m/z = 28 (N$_2$) | Lower limit or lower | 6.80E+18 |
| m/z = 30 (NO) | Lower limit or lower | 2.80E+18 |
| m/z = 32 (O$_2$) | Lower limit or lower | 1.37E+17 |
| m/z = 44 (NO$_2$) | Lower limit or lower | 9.90E+16 |

FIG. 50 shows that the amount of ammonia released from Sample A1 is larger than the total released amount of nitrogen, nitrogen monoxide, and nitrogen dioxide, and the amount of ammonia released from Sample A2 is smaller than the total released amount of nitrogen, nitrogen monoxide, and nitrogen dioxide.

The above results show that, when the flow ratio of dinitrogen monoxide to silane in a source gas is small, an oxide insulating film from which small amounts of nitrogen monoxide, dinitrogen monoxide, nitrogen dioxide, and nitrogen are reduced can be formed. The results also show that an oxide insulating film where the amount of ammonia released is larger than the amount of nitrogen oxide released can be formed.

EXAMPLE 2

The amounts of hydrogen, carbon, nitrogen, and fluorine contained in the oxide insulating films of Samples A1 and A2 fabricated in Example 1 were measured by SIMS, and the results are described in this example.

In this example, silicon wafers were used as substrates of Samples A1 and A2.

<SIMS Analysis>

SIMS analysis was performed on Samples A1 and A2. The concentration of each of hydrogen, carbon, nitrogen, and fluorine in each sample was measured, from the surface of the oxide insulating film (SiON) toward the silicon wafer (Si). FIGS. 51A and 51B show the measurement results of Samples A1 and A2, respectively.

In FIGS. 51A and 51B, the lateral axis indicates a distance from the surface of the oxide insulating film in the film thickness direction, and the longitudinal axis indicates the concentration of each element. Furthermore, in FIGS. 51A and 51B, the dashed line, the thin solid line, the bold solid line, and the dot-dashed line indicate the concentrations of hydrogen, carbon, nitrogen, and fluorine, respectively. Note that Si and SiON indicate areas of the silicon wafer and the oxide insulating film, respectively.

In the oxide insulating film of Sample A1, the hydrogen concentration is higher than or equal to $2\times10^{21}$ atoms/cm$^3$ and lower than or equal to $5\times10^{21}$ atoms/cm$^3$; the nitrogen concentration is higher than or equal to $6\times10^{20}$ atoms/cm$^3$ and lower than or equal to $3\times10^{21}$ atoms/cm$^3$; the carbon concentration gradually decreases from the surface toward the silicon wafer, and is higher than or equal to $4\times10^{17}$ atoms/cm$^3$ and lower than or equal to 5×10$^{20}$ atoms/cm$^3$; and the fluorine concentration is higher than or equal to 6×10$^{18}$ atoms/cm$^3$ and lower than or equal to 9×10$^{18}$ atoms/cm$^3$.

In the oxide insulating film of Sample A2, the hydrogen concentration is higher than or equal to 1×10$^{21}$ atoms/cm$^3$ and lower than or equal to 3×10$^{21}$ atoms/cm$^3$; the nitrogen concentration is higher than or equal to 1×10$^{20}$ atoms/cm$^3$ and lower than or equal to 4×10$^{20}$ atoms/cm$^3$; the carbon concentration gradually decreases from the surface toward the silicon wafer, and is lower than or equal to the detection limit and lower than or equal to 6×10$^{19}$ atoms/cm$^3$; and the fluorine concentration is higher than or equal to 7×10$^{18}$ atoms/cm$^3$ and lower than or equal to 2×10$^{18}$ atoms/cm$^3$.

As shown in FIGS. 51A and 51B, the nitrogen concentration in Sample A1 is higher than that in Sample A2. This is probably because the oxide insulating film of Sample A1 contains much NH and NH$_3$ that do not become carrier traps. When the oxide insulating film contains NH, NH$_3$, and the like, nitrogen oxide reacts with NH, NH$_3$, and the like by heat treatment; thus, the content of nitrogen oxide in the oxide insulating film can be reduced.

In the case where the nitrogen concentration of the oxide insulating film is higher than or equal to 6×10$^{20}$ atoms/cm$^3$, the spin density is lower than 1×10$^{18}$ spins/cm$^3$, and the oxide insulating film has a reduced number of defects caused by NO$_x$.

EXAMPLE 3

In this example, evaluation results of an oxide insulating film that can be used for the transistor of one embodiment of the present invention are described. Specifically, results of evaluating, by TDS analysis, the amounts of ammonia, water, nitrogen, oxygen, and dinitrogen monoxide released by heating are described. Note that in this example, unlike in Example 1, TDS analysis was performed on the stack including the oxide insulating film 23 and the oxide insulating film 25 containing oxygen at a higher proportion than oxygen in the stoichiometric composition, which is illustrated in FIG. 4A in Embodiment 1.

<Fabrication Methods of Samples>

In this example, Sample A4 that is one embodiment of the present invention, and Sample A5 for comparison were fabricated.

<Sample A4>

A 35-nm-thick oxide semiconductor film was formed over a quartz substrate by a sputtering method. The oxide semiconductor film was formed under the following conditions: a sputtering target containing In, Ga, and Zn at an atomic ratio of 1:1:1 was used; oxygen at a flow proportion of 50% was supplied as a sputtering gas into a treatment chamber of a sputtering apparatus; the pressure in the treatment chamber was controlled to 0.6 Pa; and direct-current power of 2.5 kW was supplied. Note that the oxide semiconductor film was formed at a substrate temperature of 170° C.

Next, heat treatment was performed at 450° C. in a nitrogen atmosphere for one hour, and after that, another heat treatment was performed at 450° C. in a mixed gas of nitrogen and oxygen for one hour.

Subsequently, a first oxide insulating film was formed over the oxide semiconductor film under the conditions of the oxide insulating film 23 described in Embodiment 1, and then, a second oxide insulating film was formed over the first oxide insulating film under the conditions of the oxide insulating film 25 described in Embodiment 1.

The first oxide insulating film was formed to a thickness of 50 nm by a plasma CVD method under the following conditions: silane with a flow rate of 50 sccm and dinitrogen monoxide with a flow rate of 2000 sccm were used as a source gas; the pressure in the treatment chamber was 20 Pa; the substrate temperature was 220° C.; and a high-frequency power of 100 W was supplied to parallel-plate electrodes.

The second oxide insulating film was formed to a thickness of 400 nm by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Through the above process, Sample A4 of this example was fabricated.

<Sample A5>

Sample A5 was fabricated in a manner similar to that of Sample A4 except that a first oxide insulating film was formed under the following conditions.

The first oxide insulating film was formed to a thickness of 50 nm by a plasma CVD method under the following conditions: silane with a flow rate of 30 sccm and dinitrogen monoxide with a flow rate of 4000 sccm were used as a source gas; the pressure in the treatment chamber was 40 Pa; the substrate temperature was 220° C.; and a high-frequency power of 150 W was supplied to parallel-plate electrodes.

<TDS Analysis>

Figure 52A:
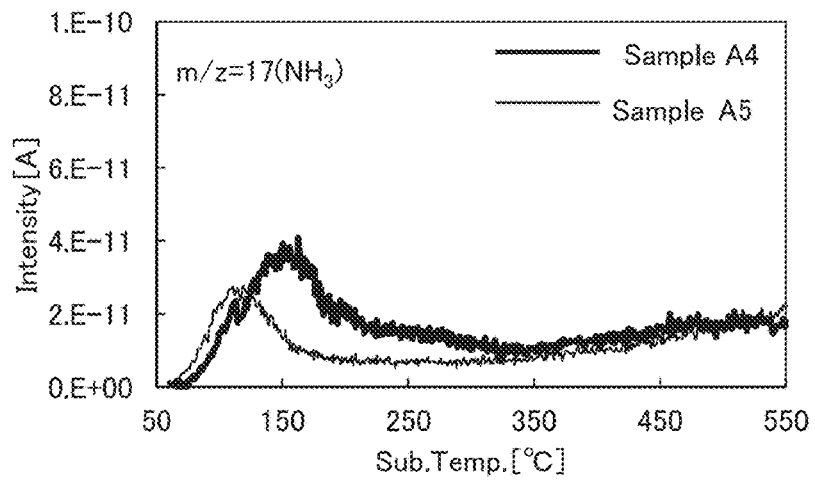
FIGS. 52A to 52C show TDS analysis results.
Figure 52B:
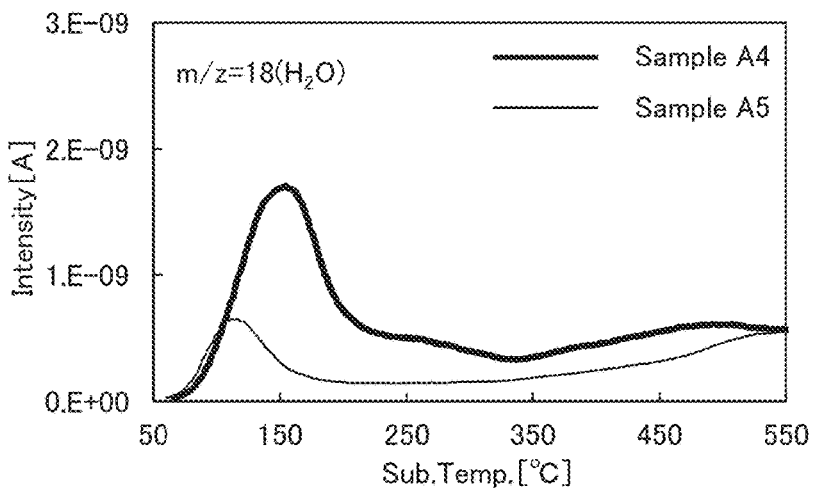
Figure 52C:
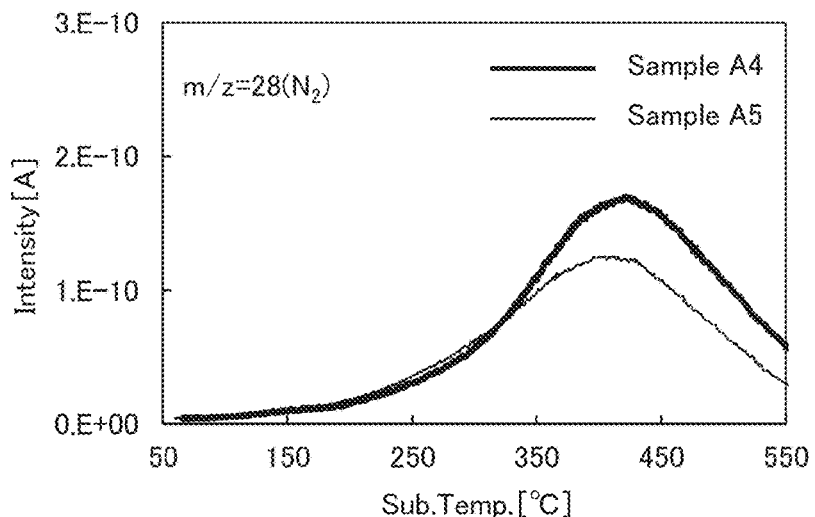
Figure 53A:
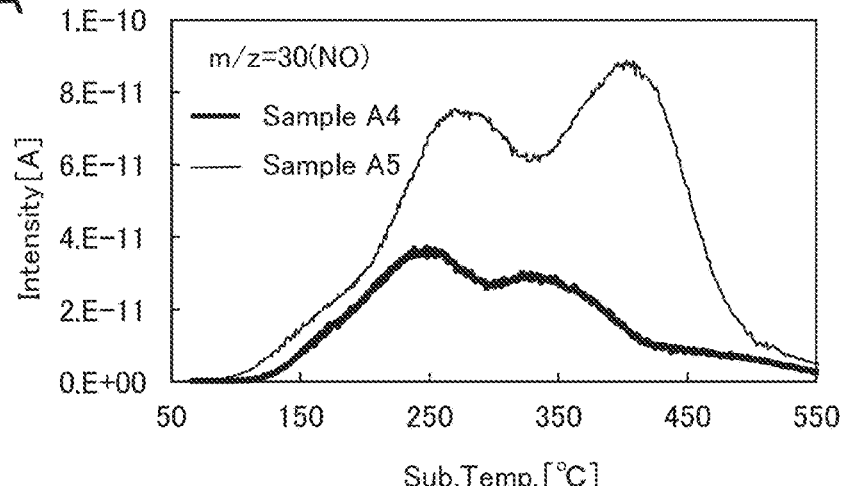
FIGS. 53A to 53C show TDS analysis results.
Figure 53B:
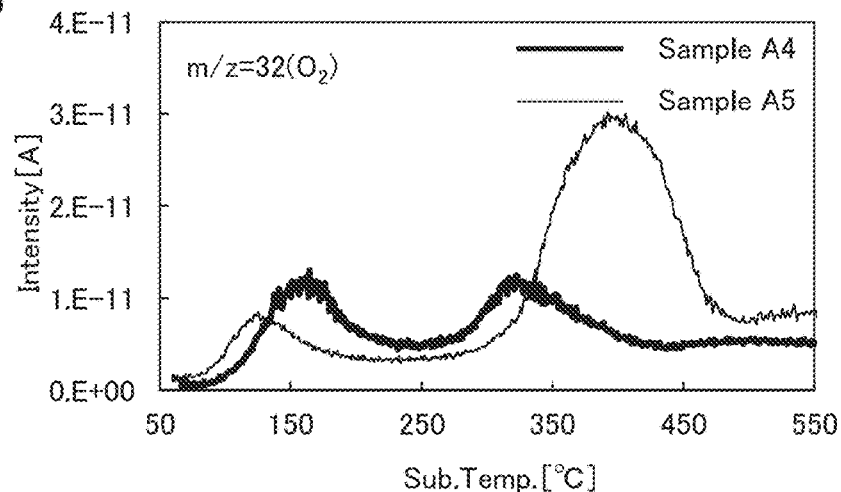
Figure 53C:
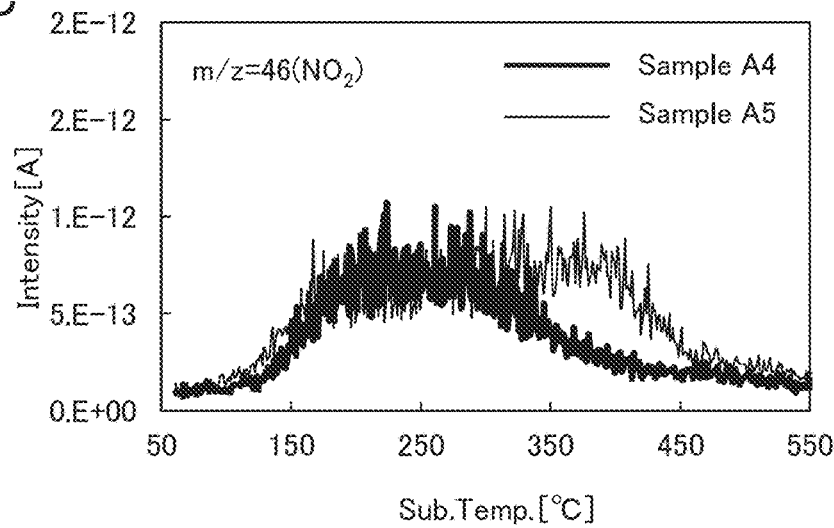

Thermal desorption spectroscopy (TDS) analyses were performed on Samples A4 and A5. The amounts of gas having a mass-to-charge ratio m/z of 17 (ammonia), gas having a mass-to-charge ratio m/z of 18 (water), and gas having a mass-to-charge ratio m/z of 28 (nitrogen molecule) released from Samples A4 and A5 are shown in FIGS. 52A, 52B, and 52C, respectively. In addition, the amounts of gas having a mass-to-charge ratio m/z of 30 (nitrogen monoxide), gas having a mass-to-charge ratio m/z of 32 (oxygen), and gas having a mass-to-charge ratio m/z of 46 (nitrogen dioxide) released from Samples A4 and A5 are shown in FIGS. 53A, 53B, and 53C, respectively.

In FIGS. 52A to 52C and FIGS. 53A to 53C, the lateral axis indicates heating temperature; here, the temperature is higher than or equal to 50° C. and lower than or equal to 550° C. The longitudinal axis indicates intensity proportional to the amounts of released gases with respective molecular weights.

In each of FIGS. 52A to 52C and FIGS. 53A to 53C, bold solid line and the thin solid line indicate the measurement result of Sample A4 and that of Sample A5, respectively.

FIGS. 52A to 52C show that Samples A4 and A5 have peaks showing a mass-to-charge ratio m/z of 17, a mass-to-charge ratio m/z of 18, and a mass-to-charge ratio m/z of 28. The intensities of the peaks showing a mass-to-charge ratio m/z of 17, a mass-to-charge ratio m/z of 18, and a mass-to-charge ratio m/z of 28 of Sample A4 are higher than those of Sample A5. This means that Sample A4 releases larger amounts of ammonia, water, and nitrogen molecules than Sample A5.

Since Samples A4 and A5 each include the second oxide insulating film containing oxygen at a higher proportion than oxygen in the stoichiometric composition, it is probable that nitrogen oxide contained in the first oxide insulating film reacts with oxygen by heat treatment, so that water and nitrogen are released.

FIGS. 53A to 53C show that Sample A5 has peaks showing a mass-to-charge ratio m/z of 30, a mass-to-charge ratio m/z of 32, and a mass-to-charge ratio m/z of 46. The intensities of the peaks showing a mass-to-charge ratio m/z of 30, a mass-to-charge ratio m/z of 32, and a mass-to-charge ratio m/z of 46 of Sample A4 are lower than those of Sample A5. This means that Sample A4 releases smaller amounts of nitrogen monoxide, oxygen, and nitrogen dioxide than Sample A5. In addition, Sample A4 releases small amounts of nitrogen monoxide, oxygen, and nitrogen dioxide at a temperature higher than or equal to 300° C.

FIGS. 52A to 52C and FIGS. 53A to 53C show that Sample A4 releases larger amounts of water and nitrogen and smaller amounts of nitrogen monoxide, oxygen, and nitrogen dioxide than Sample A5. Accordingly, the amount of nitrogen oxide which is contained in the first oxide insulating film, reacts with ammonia, and is released as nitrogen molecules and water is probably larger in Sample A4 than in Sample A5. In other words, the reactions represented by Reaction Formulae (A-1) and (A-2) described in Embodiment 1 probably occur.

EXAMPLE 4

The amounts of hydrogen, carbon, nitrogen, and fluorine contained in oxide insulating films were measured by SIMS, and the results are described in this example.

<Fabrication Methods of Samples>

In this example, Sample A6 that is one embodiment of the present invention, and Sample A7 for comparison were fabricated.

<Sample A6>

First, over a glass substrate, a silicon nitride film with a thickness of 400 nm was formed and then, a silicon oxynitride film with a thickness of 50 nm was formed. Then, an oxide semiconductor film ("IGZO" in FIGS. 54A and 54B and FIGS. 55A and 55B) with a thickness of 35 nm was formed over the silicon oxynitride film by a sputtering method. The oxide semiconductor film was formed under the deposition conditions of the oxide semiconductor film in Sample A4 described in Example 3.

Next, heat treatment was performed at 450° C. in a nitrogen atmosphere for one hour, and after that, another heat treatment was performed at 450° C. in a mixed gas of nitrogen and oxygen for one hour.

After that, a first oxide insulating film ("1st SiON" in FIGS. 54A and 54B and FIGS. 55A and 55B) with a thickness of 50 nm was formed over the oxide semiconductor film under the conditions of the oxide insulating film 23 described in Embodiment 1. Then, a second oxide insulating film ("2nd SiON" in FIGS. 54A and 54B and FIGS. 55A and 55B) with a thickness of 400 nm was formed over the first oxide insulating film under the conditions of the oxide insulating film 25 described in Embodiment 1.

The first oxide insulating film was formed under the deposition conditions of the first oxide insulating film in Sample A4 described in Example 3.

The second oxide insulating film was formed under the deposition conditions of the second oxide insulating film in Sample A4 described in Example 3.

Next, heat treatment was performed at 350° C. in an atmosphere of nitrogen and oxygen for one hour and after that, a silicon nitride film with a thickness of 100 nm was formed.

Through the above process, Sample A6 of this example was fabricated.

<Sample A7>

Sample A7 was fabricated in a manner similar to that of Sample A6 except that the first oxide insulating film was formed under the deposition conditions of the first oxide insulating film in Sample A5 described in Example 3.

<SIMS Analysis>

SIMS analysis was performed on Samples A6 and A7. Note that in each sample, the concentrations of hydrogen, carbon, nitrogen, and fluorine were measured from a surface of the second oxide insulating film (2nd SiON) to the oxide semiconductor film (IGZO). FIGS. 54A and 54B show measurement results of the hydrogen concentration and the secondary ion intensity of silicon in Sample A6 and Sample A7, respectively. FIGS. 55A and 55B show measurement results of concentrations of carbon, nitrogen, and fluorine in Sample A6 and Sample A7, respectively.

In each of FIGS. 54A and 54B and FIGS. 55A and 55B, the lateral axis indicates a distance in the thickness direction and the left longitudinal axis indicates the concentration of each element. In each of FIGS. 54A and 54B, the right longitudinal axis indicates the secondary ion intensity of silicon. In addition, in each of FIGS. 54A and 54B, a dashed line indicates the concentration of hydrogen and a dashed double-dotted line indicates the secondary ion intensity of silicon. In each of FIGS. 55A and 55B, a thin solid line, a thick solid line, and a dashed-dotted line indicate the concentration of carbon, the concentration of nitrogen, and the concentration of fluorine, respectively.

FIG. 54A shows that the hydrogen concentration in Sample A6 is almost the same in the first oxide insulating film (1st SiON) and the second oxide insulating film (2nd SiON), and is greater than or equal to $1\times10^{21}$ atoms/cm$^3$ and less than or equal to $2\times10^{21}$ atoms/cm$^3$, specifically.

FIG. 55A shows that the nitrogen concentration in the first oxide insulating film (1st SiON) is higher than that in the second oxide insulating film (2nd SiON). Specifically, the nitrogen concentration in the first oxide insulating film (1st SiON) is greater than or equal to $3\times10^{21}$ atoms/cm$^3$ and less than or equal to $6\times10^{21}$ atoms/cm$^3$, and the nitrogen concentration in the second oxide insulating film (2nd SiON) is greater than or equal to $9\times10^{20}$ atoms/cm$^3$ and less than or equal to $1\times10^{21}$ atoms/cm$^3$.

The carbon concentration is almost the same in the first oxide insulating film (1st SiON) and the second oxide insulating film (2nd SiON); however, the carbon concentration slightly increases at the interface between the first oxide insulating film (1st SiON) and the oxide semiconductor film (IGZO). Specifically, the carbon concentration in the first oxide insulating film (1st SiON) and the second oxide insulating film (2nd SiON) is greater than or equal to $1\times10^{17}$ atoms/cm$^3$ and less than or equal to $7\times10^{17}$ atoms/cm$^3$.

Furthermore, the fluorine concentration is almost the same in the first oxide insulating film (1st SiON) and the second oxide insulating film (2nd SiON); however, the fluorine concentration slightly increases at the interface between the second oxide insulating film (2nd SiON) and the first oxide insulating film (1st SiON) and at the interface between the first oxide insulating film (1st SiON) and the oxide semiconductor film (IGZO), and has a peak. Specifically, the fluorine concentration in the first oxide insulating film (1st SiON) and the second oxide insulating film (2nd SiON) is greater than or equal to $1\times10^{19}$ atoms/cm$^3$ and less than or equal to $1\times10^{20}$ atoms/cm$^3$.

FIG. 54B shows that, as in the case of Sample A6, the hydrogen concentration in Sample A7 is almost the same in the first oxide insulating film (1st SiON) and the second oxide insulating film (2nd SiON), and is greater than or equal to $8 \times 10^{20}$ atoms/cm$^3$ and less than or equal to $2 \times 10^{21}$ atoms/cm$^3$, specifically.

FIG. 55B shows that, unlike in Sample A6, the nitrogen concentration is almost the same in the first oxide insulating film (1st SiON) and the second oxide insulating film (2nd SiON), and is greater than or equal to $8 \times 10^{19}$ atoms/cm$^3$ and less than or equal to $2 \times 10^{20}$ atoms/cm$^3$, specifically.

As in the case of Sample A6, the carbon concentration is almost the same in the first oxide insulating film (1st SiON) and the second oxide insulating film (2nd SiON); however, the carbon concentration slightly increases at the interface between the first oxide insulating film (1st SiON) and the oxide semiconductor film (IGZO). Specifically, the carbon concentration in the first oxide insulating film (1st SiON) and the second oxide insulating film (2nd SiON) is greater than or equal to $6 \times 10^{16}$ atoms/cm$^3$ and less than or equal to $7 \times 10^{17}$ atoms/cm$^3$.

Furthermore, as in the case of Sample A6, the fluorine concentration is almost the same in the first oxide insulating film (1st SiON) and the second oxide insulating film (2nd SiON); however, the fluorine concentration slightly increases at the interface between the second oxide insulating film (2nd SiON) and the first oxide insulating film (1st SiON) and at the interface between the first oxide insulating film (1st SiON) and the oxide semiconductor film (IGZO), and has a peak. Specifically, the fluorine concentration in the first oxide insulating film (1st SiON) and the second oxide insulating film (2nd SiON) is greater than or equal to $1 \times 10^{19}$ atoms/cm$^3$ and less than or equal to $8 \times 10^{19}$ atoms/cm$^3$.

Note that in Samples A6 and A7, peaks are observed at the interface between the second oxide insulating film (2nd SiON) and the first oxide insulating film (1st SiON) and the interface between the first oxide insulating film (1st SiON) and the oxide semiconductor film (IGZO). This is because of the following reason. After the oxide semiconductor film (IGZO) was formed in a first treatment chamber, the sample was transferred to a second treatment chamber. Next, after the flow rate of a source gas introduced into the second treatment chamber and the pressure in the second treatment chamber were adjusted, a plasma CVD apparatus was powered on to form the first oxide insulating film (1st SiON). After the plasma CVD apparatus was powered off once, the flow rate of a source gas introduced into the second treatment chamber and the pressure in the treatment chamber were changed. Then, the plasma CVD apparatus was powered on again to form the second oxide insulating film (2nd SiON). This means that a surface of the sample was exposed to an atmosphere in the treatment chamber until formation of each of the first oxide insulating film (1st SiON) and the second oxide insulating film (2nd SiON) started.

On inner walls of the treatment chambers, fluorine or NF$_3$ that was used in cleaning of the treatment chambers was attached. For this reason, fluorine or NF$_3$ was detached from the inner walls of the treatment chambers and attached to a surface of each sample before formation of each of the first oxide insulating film (1st SiON) and the second oxide insulating film (2nd SiON) started. As a result, the fluorine concentration is high at the interface between the second oxide insulating film (2nd SiON) and the first oxide insulating film (1st SiON) and the interface between the first oxide insulating film (1st SiON) and the oxide semiconductor film (IGZO) and has a peak.

From the above, a state of stacking of oxide insulating films can be examined by measuring an impurity concentration in the oxide insulating films over the oxide semiconductor film by SIMS.

As shown in FIGS. 55A and 55B, the nitrogen concentration in Sample A6 is higher than that in Sample A7. This is probably because the oxide insulating film of Sample A6 contains much NH and NH$_3$ that do not become carrier traps. When the oxide insulating film contains NH, NH$_3$, and the like, nitrogen oxide reacts with NH, NH$_3$, and the like by heat treatment; thus, the content of nitrogen oxide in the oxide insulating film can be reduced.

EXAMPLE 5

In this example, the number of defects in the oxide insulating film is described using the measurement results of ESR.

<Fabrication Methods of Samples 1>

Fabrication methods of Samples B1 to B3 of this example are described below.

<Sample B1>

First, a first oxide insulating film and a second oxide insulating film were formed under conditions similar to those of Sample A4 described in Example 3.

Next, by heat treatment, water, nitrogen, hydrogen, and the like were released from the first oxide insulating film and the second oxide insulating film and part of oxygen contained in the second oxide insulating film was supplied to the oxide semiconductor film. Here, the heat treatment was performed at 350° C. in a mixed atmosphere of nitrogen and oxygen for one hour.

Through the above process, Sample B1 of this example was fabricated.

<Sample B2>

Sample B2, which was used for comparison, was fabricated under the same conditions as those of Sample B1 except for the formation pressure of the first oxide insulating film. Specifically, a sample including a first oxide insulating film formed under the following conditions was fabricated as Sample B2.

In Sample B2, the first oxide insulating film was formed by a plasma CVD method under the following conditions: silane with a flow rate of 50 sccm and dinitrogen monoxide with a flow rate of 2000 sccm were used as a source gas; the pressure in the treatment chamber was 100 Pa; the substrate temperature was 220° C.; and a high-frequency power of 100 W was supplied to parallel-plate electrodes.

<Sample B3>

Sample B3, which was used for comparison, was fabricated under the same conditions as those of Sample B1 except for the formation pressure of the first oxide insulating film. Specifically, a sample including a first oxide insulating film formed under the following conditions was fabricated as Sample B3.

In Sample B3, the first oxide insulating film was formed by a plasma CVD method under the following conditions: silane at a flow rate of 50 sccm and dinitrogen monoxide at a flow rate of 2000 sccm were used as a source gas; the pressure in the treatment chamber was 200 Pa; the substrate temperature was 220° C.; and a high-frequency power of 100 W was supplied to parallel-plate electrodes.

<ESR Measurement>

Next, Samples B1 to B3 were measured by ESR measurement. Here, the ESR measurement was performed under the following conditions. The measurement temperature was −170° C. the high-frequency power (power of microwaves)

of 8.92 GHz was 1 mW, and the direction of a magnetic field was parallel to a surface of each sample. The detection limit of the spin density of a signal attributed to $NO_x$ is $4.7 \times 10^{18}$ spins/cm$^3$. This means that when the number of spins is small, the number of defects is small in the film.

Figure 56A:
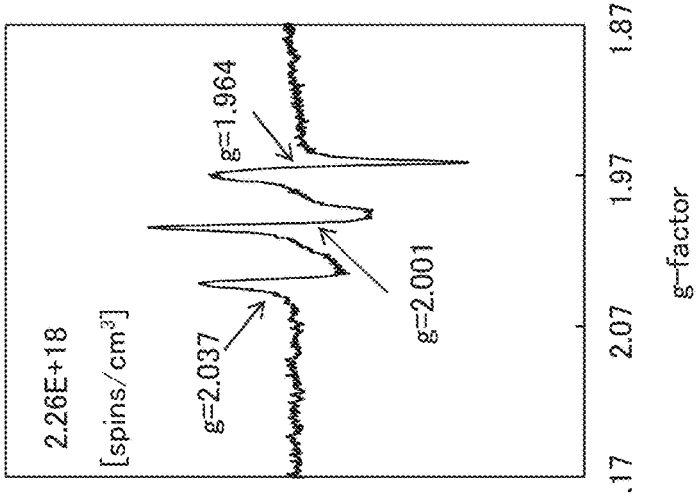
FIGS. 56A to 56C show ESR measurement results.
Figure 56B:
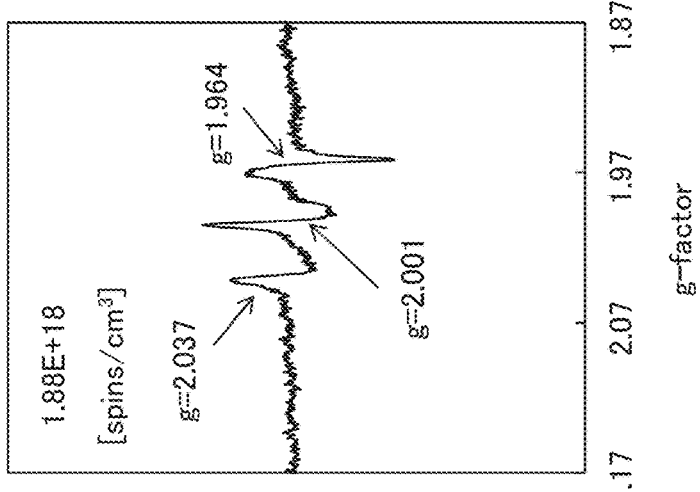
Figure 56C:
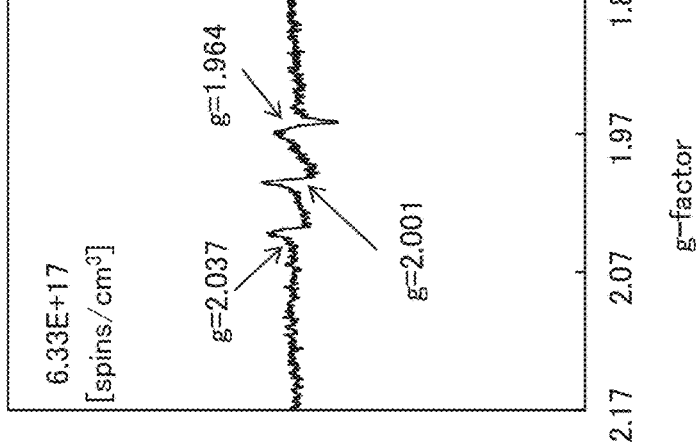

The spin densities of the signals attributed to $NO_x$ of Samples B1 to B3 are shown in FIGS. 56A to 56C, respectively. Note that shown here is the spin densities obtained by converting the number of measured spins into that per unit volume.

As shown in FIGS. 56A to 56C, in Samples B1 to B3, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. These three signals are due to $NO_x$ and represent splits of a hyperfine structure arising from the nuclear spin of an N atom. The signals attributed to $NO_x$ have anisotropic spin species and thus the waveform is asymmetrical.

The spin density of the signals attributed to $NO_x$ in Samples B2 and B3 is higher than that in Sample B1, and thus the oxide insulating films of Samples B2 and B3 have a large number of defects. In FIGS. 56A to 56C, the spin density of the signals attributed to $NO_x$ in Sample B1 is the smallest. Thus, it is shown that when the first oxide insulating film to be in contact with the oxide semiconductor film is formed in high vacuum, the oxide insulating film having a reduced number of defects is formed.

<Fabrication Methods of Samples 2>

Next, Samples B4 and B5 were fabricated: the formation pressure of the first oxide insulating film was fixed at the pressure of Sample B1, which obtained excellent results in the ESR measurement, and the flow ratio of the deposition gas was changed. The number of defects of Samples B4 and B5 were measured. The fabrication methods of Samples B4 and B5 are shown below.

<Sample B4>

Sample B4, which was used for comparison, was fabricated under the same conditions as those of Sample B1 except for the flow ratio of the deposition gas for the first oxide insulating film. Specifically, a sample including a first oxide insulating film formed under the following conditions was fabricated as Sample B4.

In Sample B4, the first oxide insulating film was formed by a plasma CVD method under the following conditions: silane at a flow rate of 20 sccm and dinitrogen monoxide at a flow rate of 2000 sccm were used as a source gas; the pressure in the treatment chamber was 100 Pa; the substrate temperature was 220° C.; and a high-frequency power of 100 W was supplied to parallel-plate electrodes. In other words, when the flow ratio of silane was 1, the flow ratio of dinitrogen monoxide was 100.

<Sample B5>

Sample B5, which was used for comparison, was fabricated under the same conditions as those of Sample B1 except for the flow ratio of the deposition gas for the first oxide insulating film. Specifically, a sample including a first oxide insulating film formed under the following conditions was fabricated as Sample B5.

In Sample B5, the first oxide insulating film was formed by a plasma CVD method under the following conditions: silane at a flow rate of 100 sccm and dinitrogen monoxide at a flow rate of 2000 sccm were used as a source gas; the pressure in the treatment chamber was 200 Pa: the substrate temperature was 220° C.; and a high-frequency power of 100 W was supplied to parallel-plate electrodes. In other words, when the flow rate of silane was 1, the flow rate of dinitrogen monoxide was 20.

<ESR Measurement>

Samples B1, B4, and B5 were measured by ESR measurement. FIGS. 57A, 57B, and 57C show the ESR measurement results of Samples B4, B1, and B5, respectively. The conditions of the ESR measurement were similar to those for FIGS. 56A to 56C.

As shown in FIGS. 57A and 57B, the spin densities of signals attributed to $NO_x$ are higher in Sample B4, which was used for comparison, than in Sample B1, and thus oxide insulating film of Samples B4 has a large number of defects. As shown in FIG. 57C, in Sample B5, which was used for comparison, the spin densities of signals attributed to $NO_x$ are lower than or equal to the detection limit, and a signal attributed to $V_OH$ that appears at a g (g-factor) of 1.93 is observed.

EXAMPLE 6

In this example, examination results of the $V_g$-$I_d$ characteristics and the reliability of fabricated transistors are described.

<Fabrication Methods of Samples 1>

As Samples C1 to C3 of this example, transistors having the same structure as that of the transistor 10a in FIG. 4A described in Embodiment 1 were fabricated.

<Sample C1>

First, a glass substrate was used as the substrate 11, and the gate electrode 13 was formed over the substrate 11.

The gate electrode 13 was formed in the following manner: a 100-nm-thick tungsten film was formed by a sputtering method, a mask was formed over the tungsten film by a photolithography process, and the tungsten film was partly etched using the mask.

Next, the gate insulating film 15 was formed over the gate electrode 13.

As the gate insulating film 15, a stack including a 400-nm-thick silicon nitride film and a 50-nm-thick silicon oxynitride film was used.

Note that the silicon nitride film was formed to have a three-layer structure of a first silicon nitride film, a second silicon nitride film, and a third silicon nitride film.

The first silicon nitride film was formed to a thickness of 50 nm under the following conditions: silane at a flow rate of 200 sccm, nitrogen at a flow rate of 2000 sccm, and an ammonia gas at a flow rate of 100 sccm were supplied to a treatment chamber of a plasma CVD apparatus as a source gas; the pressure in the treatment chamber was controlled to 100 Pa; and power of 2000 W was supplied with the use of a 27.12 MHz high-frequency power source.

The second silicon nitride film was formed to a thickness of 300 nm under the following conditions: silane at a flow rate of 200 sccm, nitrogen at a flow rate of 2000 sccm, and an ammonia gas at a flow rate of 2000 sccm were supplied to the treatment chamber of the plasma CVD apparatus as a source gas; the pressure in the treatment chamber was controlled to 100 Pa; and power of 2000 W was supplied with the use of a 27.12 MHz high-frequency power source.

The third silicon nitride film was formed to a thickness of 50 nm under the following conditions: silane at a flow rate of 200 sccm and nitrogen at a flow rate of 5000 sccm were supplied to the treatment chamber of the plasma CVD apparatus as a source gas; the pressure in the treatment chamber was controlled to 100 Pa; and power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane at a flow rate of 20 sccm and dinitrogen monoxide at a flow rate of 3000 sccm were supplied to the treatment chamber of the plasma CVD apparatus as a source gas; the pressure in the treatment chamber was controlled to 40 Pa; and power of 100 W was supplied with the use of a 27.12 MHz high-frequency power source. Note that the silicon oxynitride film was formed at a substrate temperature of 350° C.

Next, the oxide semiconductor film 17 was formed to overlap with the gate electrode 13 with the gate insulating film 15 positioned therebetween.

Here, a 35-nm-thick oxide semiconductor film was formed over the gate insulating film 15 by a sputtering method, a mask was formed over the oxide semiconductor film by a photolithography process, and part of the oxide semiconductor film was etched with the use of the mask, whereby the oxide semiconductor film 17 (S2-IGZO in FIG. 58) was formed.

The oxide semiconductor film 17 was formed under the following conditions: an In—Ga—Zn oxide sputtering target containing In, Ga, and Zn at an atomic ratio of 1:1:1 was used; oxygen at a flow proportion of 50% was supplied as a sputtering gas into a treatment chamber of a sputtering apparatus; the pressure in the treatment chamber was controlled to 0.6 Pa: and direct-current power of 2.5 kW was supplied. Note that the oxide semiconductor film was formed at a substrate temperature of 170° C.

Next, heat treatment was performed at 450° C. in a nitrogen atmosphere for one hour, and after that, another heat treatment was performed in a mixed gas of nitrogen and oxygen at 450° C. for one hour.

Next, the pair of electrodes 19 and 20 in contact with the oxide semiconductor film 17 were formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes 19 and 20 were formed.

Next, the substrate was transferred to a treatment chamber in a reduced pressure and heated at 220° C. Then, the oxide semiconductor film 17 was exposed to oxygen plasma that was generated in a dinitrogen monoxide atmosphere by supply of a high-frequency power of 150 W to an upper electrode in the treatment chamber with the use of a 27.12 MHz high-frequency power source.

After that, the protective film 21 was formed over the oxide semiconductor film 17 and the pair of electrodes 19 and 20. In this case, the protective film 21 was formed to have a three-layer structure of a first oxide insulating film (PI—SiON in FIG. 58), a second oxide insulating film (P2-SiON in FIG. 58), and a nitride insulating film.

The 50-nm-thick first oxide insulating film was formed by a plasma CVD method under the following conditions: silane at a flow rate of 50 sccm and dinitrogen monoxide at a flow rate of 2000 sccm were used as a source gas; the pressure in the treatment chamber was 20 Pa; the substrate temperature was 220° C.; and a high-frequency power of 100 W was supplied to parallel-plate electrodes.

The formation conditions of the first oxide insulating film of Sample C1 is the same as those of the first oxide insulating film of Sample A4 described in Example 3.

The 400-nm-thick second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film that contains oxygen at a higher proportion than oxygen in the stoichiometric composition so that part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Then, a 100-nm-thick nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas; the pressure in the treatment chamber was 100 Pa: the substrate temperature was 350° C.; and a high-frequency power of 1000 W was supplied to parallel-plate electrodes.

Next, a planarization film was formed (not illustrated) over the protective film 21. Here, the protective film 21 was coated with a composition, and exposure and development were performed, so that a planarization film having an opening through which the pair of electrodes are partly exposed was formed. Note that as the planarization film, a 1.5-μm-thick acrylic resin was formed. Then, heat treatment was performed. The heat treatment was performed in a nitrogen atmosphere at 250° C. for one hour.

Then, an opening was formed in part of the protective film 21 so that the opening reached one of the pair of electrodes 19 and 20. The opening portion was formed in the following manner; a mask was formed over the protective film 21, and the protective film 21 was partly etched using the mask.

Next, a pixel electrode was formed over the planarization film so that the pixel electrode was electrically connected to one of the pair of electrodes 19 and 20 through the opening formed in parts of the protective film 21 and the planarization film.

Here, as the pixel electrode, a conductive film of an indium oxide-tin oxide compound (ITO-$SiO_2$) containing silicon oxide was formed by a sputtering method. Note that the composition of a target used for forming the conductive film was $In_2O_3$:$SnO_2$:$SiO_2$=85:10:5 [wt %]. After that, heat treatment was performed at 250° C. in a nitrogen atmosphere for one hour.

Through the above process, Sample C1 of this example was fabricated.

<Sample C2>

Sample C2 was fabricated under the same conditions as those of Sample C except for the formation pressure of the first oxide insulating film. Specifically, a sample including a first oxide insulating film formed under the following conditions was fabricated as Sample C2.

In Sample C2, the first oxide insulating film was formed by a plasma CVD method under the following conditions: silane at a flow rate of 50 sccm and dinitrogen monoxide at a flow rate of 2000 sccm were used as a source gas; the pressure in the treatment chamber was 100 Pa: the substrate temperature was 220° C.; and a high-frequency power of 100 W was supplied to parallel-plate electrodes.

The formation conditions of the first oxide insulating film of Sample C2 is the same as those of the first oxide insulating film of Sample B2 described in Example 5.

<Sample C3>

Sample C3, which was used for comparison, was fabricated under the same conditions as those of Sample C1 except for the formation pressure of the first oxide insulating film. Specifically, a sample including a first oxide insulating film formed under the following conditions was fabricated as Sample C3.

In Sample C3, the first oxide insulating film was formed by a plasma CVD method under the following conditions: silane with a flow rate of 50 sccm and dinitrogen monoxide with a flow rate of 2000 sccm were used as a source gas; the pressure in the treatment chamber was 200 Pa: the substrate temperature was 220° C.; and a high-frequency power of 100 W was supplied to parallel-plate electrodes.

The formation conditions of the first oxide insulating film of Sample C3 is the same as those of the first oxide insulating film of Sample B3 described in Example 5.

<$V_g$-$I_d$ Characteristics>

Next, initial $V_g$-$I_d$ characteristics of the transistors included in Samples C1 to C3 were measured. Here, changes in characteristics of current flowing between a source and a drain (hereinafter referred to as drain current: $I_d$), that is, $V_g$-$I_d$ characteristics were measured under the following conditions: the substrate temperature was 25° C., the potential difference between the source and the drain (hereinafter referred to as drain voltage: $V_d$) was 1 V or 10 V, and the potential difference between the source and the gate electrodes (hereinafter referred to as gate voltage: $V_g$) was changed from −15 V to 15 V.

Figure 58:
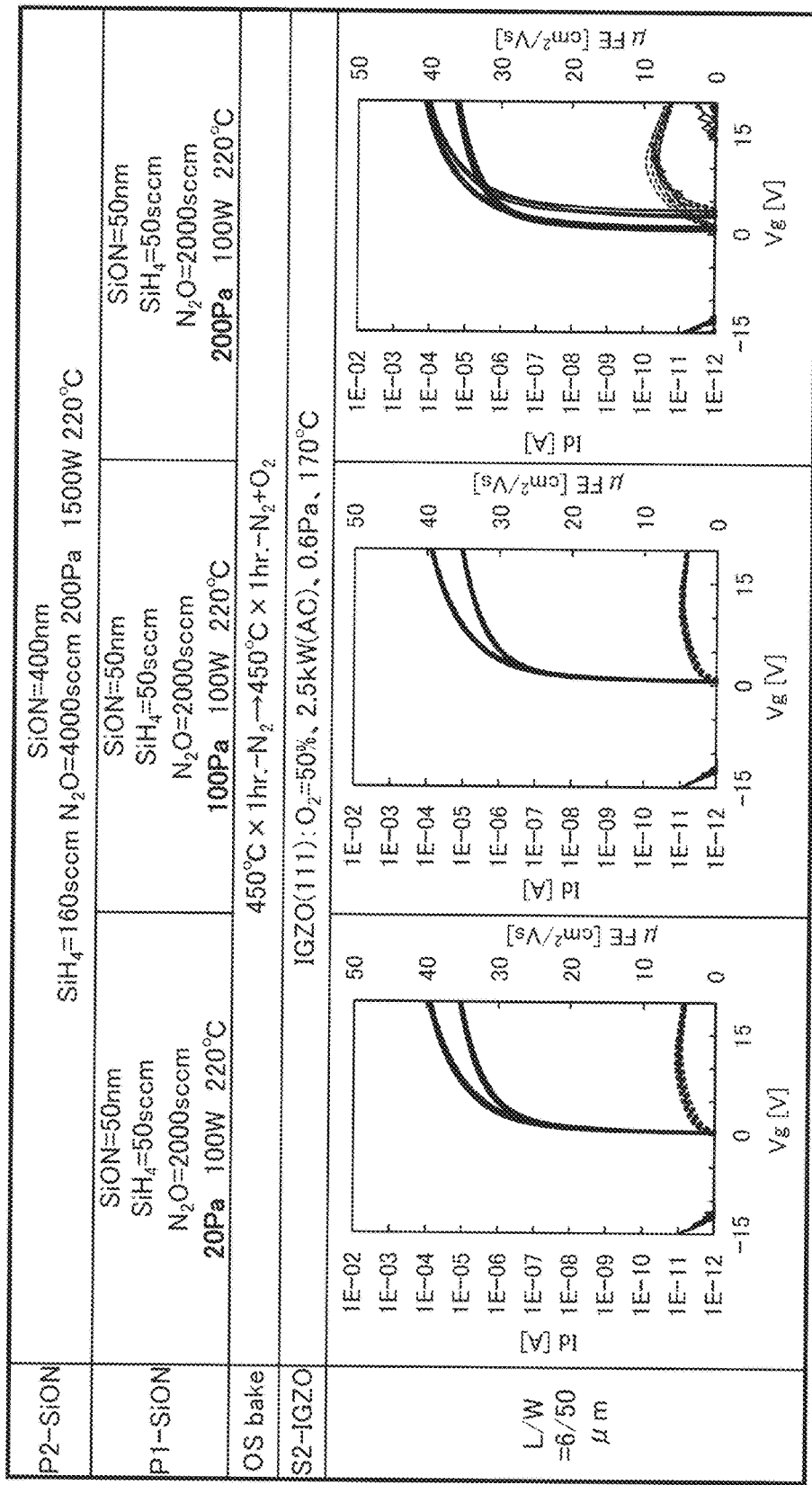
FIG. 58 shows $V_g$-$I_d$ characteristics of transistors.

FIG. 58 shows $V_g$-$I_d$ characteristics of Samples C1 to C3. FIG. 58 shows the results of transistors each having a channel length L of 6 μm and a channel width W of 50 μm. In FIG. 58, the lateral axis, the first longitudinal axis, and the second longitudinal axis represent gate voltage $V_g$, drain current $I_d$, and field-effect mobility, respectively. Here, to show field-effect mobility in a saturation region, field-effect mobility calculated when $V_d$=10 V is shown.

As shown in FIG. 58. Samples C1 and C2 have excellent initial $V_g$-$I_d$ characteristics. In contrast, Sample C3, which was used for comparison and in which the formation pressure of the first oxide insulating film was 200 Pa, has variations in $V_g$-$I_d$ characteristics.

<Gate BT Stress Test>

Next, a gate BT stress test (GBT) and a gate BT photostress test (PGBT) were performed on Samples C1 to C3.

First, a gate BT stress test and a gate BT photostress test were performed.

A measurement method of the gate BT stress test is described. First, substrate temperature is kept constant at given temperature (hereinafter, referred to as stress temperature) to measure the initial $V_g$-$I_d$ characteristics of the transistor.

Next, while the substrate temperature is kept at stress temperature, the pair of electrodes serving as a source electrode and a drain electrode of the transistor is set at the same potential and the gate electrode is supplied with a potential different from that of the pair of electrodes for a certain period of time (hereinafter referred to as stress time). Then, the $V_g$-$I_d$ characteristics of the transistor are measured while the substrate temperature is kept at the stress temperature. As a result, a difference in threshold voltage and a difference in shift value between before and after the gate BT stress test can be obtained as the amount of change in the electrical characteristics.

Note that a stress test where negative voltage is applied to a gate electrode is called negative gate BT stress test (dark negative stress); whereas a stress test where positive voltage is applied is called positive gate BT stress test (dark positive stress). Note that a stress test where negative voltage is applied to a gate electrode while light emission is performed is called negative gate BT photostress test (negative photostress); whereas a stress test where positive voltage is applied while light emission is performed is called positive gate BT photostress test (positive photostress).

Here, the gate BT stress conditions were as follows: stress temperature was 60° C., stress time was 3600 seconds. −30 V or +30 V was applied to the gate electrode, and 0 V was applied to the pair of electrodes serving as the source electrode and the drain electrode. The electric field intensity applied to the gate insulating film was 0.66 MV/cm.

Under the same conditions as those of the above gate BT stress test, the gate BT photostress test was performed where the transistor was irradiated with white light with 10000 1× using an LED. Note that the $V_g$-$I_d$ characteristics of the transistor were measured at a temperature of 60° C. after each of the BT stress tests.

Figure 59:
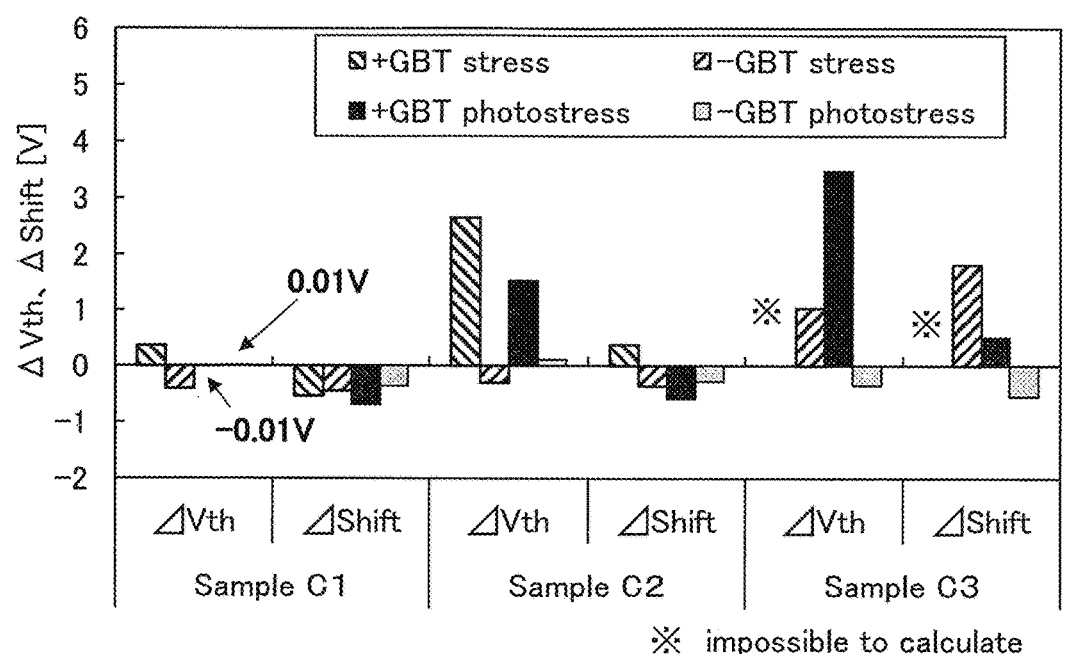
FIG. 59 shows the amount of change in threshold voltage and the amount of change in shift value of transistors after gate BT stress tests and after gate BT photostress tests.

FIG. 59 shows a difference between threshold voltage in the initial characteristics and threshold voltage after the BT stress test (i.e., the amount of change in threshold voltage ($\Delta V_{th}$)) and a difference in shift value (i.e., the amount of change in the shift value ($\Delta$Shift)) of respective transistors included in Samples C1 to C3.

Here, a threshold voltage and a shift value in this specification are described. Threshold voltage $V_{th}$ is defined as, in the $V_g$-$I_d$ curve where the lateral axis represents gate voltage $V_g$[V] and the longitudinal axis represents the square root of drain current $I_d$ ($I_d^{1/2}$) [$A^{1/2}$], gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 10 V.

Furthermore, shift value Shift in this specification is defined as, in the $V_g$-$I_d$ curve where the lateral axis represents the gate voltage $V_g$[V] and the longitudinal axis represents the logarithm of the drain current $I_d$[A], gate voltage at the intersection point of the line of $I_d$=1.0×10$^{-12}$ [A] and the tangent to the curve at a point where the slope of the curve is the steepest. Note that here, the shift value is calculated with a drain voltage $V_d$ of 10 V.

From FIG. 59, the amount of change in the threshold voltage and the amount of change in the shift value of Samples C1 and C2 were smaller than those of Sample C3, which was used for comparison. In particular, in Sample C1, the amount of change in the threshold voltage and the amount of change in the shift value were small in the positive gate BT photostress test and the negative gate BT photostress test.

<Fabrication Methods of Samples 2>

Next, Samples C4 and C5 were fabricated: the formation pressure of the first oxide insulating film was fixed at the pressure of Sample C1, which obtained the excellent $V_g$-$I_d$ characteristics and excellent results in the gate BT stress test, and the flow ratio of the deposition gas was changed. The $V_g$-$I_d$ characteristics and reliability of Samples C4 and C5 were measured. The fabrication methods of Samples C4 and C5 are shown below.

<Sample C4>

Sample C4 was fabricated under the same conditions as those of Sample C1 except for the flow ratio of the deposition gas for the first oxide insulating film. Specifically, a sample including a first oxide insulating film formed under the following conditions was fabricated as Sample C4.

In Sample C4, the first oxide insulating film was formed by a plasma CVD method under the following conditions: silane at a flow rate of 20 sccm and dinitrogen monoxide at a flow rate of 2000 sccm were used as a source gas; the pressure in the treatment chamber was 100 Pa; the substrate temperature was 220° C.; and a high-frequency power of 100 W was supplied to parallel-plate electrodes. In other words, when the flow rate of silane was 1, the flow rate of dinitrogen monoxide was 100.

The formation conditions of the first oxide insulating film of Sample C4 is the same as those of the first oxide insulating film of Sample B4 described in Example 5.

<Sample C5>

Sample C5, which was used for comparison, was fabricated under the same conditions as those of Sample C1 except for the flow ratio of the deposition gas for the first oxide insulating film. Specifically, a sample including a first oxide insulating film formed under the following conditions was fabricated as Sample C5.

In Sample C5, the first oxide insulating film was formed by a plasma CVD method under the following conditions: silane at a flow rate of 100 sccm and dinitrogen monoxide at a flow rate of 2000 sccm were used as a source gas; the pressure in the treatment chamber was 200 Pa: the substrate temperature was 220° C.; and a high-frequency power of 100 W was supplied to parallel-plate electrodes. In other words, when the flow rate of silane was 1, the flow rate of dinitrogen monoxide was 20.

The formation conditions of the first oxide insulating film of Sample C5 is the same as those of the first oxide insulating film of Sample B5 described in Example 5.

<$V_g$-$I_d$ Characteristics>

Next, initial $V_g$-$I_d$ characteristics of the transistors included in Samples C1, C4, and C5 were measured. Here, changes in drain current $I_d$, that is, $V_g$-$I_d$ characteristics were measured under the following conditions: the substrate temperature was 25° C., the drain voltage $V_d$ was 1 V or 10 V, and the gate voltage $V_g$ was changed from −15 V to 15 V.

Figure 60:
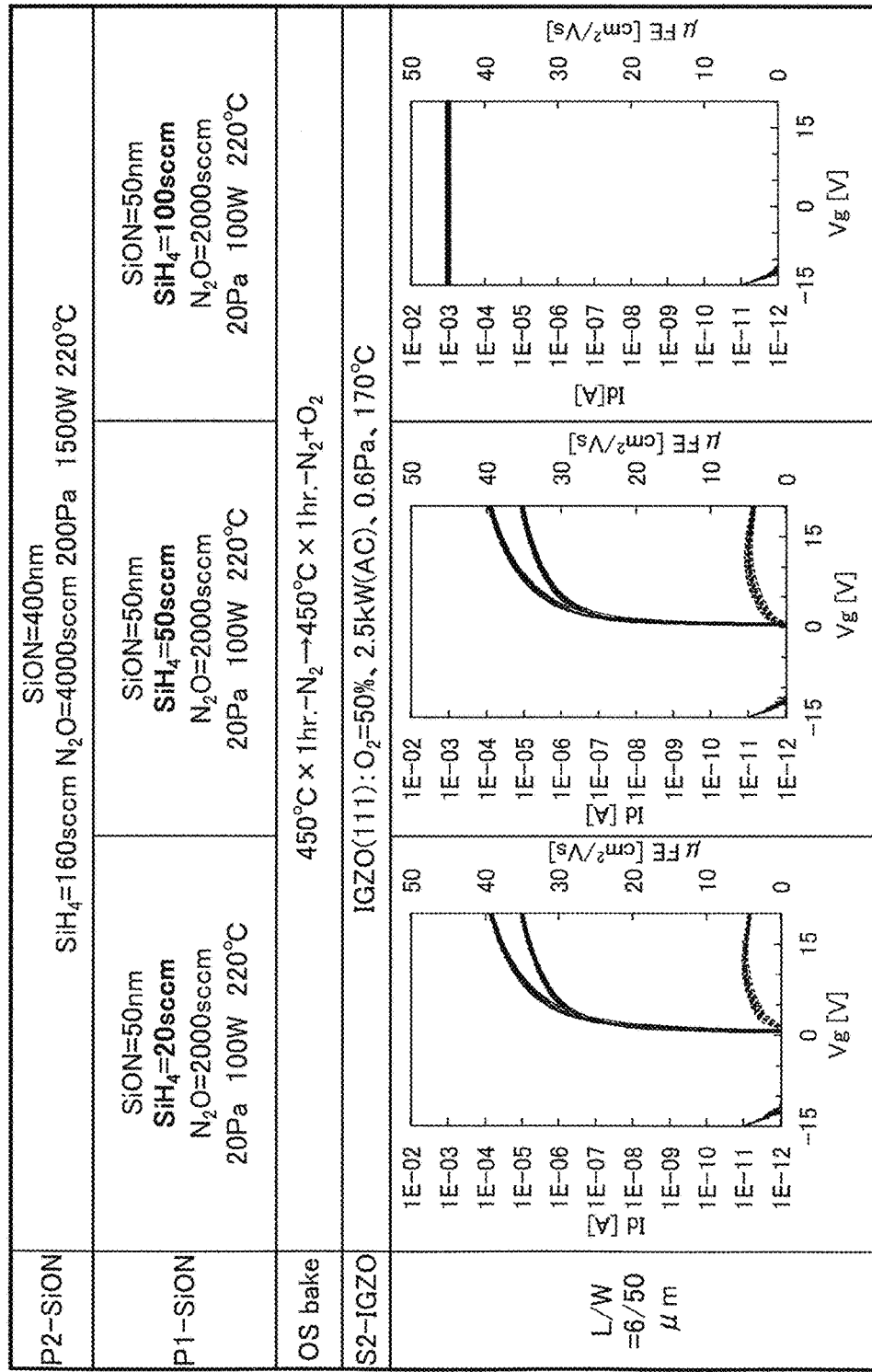
FIG. 60 shows $V_g$-$I_d$ characteristics of transistors.

FIG. 60 shows $V_g$-$I_d$ characteristics of Samples C1, C4, and C5. FIG. 60 shows the results of transistors having a channel length L of 6 μm and a channel width W of 50 μm. In FIG. 60, the lateral axis, the first longitudinal axis, and the second longitudinal axis represent gate voltage $V_s$, drain current $I_d$, and field-effect mobility, respectively. Here, to show field-effect mobility in a saturation region, field-effect mobility calculated when $V_d$=10 V is shown.

As shown in FIG. 60, Samples C1 and C4 have excellent initial $V_g$-$I_d$ characteristics. In contrast, in Sample C5, which was used for comparison, the on-off ratio of the drain current is not obtained; thus, the transistor characteristics are not obtained. In consideration of the results of Sample B5 described in Example 5, this is probably because the oxide semiconductor film contains a large number of oxygen vacancies.

<Gate BT Stress Test>

Next, a gate BT stress test and a gate BT photostress test were performed on Samples C1. C4, and C5.

Figure 61:
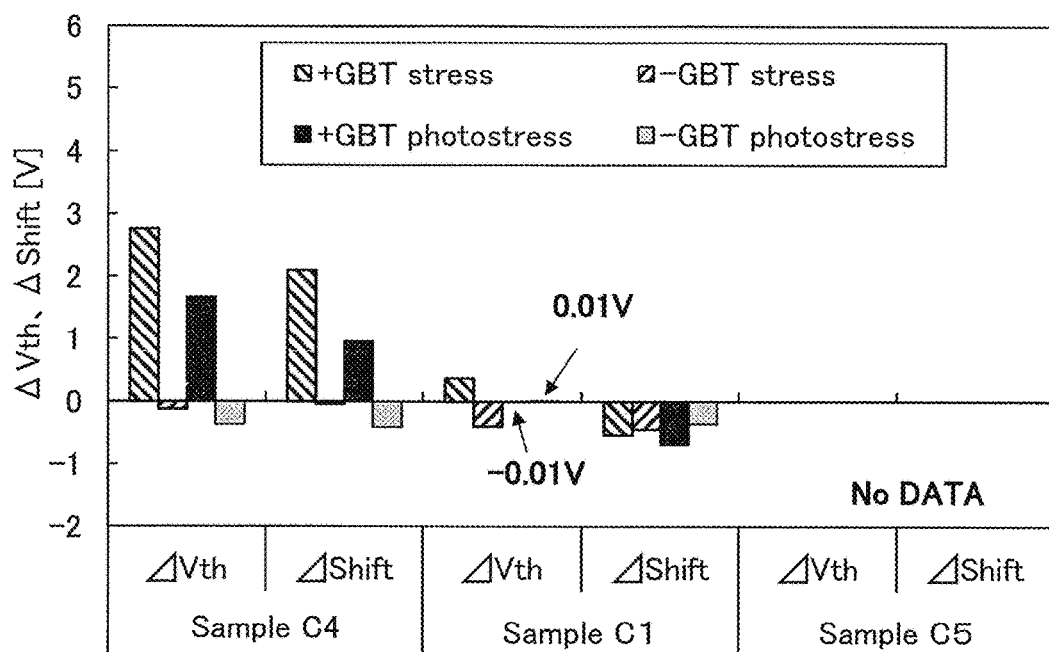
FIG. 61 shows the amount of change in threshold voltage and the amount of change in shift value of transistors after gate BT stress tests and after gate BT photostress tests.

Specifically, a positive gate BT stress test (dark positive stress), a negative gate BT stress test (dark negative stress), a positive gate BT photostress test (positive photostress), and a negative gate BT photostress test (negative photostress) were performed. FIG. 61 shows the difference between the initial threshold voltage and the threshold voltage after the gate BT stress test (i.e., the amount of change in the threshold voltage ($\Delta V_{th}$) and the difference between the initial shift value and the shift value after the gate BT stress test (i.e., the amount of change in the shift value ($\Delta$Shift)) of transistors of Samples C1, C4, and C5.

As shown in FIG. 61, the amount of change in the threshold voltage and the amount of change in the shift value were greater in Sample C4, which was used for comparison and in which the flow ratio of dinitrogen monoxide to silane was 100 in forming the first oxide insulating film, than in Sample C1 of one embodiment of the present invention in which the flow ratio of dinitrogen monoxide to silane was 40.

According to Example 5 and this example, the oxide insulating film in contact with the oxide semiconductor film in Sample C1 has a small spin density, in other words, a small number of defects, and thus the amount of change in the threshold voltage and the amount of change in the shift value of the transistor are small.

<Fabrication Methods of Samples 3>

Next, Samples C6 and C7 were fabricated by changing at least one of the flow ratio of the deposition gas, the pressure, and the formation temperature. The $V_g$-$I_d$ characteristics and reliability of Samples C6 and C7 were measured. The fabrication methods of Samples C6 and C7 are shown below.

<Sample C6>

Sample C6, which was used for comparison, was fabricated under the same conditions as those of Sample C1 except for the flow ratio of the deposition gas for the first oxide insulating film. Specifically, a sample including a first oxide insulating film formed under the following conditions was fabricated as Sample C6.

In Sample C6, the first oxide insulating film was formed by a plasma CVD method under the following conditions: silane at a flow rate of 30 sccm and dinitrogen monoxide at a flow rate of 4000 sccm were used as a source gas; the pressure in the treatment chamber was 40 Pa: the substrate temperature was 220° C.; and a high-frequency power of 100 W was supplied to parallel-plate electrodes. In other words, when the flow rate of silane was 1, the flow rate of dinitrogen monoxide was 133.

<Sample C7>

Sample C7, which was used for comparison, was fabricated under the same conditions as those of Sample C1 except for the flow ratio of the deposition gas for the first oxide insulating film. Specifically, a sample including a first oxide insulating film formed under the following conditions was fabricated as Sample C7.

In Sample C7, the first oxide insulating film was formed by a plasma CVD method under the following conditions: silane at a flow rate of 20 sccm and dinitrogen monoxide at a flow rate of 3000 seem were used as a source gas; the pressure in the treatment chamber was 200 Pa: the substrate temperature was 350° C.; and a high-frequency power of 100 W was supplied to parallel-plate electrodes. In other words, when the flow rate of silane was 1, the flow rate of dinitrogen monoxide was 150.

<Gate BT Stress Test>

Next, a gate BT stress test and a gate BT photostress test were performed on Samples C6 and C7. Here, the description of the test results is omitted.

A sample having a structure similar to that described in Example 5 was fabricated using the same conditions as those of the oxide semiconductor film, the first oxide insulating film, and the second oxide insulating film of Sample C6.

This sample is referred to as Sample B6. A sample having a structure described in Example 5 was fabricated using the same conditions as those the oxide semiconductor film, the first oxide insulating film, and the second oxide insulating film of Sample C7. This sample is referred to as Sample B7. ESR measurement was performed also in Samples B6 and B7, and the spin density of signals attributed to $NO_x$ was obtained. Here, the description of the measurement results of ESR is omitted.

<Amount of Change in Spin Density and Amount of Change in Threshold Voltage of Oxide Insulating Film>

Figure 62:
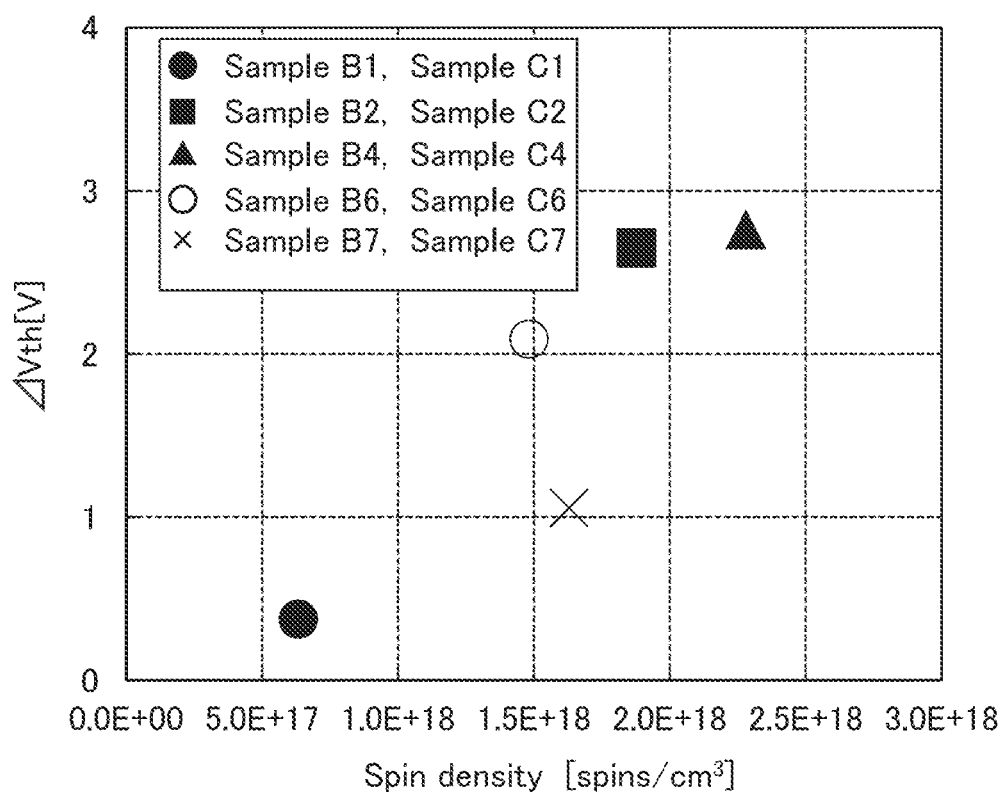
FIG. 62 shows the amount of change in spin density and the amount of change in threshold voltage.

FIG. 62 shows the spin density of the samples obtained in Example 5 and the amount of change in the threshold voltage of the samples obtained in Example 6. Here, the lateral axis indicates the spin densities of Samples B1, B2, B4, B6, and B7, and the longitudinal axis indicates the amount of change in the threshold voltage due to a negative gate BT stress test (dark negative stress) of Samples C1, C2, C4, C6, and C7.

FIG. 62 shows that when the spin density of each sample is small, the amount of change in threshold voltage is small. In Samples B1, B2, B4, B6, B7, C1, C2, C4, C6, and C7, the formation conditions of the oxide semiconductor film and the second oxide insulating film were the same, and when the spin density of signals attributed to $NO_x$ of the first oxide insulating film is lower than, typically, $1 \times 10^{18}$ spins/cm$^3$, the amount of change in the threshold voltage was small.

EXAMPLE 7

In this example, examination results of the $V_g$-$I_d$ characteristics and the reliability of fabricated transistors are described.

<Fabrication Methods of Samples>

As Sample G1 of this example, a transistor having the same structure as that of the transistor 10a in FIG. 4A described in Embodiment 1 was fabricated. Furthermore, as Samples G2 and G6 of this example, transistors having the same structure as that of the transistor 10e in FIGS. 6A to 6C described in Embodiment 1 were fabricated.

Furthermore, Samples G3 to G5 were fabricated as comparative examples.

<Sample G1>

FIG. 63A is a cross-sectional view in the channel length direction of the transistor included in Sample G1. The transistor illustrated in FIG. 63A is a channel-etched transistor. The space between the pair of electrodes 19 and 20 was 6 µm.

A method for fabricating Sample G1 is described. Sample G1 was fabricated in a manner similar to that of Sample C1 described in Example 6 except for high-frequency power supplied to parallel plate electrodes for forming the first oxide insulating film (reference numeral 23 in FIG. 63A). Specifically, a sample including a first oxide insulating film formed under the following conditions was fabricated as Sample G1.

A first oxide insulating film in Sample G1 was formed by a plasma CVD method under the following conditions: silane with a flow rate of 50 sccm and dinitrogen monoxide with a flow rate of 2000 sccm were used as a source gas; the pressure in the treatment chamber was 20 Pa; the substrate temperature was 220° C.; and a high-frequency power of 150 W was supplied to parallel-plate electrodes.

Note that the measurement result of $V_g$-$I_d$ characteristics shows that the transistor included in Sample G1 has normally-off characteristics.

<Sample G2>

FIG. 63B is a cross-sectional view in the channel length direction of the transistor included in Sample G2. The transistor illustrated in FIG. 63B is a channel-etched transistor. The space between the pair of electrodes 19 and 20 was 6 µm.

Sample G2 is different from Sample G1 in that the gate electrode 37 is provided over the protective film 21. Although not illustrated, the gate electrode 37 is connected to the gate electrode 13.

A method for fabricating Sample G2 is described. Sample G2 was fabricated in a manner similar to that of Sample G1 except that, after an opening portion was formed in the gate insulating film 15 and the protective film 21, the gate electrode 37 was formed at the same time as a pixel electrode.

Note that the measurement result of $V_g$-$I_d$ characteristics shows that the transistor included in Sample G2 has normally-off characteristics.

<Sample G3>

FIG. 63C is a cross-sectional view in the channel length direction of the transistor included in Sample G3. The transistor illustrated in FIG. 63C is a channel-etched transistor. The space between the pair of electrodes 19 and 20 was 6 µm.

Sample G3 is different from Sample G1 in that the multilayer film 48 in which the oxide semiconductor film 17 and the oxide semiconductor film 46 were stacked and a first oxide insulating film 23a that was formed under conditions different from those of the first oxide insulating film (reference numeral 23 in FIG. 63A) were included.

A method for fabricating Sample G3 is described.

The oxide semiconductor film 46 was formed under the following conditions: a sputtering target containing In, Ga, and Zn at an atomic ratio of 1:3:6 was used; oxygen at a flow proportion of 50% was supplied as a sputtering gas into a treatment chamber of a sputtering apparatus; the pressure in the treatment chamber was controlled to 0.6 Pa; and direct-current power of 2.5 kW was supplied. Note that the oxide semiconductor film was formed at a substrate temperature of 170° C.

The first oxide insulating film 23a was formed by a plasma CVD method under the following conditions: silane with a flow rate of 30 sccm and dinitrogen monoxide with a flow rate of 4000 sccm were used as a source gas; the pressure in the treatment chamber was 40 Pa; the substrate temperature was 220° C.; and a high-frequency power of 150 W was supplied to parallel-plate electrodes.

Other conditions were similar to those of Sample G1.

Note that the measurement result of $V_g$-$I_d$ characteristics shows that the transistor included in Sample G1 is a normally-off transistor.

<Sample G4>

FIG. 63D is a cross-sectional view in the channel length direction of the transistor included in Sample G4. The transistor illustrated in FIG. 63D is a channel-etched transistor. The shortest distance between the pair of electrodes 219 and 220 was 9 µm.

The transistor included in Sample G4 includes a gate electrode 213 provided over a substrate 211, a gate insulating film 215 formed over the substrate 211 and the gate electrode 213, an oxide semiconductor film 217 overlapping with the gate electrode 213 with the gate insulating film 215 provided therebetween, and a pair of electrodes 219 and 220 in contact with the oxide semiconductor film 217. Furthermore, a protective film 221 is formed over the gate insulating film 215, the oxide semiconductor film 217, and the pair of electrodes 219 and 220.

The substrate 211 is formed of a glass substrate. In the gate electrode 213, a titanium film and a copper film are stacked in this order from the substrate 211 side. In the gate insulating film 215, a silicon nitride film and a silicon oxide film are stacked in this order from the substrate 211 side. The oxide semiconductor film 217 is formed using an In—Ga—Zn oxide film. The oxide semiconductor film 217 is a nanocrystalline oxide semiconductor film. In each of the pair of electrodes 219 and 220, a titanium film and a copper film are stacked in this order from the substrate 211 side. The protective film 221 is formed using a silicon oxide film.

Note that the measurement result of $V_g$-$I_d$ characteristics shows that the transistor included in Sample G4 has normally-off characteristics.

<Sample G5>

FIG. 63E is a cross-sectional view in the channel length direction of the transistor included in Sample G5. The transistor illustrated in FIG. 63E is a channel protective transistor. The space between regions where a pair of electrodes 241 and 242 are in contact with an oxide semiconductor film 237 is 10.5 µm.

The transistor included in Sample G5 includes a gate electrode 233 provided over a substrate 231, a gate insulating film 235 formed over the substrate 231 and the gate electrode 233, the oxide semiconductor film 237 overlapping with the gate electrode 233 with the gate insulating film 235 provided therebetween, an insulating film 239 formed over the gate insulating film 235 and the oxide semiconductor film 237, and the pair of electrodes 241 and 242 in contact with the oxide semiconductor film 237 in an opening portion of the insulating film 239. The transistor also includes a gate insulating film 243 formed over the insulating film 239 and the pair of electrodes 241 and 242 and a gate electrode 245 overlapping with the oxide semiconductor film 237 with the gate insulating film 243 provided therebetween.

The substrate 231 is formed of a glass substrate. In the gate electrode 233, a molybdenum-titanium alloy film and a copper film are stacked in this order from the substrate 231 side. In the gate insulating film 235, a silicon nitride film and a silicon oxide film are stacked in this order from the substrate 231 side. The oxide semiconductor film 237 is formed using an In—Ga—Zn oxide film. The oxide semiconductor film 237 is a nanocrystalline oxide semiconductor film. The insulating film 239 is formed using a silicon oxide film. In each of the pair of electrodes 241 and 242, a molybdenum-titanium alloy film and a copper film are stacked in this order from the substrate 231 side. The gate insulating film 243 is formed using a silicon oxide film. In the gate electrode 245, a molybdenum-titanium alloy film and an indium oxide-tin oxide compound (ITO-SiO2) film are stacked in this order from the substrate 231 side.

Note that the measurement result of $V_g$-$I_d$ characteristics shows that the transistor included in Sample G5 has normally-on characteristics.

<Sample G6>

FIG. 63B is a cross-sectional view in the channel length direction of the transistor included in Sample G6. The transistor illustrated in FIG. 63B is a channel-etched transistor. The space between the pair of electrodes 19 and 20 was 6 µm.

Sample G6 differs from Sample G2 in the composition of the oxide semiconductor film.

A method for fabricating Sample G6 is described. Sample G6 was fabricated in a manner similar to that of Sample G2 except that the oxide semiconductor film was formed using a sputtering target containing In, Ga, and Zn at an atomic ratio of 1:1:1.2.

Note that the measurement result of $V_g$-$I_d$ characteristics shows that the transistor included in Sample G6 is has normally-on characteristics.

<BT Stress Test>

Then, BT stress tests were performed on the transistors included in Samples GI to G5.

Here, positive gate BT stress tests (dark+GBT) were performed. The gate BT stress conditions were as follows: stress temperature was 60° C., +30 V was applied to the gate electrode(s), and 0 V was applied to the pair of electrodes serving as the source electrode and the drain electrode.

In Samples G1, G3, and G4, the amounts of change in threshold voltages were measured with a maximum stress time of 1 hour. In Sample G2, the amount of change in threshold voltage was measured with a maximum stress time of 100 hours. In Sample G5, the amount of change in threshold voltage was measured with a maximum stress time of 24 hours. In Sample G6, the amount of change in threshold voltage was measured with a maximum stress time of 10 hours.

FIGS. 64A to 64D show measurement results of the initial $V_g$-$I_d$ characteristics of Samples G2 to G5 and $V_g$-$I_d$ characteristics with a stress time of one hour.

FIG. 64A, FIG. 64B, FIG. 64C, and FIG. 64D show the measurement results of the $V_g$-$I_d$ characteristics of Sample G2, Sample G3, Sample G4, and Sample G5, respectively. In FIGS. 64A to 64D, solid lines and dashed lines indicate the initial $V_g$-$I_d$ characteristics and the $V_g$-$I_d$ characteristics with a stress time of one hour, respectively. Note that in FIGS. 64A and 64D showing the measurement results of Samples G2 and G5, the amounts of change in the threshold voltages before and after a stress test were small with a stress time of one hour; thus, solid lines overlap with dashed lines.

FIG. 65 shows measurement results of the absolute values of the amounts of change in the threshold voltages with respect to stress time. Specifically, FIG. 65 shows the absolute values of the amounts of change in the threshold voltages of the transistors included in Samples G1 to G6, and approximate curves obtained from the absolute values of the amounts of change. Note that the lateral axis indicates stress time and the longitudinal axis indicates the absolute value ($|\Delta V_{th}|$) of the amount of change in threshold voltage. In FIG. 65, black squares, black circles, white squares, white rhombuses, white triangles, and black triangles indicate measurement data of Sample G1, Sample G2, Sample G3, Sample G4, Sample G5, and Sample G6, respectively. In addition, solid lines are power approximation lines obtained from the measurement data of Samples G1 and G2, and dashed lines are power approximation lines obtained from the measurement data of Samples G3 to G5.

The index of the power approximation line of Sample G1 was 0.29. The index of the power approximation line of Sample G2 was 0.19. The index of the power approximation line of Sample G3 was 0.32. The index of the power approximation line of Sample G4 was 0.42. The index of the power approximation line of Sample G5 was 0.56.

The absolute value of the threshold voltage of each of Samples G1, G2, and G5 with a stress time of 0.1 hours was lower than or equal to 0.1 V. At the same time, Samples G1 and G2 have lower index of the power approximation line than Sample G5. Accordingly, the longer the stress time is, the more the absolute value of the amount of change in the threshold voltage increases in Sample G5 and the less the absolute value of the amount of change in the threshold voltage increases in Samples G1 and G2.

The above results show that the transistor of one embodiment of the present invention is a highly reliable transistor with a small change in threshold voltage over time.

<Repeated ±Gate BT Stress Test>

Next, gate BT stress tests were repeatedly performed on Samples G2. G4, G5, and G6 in a dark state.

Repeated ±gate BT stress test is described. First, the stress temperature of a sample is set at 60° C. and the $V_g$-$I_d$ characteristics of a transistor are measured. Next, a +gate BT stress test is performed. Here, +30 V is applied to a gate electrode for one hour. Then, the $V_g$-$I_d$ characteristics of the transistor are measured while the temperature is kept at 60° C. Subsequently, a −gate BT stress test is performed. Here, −30 V is applied to the gate electrode for one hour while the sample is kept at 60° C. Next, the $V_g$-$I_d$ characteristics of the transistor are measured while the temperature is kept at 60° C. Repeating the +gate BT stress test and the −gate BT stress test enables the change in threshold voltage to be measured.

Figure 66:
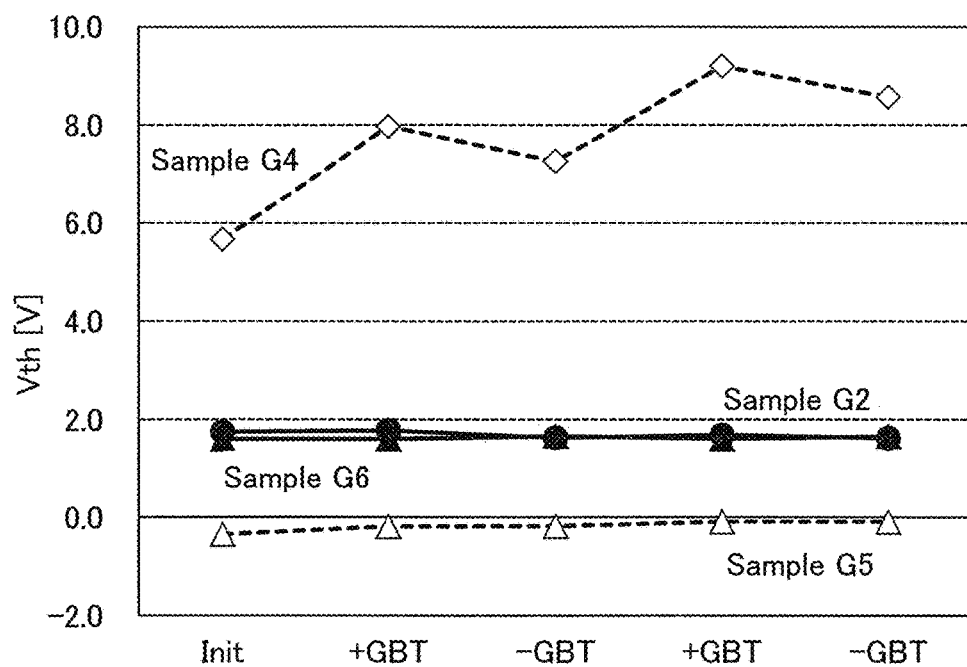
FIG. 66 shows the changes in the threshold voltages of transistors in repeating ±BT stress tests.

FIG. 66 shows the results of the repeated ±gate BT stress tests. The lateral axis indicates stress tests and the longitudinal axis indicates the threshold voltage. In FIG. 66, black circles, white rhombuses, white triangles, and black triangles indicate measurement data of Sample G2, Sample G4, Sample G5, and Sample G6, respectively.

As shown in FIG. 66, the change in threshold voltage due to the repeated ±gate BT stress tests is large in Sample G4. In Sample G5, although the change in threshold voltage due to the repeated ±gate BT stress tests is small, the threshold voltage is a negative value; thus, the transistor has normally-on characteristics. In contrast, since the changes in threshold voltages are small and the threshold voltages are positive values in Samples G2 and G6, the transistors have normally-off characteristics.

The above results show that the transistor of one embodiment of the present invention is a highly reliable transistor with a small change in threshold voltage over time. The results also show that the transistor of one embodiment of the present invention has normally-off characteristics. For this reason, a semiconductor device including the transistor of one embodiment of the present invention consumes low power.

EXAMPLE 8

Described in this example is the diffusion of oxygen in an oxide insulating film that is in contact with an oxide semiconductor film and has a stacked-layer structure like the oxide insulating film described in Modification Example 1 in Embodiment 1. In this example, the oxygen concentration was measured by SSDP-SIMS (SIMS measurement from the substrate side) to describe the diffusion of oxygen.

<Sample D1>

A method for fabricating Sample D1 is described.

First, a 100-nm-thick oxide semiconductor film (IGZO in FIGS. 67A and 67B) was formed over a glass substrate ("Glass" in FIGS. 67A and 67B) by a sputtering method using an In—Ga—Zn oxide sputtering target where In:Ga:Zn=1:1:1 (atomic ratio) and using oxygen and argon as sputtering gases.

Next, a first oxide insulating film ("SiON" in FIGS. 67A and 67B) and a second oxide insulating film ("SP—SiO$_x$" in FIGS. 67A and 67B) were formed over the oxide semiconductor film. As the second oxide insulating film, a silicon oxide film containing oxygen at a higher proportion than oxygen in the stoichiometric composition was formed.

Here, as the first oxide insulating film, a 30-nm-thick silicon oxynitride film was formed by a plasma CVD method under the following conditions: silane at a flow rate of 30 sccm and dinitrogen monoxide at a flow rate of 4000 sccm were used as a source gas, the pressure in the treatment chamber was 200 Pa, the substrate temperature was 220° C., and a high-frequency power of 150 W was supplied to parallel-plate electrodes.

As the second oxide insulating film, a 100-nm-thick silicon oxide film containing $^{18}O$ was formed by a sputtering method in which a silicon wafer was placed in a treatment chamber of a sputtering apparatus, and $^{18}O$ (an isotope of $^{16}O$) with a flow rate of 300 sccm as a source gas was supplied to the treatment chamber.

Through the above process, Sample D1 was fabricated.

<Sample D2>

A method for fabricating Sample D2 is described.

Sample D1 was heated at 350° C. in an atmosphere of a mixed gas containing nitrogen and oxygen for one hour.

Through the above process, Sample D2 was fabricated.

<SIMS Analysis>

Next, the concentration profiles of $^{18}O$ contained in the first oxide insulating films SiON and the oxide semiconductor films IGZO of Samples D1 and D2 were measured by SIMS. Here, the concentration of $^{18}O$ was measured from the glass substrate side to the second oxide insulating film.

FIGS. 67A and 67B each show the concentration profiles of $^{18}O$ that were obtained by the SIMS measurement. The first oxide insulating film SiON was quantified and the results are shown in FIG. 67A, and the oxide semiconductor film IGZO was quantified and the results are shown in FIG. 67B. In FIGS. 67A and 67B, thin solid line and the bold solid line indicate the measurement results of Samples D1 and D2, respectively.

As shown in FIG. 67A, the concentration of $^{18}O$ increases in the first oxide insulating film SiON in Sample D2. As shown in FIG. 67B, the concentration of $^{18}O$ increases in the oxide semiconductor film IGZO on the first oxide insulating film SiON side in Sample D2.

The above results indicate that oxygen is diffused by heat treatment from the second oxide insulating film SP—SiO$_x$ through the first oxide insulating film SiON to the oxide semiconductor film IGZO.

EXAMPLE 9

Described in this example are heat treatment and the number of oxygen vacancies in an oxide insulating film that is in contact with an oxide semiconductor film and has a stacked-layer structure like the oxide insulating film described in Modification Example 1 in Embodiment 1. In this example, the number of oxygen vacancies in the oxide semiconductor film is described using the measurement results of ESR.

<Sample E1>

A method for fabricating Sample E1 is described.

First, a 35-nm-thick oxide semiconductor film was formed over a quartz substrate by a sputtering method using an In—Ga—Zn oxide sputtering target where In:Ga:Zn=1:1:1 (the ratio of the number of atoms) and using a sputtering gas of oxygen and argon.

Next, heat treatment was performed at 450° C. in a nitrogen atmosphere for one hour, and then another heat treatment was performed at 450° C. in a mixed gas of nitrogen and oxygen for one hour.

Next, a first oxide insulating film and a second oxide insulating film were formed over the oxide semiconductor film. As the second oxide insulating film, a silicon oxynitride film containing oxygen at a higher proportion than oxygen in the stoichiometric composition was formed.

Here, as the first oxide insulating film, a 50-nm-thick silicon oxynitride film was formed. The first oxide insulating film was formed by a plasma CVD method under the following conditions: silane at a flow rate of 30 sccm and dinitrogen monoxide at a flow rate of 4000 sccm were used as a source gas, the pressure in the treatment chamber was 40 Pa, the substrate temperature was 220° C., and a high-frequency power of 150 W was supplied to parallel-plate electrodes.

As the second oxide insulating film, a 400-nm-thick silicon oxynitride film was formed. The second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes.

Through the above process, Sample E1 was fabricated.

<Sample E2>

A method for forming Sample E2 is described.

Sample E1 was heated at 350° C. in an atmosphere of a mixed gas containing nitrogen and oxygen for one hour.

Through the above process, Sample E2 was formed.

<ESR Measurement>

Next, Samples E1 and E2 were measured by ESR measurement. In the ESR measurement performed at a predetermined temperature, a value of a magnetic field ($H_0$) where a microwave is absorbed is used for an equation $g=h\nu/\beta H_0$; thus, a parameter "g-factor" can be obtained. Note that the frequency of the microwave is denoted by $\nu$, and the Planck constant and the Bohr magneton are denoted by, respectively, h and $\beta$ that are both constants.

Here, the ESR measurement was performed under the following conditions. Here, the ESR measurement was performed under the following conditions: the measurement temperature was room temperature (25° C.), the high-frequency power (power of microwaves) of 8.9 GHz was 20 mW, and the direction of a magnetic field was parallel to a surface of each sample. Note that the detection limit of the spin density of a signal attributed to $V_OH$ in the IGZO film, which appeared at a g (g-factor) of greater than or equal to 1.89 and less than or equal to 1.96, was $1 \times 10^{17}$ spins/cm$^3$.

Figure 68A:
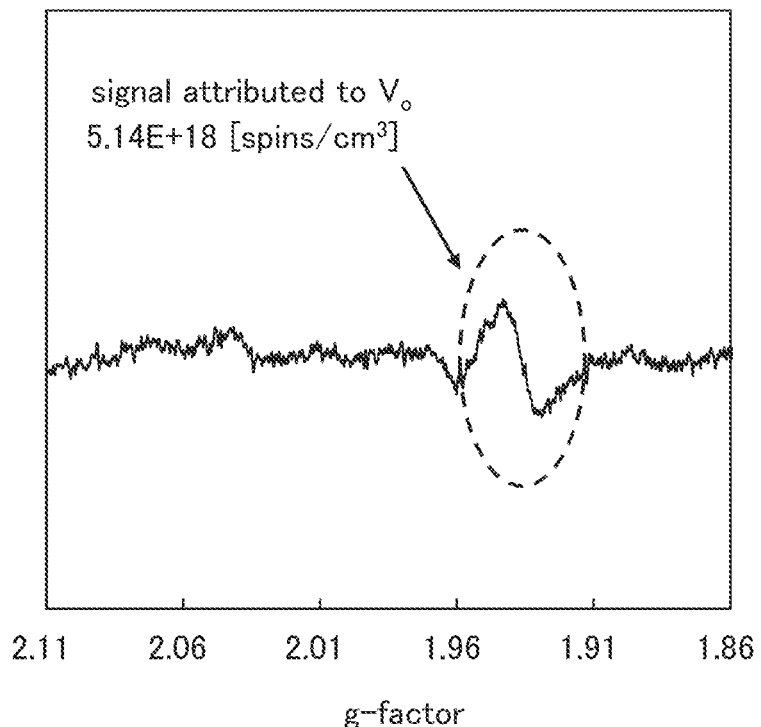
FIGS. 68A and 68B show ESR measurement results.
Figure 68B:
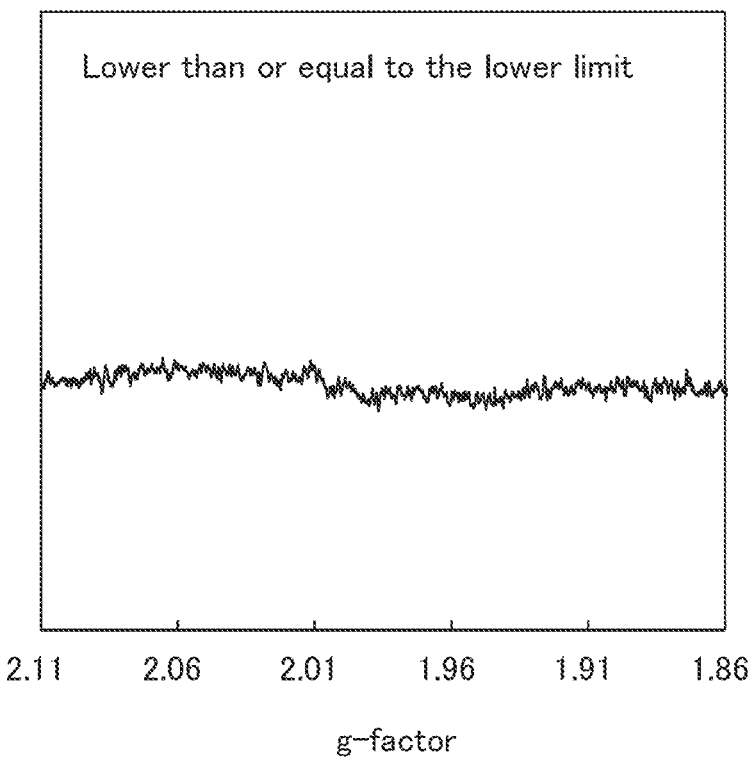

FIGS. 68A and 68B show ESR spectra obtained by ESR measurement. FIGS. 68A and 68B show ESR spectra of the oxide semiconductor films of Samples E1 and E2, respectively.

As shown in FIG. 68A, in Sample E1, a signal attributed to $V_OH$ appears at a g (g-factor) of 1.93. The number of spins absorbed at a g (g-factor) of 1.93 is $5.14 \times 10^{18}$ spins/cm$^3$. This means that the oxide semiconductor film contains $V_OH$.

In contrast, as shown in FIG. 68B, in Sample E2, a signal attributed to $V_OH$ appearing at a g (g-factor) of 1.93 is not observed.

The difference between the signals that appear at a g (g-factor) of 1.93 in FIGS. 68A and 68B confirmed that $V_OH$ in the oxide semiconductor film can be reduced by heat treatment. Furthermore, the results described in Example 8 reveal that oxygen contained in the oxide insulating film containing oxygen at a higher proportion than oxygen in the stoichiometric composition is diffused to the oxide semiconductor film by heat treatment. This means that when oxygen is diffused to the oxide semiconductor film by heat treatment, $V_OH$ in the oxide semiconductor film can be reduced.

EXAMPLE 10

In this example, oxidizing power of plasma caused when an oxide insulating film was exposed to plasma generated by using dinitrogen monoxide or oxygen as an oxidizing gas is described.

First, a method of fabricating each sample is described.

A 100-nm-thick silicon oxynitride film was formed as an oxide insulating film containing nitrogen over a quartz substrate. Then, the silicon oxynitride film was exposed to plasma that was generated in an oxidizing gas atmosphere. Conditions of the formation of the silicon oxynitride film and conditions of plasma treatment are described below.

The silicon oxynitride film was formed under the conditions as follows: the quartz substrate was placed in a treatment chamber of a plasma CVD apparatus; silane with a flow rate of 1 sccm and dinitrogen monoxide with a flow rate of 800 sccm that were used as a source gas were supplied to the treatment chamber; the pressure in the treatment chamber was controlled to 40 Pa: and the power of 150 W was supplied with the use of a 60 MHz high-frequency power source. Further, the temperature of the quartz substrate at the formation of the silicon oxynitride film was 400° C. Note that the plasma CVD apparatus used in this example is a parallel plate plasma CVD apparatus in which the electrode area is 615 cm$^2$, and the power per unit area (power density) into which the supplied power is converted is 0.24 W/cm$^2$.

Plasma was generated in such a manner that dinitrogen monoxide or oxygen with a flow rate of 900 sccm was supplied to the treatment chamber, the pressure in the treatment chamber was controlled to 200 Pa, and power of 900 W (1.46 W/cm$^2$) was supplied with the use of a 60 MHz high-frequency power source. Further, the temperature of the quartz substrate at the time of plasma generation was 200° C. Here, a sample that was exposed to plasma generated in a dinitrogen monoxide atmosphere is referred to as Sample F1. In addition, a sample that was exposed to plasma generated in an oxygen atmosphere is referred to as Sample F2.

Next, TDS analyses were performed on Samples F1 and F2.

The peaks of the curves shown in the results obtained from TDS analyses appear due to release of atoms or molecules contained in the analyzed samples (in this example, Samples F1 and F2) to the outside. The total amount of the atoms or molecules released to the outside corresponds to the integral value of the peak. Thus, with the degree of the peak intensity, the number of the atoms or molecules contained in the silicon oxynitride film can be evaluated.

Figure 69A:
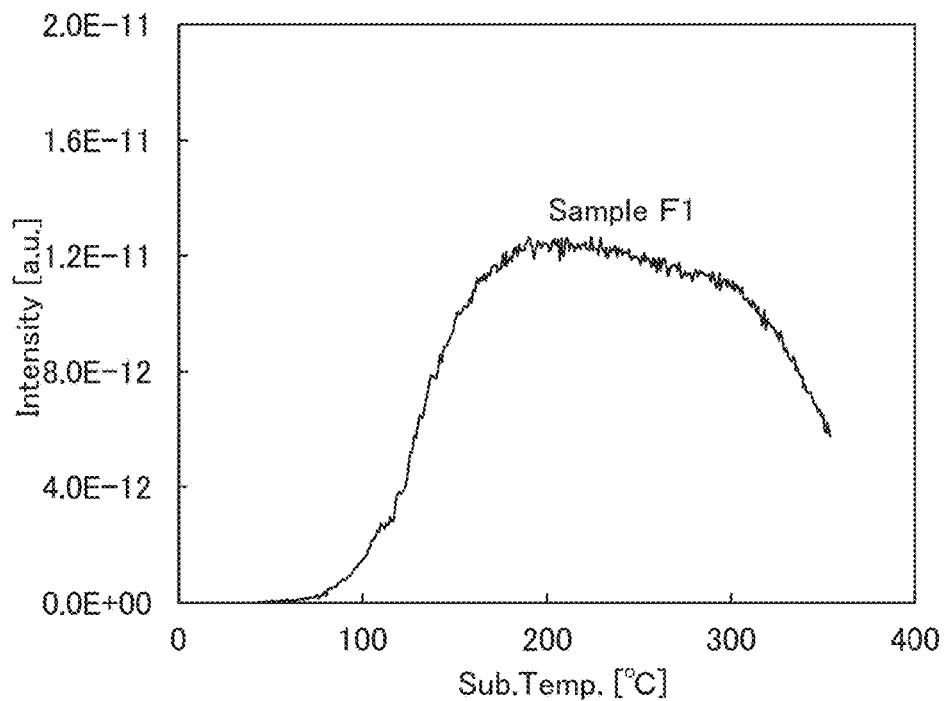
FIGS. 69A and 69B show TDS analysis results.
Figure 69B:
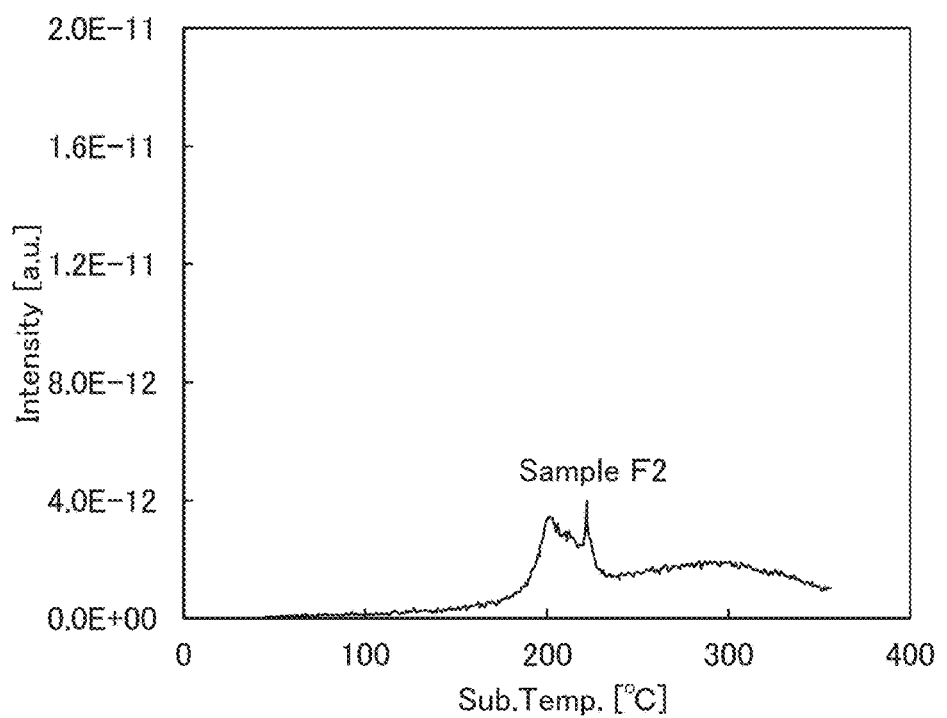

FIGS. 69A and 69B show the results of the TDS analyses on Samples F1 and F2. FIGS. 69A and 69B are each a graph showing the number of released oxygen molecules versus the substrate temperature.

FIGS. 69A and 69B demonstrate that the silicon oxynitride film that was exposed to plasma generated in a dinitrogen monoxide atmosphere has higher TDS intensity of oxygen molecules than the silicon oxynitride film that was exposed to plasma generated in an oxygen atmosphere. As described above, plasma generated in a dinitrogen monoxide atmosphere has stronger oxidizing power than plasma generated in an oxygen atmosphere and enables formation of a film containing excess oxygen, from which oxygen is released easily by heating.

Accordingly, in the case where an oxide insulating film is formed over an oxide semiconductor film by a plasma CVD method, a film containing excess oxygen, from which oxygen can be released by heating, can be formed by using a deposition gas containing silicon and dinitrogen monoxide as a source gas. Note that when dinitrogen monoxide is used as a source gas, nitrogen is contained in the oxide insulating film; therefore, an oxide insulating film containing nitrogen and excess oxygen can be obtained.

EXPLANATION OF REFERENCE

10: transistor, 10a: transistor, 10b: transistor, 10c: transistor, 10d: transistor, 10e: transistor, 10f: transistor, 10g: transistor, 10h: transistor, 10i: transistor, 10j: transistor, 10k: transistor, 11: substrate. 13: gate electrode, 15: gate insulating film, 17: oxide semiconductor film, 17a: oxide semiconductor film, 19: electrode, 19a: electrode, 20: electrode. 20a: electrode, 21: protective film, 22: insulating film, 23: oxide insulating film, 23a: oxide insulating film. 25: oxide insulating film. 27: nitride insulating film, 29: nitride insulating film, 31: oxide insulating film, 33: insulating film, 35: insulating film, 37: gate electrode, 38: organic insulating film, 42: opening portion, 43: opening portion, 45: multilayer film, 46: oxide semiconductor film, 47: oxide semiconductor film, 48: multilayer film, 50: transistor. 50a: transistor, 50b: transistor, 50c: transistor, 51: substrate, 53: protective film, 55: oxide semiconductor film. 57: electrode, 58: electrode, 59: gate insulating film. 61: gate electrode, 63: insulating film, 65: oxide insulating film, 67: oxide insulating film, 69: oxide insulating film, 71: nitride insulating film, 73: oxide semiconductor film, 75: oxide semiconductor film. 80: pixel electrode, 81: substrate, 82: common electrode. 83: liquid crystal layer, 84: insulating film, 85: insulating film, 86: light-emitting layer, 110: metal oxide film, 211: substrate, 213: gate electrode, 215: gate insulating film 217: oxide semiconductor film, 219: electrode, 220: electrode, 221: protective film, 231: substrate, 233: gate electrode, 235: gate insulating film, 237: oxide semiconductor film, 239: insulating film, 241: electrode, 242: electrode, 243: gate insulating film. 245: gate electrode, 310: electron gun chamber. 312: optical system, 314: sample chamber, 316: optical system, 318: camera, 320: observation chamber, 322: film chamber, 324: electron, 328: substance, 332: fluorescent plate, 900: substrate, 901: pixel portion, 902: scanning line driver circuit, 903: scanning line driver circuit, 904: signal line driver circuit, 910: capacitor wiring, 912: gate wiring, 913: gate wiring, 914: drain electrode, 916: transistor, 917: transistor. 918: liquid crystal element, 919: liquid crystal element. 920: pixel, 921: switching transistor, 922: driver transistor, 923: capacitor, 924: light-emitting element, 925: signal line, 926: scan line, 927: power line, 928: common electrode, 1001: main body, 1002: housing, 1003a: display portion, 1003b: display portion, 1004: keyboard button, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera lens, 1038: external connection terminal, 1040: solar cell, 1041: external memory slot, 1050: television device, 1051: housing, 1052: storage medium recording and reproducing portion, 1053: display portion, 1054: external connection terminal. 1055: stand, 1056: external memory, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, and 8011: battery.

This application is based on Japanese Patent Application serial no. 2013-213240 filed with Japan Patent Office on Oct. 10, 2013, Japanese Patent Application serial no. 2013-216220 filed with Japan Patent Office on Oct. 17, 2013, Japanese Patent Application serial no. 2013-242253 filed with Japan Patent Office on Nov. 22, 2013, and Japanese Patent Application serial no. 2013-250040 filed with Japan Patent Office on Dec. 3, 2013, the entire contents of which are hereby incorporated by reference.

The invention claimed is:

1. A semiconductor device comprising:
an oxide semiconductor layer and a gate electrode overlapping with each other,
a first insulating layer between the gate electrode and the oxide semiconductor layer, the first insulating layer being in contact with a first surface of the oxide semiconductor layer;
a second insulating layer in contact with a second surface of the oxide semiconductor layer, the second surface being on a side opposite to the first surface; and
a pair of electrodes in electrical contact with the oxide semiconductor layer,
wherein at least one of the first insulating layer and the second insulating layer includes silicon, oxygen, and nitrogen oxide,
wherein the one of the first insulating layer and the second insulating layer includes a portion whose spin density measured by electron spin resonance spectroscopy is greater than or equal to $1 \times 10^{17}$ spins/cm$^3$ and less than $1 \times 10^{18}$ spins/cm$^3$,
wherein an electron spin resonance spectrum of the portion has a first signal that appears at a g-factor in a range greater than or equal to 2.037 and less than or equal to 2.039, a second signal that appears at a g-factor in a range greater than or equal to 2.001 and less than or equal to 2.003, and a third signal that appears at a g-factor in a range greater than or equal to 1.964 and less than or equal to 1.966,
wherein the first signal, the second signal, and the third signal are attributed to the nitrogen oxide, and
wherein the one of the first insulating layer and the second insulating layer includes a region where an amount of gas having a mass-to-charge ratio m/z of 17 released by heat treatment is greater than an amount of nitrogen oxide released by the heat treatment.

2. The semiconductor device according to claim 1,
wherein at least one of an amount of gas having a mass-to-charge ratio m/z of 30 released by the heat treatment and an amount of gas having a mass-to-charge ratio m/z of 46 released by the heat treatment is less than or equal to a detection limit in the region, and
wherein the amount of the gas having the mass-to-charge ratio m/z of 17 released by the heat treatment is greater than or equal to $1 \times 10^{18}$ molecules/cm$^3$ and less than or equal to $5 \times 10^{19}$ molecules/cm$^3$ in the region.

3. The semiconductor device according to claim 2,
wherein the gas having the mass-to-charge ratio m/z of 30 comprises nitrogen monoxide,
wherein the gas having the mass-to-charge ratio m/z of 46 comprises nitrogen dioxide, and
wherein the gas having the mass-to-charge ratio m/z of 17 comprises ammonia.

4. The semiconductor device according to claim 1, wherein a split width of the first signal and the second signal and a split width of the second signal and the third signal measured by electron spin resonance spectroscopy using an X-band are each 5 mT.

5. The semiconductor device according to claim 1, wherein the nitrogen oxide includes at least one of nitrogen monoxide and nitrogen dioxide.

6. The semiconductor device according to claim 1,
wherein the gate electrode is over an insulating surface, and
wherein the second insulating layer, the oxide semiconductor layer, and the first insulating layer are between the insulating surface and the gate electrode.

7. The semiconductor device according to claim 1,
wherein the gate electrode is over an insulating surface, and
wherein the gate electrode and the first insulating layer are between the insulating surface and the oxide semiconductor layer.

8. A semiconductor device comprising:
an oxide semiconductor layer and a gate electrode overlapping with each other,
a first insulating layer between the gate electrode and the oxide semiconductor layer, the first insulating layer being in contact with a first surface of the oxide semiconductor layer;
a second insulating layer in contact with a second surface of the oxide semiconductor layer, the second surface being on a side opposite to the first surface; and
a pair of electrodes in electrical contact with the oxide semiconductor layer,
wherein at least one of the first insulating layer and the second insulating layer includes silicon, oxygen, and nitrogen oxide,
wherein the one of the first insulating layer and the second insulating layer includes a portion whose spin density measured by electron spin resonance spectroscopy is greater than or equal to $1\times10^{17}$ spins/cm$^3$ and less than $1\times10^{18}$ spins/cm$^3$,
wherein an electron spin resonance spectrum of the portion has a first signal that appears at a g-factor in a range greater than or equal to 2.037 and less than or equal to 2.039, a second signal that appears at a a-factor in a range greater than or equal to 2.001 and less than or equal to 2.003, and a third signal that appears at a a g-factor in a range greater than or equal to 1.964 and less than or equal to 1.966,
wherein the first signal, the second signal, and the third signal are attributed to the nitrogen oxide, and
wherein the one of the first insulating layer and the second insulating layer includes a region where an amount of gas having a mass-to-charge ratio m/z of 17 released by heat treatment is greater than an amount of gas having a mass-to-charge ratio m/z of 30 released by the heat treatment.

9. The semiconductor device according to claim 8,
wherein the gate electrode is over an insulating surface, and
wherein the second insulating layer, the oxide semiconductor layer, and the first insulating layer are between the insulating surface and the gate electrode.

10. The semiconductor device according to claim 8,
wherein the gate electrode is over an insulating surface, and
wherein the gate electrode and the first insulating layer are between the insulating surface and the oxide semiconductor layer.

11. A semiconductor device comprising:
an oxide semiconductor layer and a gate electrode overlapping with each other,
a first insulating layer between the gate electrode and the oxide semiconductor layer, the first insulating layer being in contact with a first surface of the oxide semiconductor layer;
a second insulating layer in contact with a second surface of the oxide semiconductor layer, the second surface being on a side opposite to the first surface; and
a pair of electrodes in electrical contact with the oxide semiconductor layer,
wherein at least one of the first insulating layer and the second insulating layer includes silicon, oxygen, and nitrogen oxide,
wherein the one of the first insulating layer and the second insulating layer includes a portion whose spin density measured by electron spin resonance spectroscopy is greater than or equal to $1\times10^{17}$ spins/cm$^3$ and less than $1\times10^{18}$ spins/cm$^3$,
wherein an electron spin resonance spectrum of the portion has a first signal that appears at a g-factor in a range greater than or equal to 2.037 and less than or equal to 2.039, a second signal that appears at a g-factor in a range greater than or equal to 2.001 and less than or equal to 2.003, and a third signal that appears at a g-factor in a range greater than or equal to 1.964 and less than or equal to 1.966,
wherein the first signal, the second signal, and the third signal are attributed to the nitrogen oxide, and
wherein the one of the first insulating layer and the second insulating layer includes a region where an amount of gas having a mass-to-charge ratio m/z of 17 released by heat treatment is greater than an amount of gas having a mass-to-charge ratio m/z of 46 released by the heat treatment.

12. The semiconductor device according to claim 11,
wherein the gate electrode is over an insulating surface, and
wherein the second insulating layer, the oxide semiconductor layer, and the first insulating layer are between the insulating surface and the gate electrode.

13. The semiconductor device according to claim 11,
wherein the gate electrode is over an insulating surface, and
wherein the gate electrode and the first insulating layer are between the insulating surface and the oxide semiconductor layer.

14. The semiconductor device according to claim 1,
wherein the first insulating layer is in direct contact with the first surface of the oxide semiconductor layer, and
wherein the second insulating layer is in direct contact with the second surface of the oxide semiconductor layer.

15. The semiconductor device according to claim 1,
wherein the region includes a first number of ammonia molecules and a second number of nitrogen oxide molecules so that the amount of the gas having the mass-to-charge ratio m/z of 17 released by the heat treatment is greater than the amount of nitrogen oxide released by the heat treatment.

16. The semiconductor device according to claim 8, wherein the first insulating layer is in direct contact with the first surface of the oxide semiconductor layer, and wherein the second insulating layer is in direct contact with the second surface of the oxide semiconductor layer.

17. The semiconductor device according to claim 8, wherein the region includes a first number of ammonia molecules and a second number of nitrogen monoxide molecules so that the amount of the gas having the mass-to-charge ratio m/z of 17 released by the heat treatment is greater than the amount of the gas having the mass-to-charge ratio m/z of 30 released by the heat treatment.

18. The semiconductor device according to claim 11, wherein the first insulating layer is in direct contact with the first surface of the oxide semiconductor layer, and wherein the second insulating layer is in direct contact with the second surface of the oxide semiconductor layer.

19. The semiconductor device according to claim 11, wherein the region includes a first number of ammonia molecules and a second number of nitrogen dioxide molecules so that the amount of the gas having the mass-to-charge ratio m/z of 17 released by the heat treatment is greater than the amount of the gas having the mass-to-charge ratio m/z of 46 released by the heat treatment.

* * * * *